(12) United States Patent
Shimokawa et al.

(10) Patent No.: US 8,462,410 B2
(45) Date of Patent: Jun. 11, 2013

(54) MIRROR DEVICE, MIRROR ARRAY, OPTICAL SWITCH, MIRROR DEVICE MANUFACTURING METHOD, AND MIRROR SUBSTRATE MANUFACTURING METHOD

(75) Inventors: Fusao Shimokawa, Kanagawa (JP); Shingo Uchiyama, Kanagawa (JP); Johji Yamaguchi, Kanagawa (JP); Makoto Sato, Kanagawa (JP); Kunihiko Sasakura, Kanagawa (JP); Hirofumi Morita, Kanagawa (JP); Shuichiro Inagaki, Kanagawa (JP); Katsuyuki Machida, Kanagawa (JP); Hiromu Ishii, Kanagawa (JP); Makoto Murakami, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 13/412,504

(22) Filed: Mar. 5, 2012

(65) Prior Publication Data

US 2012/0162735 A1    Jun. 28, 2012

Related U.S. Application Data

(62) Division of application No. 11/597,234, filed as application No. PCT/JP2005/024078 on Dec. 28, 2005, now Pat. No. 8,149,489.

(30) Foreign Application Priority Data

| Jan. 5, 2005 | (JP) | ................................ 2005-000667 |
| Jan. 12, 2005 | (JP) | ................................ 2005-005173 |
| Jan. 12, 2005 | (JP) | ................................ 2005-005174 |
| Jan. 12, 2005 | (JP) | ................................ 2005-005176 |
| Jan. 12, 2005 | (JP) | ................................ 2005-005177 |
| Jan. 18, 2005 | (JP) | ................................ 2005-010205 |
| Jan. 21, 2005 | (JP) | ................................ 2005-013743 |
| Jan. 21, 2005 | (JP) | ................................ 2005-014752 |
| Jan. 21, 2005 | (JP) | ................................ 2005-014757 |
| Jan. 21, 2005 | (JP) | ................................ 2005-014762 |
| Jan. 25, 2005 | (JP) | ................................ 2005-016561 |
| Jan. 25, 2005 | (JP) | ................................ 2005-016564 |
| Jan. 25, 2005 | (JP) | ................................ 2005-016572 |
| Mar. 1, 2005 | (JP) | ................................ 2005-055494 |
| Mar. 15, 2005 | (JP) | ................................ 2005-072477 |

(51) Int. Cl.
*G02B 26/08* (2006.01)

(52) U.S. Cl.
USPC .................. 359/198.1; 359/199.2; 359/200.6; 359/225.1; 359/226.2

(58) Field of Classification Search
USPC .......... 359/198.1–199.2, 200.6, 223.1–226.2; 310/309
See application file for complete search history.

(56) References Cited

U.S. PATENT DOCUMENTS

| 5,096,279 | A |  | 3/1992 | Hornbeck et al. |
| 5,444,566 | A |  | 8/1995 | Gale et al. |
| 5,671,083 | A |  | 9/1997 | Conner et al. |
| 7,046,422 | B2 |  | 5/2006 | Kimura et al. |
| 2002/0012180 | A1 | * | 1/2002 | Yu et al. ........................ 359/872 |
| 2002/0041455 | A1 |  | 4/2002 | Sawada et al. |
| 2003/0124462 | A1 |  | 7/2003 | Miller |
| 2003/0173654 | A1 |  | 9/2003 | Rodgers et al. |
| 2004/0125536 | A1 |  | 7/2004 | Arney et al. |
| 2004/0150872 | A1 |  | 8/2004 | Neukermans et al. |

FOREIGN PATENT DOCUMENTS

| EP | 1 479 647 A2 | 11/2004 |
| JP | 06-136551 | 5/1994 |
| JP | 02-230295 | 8/1994 |
| JP | 2000-010028 | 1/2000 |
| JP | 2001-004952 | 1/2001 |
| JP | 2001-185635 | 7/2001 |
| JP | 2002-156514 | 5/2002 |
| JP | 2002-267996 | 9/2002 |
| JP | 2002-301696 | 10/2002 |
| JP | 2003-057575 | 2/2003 |
| JP | 2003-140064 | 5/2003 |
| JP | 2003-202418 | 7/2003 |
| JP | 2004-101554 | 4/2004 |
| JP | 2004-101822 | 4/2004 |

| | | |
|---|---|---|
| JP | 2004-109580 | 4/2004 |
| JP | 2004-130507 | 4/2004 |
| JP | 2004-170833 | 6/2004 |
| JP | 2004-177957 | 6/2004 |
| JP | 2004-181619 | 7/2004 |
| JP | 2004-212829 | 7/2004 |
| JP | 2004-223620 | 8/2004 |
| JP | 2004-240011 | 8/2004 |
| JP | 2004-245892 | 9/2004 |
| JP | 2004-252337 | 9/2004 |
| JP | 2004-264603 | 9/2004 |
| JP | 2004-294877 | 10/2004 |
| JP | 2005-517990 | 6/2005 |
| JP | 2005-518954 | 6/2005 |
| JP | 2009-252463 | 10/2009 |
| JP | 2009-252465 | 10/2009 |
| JP | 2009-252467 | 10/2009 |
| WO | WO 03/031316 A2 | 4/2003 |
| WO | WO 03/071331 | 8/2003 |
| WO | WO 03/076977 | 9/2003 |

OTHER PUBLICATIONS

Shea, H.R., "Effects of Electrical Leakage Currents on MEMS Reliability and Performance," *IEEE Transactions on Device and Materials Reliability*, vol. 4, No. 2, Jun. 2004, pp. 2-11.

http://www.allcalendars.net/JapaneseYearConverter.php; "Convert Western Years to Japanese Years", 2 pages, Feb. 1, 2012 12:11 PM.

Shea, Herbert R. et al., "Effects of Electrical Leakage Currents on MEMS Reliability & Performance", IEEE Transaction on Devices & Materials Reliability, vol. 4, No. 2, Jun. 2004, pp. 2-11.

V.A. Aksyuk et al., Beam-Steering Micromirrors for Large Optical Cross-Connects, Journal of Lightwave Technology, Mar. 2003, vol. 21, No. 3.

U. Brengt et al., Electrostatic Micromechanic Actuators, IOP Publishing Ltd., pp. 256-261, 1992.

Gasparyan et al, "Drift-Free 1000G Mechanical Shock Tolerant Single-Crystal Two-Axis MEMS Tilting Mirrors in a 1000×1000-Port Optical Crossconnect", Optical Fiber Conference 2003 Post Deadline Paper, PD36-I-3.

Fisher et at "Flectrostatically deflectable polysilicon micromirrors— dynamic behaviour and comparison with the results form FEM modeling With ANSYS", Sensors and Actuators 73(1999) 122-130.

Urano et al.,, "Novel Fabrication Process and Structure of a Low-Voltage-Operation Micromirror Array for Optical MEMS Switches", IEEE/IDEM 2003, pp. 965-968.

Zhu et al., "Computing Insertion Loss in MEMS Optical Switches Caused by Non-Flat Mirrors", CLEO 2001, pp. 185-186.

* cited by examiner

*Primary Examiner* — James Phan

(74) *Attorney, Agent, or Firm* — Blakely, Sokoloff, Taylor & Zafman

(57) ABSTRACT

A mirror device includes a mirror (153) which is supported to be pivotable with respect to a mirror substrate (151), a driving electrode (103-1-103-4) which is formed on an electrode substrate (101) facing the mirror substrate, and an antistatic structure (106) which is arranged in a space between the mirror and the electrode substrate. This structure can fix the potential of the lower surface of the mirror and suppress drift of the mirror by applying a second potential to the antistatic structure.

4 Claims, 71 Drawing Sheets

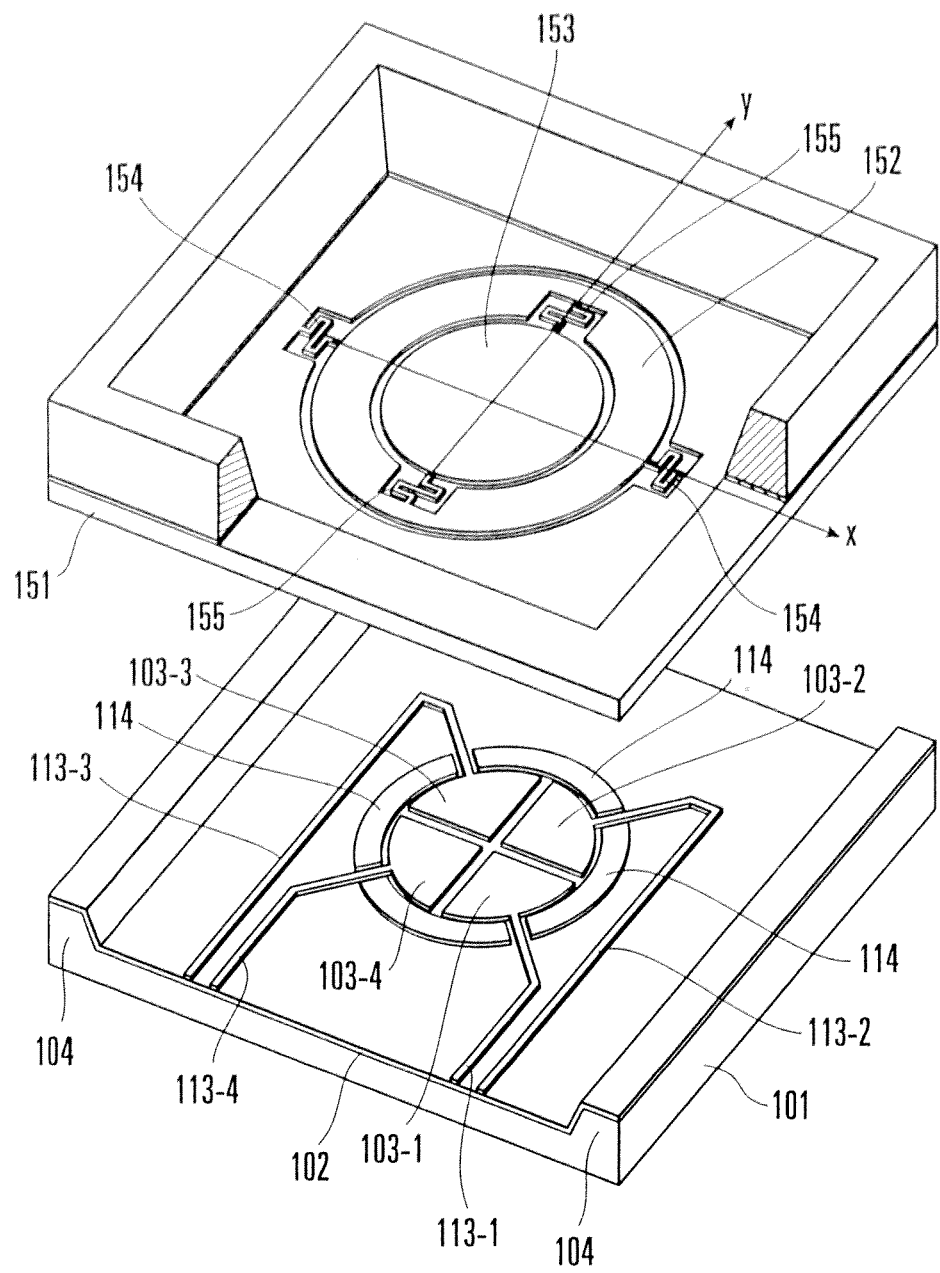
F I G. 8

MIRROR DEVICE, MIRROR ARRAY, OPTICAL SWITCH, MIRROR DEVICE MANUFACTURING METHOD, AND MIRROR SUBSTRATE MANUFACTURING METHOD

The present patent application is a Divisional application claiming the benefit of application Ser. No. 11/597,234, filed Nov. 20, 2006, now U.S. Pat. No. 8,149,489, which is a non-provisional application claiming the benefit of International Application No. PCT/JP/2005/024078, filed Dec. 28, 2005.

TECHNICAL FIELD

The present invention relates to an electrostatically driven mirror device having a mirror with changeable tilt angles, a mirror array having a plurality of mirror devices arranged two-dimensionally, an optical switch having the mirror array, a method of manufacturing the mirror device, and a method of manufacturing a mirror substrate included in the mirror device.

BACKGROUND ART

MEMS (Micro Electro Mechanical Systems) optical switches have received a great deal of attention as a hardware technology to implement large-scale optical switches. The most characteristic component of a MEMS optical switch is a MEMS mirror array. The MEMS mirror array includes a plurality of MEMS mirror devices (to be referred to as mirror devices hereinafter) arrayed two-dimensionally. A conventional mirror device (see, e.g., Japanese Patent No. 3579015) will be described below.

As shown in FIGS. 107 and 108, an insulating layer 8002 made of a silicon oxide film is formed on a lower substrate 8001 of single-crystal silicon. Four driving electrodes 8003-1 to 8003-4 are provided on the insulating layer 8002 at the center of the substrate 8001. Supports 8004 of single-crystal silicon are provided on both sides of the upper surface of the tower substrate 8001.

An upper substrate 8101 has an annular gimbal 8102 inside. A mirror 8103 is provided inside the gimbal 8102. For example, a Ti/Pt/Au layer (not shown) with a three-layered structure is formed on the upper surface of the mirror 8103. Torsion springs 8104 connect the upper substrate 8101 to the gimbal 8102 at two 180° opposite points. Similarly, torsion springs 8105 connect the gimbal 8102 to the mirror 8103 at two 180° opposite points. The X-axis passing through the pair of torsion springs 8104 and the Y-axis passing through the pair of torsion springs 8105 intersect at a right angle. As a result, the mirror 8103 can pivot around the X- and Y-axes each serving as a pivot axis. The upper substrate 8101, gimbal 8102, mirror 8103, and torsion springs 8104 and 8105 are integrally made of single-crystal silicon.

The structure of the lower substrate 8001 and the structure of the upper substrate 8101 shown in FIGS. 107 and 108 are separately manufactured. The upper substrate 8101 is soldered to the supports 8004 so that the upper substrate 8101 bonds to the lower substrate 8001. In this mirror device, the mirror 8103 is grounded. A positive voltage is applied to the driving electrodes 8003-1 to 8003-4 to generate an asymmetrical potential difference between the driving electrodes 8003-1 to 8003-4. An electrostatic force attracts the mirror 8103 and causes it to pivot in an arbitrary direction.

The design of the mirror device whose driving electrodes 8003-1 to 8003-4 generate an electrostatic force to drive the mirror 8103 is based on the fact that the electrostatic force is proportional to the second power of size, i.e., the area, unlike the gravity or inertial force that is proportional to the third power of size, i.e., the volume. For the usual order of centimeters, the presence of an electrostatic force is noticeable only in frictional electricity with a high voltage of several thousand V or more. As the size reduces, an inertial force abruptly becomes small in proportional to the third power of size. However, the electrostatic force decreases in proportional to the second power of size. Hence, the electrostatic force can lift or move an object even at a low voltage of several V to several ten V in a microscopic world. In the mirror device shown in FIGS. 107 and 108, the diameter of the mirror 8103 is, e.g., about 500 μm. The distance between the mirror 8103 and the driving electrodes 8003-1 to 8003-4 is, e.g., about 90 μm.

Frictional electricity causes spark discharge due to its high voltage. In a small mirror device, however, no avalanche discharge with spark occurs with the same electric field strength. This is because even when the electric field is strong, particles (particles ionized due to some reason, e.g., ions in air that are ionized by cosmic rays or natural radiation) accelerated by it cannot acquire energy so high as to ionize other neutral particles collided with them because of the short distance between the mirror 8103 and the driving electrodes 8003-1 to 8003-4. The electrostatic force is proportional to the electric field strength between the electrodes (in the mirror device, between the mirror 8103 and the driving electrodes 8003-1 to 8003-4). Hence, if the interelectrode distance is long, it is necessary to give a large voltage difference between the electrodes. However, the large voltage difference applied between the electrodes may cause discharge, as described above. Even with the same electric field strength, the voltage difference applied between the electrodes can decrease in proportional to the interelectrode distance in the small mirror device. Since the above-described factor prevents discharge, a stable driving force is available. The reasons that mainly make the electrostatic force effective as a driving force in the mirror device have been described above. Use of the electrostatic force allows to control the driving force by the voltage applied to the driving electrodes 8003-1 to 80034. Since control by an electronic circuit is easy, and any steadily flowing current does not exist, power consumption greatly decreases.

DISCLOSURE OF INVENTION

Problems to be Solved by the Invention

The absolute value of the force necessary for driving the mirror 8103 is small because the size of the mirror device is small. When using an inertial force as the driving force, the absolute value of the force necessary for driving the mirror 8103 abruptly decreases in proportion to the third power of size. An electrostatic force also decreases in proportion to the second power of size, although it is relatively large as compared to the absolute value of the force necessary for driving the mirror 8103. The mirror device that operates with a very small force readily receives the influence of an unexpected slight electrostatic force that is negligible in a usual size.

A typical example is a drift phenomenon that poses a problem in an electrostatically driven MEMS mirror device. Drift indicates a displacement of a tilt angle θ of the mirror 8103 from a proper angle decided by the voltage applied to the driving electrodes 8003-1 to 8003-4. Those skilled in the art have known the problem of drift for a long time and understood that the cause of it is related to movement of charges. That is drift occurs in relation to a time required to charge between electrodes or another stray capacitance or electrification near the electrodes. However, a specific mechanism f drift is unknown, and therefore, only measures are empirically taken against drift. That is, the measures can or cannot have effects, and it is hard to say that a practical method is established.

Means of Solution to the Problems

The present invention has been made in consideration of the above-described conventional problems, and has as its object to suppress drift of a mirror.

It is another object of the present invention to provide a mirror device manufacturing method capable of manufacturing a mirror with a desired warp amount.

It is still another object of the present invention to form a mirror substrate at a high yield of non-defective units.

It is still another object of the present invention to achieve low-voltage driving and cost reduction and increase the pivot angle of a mirror.

In order to achieve the above objects, according to the present invention, there is provided a mirror device characterized by comprising a mirror which is supported to be pivotable with respect to a mirror substrate, a driving electrode which is formed on an electrode substrate facing the mirror substrate, and an antistatic structure which is arranged in a space between the mirror and the electrode substrate.

According to the present invention, there is also provided a mirror array characterized by two-dimensionally arraying a plurality of mirror devices, each of the mirror devices comprising a mirror which is supported to be pivotable with respect to a mirror substrate, a driving electrode which is formed on an electrode substrate facing the mirror substrate, and an antistatic structure which is arranged in a space between the mirror and the electrode substrate.

According to the present invention, there is also provided an optical switch characterized by comprising a first mirror array which reflects light from an input port, and a second mirror array which reflects the light from the first mirror array and guides the light to an output port, each of the first mirror array and the second mirror array comprising a plurality of above-described mirror devices arranged two-dimensionally.

According to the present invention, there is also provided a method of manufacturing a mirror device which includes a mirror substrate having a flat mirror pivotally supported, and an electrode substrate which faces the mirror substrate and has an electrode to control pivotal movement of the mirror, characterized by comprising the first step of preparing the mirror substrate having the flat mirror pivotally supported, the second step of forming a first metal layer on one surface of the mirror, the third step of forming a second metal layer on the other surface of the mirror, and the fourth step of placing the mirror substrate on the electrode substrate to make the electrode face the mirror.

According to the present invention, there is also provided a method of manufacturing a mirror substrate, characterized by comprising at least the first step of preparing an SOI substrate including a substrate portion, a buried insulating layer on the substrate portion, and a silicon layer on the buried insulating layer, the second step of forming a movable portion formation mask pattern on a surface of the silicon layer and forming the silicon layer by etching using the movable portion formation mask pattern as a mask to form, in a mirror formation region on the buried insulating layer, a base and a plate-shaped mirror structure connected to the base through a pair of connectors, the third step of forming a protective layer that fills spaces between the base, the connectors, and the mirror structure, and the fourth step of forming, on a surface of the substrate portion, a frame formation mask pattern with an opening corresponding to the mirror formation region and removing the substrate portion and the buried insulating layer by etching using the frame formation mask pattern as a mask to expose the silicon layer on a side of the substrate portion in the formation region and form a frame portion outside the mirror formation region.

According to the present invention, there is also provided a method of manufacturing a device which includes a mirror substrate having a mirror pivotally supported, and an electrode substrate which faces the mirror substrate, characterized by comprising the first step of preparing the electrode substrate having a flat surface, a substantially conical projecting portion that projects from the flat surface, and a trench formed in the flat surface around the projecting portion, the second step of forming a metal layer on the flat surface and surfaces of the projecting portion and trench of the electrode substrate, the third step of patterning the metal layer while setting focus of an exposure apparatus on the flat surface to form an interconnection on the flat surface and, at least on the surfaces of the projecting portion and trench, an electrode connected to the interconnection, and the fourth step of placing the mirror substrate on the electrode substrate to make the electrode face the mirror.

Effects of the Invention

An effect of the present invention is to suppress drift of the mirror. Since the antistatic structure is arranged in the space between the mirror and the lower substrate, the charge/discharge time constant to a part related to driving of the mirror can be small, or a part with a large charge/discharge time constant can be eliminated from the vicinity of the driving electrodes.

According to the present invention, since a metal layer is provided not only on one surface but also on the other surface of the mirror, warp of the mirror can be controlled.

According to the present invention, when the base, connectors, and mirror structure are formed on the buried insulating layer, a protective layer filling the spaces between them is formed. Even when the buried insulating layer in the mirror formation region is removed to expose the both surfaces of the silicon layer and make the mirror structure movable, the mirror structure is prevented from moving. As a result, according to the present invention, the mirror structure and connectors are protected from damage. This allows to form mirror substrates at a high yield of non-defective units.

According to the present invention, since a projecting portion is formed in a trench formed in the base to increase the difference of elevation of the projecting portion, the mirror can have a large pivot angle. Interconnections are formed on the base, and the electrodes are formed on the trench formed in the substrate and the projecting portion projecting from the trench. Hence, setting the focus of the exposure apparatus on the upper surface of the base allows to form the interconnections and electrodes at a necessary accuracy.

BRIEF DESCRIPTION OF DRAWINGS

FIG. 8 is an exploded perspective view showing the structure of a mirror device according to the sixth embodiment of the present invention;

BEST MODE FOR CARRYING OUT THE INVENTION

The embodiments of the present invention will be described below in detail with reference to the accompanying drawings.

First Embodiment

Figure 1:
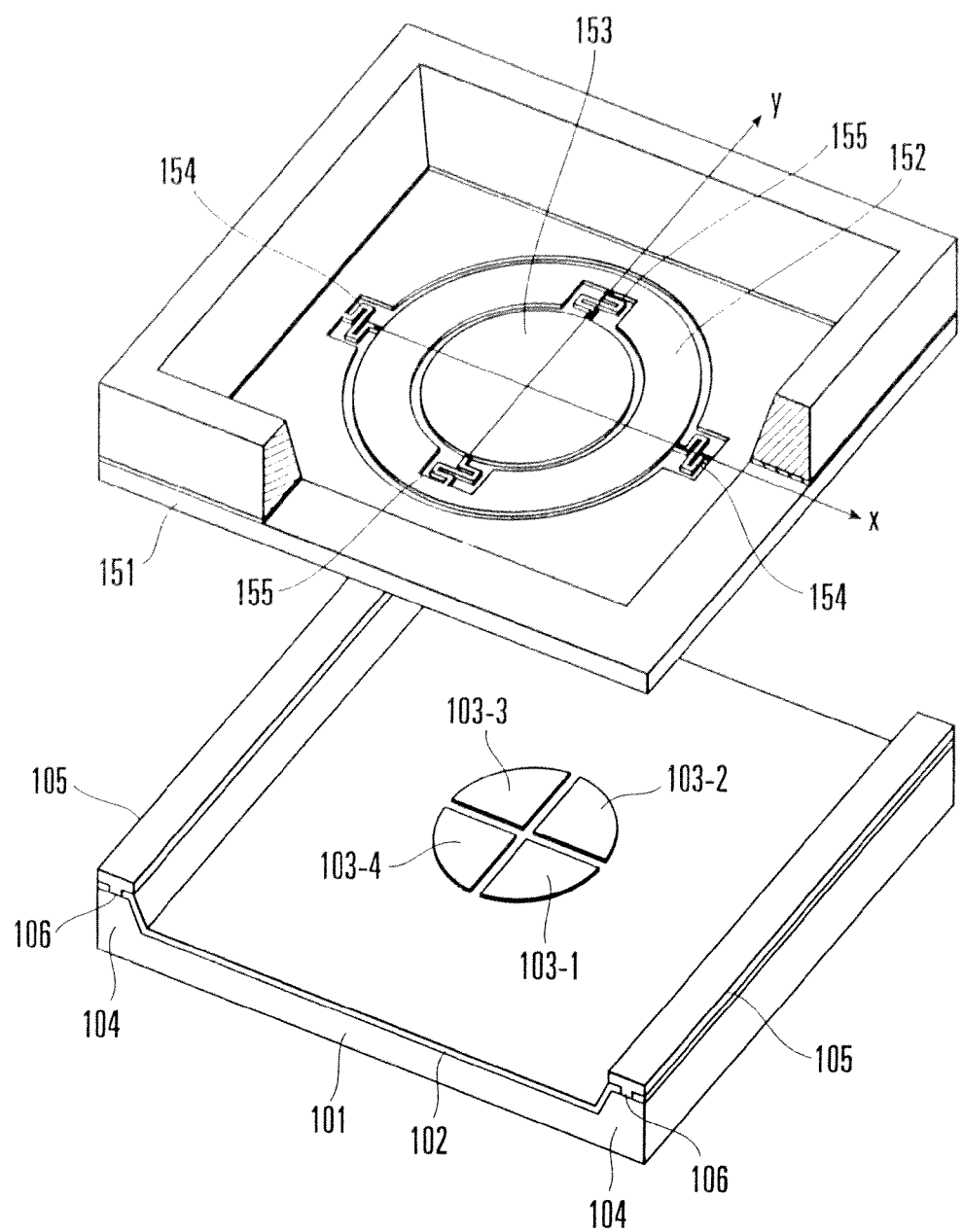
FIG. 1 is an exploded perspective view of a mirror device according to the first embodiment of the present invention.
Figure 2:
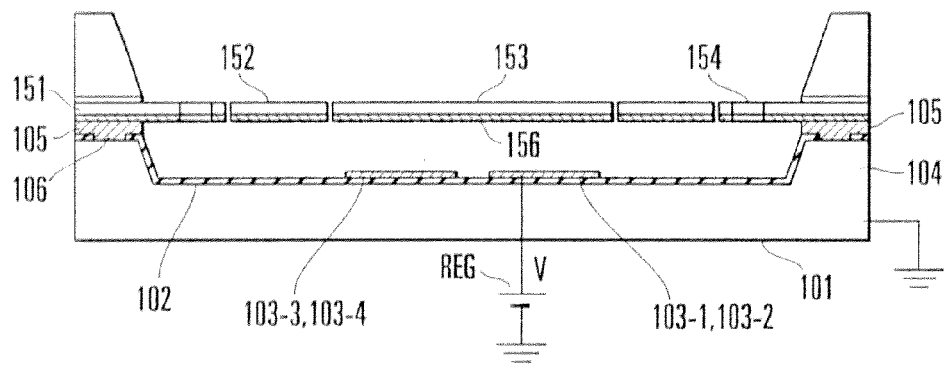
FIG. 2 is a sectional view of the mirror device according to the first embodiment of the present invention.

A mirror device 1 according to the first embodiment will be described below. As shown in FIGS. 1 and 2, an insulating layer 102 made of a silicon oxide film is formed on a lower substrate 101 of single-crystal silicon. Four driving electrodes 103-1 to 103-4 are provided on the insulating layer 102 at the center of the lower substrate 101. Supports 104 of single-crystal silicon are provided on both sides of the upper surface of the lower substrate 101.

In this embodiment, the insulating layer 102 on the surface of each support 104 is partially removed to form a contact hole 106. A metal layer 105 made of, e.g., Au is formed on the contact hole 106.

An upper substrate 151 has an annular gimbal 152 inside. A mirror 153 is provided inside the gimbal 152. For example, a Ti/Pt/Au layer (not shown) with a three-layered structure is formed on the upper surface of the mirror 153. Torsion springs 154 connect the upper substrate 151 to the gimbal 152 at two 180° opposite points. Similarly, torsion springs 155 connect the gimbal 152 to the mirror 153 at two 180° opposite points. The X-axis passing through the pair of torsion springs 154 and the Y-axis passing through the pair of torsion springs 155 intersect at a right angle. As a result, the mirror 153 can pivot around the X- and Y-axes each serving as a pivot axis.

In this embodiment, a metal layer 156 made of, e.g., Au and serving as an antistatic structure is formed on the lower surfaces of the upper substrate 151, gimbal 152, mirror 153, and torsion springs 154 and 155.

The mirror device generally uses an SOI (Silicon On Insulator) substrate capable of easily obtaining single-crystal silicon and, more particularly, a single-crystal silicon plate with a thickness of about 10 μm because of the requirements of the surface flatness of the mirror 153 and the reliability of the torsion springs 154 and 155. The mirror 153 is formed on the SOI substrate. Making the mirror 153 face the driving electrodes 103-1 to 103-4, the metal layer 105 is bonded to the metal layer 156 by using solder such as an AuSn alloy or a conductive adhesive such as Ag paste so that the upper substrate 151 bonds to the lower substrate 101.

In this mirror device, the mirror 153 is grounded. A positive or negative voltage is applied to the driving electrodes 103-1 to 103-4 to generate an asymmetrical potential difference between the driving electrodes 103-1 to 103-4. An electrostatic force attracts the mirror 153 and causes it to pivot in an arbitrary direction.

The causes of drift of the mirror will be described next with reference to FIG. 3 by exemplifying a conventional mirror device shown in FIGS. 107 and 108.

Figure 3:
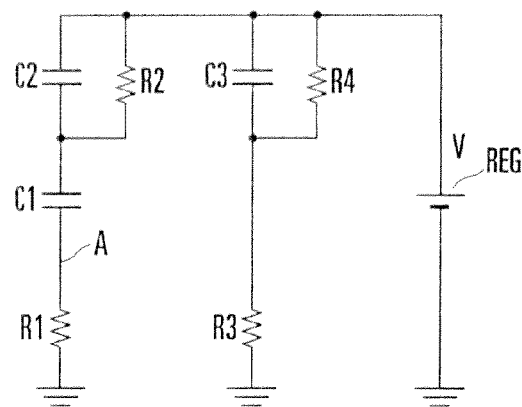
FIG. 3 is an equivalent circuit diagram of an electric circuit related to driving of a mirror in the mirror device.

Referring to FIG. 3, reference symbol R1 denotes a grounding resistance of a mirror 8103; R2, a resistance of an insulating layer (not shown in FIGS. 107 and 108) formed on the surface of driving electrodes 8003-1 to 8003-4; R3, a grounding resistance of a lower substrate 8001; R4, an insulating leakage resistance when a leakage current from the driving electrodes 8003-1 to 8003-4 and interconnections (not shown in FIGS. 107 and 108) to supply a first potential V ($V \geq 0$ in this embodiment) to the electrodes flows to the lower substrate 8001 through an insulating layer 8002; C1, a capacitance formed between the mirror 8103 and the driving electrodes 8003-1 to 8003-4; C2, a capacitance of an insulating layer formed on the surfaces of the driving electrodes 8003-1 to 8003-4; C3, an interconnection stray capacitance (the capacitance of the insulating layer 8002) formed between the lower substrate 8001 and the driving electrodes 8003-1 to 8003-4 and interconnections to supply the first potential to the electrodes; and REG, a power supply which applies the first potential to the driving electrodes 8003-1 to 8003-4 through the interconnections and also applies a second potential (the second potential is equal to or different from the first potential, and in this embodiment, a ground potential) to the mirror 8103 and lower substrate 8001.

The drift of the mirror 8103 can roughly be classified into two types. Drift of the first type occurs when the voltage between the mirror 8103 and the driving electrodes 8003-1 to 8003-4 does not follow the voltage applied to the electrical interconnections because the interconnections to apply the voltage between the mirror 8103 and the driving electrodes 8003-1 to 8003-4 are imperfect. Drift of the second type occurs when an electrically stray part with an indefinite potential polarizes upon voltage application, causes gradual electrification due to some reason, or gradually loses accumulated charges to influence the driving force of the mirror 8103. Another example of the part where such polarization or electrification occurs is a part connected to the first potential or second potential at a high resistance.

That is, the drift fundamentally occurs when the charge/discharge time constant in parts (the mirror 8103, the driving electrodes 8003-1 to 8003-4, and the structures near the driving electrodes 8003-1 to 8003-4) related to driving of the mirror 8103 is large. Two measures are available to suppress the drift. One measure is to reduce the charge/discharge time constant. The other is to eliminate the parts with the large charge/discharge time constant from the vicinity of the driving electrodes 8003-1 to 8003-4.

In the mirror device that deflects a light beam by making the mirror 8103 pivot by an electrostatic force, a slight displacement of the tilt angle of the mirror 8103 is amplified to a displacement of the light beam projection point. Hence, it is necessary to minimize the drift of the mirror 8103. Especially in a spatial optical switch using the mirror device, a displacement of the tilt angle of the mirror 8103 changes to an insertion loss variation. Hence, the optical switch is not practically usable if drift occurs.

In this embodiment, an antistatic structure is formed on parts (the mirror 8103, the driving electrodes 8003-1 to 8003-4, and the structures near the driving electrodes 8003-1 to 8003-4) related to driving of the mirror 8103 on the basis of the two measures.

As described above, the upper substrate 151, gimbal 152, mirror 153, and torsion springs 154 and 155 are integrally made of single-crystal silicon of the SOI substrate. A ground potential is applied to the mirror 153 through the upper substrate 151, torsion springs 154, gimbal 152, and torsion springs 155. However, the actual potential of the mirror 153 is the potential of a point A in FIG. 3, which is higher than the ground potential before the capacitance C1 formed between the mirror 153 and the driving electrodes 103-1 to 103-4 finishes charge. This is because the grounding resistance R1 of the mirror 153 (silicon layer) shown in FIG. 3 exists.

To prevent drift, it is necessary to reliably ensure electrical connection to fix the potential of the lower surface of the mirror 153 facing the driving electrodes 103-1 to 103-4. However, it is generally not easy to attain it. The silicon layer serving as the mirror 153 is electrically disconnected from the base silicon layer of the SOI substrate by an insulating layer. To obtain a light beam reflecting function, a metal layer of, e.g., Au is deposited on the upper surface of the mirror 153. It is however normally impossible to expect the deposited metal layer to electrical connect the silicon layer of the mirror 153 to the base silicon layer of the SOI substrate. A native oxide film, i.e., a silica layer with insulating properties is usually formed on the silicon surface. For this reason, even when the metal layer deposited on the upper surface of the silicon layer serving as the mirror 153 electrically connects to a potential, the silicon layer of the mirror 153 itself does not always connect to that potential.

To fix the potential of the lower surface of the mirror 153 facing the driving electrodes 103-1 to 103-4, it is effective to ensure electrical contact to the lower surface of the mirror 153 directly from the side facing the driving electrodes 103-1 to 103-4.

In this embodiment, as shown in FIGS. 1 and 2, the metal layer 156 made of, e.g., Au and serving as an antistatic structure is formed on the lower surfaces of the upper substrate 151, gimbal 152, mirror 153, and torsion springs 154 and 155. A second potential is applied to the metal layer 156. This structure reduces the grounding resistance R1 in FIG. 3.

The upper substrate 151, gimbal 152, mirror 153, and torsion springs 154 and 155 are integrally made of single-crystal silicon. Hence, when the metal layer 156 is formed on the lower surfaces, and the second potential is applied from an end of the metal layer 156, the lower surface of the mirror 153 is fixed to the second potential. However, it is sometimes difficult to directly apply the second potential from a side surface of the mirror device to the metal layer 156.

In this embodiment, the second potential is applied to the metal layer 156 through the lower substrate 101 and supports 104. To obtain this electrical connection, in this embodiment, the insulating layer 102 on the surface of each support 104 is partially removed to form the contact hole 106. The metal layer 105 made of, e.g., Au is formed on the contact hole 106. The metal layer 105 connects to the metal layer 156 on the side of the upper substrate 151. It is therefore easy to ensure electrical connection to the metal layer 156 that has difficulty in interconnection.

The metal layer 156 serving as an antistatic structure is formed on the lower surface of the mirror 153 facing the driving electrodes 103-1 to 103-4, and the second potential is applied to the metal layer 156, determining the potential of the lower surface of the mirror 153. This allows to suppress drift of the mirror 153.

Second Embodiment

Figure 4:
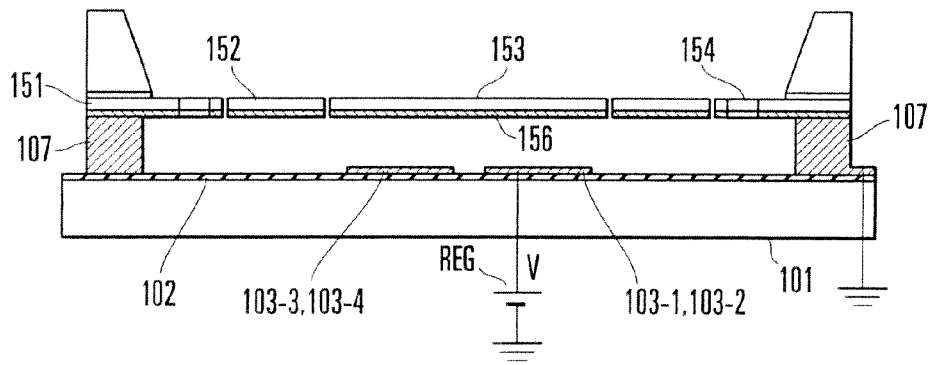
FIG. 4 is a sectional view of a mirror device according to the second embodiment of the present invention.

The second embodiment of the present invention will be described next with reference to FIG. 4. The same reference numerals as in FIGS. 1 and 2 denote the same parts in FIG. 4. In the first embodiment, the second potential is applied to the metal layer 156 through the lower substrate 101 and supports 104, which are made of single-crystal silicon. Instead, the second potential may be applied to a metal layer 156 through metal supports 107 formed on an insulating layer 102, as shown in FIG. 4. To form the supports 107, a metal such as Au is deposited by, e.g. plating. In the second embodiment, since it is possible to ensure electrical connection to the metal layer 156 without intervening a silicon layer, the potential of the lower surface of a mirror 153 can properly be set.

Third Embodiment

Figure 5:
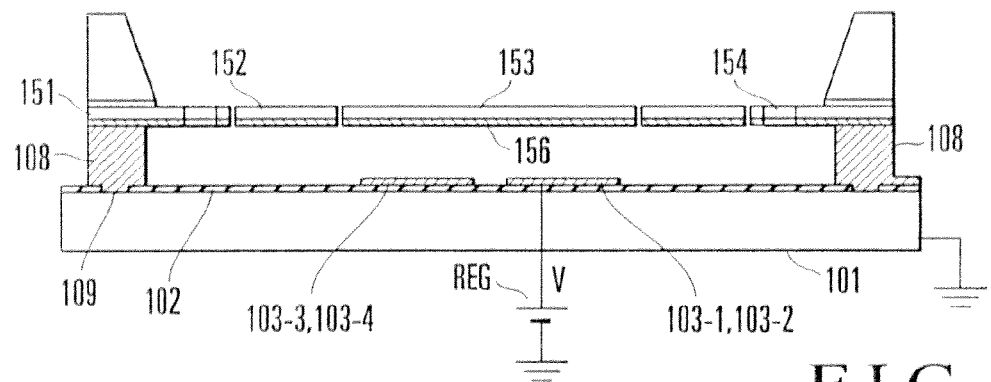
FIG. 5 is a sectional view of a mirror device according to the third embodiment of the present invention.

The third embodiment of the present invention will be described next with reference to FIG. 5. The same reference numerals as in FIGS. 1 and 2 denote the same parts in FIG. 5. In the first embodiment, the second potential is applied to the metal layer 156 through the lower substrate 101 and supports 104, which are made of single-crystal silicon. Instead, an insulating layer 102 on a lower substrate 101 may partially be removed to form contact holes 109, as shown in FIG. 5. Supports 108 made of, e.g., Au may be formed on the contact holes 109 to apply the second potential to a metal layer 156 through the supports 108. This facilitates electrical connection to the supports 108.

In the first to third embodiments, to obtain reliable electrical connection to the metal layer 156, an oxide film on the surface of the metal layer 105 or 156 or the supports 107 and 108 may be removed by, e.g., an acid. Not only mechanical contact but also solder such as an AuSn alloy or a conductive adhesive such as Ag paste can ensure electrical connection between the metal layers 105 and 156 or electrical connection between the metal layer 156 and the supports 107 or 108.

Fourth Embodiment

Figure 6:
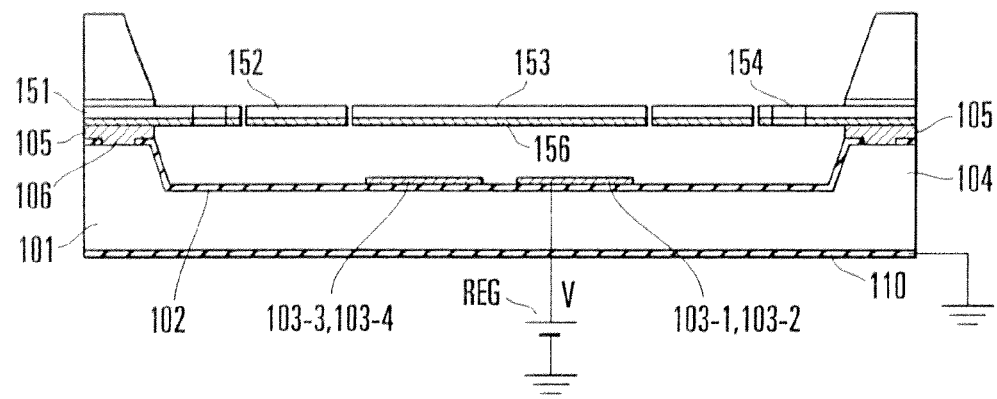
FIG. 6 is a sectional view of a mirror device according to the fourth embodiment of the present invention.

The fourth embodiment of the present invention will be described next with reference to FIG. 6. The same reference numerals as in FIGS. 1 and 2 denote the same parts in FIG. 6. In this embodiment, an antistatic structure exists on the side of a tower substrate 101. Since the first potential is supplied to driving electrodes 103-1 to 103-4 normally through a metal interconnection, the potential of the driving electrodes 103-1 to 103-4 is never indeterminate. Hence, the problem that the voltage of the driving electrodes 103-1 to 103-4 does not follow the voltage applied to the interconnection is avoidable.

Electrically stray parts with an indeterminate potential can be classified into several parts. An example of such parts is the lower substrate 101. Normally, a mirror 153 has a larger area than the counter driving electrodes 103-1 to 103-4. For this reason, the lower substrate itself may exist at positions facing the mirror 153. If the potential of the lower substrate 101 is different from that of the mirror 153, an electrostatic force corresponding to charges present in the lower substrate 101 facing the mirror 153 acts on the mirror 153. The charges gradually move to the first potential side through a resistance R4 in FIG. 3 or to the side of the second potential through a resistance R3. Hence, the mirror 153 drifts.

To prevent the mirror 153 from drifting due to the lower substrate 101, it is important to set the Lower substrate 101 to the second potential equal to the mirror 153. In this embodiment, the antistatic structure is formed in the following way. The lower substrate 101 uses a conductive material (single-crystal silicon in this embodiment). An oxide film on the lower or side surfaces of the lower substrate 101 is removed. A metal layer 110 is deposited at portions without the oxide film. The second potential is applied to the lower substrate 101 through the metal layer 110. This structure decreases the grounding resistance R3 in FIG. 3.

As described above, in this embodiment, the lower substrate 101 uses a conductive material. The oxide film on the lower or side surfaces of the lower substrate 101 is removed. The metal layer 110 is deposited at portions without the oxide film. The second potential is applied to the lower substrate 101 through the metal layer 110. Hence, it is possible to determine the lower substrate 101 to the same potential as that of the mirror 153 and suppress drift of the mirror 153.

Fifth Embodiment

The fifth embodiment of the present invention will be described next with reference to FIG. 7. The same reference numerals as in FIGS. 1 and 2 denote the same parts in FIG. 7.

The fourth embodiment ensures reliable electrical connection of the lower substrate 101. The next problem is insulating layers present on the surfaces of driving electrodes 103-1 to 103-4. Generally, an insulating layer is formed on the surface of each of the driving electrodes 103-1 to 103-4 to protect the electrode and prevent a short circuit, although not illustrated in FIGS. 1, 2, 4, 5, 107, and 108. The insulating layers polarize upon application of the first potential to the driving electrodes 103-1 to 103-4. Even the insulating layers have a finite electrical conductivity although it is very low. Hence, charges move at a predetermined time constant and finally make the insulating layers equipotential to the driving electrodes 103-1 to 103-4.

Finally, the distance between the driving electrodes 103-1 to 103-4 and the mirror 153 decreases by an amount corresponding to the thickness of the insulating layers. The force between the driving electrodes 103-1 to 103-4 and the mirror 153 that attract each other increases as the distance therebetween decreases. For this reason, the mirror 153 drifts. The discharge time constant of polarization in the insulating layers is normally large and ranges from several min to several hrs.

Figure 7:
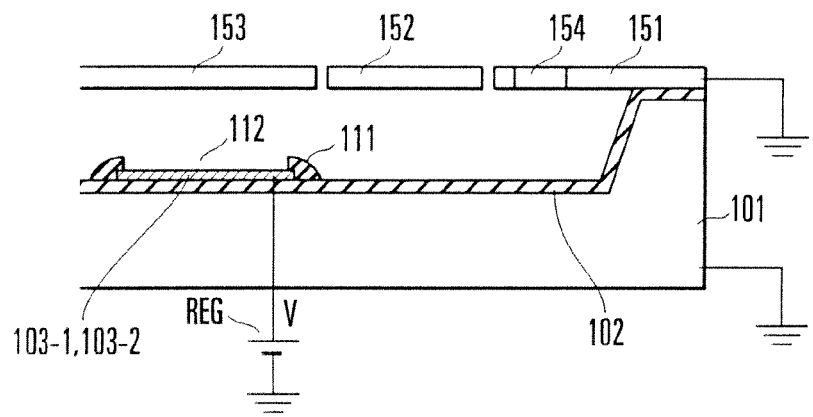
FIG. 7 is a sectional view of the main part of a mirror device according to the fifth embodiment of the present invention.

In this embodiment, an insulating layer 111 on the surface of each of the driving electrodes 103-1 to 103-4 has an opening 112 serving as the above-described antistatic structure, as shown in FIG. 7. This indicates removal (short circuit) of the capacitance C1 and resistance R2 in FIG. 3.

As described above, in this embodiment, the insulating layer 111 on the surface of each of the driving electrodes 103-1 to 103-4 has the opening 112. It is therefore possible to eliminate a portion with a large charge/discharge time constant from the vicinity of the driving electrodes 103-1 to 103-4 and prevent drift of the mirror 153.

Sixth Embodiment

The sixth embodiment of the present invention will be described next with reference to FIGS. 8 and 9. The same reference numerals as in FIGS. 1 and 2 denote the same parts in FIGS. 8 and 9.

Figure 9:
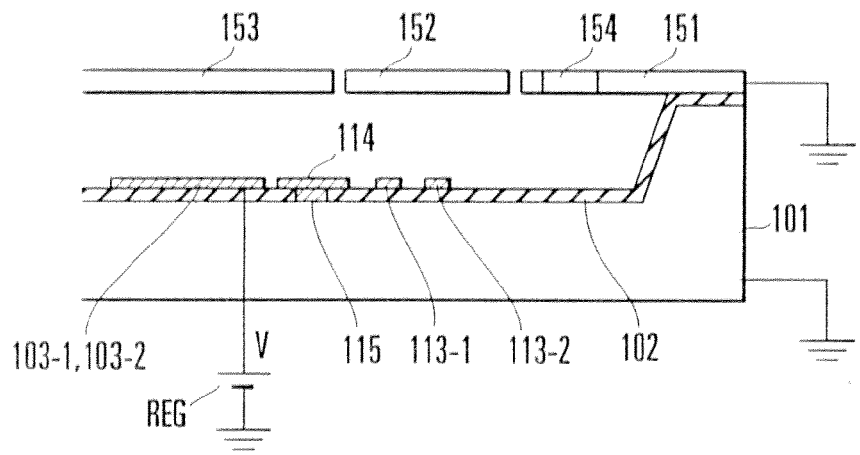
FIG. 9 is a sectional view of the main part of the mirror device shown in FIG. 8.

Referring to FIGS. 8 and 9, interconnections 113-1 to 113-4 supply a first potential to driving electrodes 103-1 to 103-4, respectively. Metal layers 114 are formed around the driving electrodes 103-1 to 103-4.

The fifth embodiment allows to avoid polarization/discharge in the insulating layers on the driving electrodes 103-1 to 103-4. The next problem is an insulating layer 102 on the surface of a lower substrate 101. It is easy to remove the insulating layers on the driving electrodes 103-1 to 103-4, as in the fifth embodiment. However, it is often impossible to remove the insulating layer 102 because the driving electrodes 103-1 to 103-4 and interconnections are formed on the insulating layer 102.

In this embodiment, the metal layers 114 serving as the antistatic structure are formed around the driving electrodes 103-1 to 103-4 on the insulating layer 102. A second potential is applied to the metal layers 114, like a mirror 153. As described above, the area of the mirror 153 is larger than that of the driving electrodes 103-1 to 103-4. For this reason, the insulating layer 102 around the driving electrodes 103-1 to 103-4 faces the outer peripheral portion of the mirror 153. The metal layers 114 are formed on the insulating layer 102 facing the mirror 153. The metal layers 114 can be formed simultaneously together with the driving electrodes 103-1 to 103-4 and interconnections 113-1 to 113-4.

To apply the second potential to the plurality of metal layers 114, it is necessary to provide interconnections connected to the metal layers 114. However, this is not practical because the number of interconnections increases, and the interconnections must cross over the interconnections 113-1 to 113-4 to the driving electrodes 103-1 to 103-4. As shown in FIG. 9, the insulating layer 102 on the lower substrate 101 is partially removed to form contact holes 115. When the metal layers 114 are formed on the contact holes 115, the metal layers 114 are equipotential to the lower substrate 101. This structure facilitates electrical connection to the metal layers 114 without interconnection routing on the surface layer.

As described above, in this embodiment, the metal layers 114 serving as the antistatic structure are formed around the driving electrodes 103-1 to 103-4 on the insulating layer 102, and the second potential is applied to the metal layers 114. It is possible to eliminate a portion with a large charge/discharge time constant from the vicinity of the driving electrodes 103-1 to 103-4 and prevent drift of the mirror 153.

Seventh Embodiment

The seventh embodiment of the present invention will be described next with reference to FIG. 10. The same reference numerals as in FIGS. 1, 2, 8, and 9 denote the same parts in FIG. 10.

In the sixth embodiment, the interconnections 113-1 to 113-4 are formed on the same plane as the driving electrodes 103-1 to 103-4. As shown in FIG. 10, interconnections 113-1 to 113-4 and driving electrodes 103-1 to 103-4 may be formed on different planes. In this embodiment, the interconnections 113-1 to 113-4 are formed on an insulating layer 102. An insulating layer 115 is deposited on the insulating layer 102 and interconnections 113-1 to 113-4. The driving electrodes 103-1 to 103-4 and metal layers 114 are formed on the insulating layer 115. Interconnections 116 connected to the metal layers 114 are formed on the insulating layer 102 simultaneously together with the interconnections 113-1 to 113-4. The metal layers 114 receive the same second potential as that of a mirror 153 or the second potential with an offset through the interconnections 116. This structure facilitates electrical connection to the metal layers 114 without interconnection routing on the surface layer.

In this embodiment, interconnections 117 may also be formed on the insulating layer 102 simultaneously together with the interconnections 113-1 to 113-4. Metal supports 118 to support an upper substrate 153 may be formed on the insulating layer 115 to which one end of each interconnection 117 is exposed. At this time, the driving electrodes 103-1 to 103-4 are spaced apart from the supports 118 by a distance (e.g., about several µm to 25 µm) not to cause discharge to the metal layers 114 and supports 118. To form the supports 118, a metal such as Au is deposited by, e.g., plating. This structure allows to apply the second potential to a metal layer 156 through the supports 118 and interconnections 117 and ensure potential setting on the lower surface of the mirror 153.

In this embodiment, the metal layer 156 may receive the second potential through a tower substrate 101 and supports 104, as in the first embodiment, instead of using the supports 118. In this case, as well shown in FIG. 2, the insulating layer 102 on the surface of each support 104 is partially removed to form a contact hole 106. A metal layer 105 made of, e.g., Au is formed on the contact hole 106. The metal layer 105 connects to the metal layer 156 on the side of the upper substrate 151. This structure also allows to apply the second potential to the metal layer 156 and ensure potential setting on the lower surface of the mirror 153.

As described above, in this embodiment, the metal layers 114 serving as the antistatic structure are formed around the driving electrodes 103-1 to 103-4 on the insulating layer 102, and the second potential is applied to the metal layers 114 through the interconnections 116. It is possible to eliminate a portion with a large charge/discharge time constant from the vicinity of the driving electrodes 103-1 to 103-4 and prevent drift of the mirror 153.

Figure 10:
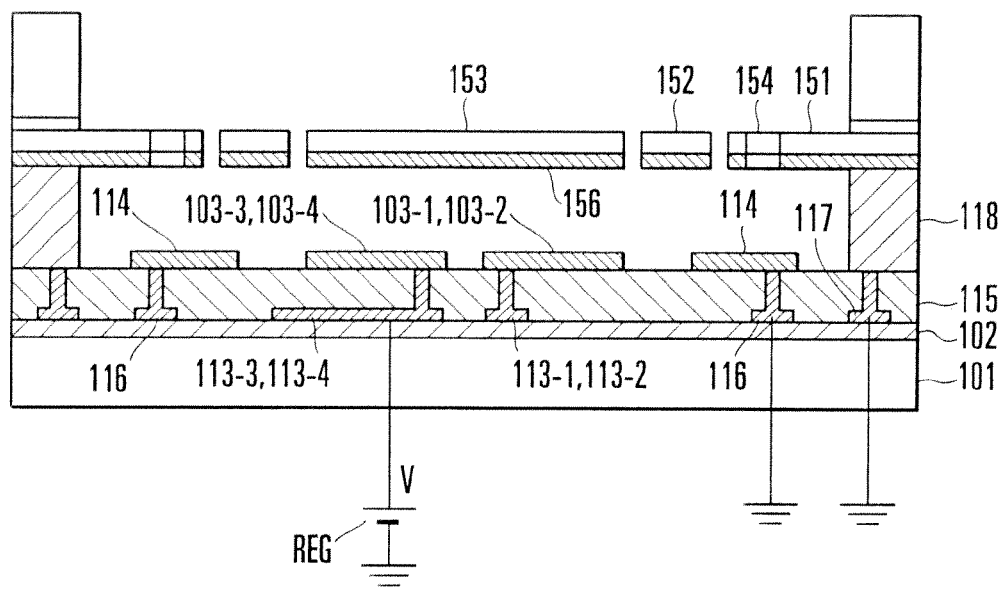
FIG. 10 is a sectional view of a mirror device according to the seventh embodiment of the present invention.

Referring to FIG. 10, the interconnections 116 connected to the metal layers 114 and the interconnections 117 connected to the supports 118 are separately provided. However, the interconnections may connect to each other.

In the first to seventh embodiments, first potential≧second potential. However, the present invention is not limited to this, and first potential≦second potential may also hold.

Eighth Embodiment

The eighth embodiment of the present invention will be described next.

Figure 11:
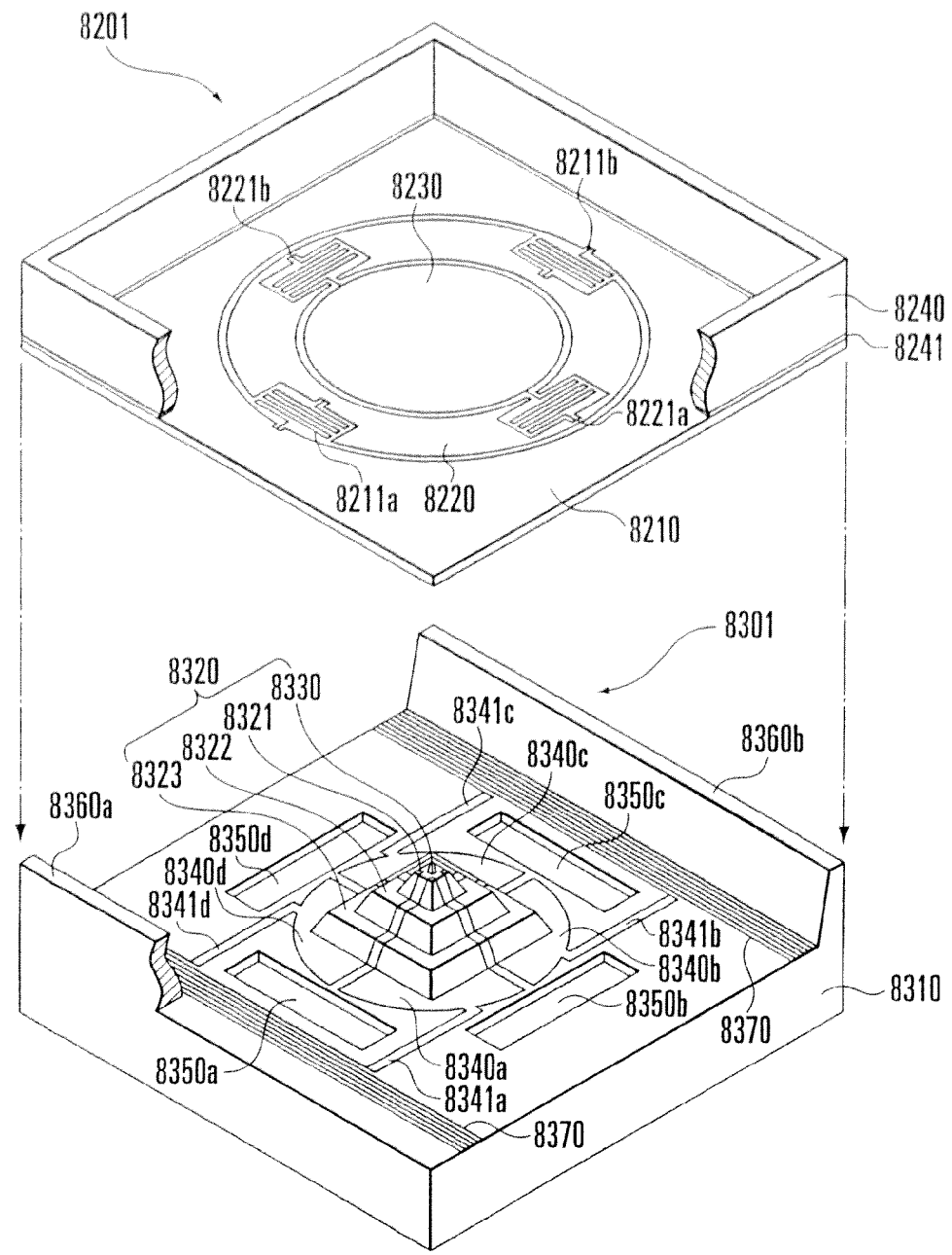
FIG. 11 is a schematic perspective view showing the structures of conventional mirror substrate and electrode substrate.
Figure 12:
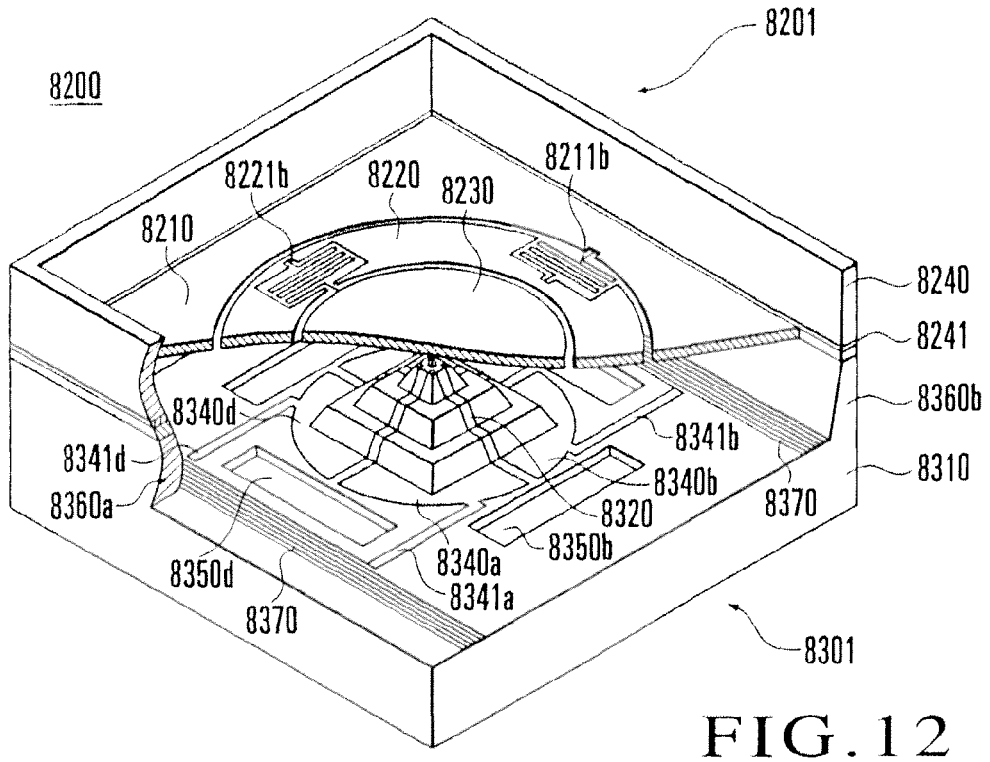
FIG. 12 is a schematic perspective view showing the structure of a conventional mirror device.

FIGS. 11 and 12 show an example of a conventional mirror array. FIGS. 11 and 12 mainly partially illustrate a mirror device having a mirror as a constituent unit of a array. A mirror array includes a plurality of mirror devices two-dimensional arranged in a matrix.

A mirror device 8200 has a structure in which a mirror substrate 8201 with a mirror and an electrode substrate 8301 with electrodes are arranged in parallel.

The mirror substrate 8201 has a frame portion 8210, a movable frame 8220 arranged in an opening of the frame portion 8210 by a pair of movable frame connectors 8211a and 8211b, and a mirror 8230 that has an almost circular shape when viewed from the upper side and arranged in an opening of the movable frame 8220 by a pair of mirror connectors 8221a and 8221b. A frame-shaped member 8240 surrounding the movable frame 8220 and mirror 8230 is formed on the upper surface of the frame portion 8210.

The pair of movable frame connectors 8211a and 8211b including g torsion springs and provided the notches of the movable frame 8220 connect the frame portion 8210 to the movable frame 8220. The pair of connectors 8221a and 8221b including zigzag torsion springs and provided in the notches of the movable frame 8220 connect the movable fry 8220 to the mirror 8230.

The electrode substrate 8301 has a plate-shaped base 8310 and a projecting portion 8320 projecting from the surface (upper surface) of the base 8310. The projecting portion 8320 includes a third terrace 8323 formed on the upper surface of the base 8310, a second terrace 8322 formed on the upper surface of the third terrace 8323, a first terrace 8321 formed on the upper surface of the second terrace 8322, and a pivot 8330 formed on the upper surface of the first terrace 8321.

Four sector electrodes 8340a to 8340d are formed on the upper surface of the base 8310 including the outer surface of the projecting portion 8320. Around the electrodes 8340a to 8340d, concave portions 8350a to 8350d that have an almost rectangular shape when viewed from the upper side are formed at positions facing the movable frame connectors 8211a and 8211b and mirror connectors 8221a and 8221b of the counter mirror substrate 8201. A pair of convex portions 8360a and 8360b are formed on the upper surface of the base 8310 to sandwich the first to third terraces 8321 to 8323 and the concave portions 8350a to 8350d. Interconnections 8370 are formed on the upper surface of the base 8310 between the concave portion 8350a and the convex portion 8360a and between the concave portion 8350c and the convex portion 8360b. The electrodes 8340a to 8340d connect to the interconnections 8370 through leads 8341a to 8341d.

The above-described mirror substrate 8201 and electrode substrate 8301 form the mirror device 8200 shown in FIG. 12 by joining the lower surface of the frame portion 8210 to the upper surfaces of the convex portions 8360a and 8360b such that the mirror 8230 faces the electrodes 8340a to 8340d corresponding to it. A mirror array having a plurality of mirror devices 8200 arranged in a matrix is manufactured by a method to be described below.

The mirror substrate 8201 is formed from an SOI (Silicon On Insulator) substrate.

First, a side (major surface: SOI layer) of the SOI substrate with a buried insulating layer 8241 undergoes known photolithography and etching such as DEEP RIE to form, in the single-crystal silicon layer, trenches conforming to the shapes of the frame portion 8210, movable frame connectors 8211a and 8211b, movable frame 8220, mirror connectors 8221a and 8221b, and mirror 8230.

A resist pattern with openings in predetermined regions corresponding to the trenches is formed on the lower surface of the SOI substrate. The silicon is selectively etched from the lower surface of the SOI substrate by using an etchant such as potassium hydroxide. In this etching, the opening and frame-shaped member 8240 are formed on the lower surface of the SOI substrate by using the buried insulating layer 8241 as an etching stopper layer.

A region of the buried insulating layer 8241 exposed to the opening is removed by wet etching using hydrofluoric acid or dry etching using a CF-based gas.

With this process, the mirror substrate 8201 having the above-described shape is formed.

On the other hand, the electrode substrate 8301 is formed from, e.g., a silicon substrate.

First, a silicon substrate is selectively etched by using, as a mask, a predetermined mask pattern made of a silicon nitride film or silicon oxide film and an alkaline solution such as a potassium hydroxide solution. The base 8310, first to third terraces 8321 to 8323, pivot 8330, concave portions 8350, and convex portions 8360a and 8360b are formed by repeating the above-described process.

The surface of the silicon substrate on the etched side is oxidized to form a silicon oxide film.

A metal film is formed on the silicon oxide film by, e.g., vapor deposition and patterned by known photolithography and etching to form the electrodes 8340a to 8340d, leads 8341a to 8341d, and interconnections 8370.

With this process, the electrode substrate 8301 having the above-described shape is formed.

Then, the mirror substrate 8201 is bonded to the electrode substrate 8301 to form a mirror array having the mirror device 8200 that can move the mirror 8230 by applying an electric field to the electrodes 8340a to 8340d. To improve the reflectance of the mirror 8230, a metal film such as a gold film may be formed on the upper surface of the mirror 8230.

In the mirror device 8200 of the mirror array, an electric field generated by applying individual voltages to the electrodes 8340a to 8340d through the interconnections 8370 gives an attracting force to the mirror 8230 and causes it to pivot by an angle of several degrees. The pivot operation of the mirror 8230 will be described with reference to FIG. 13. For the descriptive convenience, the vertical direction of FIG. 13 viewed from the front side will be called a height or depth direction. The upper part of FIG. 13 will be called an upper side, and the lower part of FIG. 13 will be called a lower side.

Figure 13:
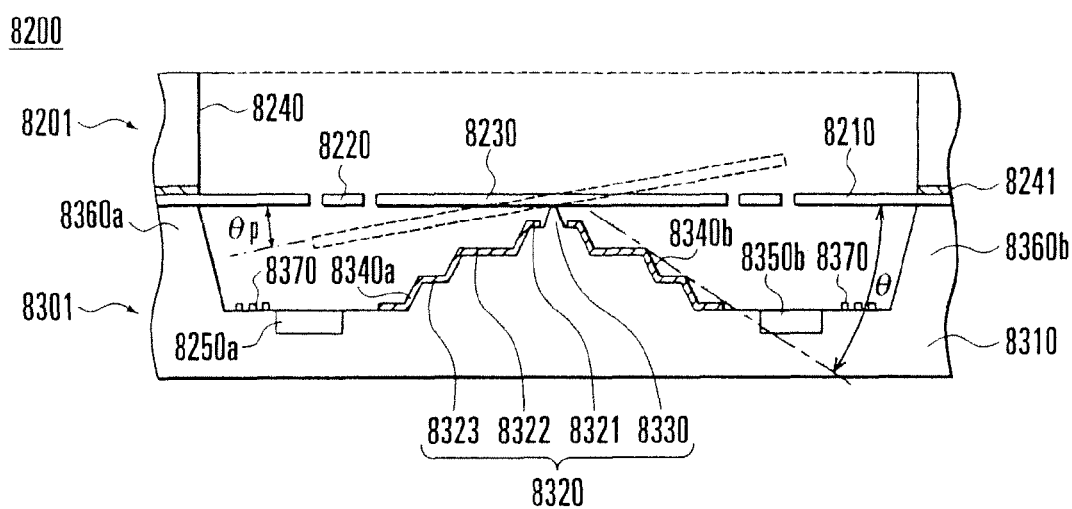
FIG. 13 is a sectional view of the mirror device shown in FIG. 12.

As a characteristic feature of an optical MEMS mirror device, the mirror can stably statically pivot to only an angle that is uniquely decided by the electrode structure of the electrode substrate. As shown in FIG. 13, a pull-in pivot angle $\theta_p$ of the mirror 8230 and a tilt angle θ of the electrodes 8340a to 8340d formed on the projecting portion 8320 have a relationship approximately given by $$\theta_p = (1/3)\theta \quad (1)$$

To make the mirror 8230 pivot largely at a low voltage as much as possible, it is necessary to arrange the electrodes 8340a to 8340d facing the mirror 8230 such that they can have the same area as that of the mirror 8230 and also to increase the tilt angle of the projecting portion 8320 on which the electrodes 8340a to 8340d are formed. This can be achieved by, e.g., increasing the difference of elevation of the projecting portion 8320.

However, it is conventionally difficult to increase the difference of elevation of the projecting portion 8320 because the interconnections 8370 are formed on the same surface as the bottom surface of the projecting portion 8320.

As described above, the interconnections 8370 on the electrode substrate 8301 are formed by applying a photoresist to a metal film, transferring the pattern of the interconnections 8370 to the photoresist by an exposure apparatus, and executing etching. The depth (depth of field) to which the exposure apparatus can precisely transfer a pattern is limited (50 to 70 μm at maximum). If exposure is done beyond this limitation, the pattern to be transferred to the photoresist defocuses so that it is difficult to form a fine interconnection pattern. Especially, since the interconnections 8370 include a lot of interconnections, interconnection pattern formation at an accuracy of several μm is required.

Conventionally, as shown in FIGS. 11 to 13, the interconnections 8370 are formed on the base 8310, i.e., on the bottom layer of the third terrace 8323 of the projecting portion 8320. Since exposure is done by setting the lower limit of focus of the exposure apparatus to the interconnections 8370, the difference of elevation of the projecting portion 8320 must be limited to 50 to 70 μm. However, to increase the pivot angle of the mirror 8230, the difference of elevation of the projecting portion 8320 must be more than the above-described limitation and, preferably, 100 μm or more. To attain this difference of elevation, it is necessary to use a special exposure apparatus with a large focus range or execute exposure a plurality of number of times for the respective elevations, resulting in an increase in the cost.

This embodiment has been made to solve the above-described problem and has as its object to provide a mirror device capable of achieving low-voltage driving and cost reduction and increasing the pivot angle of a mirror, a mirror array, and a mirror device manufacturing method.

This embodiment will be described next with reference to FIGS. 14 to 16B. FIGS. 14 to 16B mainly partially illustrate a mirror device having a mirror as a constituent unit of a mirror array. A mirror array according to this embodiment includes a plurality of mirror devices two-dimensionally formed in a matrix.

A mirror device according to this embodiment has a structure in which a mirror substrate 200 with a mirror and an electrode substrate 300 with electrodes are arranged in parallel.

The mirror substrate 200 has a plate-shaped frame portion 210 with an opening having an almost circular shape when viewed from the upper side, a movable frame 220 with an opening having an almost circular shape when viewed from the upper side and arranged in the opening of the frame portion 210 by a pair of movable frame connectors 211a and 211b, and a mirror 230 having an almost circular shape when viewed from the upper side and arranged in the opening of the movable frame 220 by a pair of mirror connectors 221a and 221b. A frame-shaped member 240 surrounding the movable frame 220 and mirror 230 is formed on the upper surface of the frame portion 210.

The pair of movable frame connectors 211a and 211b including zigzag torsion springs and provided in the notches of the movable frame 220 connect the frame portion 210 to the movable frame 220. This structure makes the movable frame 220 pivotable about a pivot axis (movable frame pivot axis) passing through the pair of movable frame connectors 211a and 211b.

The pair of mirror connectors 221a and 221b including zigzag torsion springs and provided in the notches of the movable frame 220 connect the movable frame 220 to the mirror 230. This structure makes the mirror 230 pivotable about a pivot axis (mirror pivot axis) passing through the pair of mirror connectors 221a and 221b.

The movable frame pivot axis and mirror pivot axis intersect each other at a right angle.

The electrode substrate 300 has a plate-shaped base 320, an outer trench 330 formed on the base 320 and having an almost rectangular shape when viewed from the upper side, and a projecting portion 340 formed in the outer trench 330 and having an almost conical shape. The surface of the base 320 with the outer trench 330 and projecting portion 340 has an insulating film 321.

Four sector electrodes 360a to 360d are formed on the outer surface of the projecting portion 340 and the upper surface of the outer trench 330 to form a circle that is concentric to the mirror 230 and has the same area as the mirror 230. A pair of convex portions 370a and 370b are formed on an upper surface 320a of the base 320 to sandwich the outer trench 330. Interconnections 380 are formed on the upper surface 320a of the base 320 between the convex portions 370a and 370b and the outer trench 330. The interconnections 380 connect to the electrodes 360a to 360d through leads 361a to 361d.

The outer trench 330 includes a concave portion formed in the surface of the base 320. The concave portion has a truncated pyramidal shape with an opening (upper surface) larger than the bottom surface portion. The projecting portion 340 is formed on the surface of the outer trench 330. When the projecting portion 340 is formed not on the base 320 but on the outer trench 330 formed in the surface of the base 320, the difference of elevation of the projecting portion 340 can increase.

The electrodes 360a to 360d are formed on the outer trench 330 and projecting portion 340.

The projecting portion 340 includes a third terrace 343 formed on the surface (bottom surface) of the outer trench 330 and having a truncated pyramidal shape, a second terrace 342 formed on the upper surface of the third terrace 343 and having a truncated pyramidal shape, a first terrace 341 formed on the upper surface of the second terrace 342 and having a truncated pyramidal shape, and a pivot 350 formed on the upper surface of the first terrace 341 and having a truncated pyramidal shape.

Figure 14:
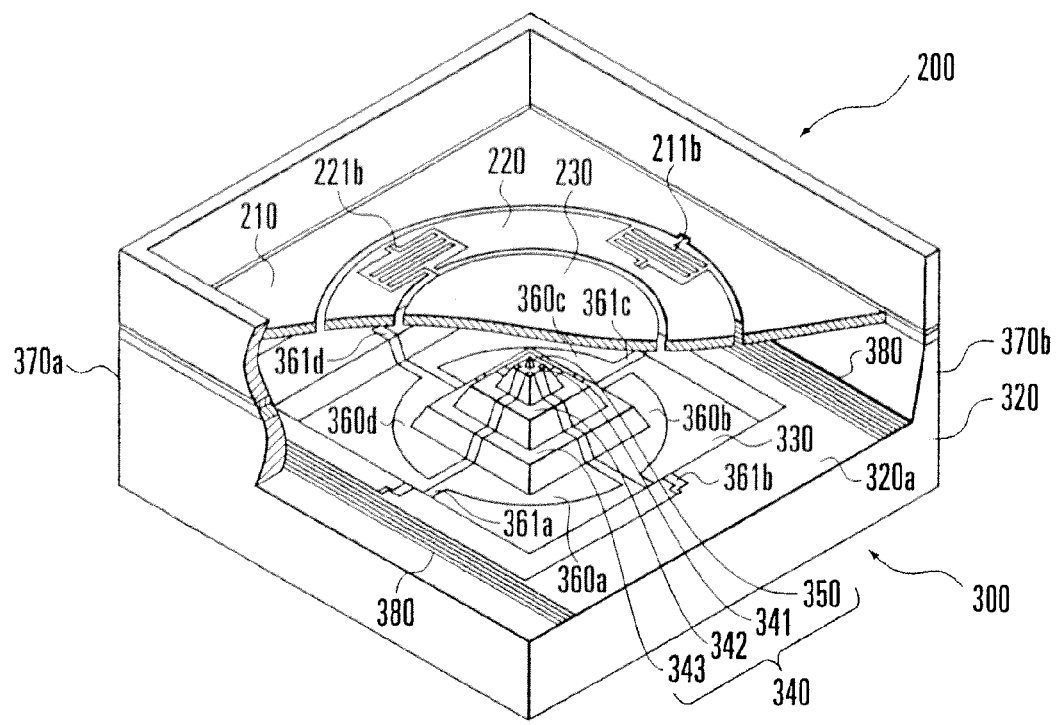
FIG. 14 is a perspective view showing the structure of the electrode substrate of a mirror array according to the eighth embodiment.
Figure 15:
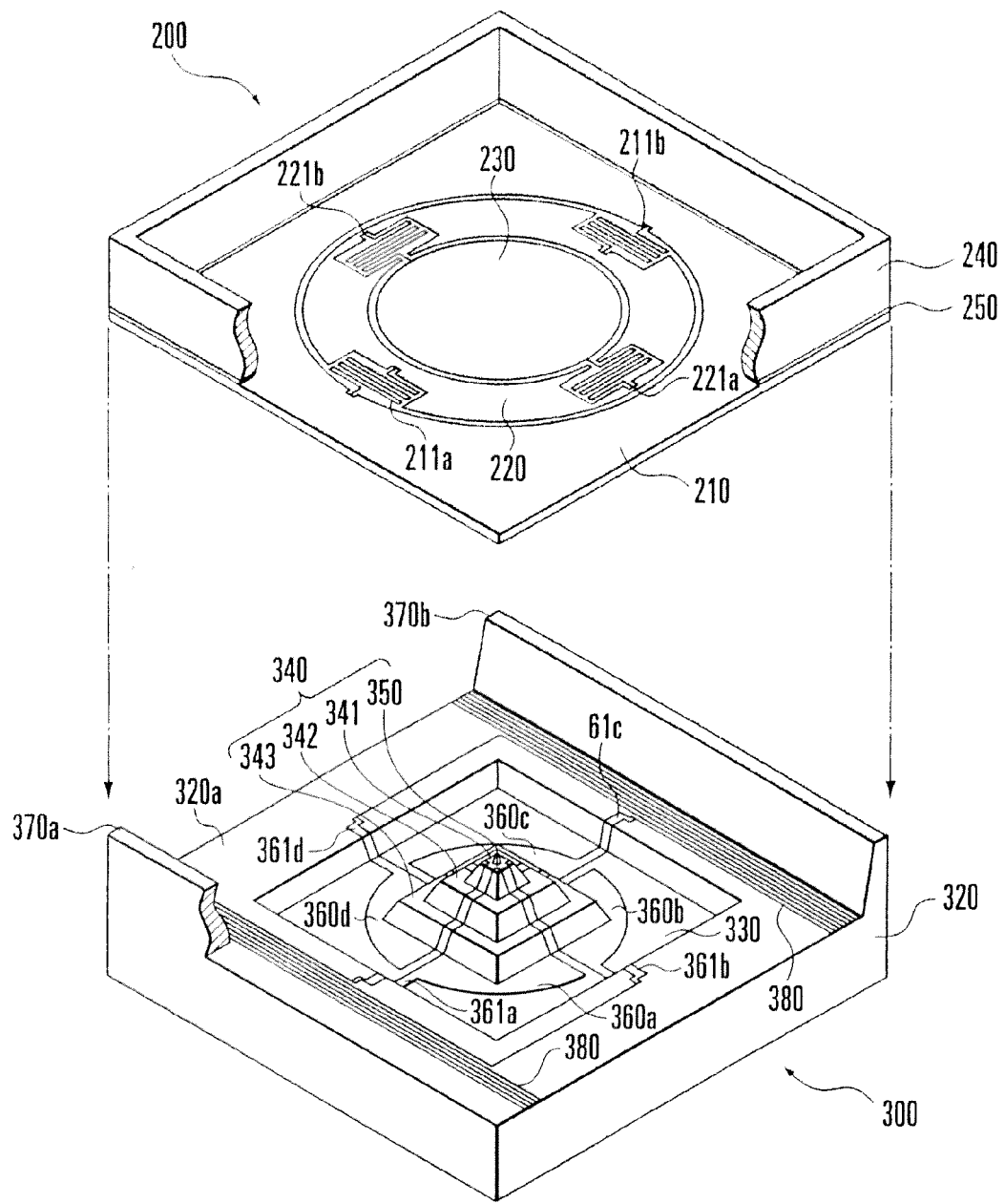
FIG. 15 is a schematic perspective view showing the structures of a mirror substrate and electrode substrate according to the eighth embodiment.

As shown in FIG. 14, the tower surface of the second terrace 342, i.e., the upper surface of the third terrace 343 is flush with the upper surface 320a of the base 320.

A mirror array having a plurality of mirror devices two-dimensionally arranged in a matrix is formed by joining the mirror substrate 200 to the electrode substrate 300 with the above-described structure and, more specifically, joining the upper surfaces of the convex portions 370a and 370b of the electrode substrate 300 to the lower surface of the frame portion 210 of the mirror substrate 200 such that the mirror 230 of the mirror substrate 200 faces the electrodes 360a to 360d corresponding to the mirror 230.

A method of manufacturing the electrode substrate 300 will be described next with reference to FIGS. 17A to 20F.

Figure 17A:
FIGS. 17A to 17D are views showing a method of manufacturing the electrode substrate according to the eighth embodiment.

First, to form the pivot 350 on the silicon substrate 300, a silicon substrate 400 is oxidized to form an insulating film 401 made of SiO$_2$ on the surface of the silicon substrate 400, as shown in FIG. 17A.

Figure 17B:

As shown in FIG. 17B, a photoresist material is applied to the upper surface of the insulating film 401 to form a protective film 402.

Figure 17C:
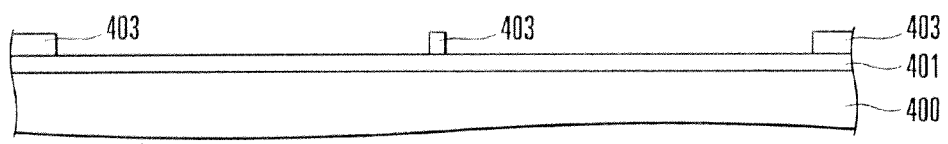

As shown in FIG. 17C, the protective film 402 is patterned by known photolithography to form a mask pattern (pivot preformation mask pattern) 403.

Figure 17D:
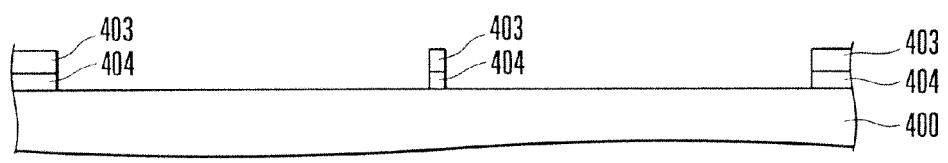

As shown in FIG. 17D, the insulating film 401 is etched by using the pivot preformation mask pattern 403 as a mask to form a mask pattern (pivot formation mask) 404 in the insulating film 401. This etching can be done by, e.g., known wet etching or dry etching.

Figure 18A:
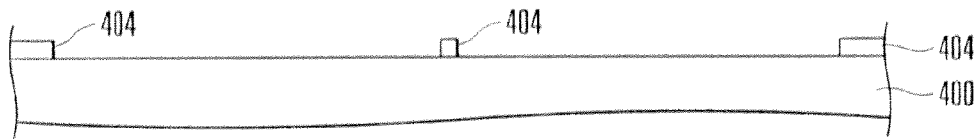
FIGS. 18A to 18C are views showing a method of manufacturing the electrode substrate according to the eighth embodiment.

As shown in FIG. 18A, the pivot preformation mask pattern 403 is removed by, e.g., ashing.

Figure 18B:
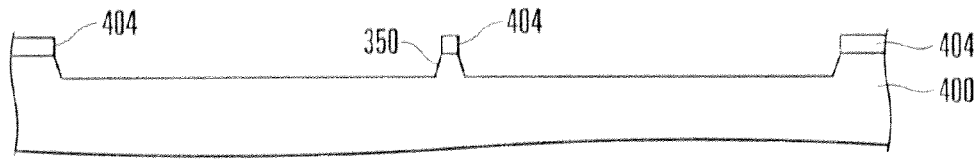

As shown in FIG. 18B, the silicon substrate 400 is etched by using the pivot formation mask pattern 404 as a mask to form the pivot 350. This etching is done by wet etching using an alkaline solution such as a potassium hydroxide solution.

Figure 18C:

As shown in FIG. 18C, the pivot formation mask pattern 404 is removed from the upper surface of the silicon substrate 400 by, e.g., hydrofluoric acid. The pivot 350 is thus formed on the surface of the silicon substrate 400.

Figure 19A:
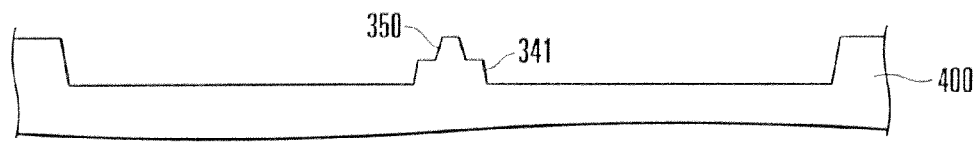
FIGS. 19A to 19C are views showing a method of manufacturing the electrode substrate according to the eighth embodiment.

The first terrace 341 is formed on the surface of the silicon substrate 400, as shown in FIG. 19A, in accordance with the same procedures as in FIGS. 17A to 18C.

Figure 19B:
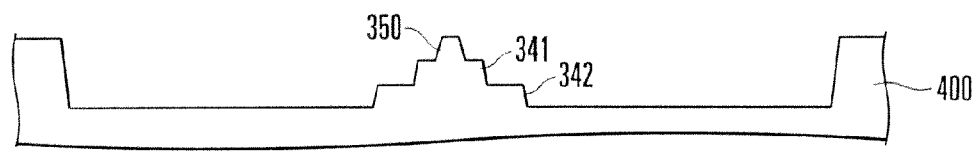

The second terrace 342 is formed on the surface of the silicon substrate 400, as shown in FIG. 19B, in accordance with the same procedures in forming the first terrace 341.

Figure 19C:
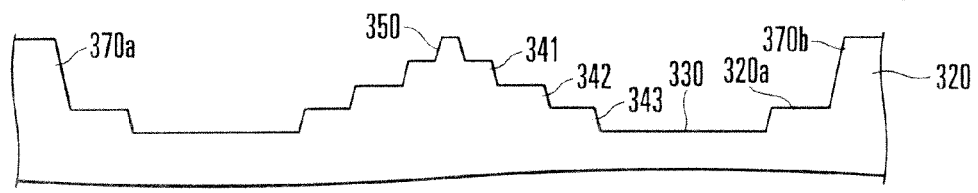

The outer trench 330, third terrace 343, and convex portions 370a and 370b are formed on the surface of the silicon substrate 400, as shown in FIG. 19C, in accordance with the same procedures as in forming the second terrace 342. The shape of the base 320 is thus formed.

The pivot 350 is formed such that its difference of elevation, i.e., the distance from the lower surface of the third terrace 343 to the end of the pivot 350 obtains a desired value of, e.g., 100 µm. The upper surface of the third terrace 343 is flush with the upper surface 320a of the base 320.

Figure 20A:
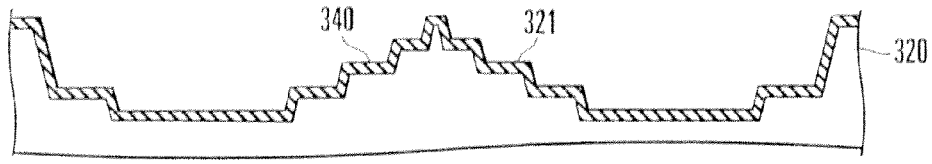
FIGS. 20A to 20F are views showing a method of manufacturing the electrode substrate according to the eighth embodiment.

Next, as shown in FIG. 20A, the base 320 is oxidized to form the insulating film 321 on the surface of the base 320 with the projecting portion 340.

Figure 20B:
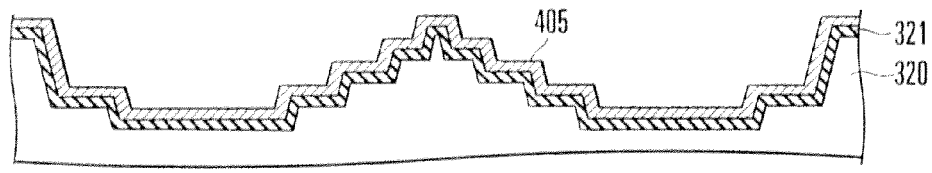

As shown in FIG. 20B, a metal film (metal film for electrodes/interconnections) 405 made of, e.g., Al is formed on the surface of the base 320 with the insulating film 321 by, e.g., sputtering or vapor deposition.

Figure 20C:
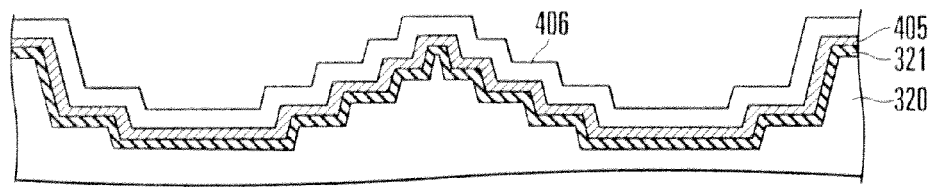

As shown in FIG. 20C, a protective film 406 made of a photoresist material is formed on the surface of the metal film 405.

Figure 16A:
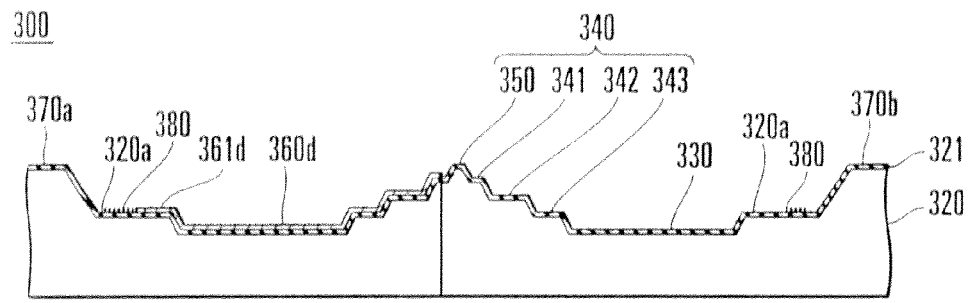
FIG. 16A is a sectional view taken along a line I-I in FIG. 16B.
Figure 16B:
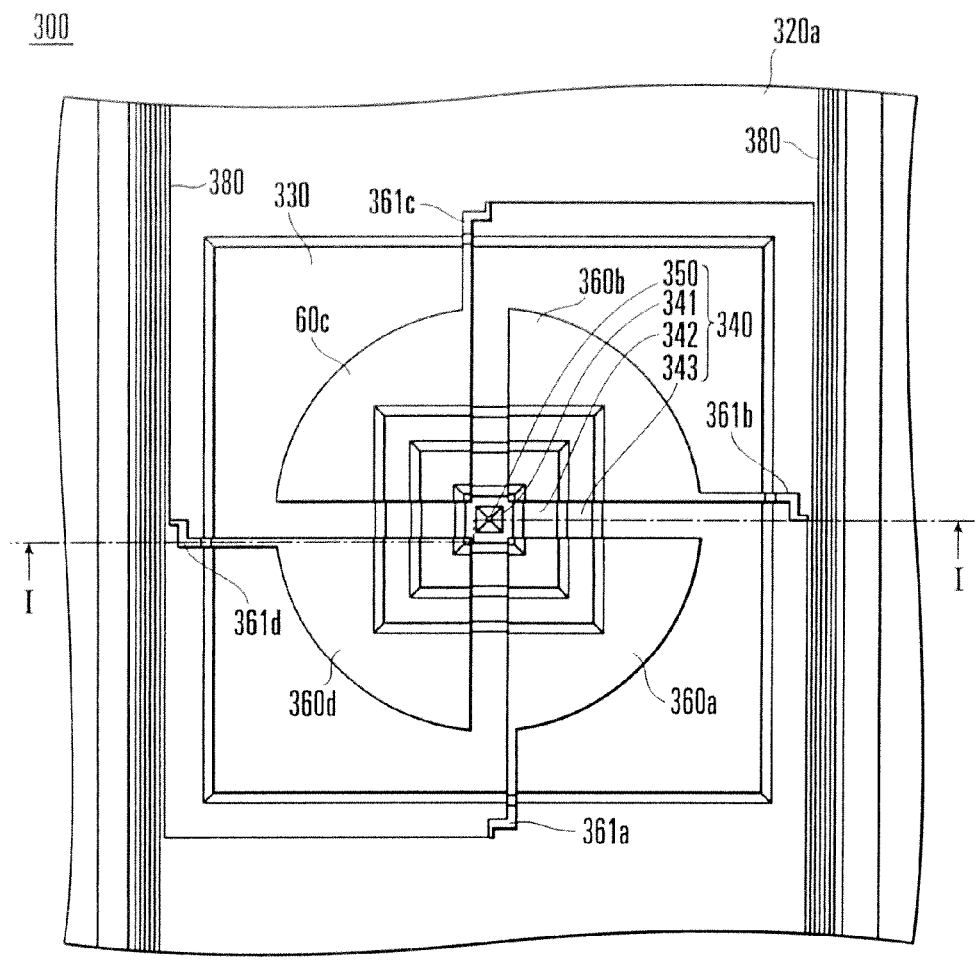
FIG. 16B is a plan view of a mirror device according to the eighth embodiment of the present invention.
Figure 20D:
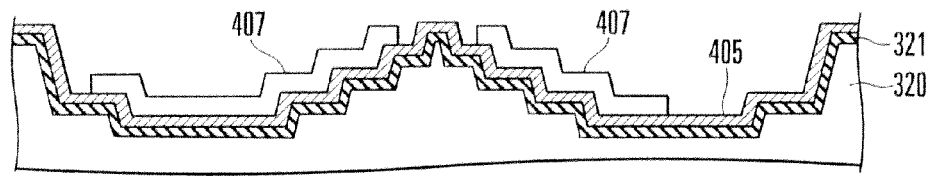

As shown in FIG. 20D, the protective film 406 is patterned by known photolithography to form a pattern 407 with the interconnection patterns of the electrodes 360a to 360d, leads 361a to 361d, and interconnections 380 shown in FIGS. 14, 16A, and 16B.

The focus of the exposure apparatus to transfer the interconnection pattern to the protective film 406 is set to the upper surface 320a of the base 320 on which the interconnections 380 are to be formed. This allows to form the interconnections 380 at the highest resolution.

On the other hand, the electrodes 360a to 360d and leads 361a to 361d are located, in the height direction (vertical direction when FIG. 16A is viewed from the front side), between the first terrace 341 and the outer trench 330 formed in the upper surface 320a of the base 320, i.e., from the upper part to the lower part of the upper surface 320a of the base 320 while almost centered on the upper surface 320a. For this reason, when the exposure apparatus executes exposure with the focus on the upper surface 320a of the base 320, pattern transfer is done even for the electrodes 360a to 360d and leads 361a to 361d in a region with relatively small image defocus within or near the range where the exposure apparatus can precisely transfer the pattern. It is therefore possible to accurately form the electrodes 360a to 360d and leads 361a to 361d.

Figure 20E:
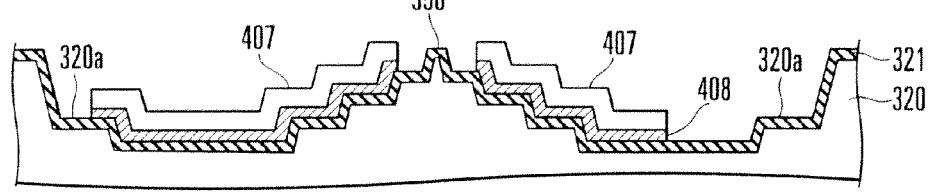

As shown in FIG. 20E, the metal film 405 is etched by using the pattern 407 as a mask to form an interconnection layer 408 including the electrodes 360a to 360d, leads 361a to 361d, and interconnections 380 shown in FIGS. 14 to 16B.

Figure 20F:
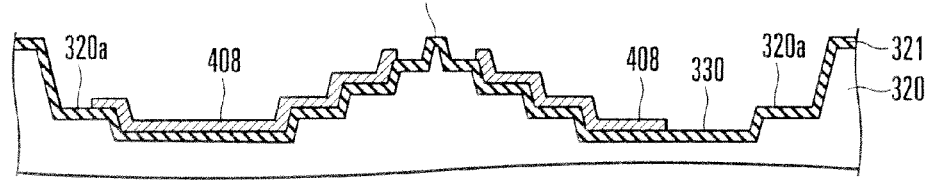

As shown in FIG. 20F, the pattern 407 is removed by, e.g., ashing.

The mirror array according to this embodiment which has the thus manufactured electrode substrate 300 can make the mirror 230 pivot by applying a predetermined bias voltage to all the electrodes 360a to 360d through the interconnections 380 and applying individual displacement voltages to the electrodes 360a to 360d.

According to this embodiment, even when the conventional exposure apparatus is used, the difference of elevation of the projecting portion 340 can have a desired value of, e.g., about 100 µm. Hence, the projecting portion 340 can have a large tilt angle so that the mirror 230 can have a pivot angle larger than before. In addition, the electrodes 360a to 360d have the same size as the mirror 230 and can therefore drive the mirror 230 at a low voltage.

Figure 21:
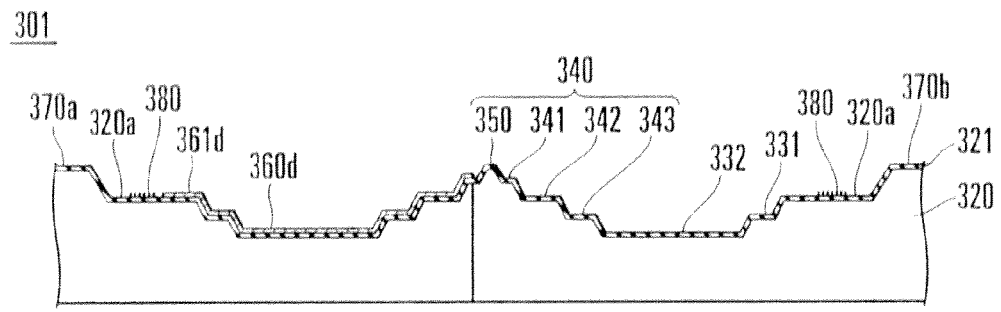
FIG. 21 is a sectional view showing a modification of the electrode substrate according to the eighth embodiment.

The outer trench need not always have the above-described single-stage structure but may have a multistage structure. FIG. 21 shows a mirror array having an outer trench with a multistage structure. The same names and reference numerals as in the mirror device shown in FIGS. 14 to 16B denote the same constituent elements in FIG. 21, and a description thereof will be omitted as needed. FIG. 21 is a sectional view showing the same section as in FIGS. 16A and 16B.

An electrode substrate 301 shown in FIG. 21 has the plate-shaped base 320, a first outer trench 331 including a concave portion formed on the base 320 and having an almost rectangular shape when viewed from the upper side, a second outer trench 322 including a concave portion formed on the first outer trench 331 and having an almost rectangular shape when viewed from the upper side, and the almost conical projecting portion 340 formed on the second outer trench 332. The insulating film 321 is formed on the surface of the base 320 with the first outer trench 331, second outer trench 332, and projecting portion 340. The four sector electrodes 360a to 360d are formed on the outer surface of the projecting portion 340 and the upper surface of the second outer trench 332 to form a circle that is concentric to the mirror 230. The pair of convex portions 370a and 370b (not shown) are formed on an upper surface 320a of the base 320 to sandwich the first outer trench 331. The interconnections 380 are formed on the base 320 between the convex portions 370a and 370b and the first outer trench 331. The interconnections 380 connect to the electrodes 360a to 360d through the leads 361a to 361d.

The first outer trench 331 includes a concave portion formed in the base 320. The concave portion has a truncated pyramidal shape with an upper surface larger than the bottom surface. The upper surface of the first outer trench 1331 is flush with the upper surface of the second terrace.

The second outer trench 332 includes a concave portion formed in the bottom surface of the first outer trench 331. The concave portion has a truncated pyramidal shape with an upper surface larger than the bottom surface. The projecting portion 340 is formed on the bottom surface of the second outer trench 332. The electrodes 360a to 360d are formed on the second outer trench 332 and projecting portion 340.

The projecting portion 340 includes the third terrace 343 formed on the surface (bottom surface) of the second outer trench 332 and having a truncated pyramidal shape, the second terrace 342 formed on the upper surface of the third terrace 343 and having a truncated pyramidal shape, the first terrace 341 formed on the upper surface of the second terrace 342 and having a truncated pyramidal shape, and the pivot 350 formed on the upper surface of the first terrace 341 and having a truncated pyramidal shape.

As shown in FIG. 21, the lower surface of the first terrace 341, i.e., the upper surface of the second terrace 342 is flush with the surface of the base 320. The lower surface of the second terrace 342, i.e., the upper surface of the third terrace is flush with the upper surface of the first outer trench 331.

The projecting portion 340 is formed such that its difference of elevation obtains a desired value of, e.g., about 100 μm.

Even in FIG. 21, in transferring a pattern serving as the electrodes 360a to 360d, leads 361a to 361d, and interconnections 380 to a photoresist, the exposure apparatus sets the focus on the upper surface of the base 320. Hence, the interconnections 380 can be formed at an accuracy of several μm. Even for the electrodes 360a to 360d and leads 361a to 361d, pattern transfer is done in a region with relatively small image defocus within or near the range where the exposure apparatus can precisely transfer the pattern. It is therefore possible to accurately form the electrodes 360a to 360d and leads 361a to 361d.

As a result, the difference of elevation of the projecting portion 340 can have a desired value of, e.g., about 100 μm. Hence, the projecting portion 340 can have a large tilt angle so that the mirror 230 can have a pivot angle larger than before.

Especially, in the electrode substrate shown in FIG. 21, the difference of elevation from the upper surface 320a of the base 320 to the pivot 350 can be smaller than in the electrode substrate shown in FIGS. 16A and 16B. For this reason, in pattern transfer by the exposure apparatus in forming the pivot 350, the defocus in the vertical direction for the upper surface 320a of the base 320 can be smaller. Consequently, more accurate pattern formation is possible.

The mirror array having an outer trench with a multistage structure shown in FIG. 21 can be manufactured by the same manufacturing method as that for the above-described mirror array shown in FIGS. 14 to 16B.

Figure 22:
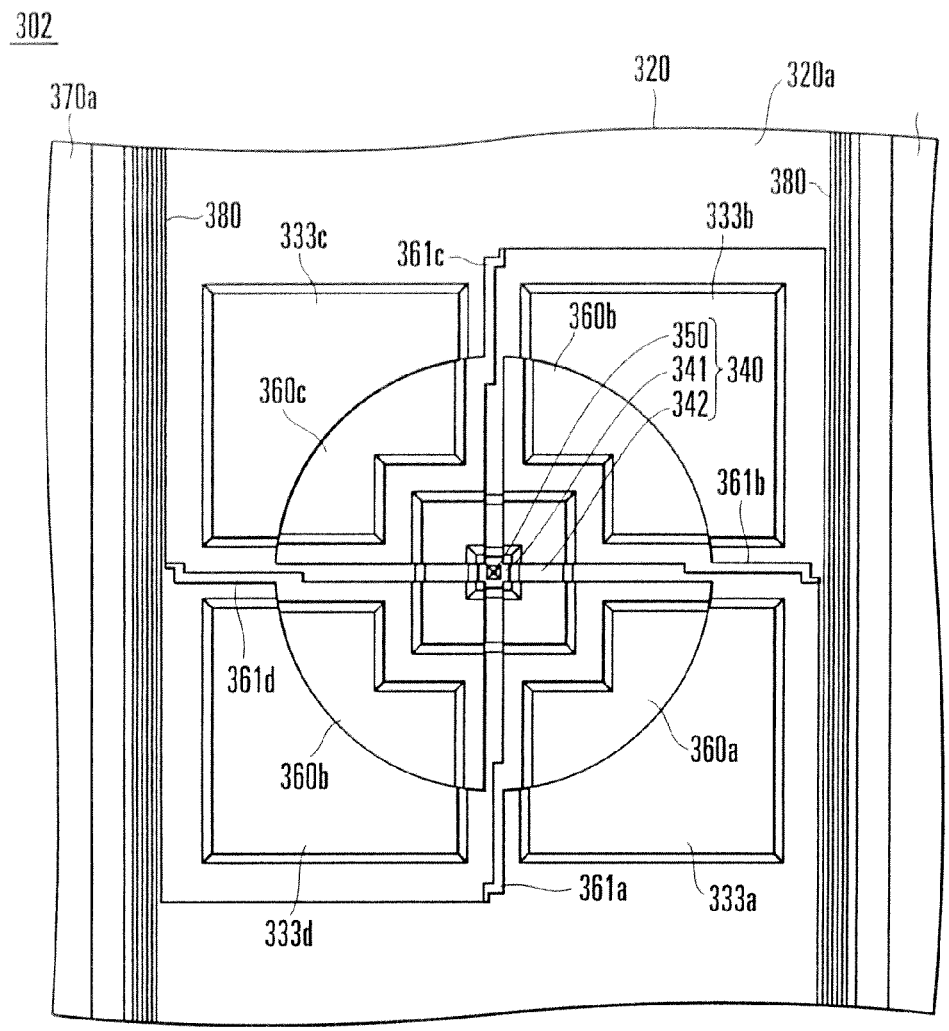
FIG. 22 is a sectional view showing a modification of the electrode substrate according to the eighth embodiment.

The outer trench need not always have the above-described integral structure but may have a divided structure. FIG. 22 shows a mirror array having an outer trench with a divided structure. FIG. 22 is a sectional view showing a modification of the electrode substrate of the mirror array according to this embodiment. The same names and reference numerals as in the mirror device shown in FIGS. 14 to 16B denote the same constituent elements in FIG. 22, and a description thereof will be omitted as needed.

An electrode substrate 302 shown in FIG. 22 has the plate-shaped base 320, four outer trenches 333a to 333d each including a concave portion formed on the base 320 and having an almost L-shape when viewed from the upper side, and the almost conical projecting portion 340 formed on the base 320. An insulating film (not shown) is formed on the surface of the base 320 with the outer trenches 333a to 333d and projecting portion 340. The four sector electrodes 360a to 360d are formed on the upper surfaces of the mirror 230 with the insulating film, the outer trenches 333a to 333d, and the projecting portion 340 to form a circle that is concentric to the mirror 230. The pair of convex portions 370a and 370b are formed on the upper surface 320a of the base 320 to sandwich the outer trenches 333a to 333d. The interconnections 380 formed on the upper surface 320a of the base 320 between the convex portions 370a and 370b and the outer trenches 333a to 333d. The interconnections 380 connect to the electrodes 360a to 360d through the leads 361a to 361d formed on the base 320.

Each of the outer trenches 333a to 333d includes a concave portion formed in the base 320. The concave portion has an inverted truncated pyramidal shape with an upper surface larger than the bottom surface. The outer trenches 333a to 333d are formed point-symmetrically to surround the projecting portion 340 and form a rectangle concentric to the projecting portion 340 and electrodes 360a to 360d.

The projecting portion 340 includes the second terrace 342 having a truncated pyramidal shape and formed on the upper surface 320a of the base 320 surrounded by the outer trenches 333a to 333d, the first terrace 341 formed on the upper surface of the second terrace 342 and having a truncated pyramidal shape, and the pivot 350 formed on the upper surface of the first terrace 341 and having a truncated pyramidal shape. The lower surface of the second terrace 342 is flush with the upper surface of the base 320, as a matter of course. A portion surrounded by the outer trenches 333a to 333d and having an almost truncated pyramidal shape with an upper surface corresponding to the upper surface 320a of the base 320 is equivalent to the third terrace 343 shown in FIGS. 14 to 16B and 21.

The projecting portion 340 can be formed such that its difference of elevation obtains a desired value. For example, when the projecting portion 340 includes the almost truncated pyramidal portion corresponding to the third terrace, the projecting portion 340 can have a difference of elevation of, e.g., about 100 μm. Hence, the projecting portion 340 can have a large tilt angle so that the mirror 230 can have a pivot angle larger than before.

Each of the leads 361a to 361d is formed between adjacent two of the outer trenches 333a to 333d on the base 320. Hence, the leads 361a to 361d and interconnections 380 are formed on the base 320.

Even in FIG. 22, in transferring a pattern serving as the electrodes 360a to 360d, leads 361a to 361d, and interconnections 380 to a photoresist, the exposure apparatus sets the focus on the upper surface of the base 320. Hence, the interconnections 380 can be formed at an accuracy of several μm. Especially in FIG. 22, since the leads 361a to 361d are formed on the base 320, not only the interconnections 330 but also the leads 361a to 361d can be formed at an accuracy of several μm. Even for the electrodes 360a to 360d, pattern transfer is done in a region with relatively small image defocus within or near the range where the exposure apparatus can precisely transfer the pattern. It is therefore possible to accurately form the electrodes 360a to 360d.

As a result, the difference of elevation of the projecting portion 340 can have a desired value. Hence, the projecting portion 340 can have a large tilt angle so that the mirror 230 can have a pivot angle larger than before.

The mirror array having divided outer trenches shown in FIG. 22 can be manufactured by the same manufacturing method as that for the above-described mirror array shown in FIGS. 14 to 16B.

In this embodiment, the electrode substrate 300, 301, or 302 having the projecting portion 340 and the like is formed by etching the silicon substrate 400. Instead, the electrode substrate 300, 301, or 302 having the projecting portion 340 and the like may be formed by depositing an arbitrary substance on an arbitrary substrate.

As described above, according to this embodiment, since a projecting portion is formed in a trench formed in the base to increase the difference of elevation of the projecting portion, the mirror can have a large pivot angle. Interconnections are formed on the base, and the electrodes are formed on the trench formed in the substrate and the projecting portion projecting from the trench. Hence, setting the focus of the exposure apparatus on the upper surface of the base allows to form the interconnections and electrodes at a necessary accuracy.

Ninth Embodiment

A conventional mirror device will be described first. As shown in FIG. 13, in a conventional mirror device 8200, an electric field generated by applying individual voltages to electrodes 8340a to 8340d through interconnections 8370 gives an attracting force to a mirror 8230 and causes it to pivot by an angle of several degrees. When no voltages are applied to the electrodes 8340a to 8340d, the mirror 8230 is almost parallel to an electrode substrate 8301 (this state will be referred to as an initial position hereinafter), as indicated by the solid line in FIG. 13. When individual voltages are applied to the electrodes 8340a to 8340d in this state, the mirror 8230 tilts, as indicated by the dotted line in FIG. 13.

Figure 23:
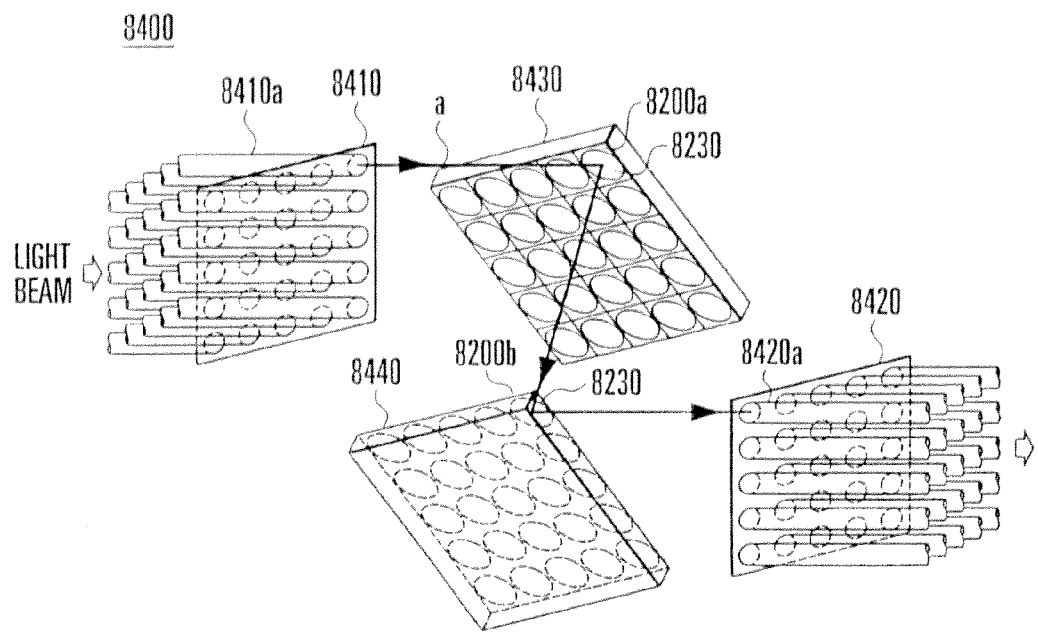
FIG. 23 is a schematic view showing a conventional optical switch.

FIG. 23 shows an optical switch having the mirror device 8200. An optical switch 8400 includes a pair of collimator arrays 8410 and 8420 each having a plurality of optical fibers arrayed two-dimensionally, and a pair of mirror arrays 8430 and 8440 each having a plurality of above-described mirror devices 8200 arrayed two-dimensionally. In the optical switch 8400, a light beam input from the collimator array 8410 serving as an input port is reflected by the mirror arrays 8430 and 8440, reaches the collimator array 8420 serving as an output port, and exits it. For example, a light beam a that has entered from an optical fiber 8410a of the collimator array 8410 into the optical switch 8400 irradiates a mirror device 8200a of the mirror array 8430. The light beam is reflected by the mirror 8230 of the mirror device 8200a and reaches a mirror device 8200b of the mirror array 8440. In the mirror array 8440, the light beam is reflected by the mirror 8230 of the mirror device 8200b and reaches an optical fiber 8420a of the collimator array 8420, as in the mirror array 8430. In this way, the optical switch 8400 can spatially cross-connect the collimated light input from the collimator array 8410 to the collimator array 8420 in the form of a light beam without converting it into an electrical signal.

Figure 24:
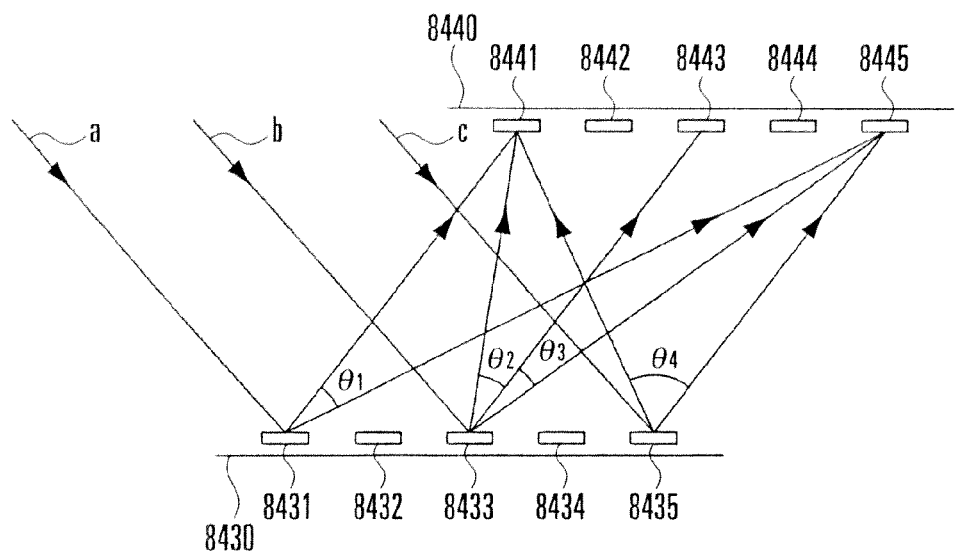
FIG. 24 is a sectional view schematically showing the structure of a conventional mirror array.

In the optical switch 8400, identical constituent elements of the mirror devices 8200 two-dimensionally arranged in the mirror arrays 8430 and 8440 have the same shape. For example, the size of the mirror 8230, the shapes of movable frame connectors 8211a and 8211b and mirror connectors 8221a and 8221h, the relative positions between the mirror 8230 and the movable frame connectors 8211a and 8211b or between the mirror 8230 and the mirror connectors 8221a and 8221b, the relative positions between the mirror 8230 and the electrodes 8340a to 8340d, and the sizes of the electrodes 8340a to 8340d do not change between the mirror devices. As described above, in the conventional optical switch 8400, the mirror devices 8200 having the same shape are arranged in the mirror arrays 8430 and 8440. For this reason, each mirror 8230 in the mirror arrays 8430 and 8440 is almost parallel to the electrode substrate 8301, as shown in FIG. 24. FIG. 24 schematically shows the sections of the mirrors 8230 of the plurality of mirror devices 8200 arranged in the mirror arrays 8430 and 8440. The mirror array 8430 has mirrors 8431 to 8435 corresponding to the mirror 8230. The mirror array 8440 has mirrors 8441 to 8445 corresponding to the mirror 8230.

The mirrors 8431 to 8435 of the mirror array 8430 are almost parallel to the electrode substrate 8301 at the initial position and are arranged such that a light beam irradiates corresponding mirrors in the counter mirror array 8440. For example, the mirror 8431 reflects a light beam indicated by a (to be referred to as a light beam a hereinafter) in FIG. 24 to the mirror 8441 as the counterpart of the mirror 8431. The mirror 8433 reflects a light beam indicated by b (to be referred to as a light beam b hereinafter) in FIG. 24 to the mirror 8443 as the counterpart of the mirror 8433. The mirror 8435 irradiates the mirror 8445 as the counterpart of the mirror 8435 with a light beam indicated by c (to be referred to as a light beam c hereinafter) in FIG. 24. A counter mirror indicates, e.g., a mirror located at the same position in the counter mirror ray when one mirror array is projected from the back of the beam reflection surface, and the other mirror ray is viewed from the beam reflection surface.

When individual voltages are applied to the electrodes 8340a to 8340d of the mirrors 8431 to 8435 in the mirror array 8430 of the optical switch 8400 to tilt the mirrors 8431 to 8435, the light beams that irradiate the mirrors 8431 to 8435 can irradiate arbitrary mirrors in the mirror array 8440.

In the conventional mirror array, however, if a light beam should irradiate a two-dimensional target by tilting the mirrors of the mirror devices, the mirror tilt angle changes depending on the position of the mirror device in the mirror array.

For example, in the optical switch 8400 having the pair of mirror arrays 8430 and 8440 shown in FIG. 24, when the mirror 8431 tilts by ½ of θ1 in the positive direction (to the right in FIG. 24 viewed from the front side) from the initial position, the light beam a irradiates the mirror 8445 of the mirror array 8440 as a target. Hence, to irradiate all the mirrors 8441 to 8445 of the counter mirror array 8440 with the light beam a, the mirror 8431 must be able to tilt by ½ of θ1 in the positive direction from the initial position.

When the mirror 8433 tilts by ½ of θ2 in the negative direction (to the left in FIG. 24 viewed from the front side) from the initial position, the light beam b irradiates the mirror 8441. When the mirror 8433 tilts by ½ of θ3 in the positive direction from the initial position, the light beam b irradiates the mirror 8445. Hence, to irradiate all the mirrors 8441 to 8445 of the counter mirror array 8440 with the light beam b, the mirror 8433 must be able to tilt by ½ of θ2 in the negative direction from the initial position and by ½ of θ3 in the positive direction from the initial position.

When the mirror 8435 tilts by ½ of θ4 in the negative direction from the initial position, the light beam c irradiates the mirror 8441. Hence, to irradiate all the mirrors 8441 to 8445 of the counter mirror array 8440 with the light beam c, the mirror 8435 must be able to tilt by ½ of θ4 in the negative direction from the initial position.

As described above, in the conventional mirror array, the mirror tilt angle changes depending on the position in the mirror array. However, since the mirror devices have the same shape, all the mirror devices must be able to tilt by the same angles necessary for the devices included in the same mirror array. For example, the mirrors 8431 to 8435 in FIG. 24 must be able to tilt by ½ of θ1 in the positive direction and by ½ of θ4 in the negative direction. However, since the mirror device using the MEMS technology has difficulty in increasing the mirror tilt angle at a low voltage, a demand has arisen for a mirror device capable of decreasing the mirror tilt angle.

This embodiment has been made to solve the above-described problem and has as its object to provide a mirror device capable of decreasing the mirror tilt angle, a mirror array, and an optical switch.

Figure 25A:
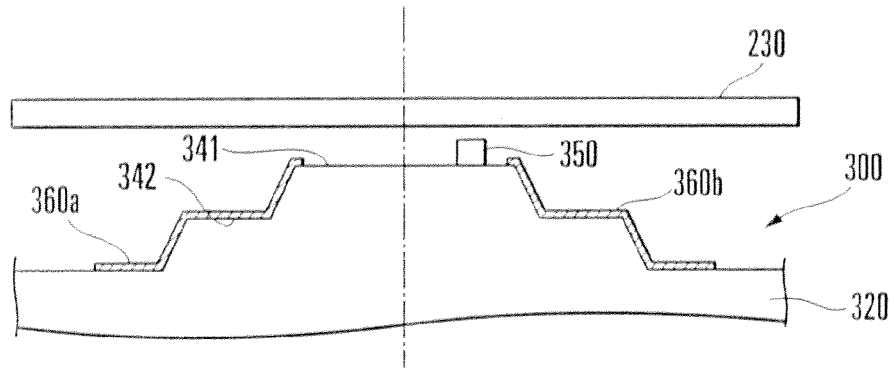
FIG. 25A is a schematic sectional view showing the structure of a mirror array according to the ninth embodiment.
Figure 25B:
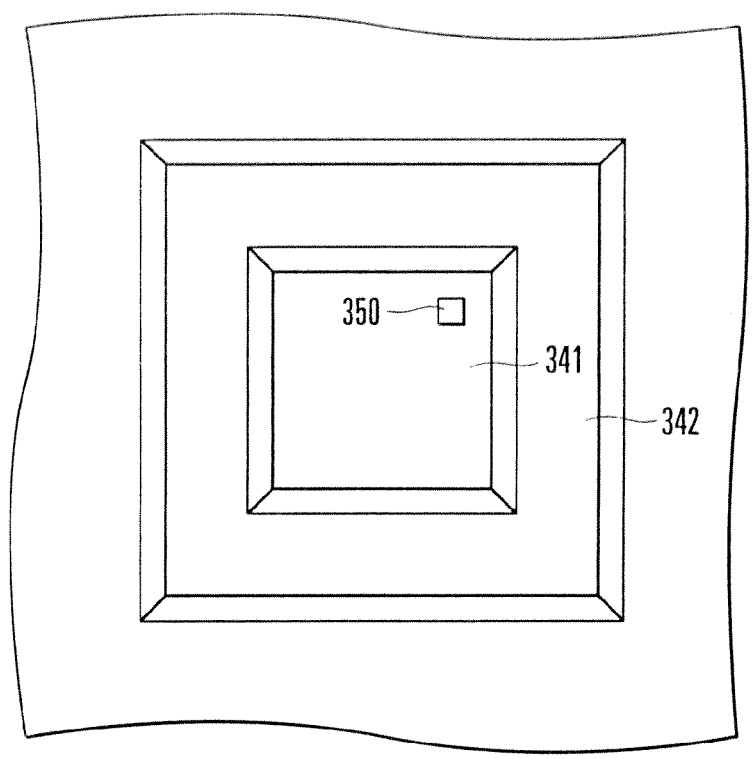
FIG. 25B is a schematic plan view showing the structure of the mirror array according to the ninth embodiment.

This embodiment will be described next. In this embodiment, the position of a fulcrum projection shifts from the center of a mirror to decrease the mirror tilt angle. The same reference numerals as in the eighth embodiment denote the same constituent elements in the ninth embodiment. FIGS. 25A and 25B mainly partially illustrate a mirror device having a mirror as a constituent unit of a mirror array.

A mirror device 2 according to this embodiment has a structure in which a mirror substrate 200 with a mirror and an electrode substrate 300 with electrodes are arranged in parallel. As shown in FIG. 25A, a pivot (fulcrum projection) 350 formed from an almost columnar projection exists on the upper surface of a first terrace 341 of the electrode substrate 300 at a point shifted from the center of the upper surface. A projecting portion 320 of the electrode substrate 300 faces a mirror 230 of the mirror substrate 200. Hence, the position of the pivot 350 shifts from the central axis perpendicular to the plane of the mirror 230. That is, when the center of the mirror 230 is projected to the electrode substrate 300, the center of the mirror 230 and the pivot 350 are located at different points on the electrode substrate 300 without coincidence. The distance and direction of movement of the pivot 350 from almost the center of the first terrace 341 are set in accordance with the position of the mirror device 2 in the mirror array.

Figure 26:
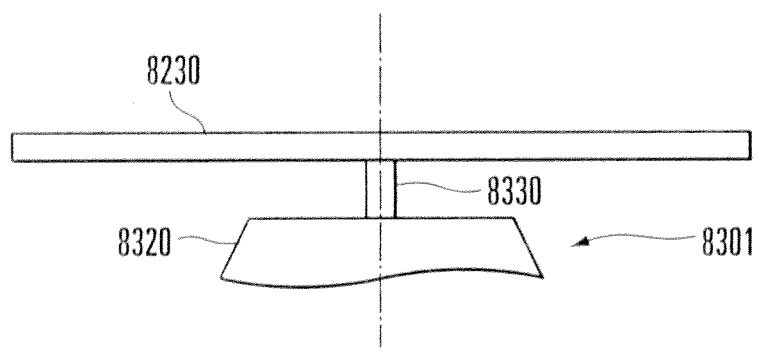
FIG. 26 is a schematic sectional view showing the structure of a conventional mirror device.

As shown in FIG. 26, in the conventional mirror device 8200, a pivot 8330 faces almost the center of the mirror 8230. For this reason, when a uniform voltage is applied to the electrodes 8340a to 8340d, a uniform attracting force acts on the entire mirror 8230. The mirror 8230 approaches the side of the electrode substrate 8301 and contacts the pivot 8330. The mirror 8230 is almost parallel to the electrode substrate 8301, i.e., perpendicular to the axis (indicated by the alternate long and short dashed line in FIG. 26) of the pivot 8330.

To the contrary, in the mirror device 2 of this embodiment, the position of the pivot 350 shifts from the center of the mirror 230 facing the pivot 350. For this reason, when a uniform voltage (to be referred to as a bias voltage hereinafter) is applied to electrodes 360a to 360d, the mirror 230 contacts the pivot 350 and tilts by a predetermined angle from a state (indicated by the dotted line in FIG. 27) wherein the mirror perpendicular to the axis (indicated by the alternate long and short dashed line in FIG. 27) of the pivot 350 (this state will be referred to as an initial state hereinafter). In this embodiment, individual displacement voltages are applied to the electrodes 360a to 360d in this state, thereby tilting the mirror 230 on the pivot 350.

A mirror array according to this embodiment and an optical switch having the mirror array will be described next.

Figure 27:
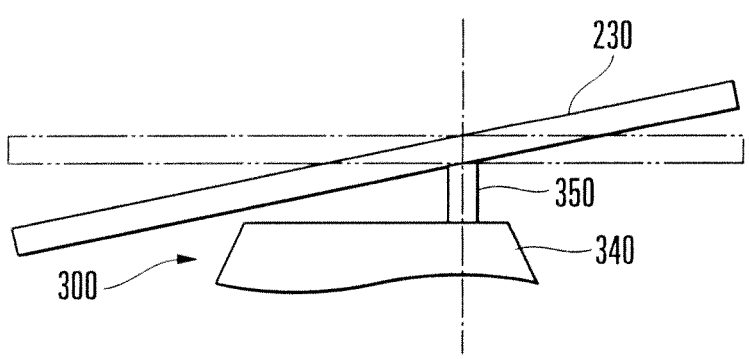
FIG. 27 is a schematic sectional view showing the structure of a mirror device according to the ninth embodiment.
Figure 28:
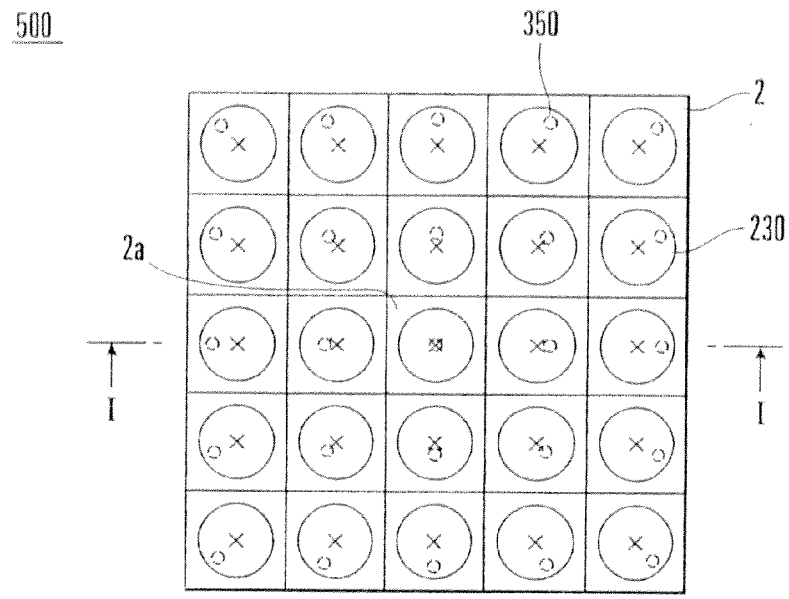
FIG. 28 is a schematic plan view showing the structure of the mirror array according to the ninth embodiment.

As shown in FIG. 28, in a mirror array 500 according to this embodiment, mirror devices 2 described with reference to FIGS. 25A, 25B, and 27 are two-dimensionally arranged in a matrix.

Figure 29:
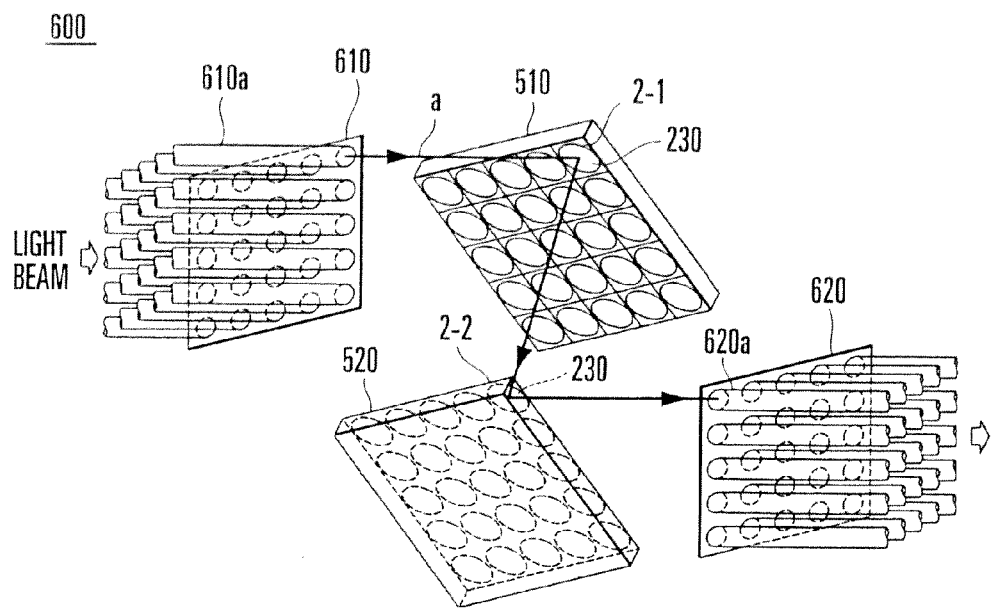
FIG. 29 is a schematic view showing the structure of an optical switch according to the ninth embodiment.

As shown in FIG. 29, an optical switch 600 according to this embodiment includes a pair of collimator arrays 610 and 620 each having a plurality of optical fibers arrayed two-dimensionally, and a pair of mirror arrays 510 and 520 each including the above-described mirror array 500. In the optical switch 600, a light beam input from the collimator array 610 serving as an input port is reflected by the mirror arrays 510 and 520, reaches the collimator array 620 serving as an output port, and exits it. For example, light beam a that has entered from an optical fiber 610a of the collimator array 610 into the optical switch 600 irradiates a mirror device 2-1 of the mirror array 510. The light beam is reflected by the mirror 230 of the mirror device 2-1 and reaches a mirror device 2-2 of the mirror array 520. In the mirror array 520, the light beam is reflected by the mirror 230 of the mirror device 2-2 and reaches an optical fiber 620a of the collimator array 620, as in the mirror array 510. In this way, the optical switch 600 can spatially cross-connect the collimated light input from the collimator array 610 to the collimator array 620 in the form of a light beam without converting it into an electrical signal.

In the mirror array 500, the position (indicated by a dotted circle in FIG. 28) of the pivot 350 of each mirror device shifts from the center (indicated by x in FIG. 28) of the mirror 230 to reflect a light beam to a mirror located at the center of the counter mirror array in the initial state. For example, in the mirror array 500 shown in FIG. 28, the pivot 350 of each mirror device 2 exists on a straight line that connects a mirror device 2a located at the center of the mirror array 500 to the center of the mirror 230 of the mirror device 2. As the distance from the mirror device 2a increases, the position of the pivot 350 of each mirror device 2 gradually separates from the center of the mirror 230 of the mirror device 2 to the opposite side of the mirror device 2a. The pivot 350 of the mirror device 2a exists at a position facing the center of the mirror 230. Hence, when a bias voltage is applied to the electrodes 360a to 360d of each mirror device 2 of the mirror array 500, the mirror 230 contacts the pivot 350 and tilts to reflect a received light beam to the mirror at the center of the counter mirror array.

Figure 30:
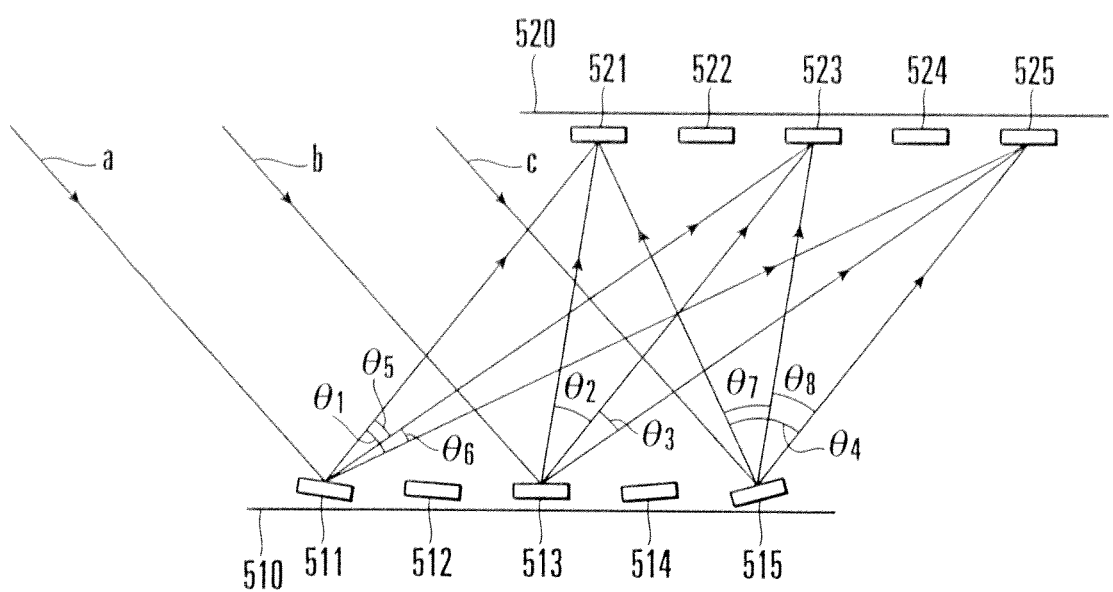
FIG. 30 is a schematic view of the sections of the mirror arrays according to the ninth embodiment.

FIG. 30 is a schematic view of the sections of the mirror arrays 510 and 520. FIG. 30 schematically illustrates the sections of the mirrors 230 of the plurality of mirror devices 2 arranged in the mirror arrays 510 and 520. Each of mirrors 511 to 515 of the mirror array 510 and mirrors 521 to 525 of the mirror array 520 corresponds to the above-described mirror 230.

When a bias voltage is applied to the electrodes 360a to 360d of each mirror device 2 of the mirror array 510, each of the mirrors 511 to 515 tilts at a predetermined angle depending on the position in the mirror array 510, as shown in FIG. 30. In this initial state, the mirrors 511 to 515 tilt to reflect a light beam input to the mirror array 510 to the mirror 523 located at the center of the mirror array 520. To irradiate the mirrors 521 to 525 of the mirror array 520 with a light beam, the mirrors 511 to 515 need only be able to tilt by almost the same angle in the positive direction (to the right in FIG. 30 viewed from the front side) and negative direction (to the left in FIG. 30 viewed from the front side).

For example, when the mirror 511 in FIG. 30 tilts by ½ of θ5 in the negative direction from the initial state, the light beam a irradiates the mirror 521. When the mirror 511 tilts by ½ of θ6 in the positive direction from the initial state, the light beam a irradiates the mirror 525. Hence, to irradiate all the mirrors 521 to 525 of the counter mirror array 520 with the light beam a, the mirror 511 need only be able to tilt by ½ of θ5 in the negative direction and by ½ of θ6 in the positive direction from the initial state.

When the mirror 515 tilts by ½ of θ7 in the negative direction from the initial state, a light beam c irradiates the mirror 521. When the mirror 515 tilts by ½ of θ8 in the positive direction from the initial state, the light beam c irradiates the mirror 525. Hence, to irradiate all the mirrors 521 to 525 of the counter mirror array 520 with the light beam c, the mirror 515 need only be able to tilt by ½ of θ7 in the negative direction and by ½ of θ8 in the positive direction from the initial state.

In the conventional mirror array 8430 shown in FIG. 24, to irradiate all the mirrors 8441 to 8445 of the counter mirror array 8440 with the light beam a, the mirror 8431 corresponding to the mirror 511 of the mirror array 510 of this embodiment must be able to tilt by ½ of θ1 (=θ5+θ6) in the positive direction from the initial position. Additionally, the mirror 8435 corresponding to the mirror 515 of the mirror array 510 of this embodiment must be able to tilt by ½ of θ4 (=θ7+θ8) in the negative direction from the initial position. Since the mirror devices 8200 of the conventional mirror array 8430 have the same shape, the mirrors 230 must be able to tilt by ½ of θ1 in the positive direction and by ½ of θ4 in the negative direction.

In this embodiment, however, for example, the mirror 511 need only be able to tilt by ½ of θ5 in the negative direction and by ½ of θ6 in the positive direction from the initial state, as described above. This angle is smaller than and, more specifically, about ½ the tilt angle of the mirror 230 of the mirror device 8200 in the conventional mirror array 8430. As described above, the mirror array according to this embodiment can decrease the mirror tilt angle. Hence, the driving voltage of the mirror device and mirror array can be low.

A method of manufacturing the mirror device and mirror array according to this embodiment will be described next. The mirror substrate 200 is formed from an SOI (Silicon On Insulator) substrate.

First, a side (major surface: SOI layer) of the SOI substrate with a buried insulating layer 250 undergoes known photolithography and etching such as DEEP RIE to form, in the single-crystal silicon layer, trenches conforming to the shapes of a frame portion 210, movable frame connectors 211a and 211b, movable frame 220, mirror connectors 221a and 221b, and mirror 230.

A resist pattern with openings in predetermined regions corresponding to the trenches is formed on the lower surface of the SOI substrate. The silicon is selectively etched from the lower surface of the SOI substrate by dry etching using, e.g., $SF_6$. In this etching, an opening and a frame-shaped member 240 are formed on the lower surface of the SOI substrate by using the buried insulating layer 250 as an etching stopper layer. The etching of silicon may be wet etching using, e.g., potassium hydroxide.

A region of the buried insulating layer 250 exposed to the opening is removed by dry etching using, e.g., $CF_6$. With this process, the mirror substrate 201 is formed. The buried insulating layer 250 may be removed by using hydrofluoric acid.

On the other hand, the electrode substrate 8301 is formed from, e.g., a silicon substrate. First, a silicon substrate is selectively etched by using, as a mask, a predetermined mask pattern made of a silicon nitride film or silicon oxide film and a potassium hydroxide solution. A base 310, first and second terraces 321 and 322, pivot 350, and convex portions 360a and 360b are formed by repeating the above-described process. The pivot 350 is formed at a position shifted from the center of a first terrace 341 depending on the position in the mirror array 500. The pivot 350 of the mirror device 2 at the center of the mirror ray 500 is formed almost at the center of the first terrace 341.

The surface of the silicon substrate on the etched side is oxidized to form a silicon oxide film. A metal film is formed on the silicon oxide film by, e.g., vapor deposition and patterned by known photolithography and etching to form the electrodes 360a to 360d, leads 341a to 341d, and interconnections 370. With this process, the electrode substrate 300 having the above-described shape is formed.

Then, the mirror substrate 20 is bonded to the electrode substrate 300 to form the mirror array 500 having the mirror device 2 that moves the mirror 230 by applying an electric field to the electrodes 360a to 360d. The position of the pivot 350 of each mirror device 2 of the thus manufactured mirror array 500 is adjusted in accordance with its position in the mirror array 500. Each mirror device reflects a light beam to the mirror at the center of the counter mirror array 520 upon applying a bias voltage to the electrodes 360a to 360d. This allows to decrease the tilt angle of the mirror 230 of each mirror device 2.

In this embodiment, the mirror array 500 shown in FIG. 28 has 5×5 mirror devices 2. However, the number of mirror devices 2 provided in the mirror 500 is not limited to 5×5 and can freely be set as needed.

The mirror array 520 according to this embodiment may have the same structure as the mirror array 510.

The mirror 230 of the mirror device 2 according to this embodiment need not always tilt one-dimensionally, as shown in FIG. 30. The mirror 230 may tilt two-dimensionally about the movable frame pivot axis and the mirror pivot axis. Hence, the position of the pivot 350 of the mirror device 2 on the first terrace 341 is two-dimensionally adjusted depending on the position in the mirror array 500 of the mirror device 2.

In this embodiment, the pivot 350 is provided on the projecting portion 320. However, the pivot 350 may exist on the electrode substrate 300. In this case, the electrodes 360a to 360d are formed on the electrode substrate 300.

In this embodiment, a bias voltage and displacement electrodes are applied to the electrodes 360a to 360d. However, only the displacement voltages may be applied.

In this embodiment, no third terrace 343 is formed on a projecting portion 340. However, the present invention is also applicable to a mirror device with the third terrace 343. Similarly, although no outer trench is formed in this embodiment, the present invention is also applicable to a mirror device with an outer trench.

The mirror device 2 and mirror array according to this embodiment are usable not only in an optical switch but also in a measurement device, display, and scanner. In this case, the pivot 350 of the mirror device 2 is provided at an arbitrary position in accordance with the application purpose and specifications.

As described above, according to this embodiment, since the position of the fulcrum projection shifts from the center of the mirror, the mirror tilts by a predetermined angle when a bias voltage is applied to the electrodes. Since the mirror tilts from this tilted state, the tilt angle of the mirror can be small. This also allows to drive the mirror device at a low voltage.

10th Embodiment

The 10th embodiment of the present invention will be described next. In this embodiment, a connector and a counter connector have different structures to decrease the mirror tilt angle.

Figure 31:
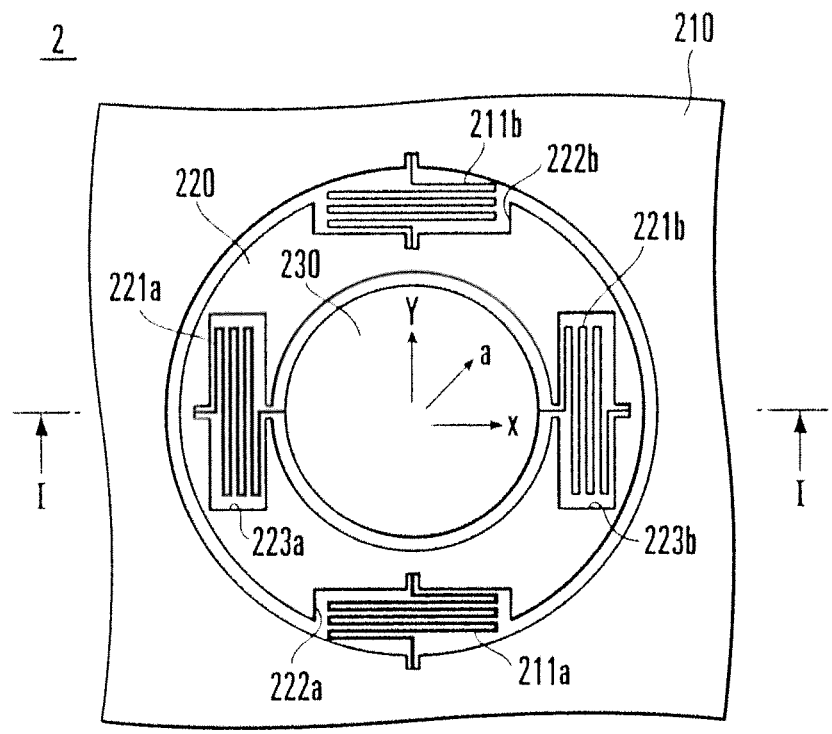
FIG. 31 is a schematic plan view of a mirror device according to the 10th embodiment.

The same reference numerals as in the eighth and ninth embodiments denote the same constituent elements in the 10th embodiment. FIG. 31 mainly partially illustrates a mirror device 2 having a mirror as a constituent unit of a mirror array. A mirror array according to this embodiment includes a plurality of mirror devices two-dimensionally arranged in a matrix.

The mirror device 2 has a structure in which a mirror substrate 200 with a mirror and an electrode substrate 300 with electrodes are arranged in parallel. The mirror substrate 200 has a plate-shaped frame portion 210 with an opening having an almost circular shape when viewed from the upper side, a movable frame 220 with an opening having an almost circular shape when viewed from the upper side and arranged in the opening of the frame portion 210 by a pair of movable frame connectors 211a and 211b, a mirror 230 having an almost circular shape when viewed from the upper side and arranged in the opening of the movable frame 220 by a pair of mirror connectors 221a and 221b, and a frame-shaped member 240 formed on the upper surface of the frame portion 210 to surround the movable frame 220 and mirror 230.

The pair of movable frame connectors 211a and 211b including zigzag torsion springs and provided in first notches 222a and 222b of the movable frame 220 connect the frame portion 210 to the movable frame 220. This structure makes the movable frame 220 pivotable about a movable frame pivot axis passing through the pair of movable frame connectors 211a and 211b. The movable frame connectors 211a and 211b have different structures and, more particularly, different spring constants. In, e.g., FIG. 31, the movable frame connector 211a is thicker than the movable frame connector 211b. Hence, the spring constant of the movable frame connector 211a is larger than that of the movable frame connector 211b.

The pair of mirror connectors 221a and 221b including zigzag torsion springs and provided in second notches 223a and 223b of the movable frame 220 connect the movable frame 220 to the mirror 230. This structure makes the mirror 230 pivotable about a mirror pivot axis passing through the pair of mirror connectors 221a and 221b. The mirror connectors 221a and 221b have different structures and, more particularly, different spring constants. In, e.g., FIG. 31, the mirror connector 221a is thicker than the mirror connector 221b. Hence, the spring constant of the mirror connector 221a is larger than that of the mirror connector 221b. The movable frame pivot axis and mirror pivot axis intersect each other at a right angle.

Figure 32:
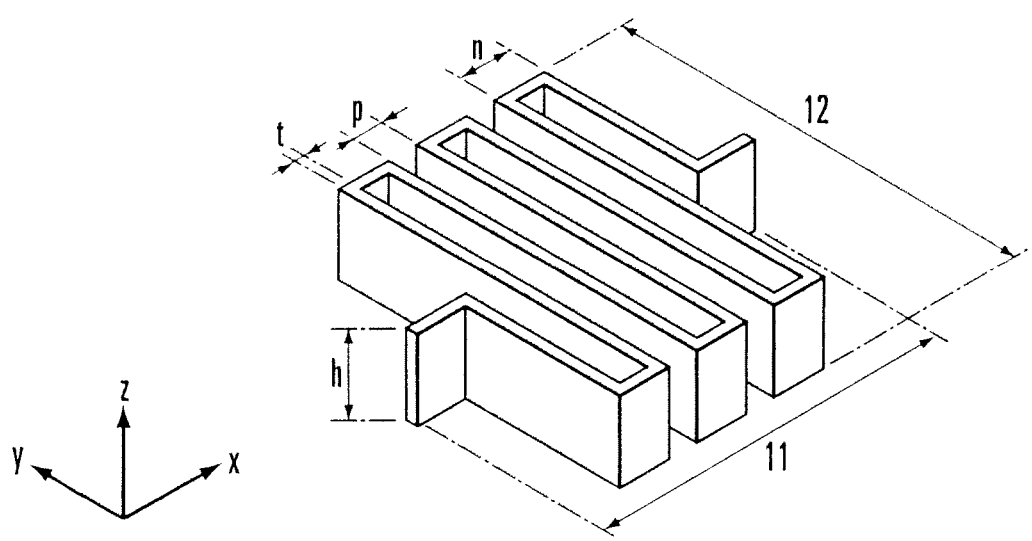
FIG. 32 is a schematic view showing the structure of a torsion spring.

The order of the spring constants of the movable frame connectors 211a and 211b and mirror connectors 221a and 221b will be described with reference to FIG. 32. FIG. 32 is a schematic view of a torsion spring included in the movable frame connectors 211a and 211b and mirror connectors 221a and 221b. The spring constants of the movable frame connectors 211a and 211b and mirror connectors 221a and 221b of the mirror array according to this embodiment mainly indicate spring constants in the distance direction of the mirror substrate 200 and electrode substrate 300, i.e., the Z-axis direction. The order of the spring constants in the Z-axis direction depends on the following elements.

The order of the spring constants in the Z-axis direction depends on an X-direction length l1 of the torsion spring in FIG. 32. The longer the length l1 is, the smaller the spring constant is. Reversely, the shorter the length l1 is, the larger the spring constant is.

The order of the spring constants in the Z-axis direction also depends on a Y-direction length l2 of the torsion spring in FIG. 32. The longer the length l2 is, the smaller the spring constant is. Reversely, the shorter the length l2 is, the larger the spring constant is.

The order of the spring constants the Z-axis direction also depends on a width t of the torsion spring in FIG. 32. The smaller the width t is, i.e., the thinner the torsion spring is, the smaller the spring constant is. Reversely, the larger the width t is, i.e., the thicker the torsion spring is, the larger the spring constant is.

The order of the spring constants in the Z-axis direction also depends on an interval p between adjacent torsion spring elements, i.e., the pitch of the zigzag of the torsion spring in FIG. 32. The larger the interval p is, the smaller the spring constant is. Reversely, the smaller the interval p is, the larger the spring constant is.

The order of the spring constants in the Z-axis direction also depends on a number n of times of turn of the zigzag of the torsion spring in FIG. 32. The larger the number n is, i.e., the larger the number of times of turn of the torsion spring is, the smaller the spring constant is. Reversely, the smaller the number n is, i.e., the smaller the number of times of turn of the torsion spring is, the larger the spring constant is.

The order of the spring constants in the Z-axis direction also depends on a thickness h of the torsion spring in FIG. 32. The smaller the thickness h is, i.e., the thinner the torsion spring is, the smaller the spring constant is. Reversely, the larger the thickness h is, i.e., the thicker the torsion spring is, the larger the spring constant is.

In the mirror array according to this embodiment, at least one of the above-described elements changes between a pair of members, i.e., the movable frame connectors 211a and 211b and mirror connectors 221a and 221b. This causes each of the movable frame connectors 211a and 211b and mirror connectors 221a and 221b to have a spring constant different from that of the counterpart.

Figure 33A:
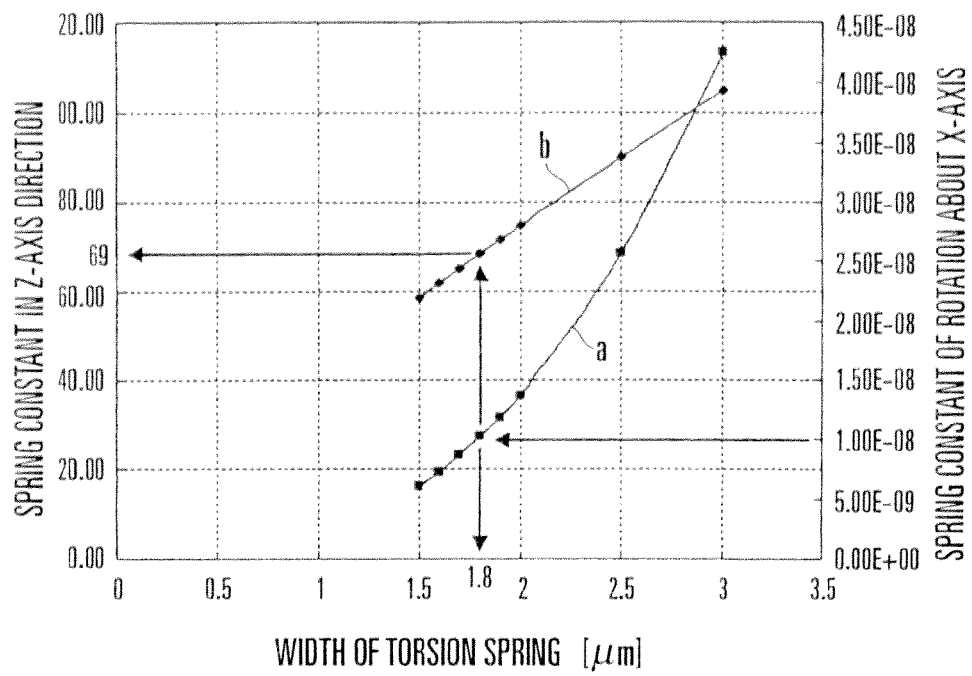
FIG. 33A is a schematic view showing the structure of a torsion spring.

The spring constants in the X and Y directions and the spring constant of rotation about the X-axis also change depending on the shape of the torsion spring, like the order of the above-described spring constants in the Z-axis direction. This will be described with reference to FIGS. 33A to 34B. FIGS. 33A to 34B show the relationship between the width and the spring constant of a torsion spring made of, e.g., Si and having a simple beam structure with a rectangular section. Referring to FIGS. 33A and 34A, the ordinate on the right side represents the spring constant of rotation about the longitudinal axis, i.e., the X-axis of the torsion spring. The ordinate on the left side represents the spring constant in the height direction, i.e., the Z-axis direction of the torsion spring. The abscissa represents the width, i.e., Y-direction length of the torsion spring. Referring to FIGS. 33A and 34A, a curve a indicates the relationship between the spring constant of rotation about the X-axis of the torsion spring and the width of the torsion spring. A curve b indicates the relationship between the spring constant in the Z-axis direction of the torsion spring and the width of the torsion spring.

As indicated by the curves a in FIGS. 33A and 34A, the smaller the width of the torsion spring is, the smaller the spring constant of rotation about the X-axis of the torsion spring is. The larger the width of the torsion spring is, the larger the spring constant is. When a parameter such as the torsion spring width related to the shape of the torsion spring changes, not only the above-described spring constant in the Z-axis direction of the torsion spring but also the spring constants in the X and Y directions and the spring constant of rotation about the X-axis change. If the spring constant of rotation about the X-axis changes, a voltage necessary for tilting the mirror to a predetermined angle also changes. When the spring constant in the Z-axis direction of the torsion spring should change, it is necessary to set a torsion spring shape that does not change the spring constants in the X and Y directions and the spring constant of rotation about the X-axis of the torsion spring. To do this for example, the spring constants in the X and Y directions and the spring constant of rotation about the X-axis of the torsion spring are fixed to arbitrary values.

Figure 33B:
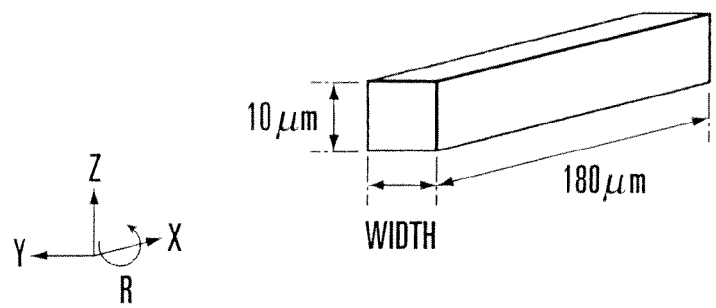
FIG. 33B is a graph showing the spring constant of the torsion spring shown in FIG. 33A.
Figure 34A:
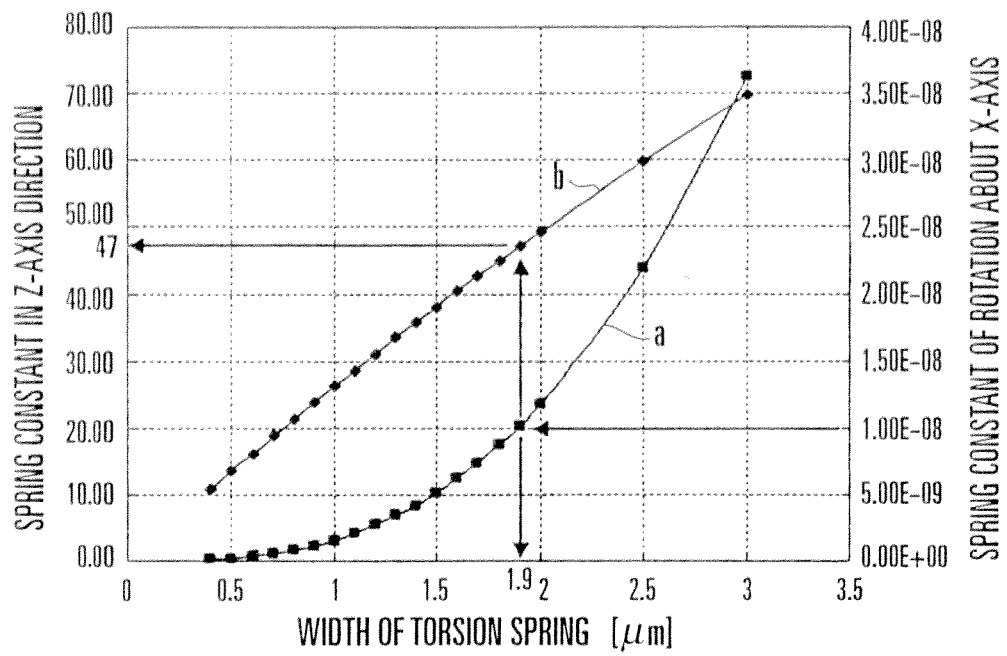
FIG. 34A is a schematic view showing the structure of a torsion spring.
Figure 34B:
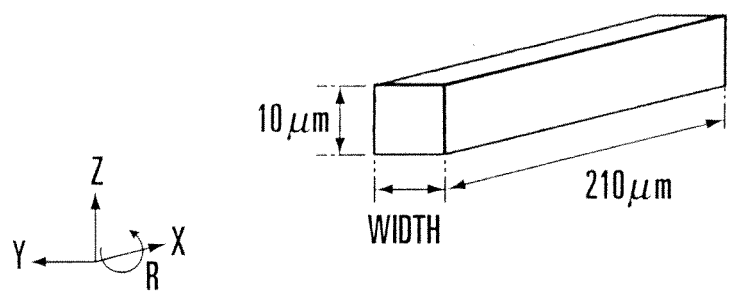
FIG. 34B is a graph showing the spring constant of the torsion spring shown in FIG. 34A.

For example, in a torsion spring with an X-direction length of 180 μm and a height of 10 μm in FIG. 33B, the spring constant of rotation about the X-axis is set to $1.0 \times 10^{-8}$. As shown in FIG. 33A, the torsion spring width is calculated as 1.8 μm from the curve a, and the spring constant in the Z-axis direction is calculated as 69 from the curve b. Assume that the X-direction length of the torsion spring in FIG. 33B changes to 210 µm, as shown in FIG. 34B, and the spring constant of rotation about the X-axis is $1.0 \times 10^{-8}$, like the torsion spring in FIG. 33B. As shown in FIG. 34A, the torsion spring width is calculated as 1.9 µm from the curve a, and the spring constant in the Z-axis direction is calculated as 47 from the curve b.

As described above, when a parameter such as the torsion spring width or length related to the shape of the torsion spring changes, the spring constant in the Z-axis direction of the torsion spring can change without changing the spring constant of rotation about the X-axis of the torsion spring.

Figure 35:
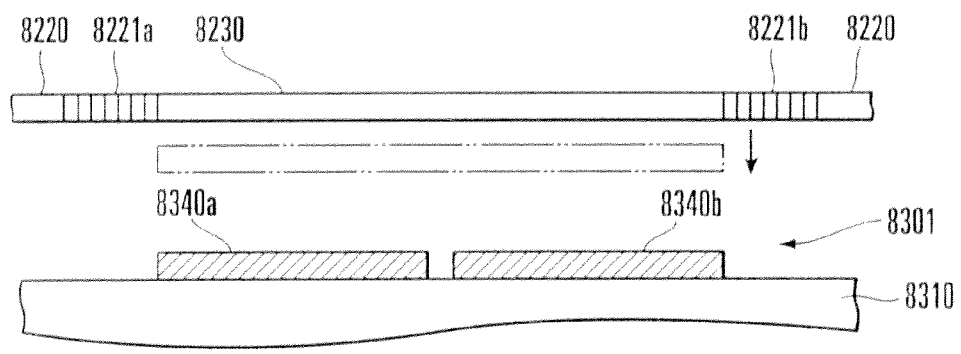
FIG. 35 is a schematic sectional view showing the structure of a conventional mirror device.
Figure 36:
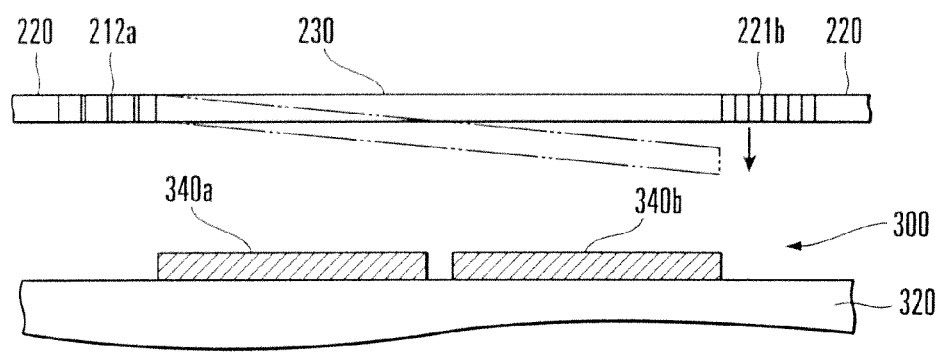
FIG. 36 is a schematic sectional view showing the structure of the mirror device according to the 10th embodiment.

The operation of the mirror device of the mirror array according to this embodiment will be described next with reference to FIGS. 31, 35, and 36. FIGS. 35 and 36 illustrate the sections of the main part taken along a line I-I in FIG. 31 so as to explain the relationship between the mirror 230 and the mirror connectors 221a and 221b. FIGS. 35 and 36 explain a mirror device having flat electrodes without any projecting portion as an example. However, this embodiment is also applicable to a mirror device having a projecting portion. FIGS. 35 and 36 also explain a mirror device without any outer trench as an example. However, this embodiment is also applicable to a mirror device having an outer trench.

The one-dimensional tilting operation of the mirror device will be described first. In a conventional mirror device 8200 shown in FIG. 35, mirror connectors 8221a and 8221b have the same structure. Hence, two ends of a mirror 8230 supported by the mirror connectors 8221a and 8221b are connected to a movable frame 8220 by the same suspending force. For this reason, when a uniform voltage is applied to electrodes 8340a to 8340d, a uniform attracting force acts on the entire mirror 8230. The mirror 8230 becomes almost parallel to a base 8310, as indicated by the dotted line in FIG. 35.

In the mirror device 2 of this embodiment shown in FIG. 36, the mirror connectors 221a and 221b serving as a pair of members have different structures and, more particularly, different spring constants. Hence, two ends of the mirror 230 supported by the mirror connectors 221a and 221b are connected to the movable frame 220 by different suspending force. For this reason, when a uniform voltage (to be referred to as a bias voltage hereinafter) is applied to the electrodes 340a to 340d to make an attracting force act on the mirror 230, the mirror 230 tilts by a predetermined angle with respect to a base 310 (this state will be referred to as an initial state hereinafter), as indicated by the dotted line in FIG. 36.

The two-dimensional tilting operation of the mirror device will be described next. In the mirror device 2 shown in FIG. 31, the movable frame connector 211a has a spring constant larger than that of the movable frame connector 211b, and the mirror connector 221a has a spring constant larger than that of the mirror connector 221b. For this reason, when a bias voltage is applied to the electrodes 340a to 340d, the movable frame 220 that is parallel to the frame portion 210 tilts to the side of the base 300 while reducing the distance to the base 300 in the Y direction (this motion will be referred to as "tilt in the Y direction" hereinafter). The mirror 230 that is parallel to the movable frame 220 tilts to the side of the base 300 while reducing the distance to the base 300 in the X direction (this motion will be referred to as "tilt in the X direction" hereinafter). Hence, in the mirror device 2 of this embodiment, when a voltage with a uniform magnitude is applied to the electrodes 340a to 340d, the mirror 230 that is parallel to the frame portion 210 tilts to the side of the base 310 while reducing the distance to the base 300 in a direction of an arrow a in FIG. 31 (this motion will be referred to as "tilt in the a direction" hereinafter). In this embodiment, the mirror 230 is tilted by applying individual control voltages to the electrodes 340a to 340d in this state.

Figure 37:
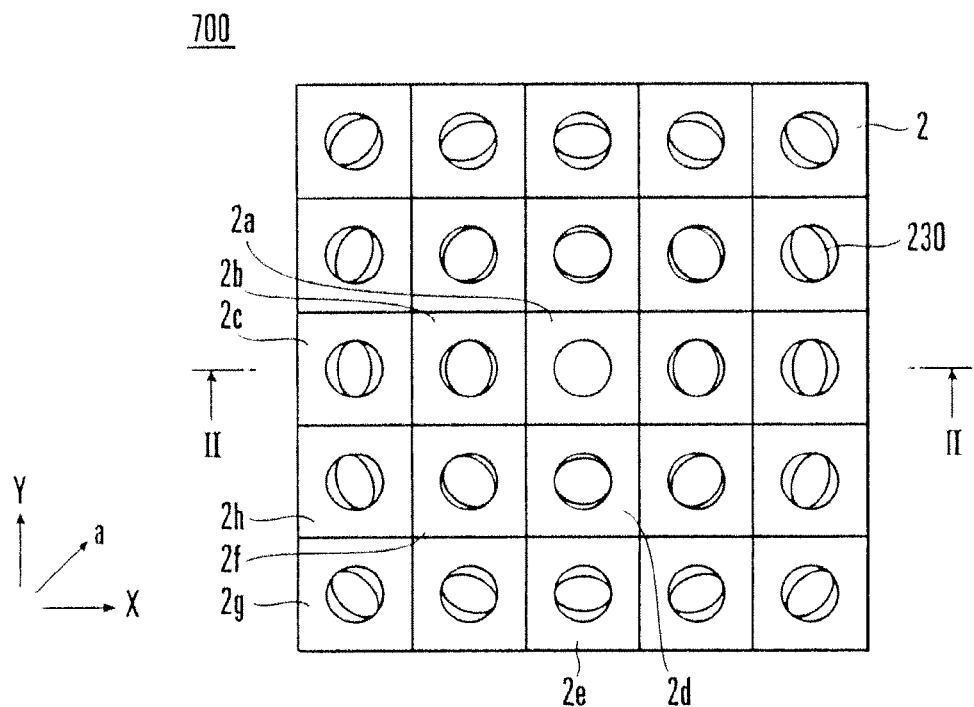
FIG. 37 is a schematic plan view showing the structure of a mirror array according to the 10th embodiment.

FIG. 37 shows an example of a mirror array including the mirror devices 2 according to this embodiment. FIG. 37 illustrates a state wherein a predetermined bias voltage is applied to the electrodes 340a to 340d. Each mirror device shown in FIG. 37 is in the state shown in FIG. 31 viewed from the front side. That is, each mirror device has the mirror connectors 221a and 221b in the horizontal direction and the movable frame connectors 211a and 211b in the vertical direction.

In a mirror array 700 according to this embodiment, the mirror devices 2 described with reference to FIGS. 31 and 36 are two-dimensionally arranged in a matrix. The mirror array 700 corresponds to the mirror arrays 510 an 520 of the optical switch 600 shown In FIG. 29. In the mirror array 700, each of the movable frame connectors 211a and 211b and mirror connectors 221a and 221b in each mirror device has a spring constant different from the counterpart so that the mirror 230 reflects a light beam to a mirror located at the center of the counter mirror array in the initial state wherein a uniform bias voltage is applied to the electrodes 340a to 340d. In the mirror device located at the center of the mirror array 700, each of the movable frame connectors 211a and 211b and mirror connectors 221a and 221b has the same spring constant as the counterpart.

For example, in a mirror device 2b adjacent to a mirror device 2a in a direction (to be referred to as a "−X direction" hereinafter) reverse to the X direction, the spring constant in the Z-axis direction of the mirror connector 221a is larger than that of the mirror connector 221b such that the mirror 230 tilts in the X direction more than in the mirror device 2a in the initial state. In a mirror device 2c adjacent to the mirror device 2b in the −X direction, the mirror 230 tilts in the X direction more than the mirror 230 of the mirror device 2b in the initial state. For example, if the mirror connectors 221b of the mirror devices 2c and 2b have the same spring constant in the Z-axis direction, the spring constant in the Z-axis direction of the mirror connector 221a of the mirror device 2c is set larger than that of the mirror connector 221b of the mirror device 2b.

In a mirror device 2d adjacent to the mirror device 2a in a direction (to be referred to as a "−Y direction" hereinafter) reverse to the Y direction, the spring constant in the Z-axis direction of the movable frame connector 211a is larger than that of the movable frame connector 211b such that the mirror 230 tilts in the Y direction more than in the mirror device 2a in the initial state. In a mirror device 2e adjacent to the mirror device 2d in the −Y direction, the mirror 230 tilts in the Y direction more than the mirror 230 of the mirror device 2d in the initial state. For example, if the movable frame connectors 211b of the mirror devices 2d and 2e have the same spring constant in the Z-axis direction, the spring constant in the Z-axis direction of the movable frame connector 211a of the mirror device 2e is set larger than that of the movable frame connector 211b of the mirror device 2d.

In a mirror device 2f adjacent to the mirror device 2a in the −X and −Y directions, i.e., in a direction (to be referred to as a "−a direction" hereinafter) reverse to the direction of the arrow a in FIG. 37, the spring constant in the Z-axis direction of the movable frame connector 211a is larger than that of the movable frame connector 211b, and the spring constant in the Z-axis direction of the mirror connector 221a is larger than that of the mirror connector 221b such that the mirror 230 tilts in the X and Y directions, i.e., in the direction of the arrow a (to be referred to as an "a direction" hereinafter) in FIG. 37 more than in the mirror device 2a in the initial state. In a mirror device 2g adjacent to the mirror device 2f in the −a direction, the mirror 230 tilts in the a direction more than the mirror 230 of the mirror device 2f in the initial state. For example, if the movable frame connectors 211b and mirror connectors 221b of the mirror devices 2f and 2g have the same spring constants in the Z-axis direction, the spring constants in the Z-axis direction of the movable frame connector 211a and connector 221a of the mirror device 2f are set larger than those of the movable frame connector 211b and mirror connector 221b of the mirror device 2f.

In a mirror device 2h adjacent to the mirror device 2c in the −Y direction, the mirror 230 tilts in the X direction similarly as in the mirror devices 2c and 2g and in the Y direction similarly as in the mirror devices 2d and 2f in the initial state. For example, if the movable frame connectors 211b and mirror connectors 221b of the mirror devices 2c, 2d, 2f, 2g, and 2h have the same spring constants in the Z-axis direction, the movable frame connector 211a of the mirror device 2h has the same spring constant in the Z-axis direction as that of the movable frame connectors 211a of the mirror devices 2d and 2f. In addition, the mirror connector 221a of the mirror device h has the same spring constant in the Z-axis direction as that of the mirror connectors 221a of the mirror devices 2c and 2g.

As described above, the movable frame connectors 211a and 211b and mirror connectors 221a and 221b have spring constants set depending on the position in the mirror array 700. When a bias voltage having a uniform magnitude is applied to the electrodes 340a to 340d, the mirror 230 of each mirror device 2 of the mirror array 700 tilts to reflect a received light beam to the mirror at the center of the counter mirror array. This reflecting operation is the same as that described in the ninth embodiment with reference to FIG. 30.

FIG. 30 is a sectional view taken along a line II-II in FIG. 37. FIG. 30 schematically illustrates the sections of the mirrors 230 of the plurality of mirror devices 2 arranged in mirror arrays 510 and 520 each including the mirror array 700. Each of mirrors 511 to 515 of the mirror array 510 and mirrors 521 to 525 of the mirror array 520 corresponds to the mirror 230 of the mirror device 2 included in the above-described mirror array 700. The mirror arrays 510 and 520 shown in FIG. 30 correspond to the mirror arrays 510 and 520, respectively, of the optical switch 600 shown in FIG. 29.

As described above, in this embodiment, each able frame connectors 211a and 211b and mirror connectors 221a and 221b has a spring constant different from that of the counterpart. Since the mirror tilts by a predetermined angle in the mirror tilt angle can be small consequently.

The mirror device and mirror array according to this embodiment are manufactured by the same manufacturing method the above-described ninth embodiment.

In this embodiment, in the step of forming, in the crystal silicon layer, trenches conforming the shapes of the frame portion 210, movable frame connectors 211a and 211b, movable frame 220, mirror connectors 221a and 221b, and mirror 230, the movable frame connectors 211a and 211b and mirror connectors 221a and 221b are formed while changing the spring constant depending on the position in the mirror array.

The spring constants of the movable frame connectors 211a and 211b and mirror connectors 221a and 221b of each mirror device 2 of the thus manufactured mirror array 700 are adjusted in accordance with its position in the mirror array 700. Each mirror device reflects a light beam to the mirror at the center of a counter mirror array 80 upon applying a predetermined bias voltage to the electrodes 340a to 340d. This allows to decrease the tilt angle of the mirror 230 of each mirror device 2.

Figure 38:
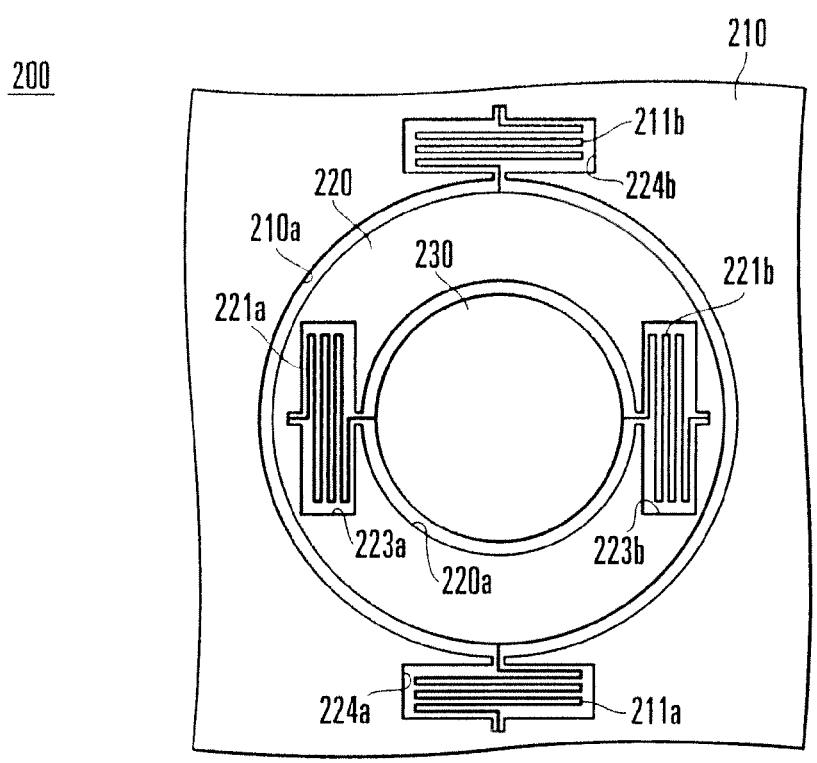
FIG. 38 is a schematic plan view showing modification of a mirror substrate.

FIG. 38 shows a modification of the mirror substrate 200. In this embodiment, as described above, the movable frame connectors 211a and 211b are provided in the first notches 222a, and 222b formed in the movable frame 220. However, the movable frame connectors 211a and 211b need not always exist there and may exist in third notches 224a and 224b formed in the frame portion 210, as shown in FIG. 38.

The electrodes 340a to 340d need not always exist on the base 310 and may exist on, e.g., projecting portion provided on the base 310. Alternatively, the electrodes 340a to 340d may exist the projecting portion and base 310.

In this embodiment, the mirror array 700 shown in FIG. 37 has 5×5 mirror devices 2. However, the number of mirror devices 2 provided in the mirror array 700 is not limited to 5×5 and can freely be set as needed. The mirror array 80 of this embodiment may have the same structure as the mirror array 700.

The mirror device 2 and mirror array according to this embodiment are usable not only in an optical switch but also in a measurement device, display, and scanner. In this case, the projecting portion 320 and electrodes 340a to 340d are provided at arbitrary positions in accordance with the application purpose and specifications.

In this embodiment, the mirror 230 is tilted in the initial state by adjusting the spring constant in the Z-axis direction of a torsion spring included in each of the movable frame connectors 211a and 211b and mirror connectors 221a and 221b. Instead, the spring constant of rotation about the X-axis of the torsion spring may be adjusted. Even this can make the mirror 230 tilt in the initial state.

In this embodiment, a bias voltage and displacement electrodes are applied to the electrodes 340a to 340d. However, only the displacement voltages may be applied.

As described above, according to this embodiment, each connector has a structure different from that of the counter connector so that the mirror tilts by a predetermined angle in accordance with bias voltage application to the electrodes. Since the mirror is tilted by applying control voltages in this tilted state, the mirror tilt angle can be small. Even when it is necessary to tilt the mirror largely, it can operate at a low voltage.

11th Embodiment

Figure 39A:
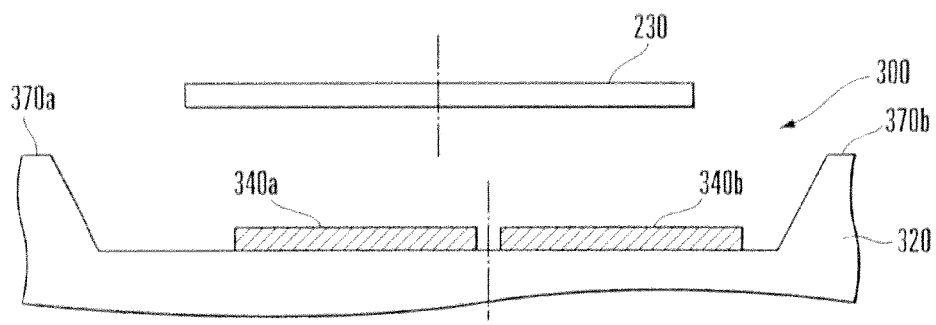
FIG. 39A is a schematic sectional view of a mirror device according to the 11th embodiment.
Figure 39B:
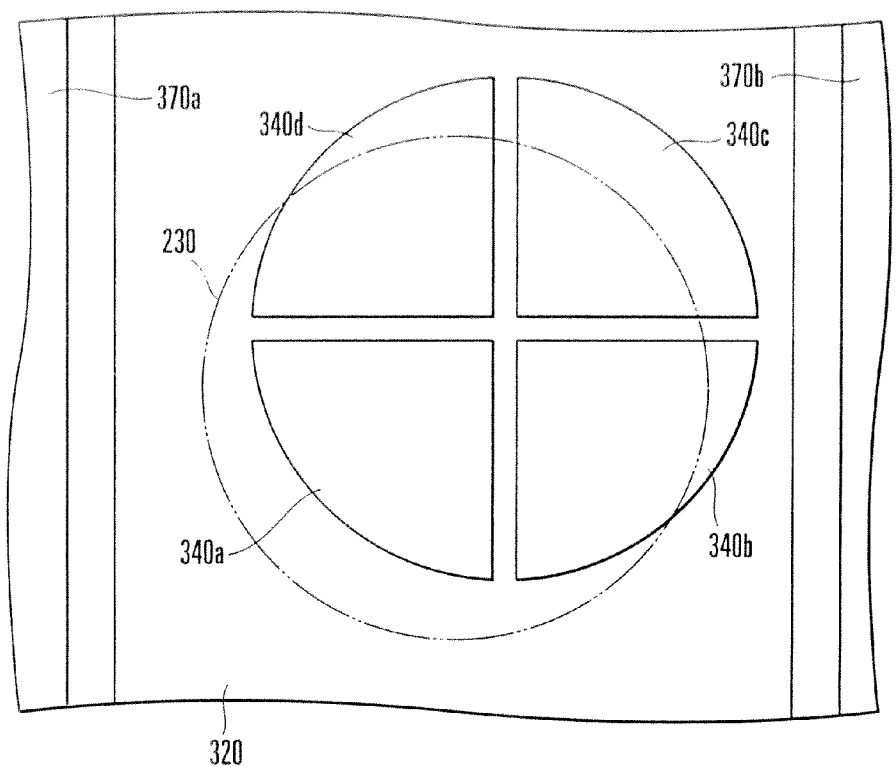
FIG. 39B is a schematic plan view of the mirror device according to the 11th embodiment.

The 11th embodiment of the present invention will be described next. This embodiment reduces the mirror tilt angle by providing electrodes at arbitrary positions on a substrate asymmetrically with respect to the pivot axis of a mirror projected onto an electrode substrate. The same reference numerals as in the eighth to 10th embodiments denote the same constituent elements in the 11th embodiment. FIGS. 19A and 39B mainly partially illustrate a mirror device 2 having a mirror as a constituent unit of a mirror array. In this embodiment, a mirror device having flat electrodes without any projecting portion will be described as an example.

The mirror device 2 has a structure in which a mirror substrate 200 with a circular mirror 230 and an electrode substrate 300 with electrodes 340a to 340d are arranged in parallel. As shown in FIGS. 39A and 39B, the electrodes 340a to 340d are formed at arbitrary positions on the electrode substrate 300 asymmetrically with respect to at least one of the movable frame pivot axis and mirror pivot axis of the mirror 230 projected onto the electrode substrate 300. The electrodes 340a to 340d have a sector shape obtained by dividing a circle with the same size as the mirror 230 into four parts of uniform size along parting lines parallel to the movable frame pivot axis and mirror pivot axis. The center of the electrodes 340a to 340d indicates the center of the circle. The center passes through the intersection of the parting lines. The distance and direction of movement of the electrodes 340a to 340d from almost the center of the electrode substrate 300 are set in accordance with the position of the mirror device 2 in the mirror array. The parting lines need not always include only straight lines but may include arbitrary curves.

Figure 40:
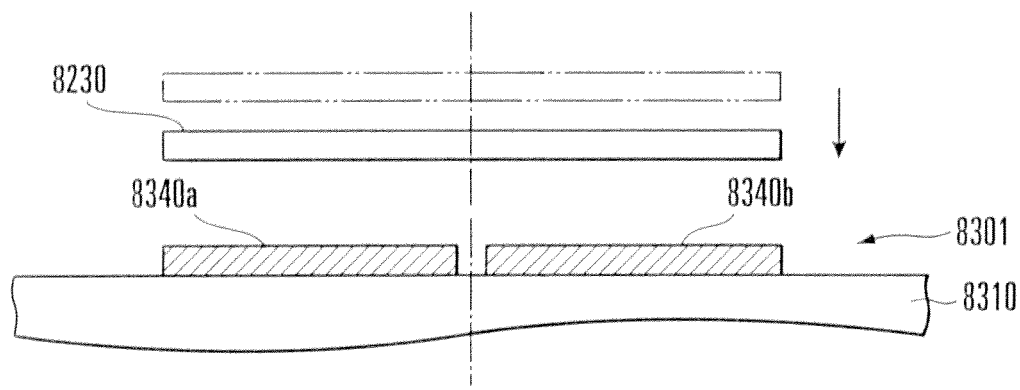
FIG. 40 is a schematic sectional view showing the structure of a conventional mirror device.

As shown in FIG. 40, in a conventional mirror device 8200, electrodes 8340a to 8340d are formed at positions on a base 8310 symmetrically with respect to the movable frame pivot axis and mirror pivot axis of a mirror 8230 projected onto an electrode substrate 8301. Hence, as shown in FIG. 40, the central axis (indicated by the alternate long and short dashed line in FIG. 40) of the mirror 8230 matches the central axis (indicated by the alternate long and two short dashed line in FIG. 40) of the electrodes 8340a to 8340d. For this reason, when a uniform voltage is applied to the electrodes 8340a to 8340d, a uniform attracting force acts on the entire mirror 8230. The mirror 230 is almost parallel to the major surface of the base 8310 of the electrode substrate 8301, i.e., almost perpendicular to the central axis of the mirror 8230. The central axis of the mirror 230 indicates a straight line that passes through the center of the mirror 8230 and is perpendicular to the plane of the mirror 8230, i.e., parallel to the distance direction between a mirror substrate 8201 and the electrode substrate 8301. The central axis of the electrodes 8340a to 8340d indicates a straight line that passes through the center of the electrodes 8340a to 8340d and is parallel to the planes of the electrodes 8340a to 8340d, i.e., the distance direction between a mirror substrate 8201 and the electrode substrate 8301.

Figure 41:
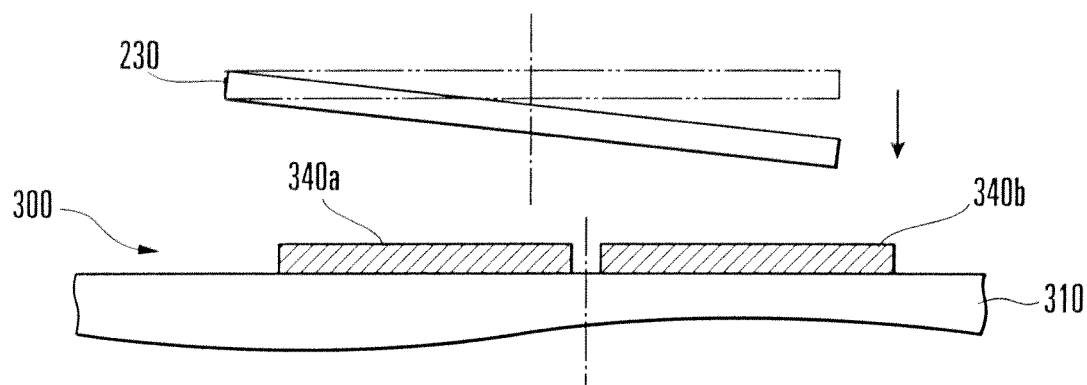
FIG. 41 is a schematic sectional view showing the structure of the mirror device according to the 11th embodiment.

To the contrary, in the mirror device 2 of this embodiment, the electrodes 340a to 340d are formed at positions on the base 310 asymmetrically with respect to at least one of the movable frame pivot axis and mirror pivot axis of the mirror 230 projected onto the electrode substrate 300. Hence, as shown in FIG. 41, the central axis (indicated by the alternate long and short dashed line in FIG. 41) of the mirror 230 does not match the central axis (indicated by the alternate long and two short dashed line in FIG. 41) of the electrodes 340a to 340d. For this reason, when a uniform voltage (to be referred to as a bias voltage hereinafter) is applied to the electrodes 340a to 340d, an attraction acts on a portion facing the electrodes 340a to 340d. The mirror 230 tilts by a predetermined angle (this state will be referred to as an "initial state" hereinafter) from a state (indicated by the dotted line in FIG. 41) wherein the mirror is perpendicular to the central axis. In this embodiment, the mirror 230 is tilted by applying individual control voltages to the electrodes 340a to 340d in this state.

A mirror array according to this embodiment will be described next with reference to FIG. 42. In a mirror array 800 according to this embodiment, the mirror devices 2 described with reference to FIGS. 39A, 39B, and 41 are two-dimensionally arranged in a matrix. The mirror array 800 corresponds to the mirror arrays 510 an 520 of the optical switch 600 shown in FIG. 29. In the mirror array 800, the electrodes 340a to 340d (indicated by the dotted line in FIG. 42) of each mirror device are formed at positions on the electrode substrate 300 asymmetrically with respect to the pivot axis of the mirror 230 projected onto the electrode substrate 300 so that the mirror 230 reflects a light beam to a mirror located at the center of the counter mirror array in the initial state. It is also possible to adjust the tilt of the mirror 230 by the magnitude of a bias voltage.

Figure 42:
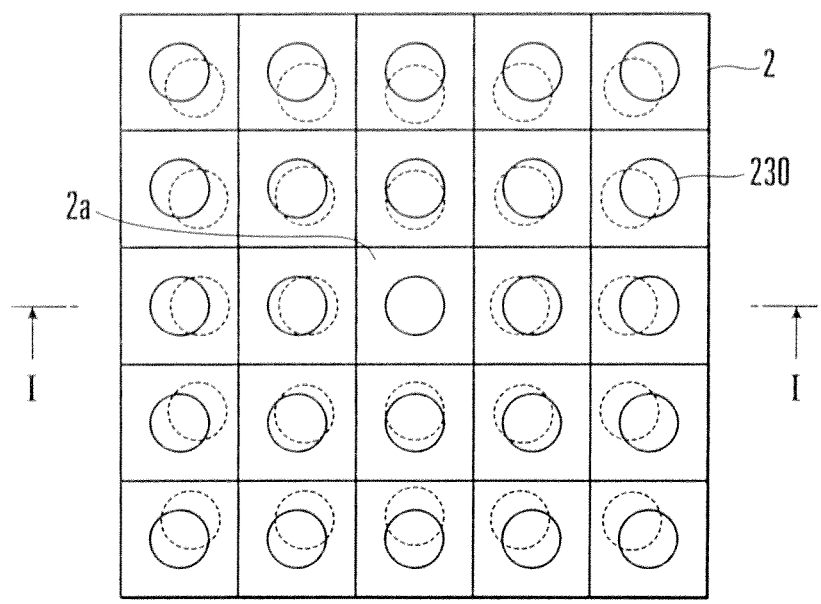
FIG. 42 is a schematic plan view showing the structure of a mirror array according to the 11th embodiment.

For example, in the mirror array 800 shown in FIG. 42, the electrodes 340a to 340d of each mirror device 2 exist on a straight line that connects a mirror device 2a located at the center of the mirror array 800 to the center of the mirror 230 of the mirror device 2. As the distance from the mirror device 2a increases, the positions of the electrodes 340a to 340d of each mirror device 2 gradually separate from the center of the mirror 230 of the mirror device 2 to the opposite side of the mirror device 2a. This arrangement increases the tilt of the mirror 230 as the distance between the mirror device 2a and the mirror device 2 increases. The central axis of the electrodes 340a to 340d of the mirror device 2a matches the central axis of the mirror 230. When a bias voltage having a uniform magnitude is applied to the electrodes 340a to 340d of each mirror device 2 of the mirror array 800, the mirror 230 tilts to reflect a received light beam to the mirror at the center of the counter mirror a ray. This reflecting operation is the same as that described in the ninth embodiment with reference to FIG. 30.

FIG. 30 is a sectional view taken along a line I-I in FIG. 42. FIG. 30 schematically illustrates the sections of the mirrors 230 of the plurality of mirror devices 2 arranged in mirror arrays 510 and 520 each including the mirror array 800. Each of mirrors 511 to 515 of the mirror array 510 and mirrors 521 to 525 of the mirror array 520 corresponds to the above-described mirror 230. The mirror arrays 510 and 520 shown in FIG. 30 correspond to the mirror arrays 510 and 520 of the optical switch 600 shown in FIG. 29, respectively.

As described above, in this embodiment, it is possible to reduce the mirror tilt angle. This allows to lower the driving voltage of the mirror device and mirror array.

The mirror device and mirror array according to this embodiment are manufactured by the same manufacturing method as in the above-described ninth embodiment.

In this embodiment, in the step of patterning a metal film by known photolithography and etching to form the electrodes 340a to 340d, leads 341a to 341d, and interconnections 370, the electrodes 340a to 340d are formed at positions shifted from the center of a base 310 depending on the position in the mirror array 800. The electrodes 340a to 340d of the mirror device 2 located at the center of the mirror array 800 are formed almost at the center of the base 310. With this process, the electrode substrate 300 having the above-described shape is formed.

The positions of the electrodes 340a to 340d of each mirror device 2 of the thus manufactured mirror array 800 are adjusted in accordance with its position in the mirror array 800. Each mirror device reflects a light beam to the mirror at the center of the counter mirror array 800 upon applying a uniform bias voltage to the electrodes 340a to 340d. This allows to decrease the tilt angle of the mirror 230 of each mirror device 2. Additionally, since the mirror 230 tilts in the initial state, the operation range of the mirror 230 is small, and consequently, low voltage driving is possible.

As described above, according to this embodiment, the electrodes are provided at arbitrary positions on the substrate asymmetrically with respect to the pivot axis of the mirror projected onto the electrode substrate. The mirror tilts by a predetermined angle in accordance with bias voltage application to the electrodes. Since the mirror is tilted by applying a control voltage in the tilted state, the mirror tilt angle can be small. Since the tilt angle is small, low voltage driving is possible.

12th Embodiment

Figure 43:
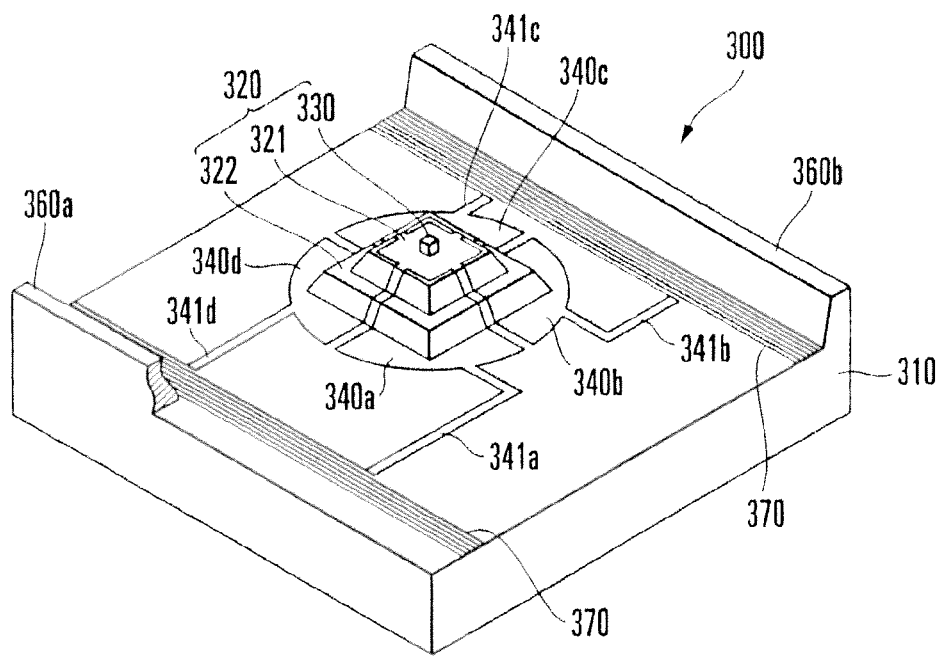
FIG. 43 is a perspective view showing the structure of a mirror device according to the 12th embodiment.
Figure 44:
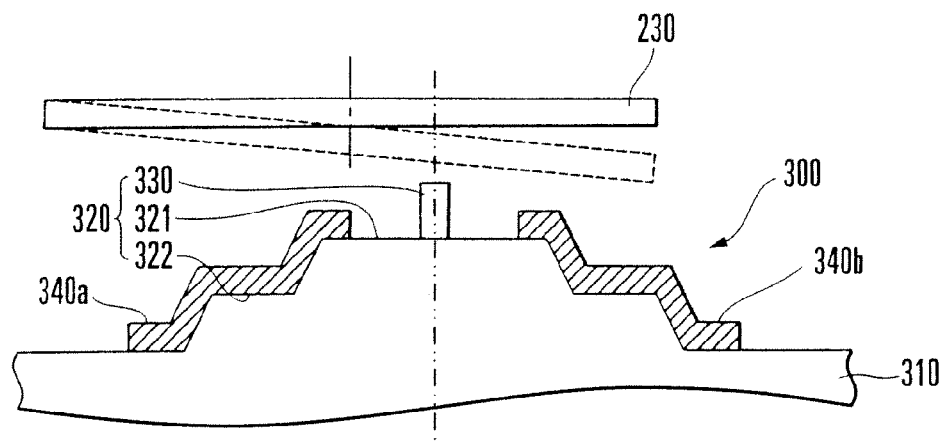
FIG. 44 is a schematic sectional view showing the structure of the mirror device according to the 12th embodiment.

The 12th embodiment of the present invention will be described next. In this embodiment, a projecting portion is provided on the electrode substrate 300 of the 11th embodiment, and electrodes 340a to 340d are provided on the projecting portion and electrode substrate 300, as shown in FIGS. 43 and 44. Hence, the same names and reference numerals as in the 11th embodiment denote the same constituent elements in the 12th embodiment, and a description thereof will be omitted as needed.

A mirror device 2 has a structure in which a mirror substrate 200 with a mirror and an electrode substrate 300 with electrodes are arranged in parallel.

The electrode substrate 300 has a plate-shaped base 310 and a conical projecting portion 320 projecting from the surface (upper surface) of the base 310. The projecting portion 320 includes a second terrace 322 having a truncated pyramidal shape and formed on the upper surface of the base 310, a first terrace 321 having a truncated pyramidal shape and formed on the upper surface of the second terrace 322, and a pivot 330 having a columnar shape and formed on the upper surface of the first terrace 321. The projecting portion 320 has the center Formed at a position shifted from the center of the base 310 depending on the position in a mirror array. The distance and direction of movement of the projecting portion 320 from the center of the base 310 are et in accordance with the position of the mirror device 2 in the mirror array.

The four sector electrodes 340a to 340d are formed on the upper surface of the base 310 including the outer surface of the projecting portion 320 in a circle with the same size as a mirror 230 of the counter mirror substrate 200. In the device 2 viewed from the upper side, the center of the electrodes 340a to 340d almost matches the center of the pivot 330. As described above, the position of the projecting portion 320 shifts from the center of the base 310 depending on the position in a mirror array 800. Since the central axes do not match, the electrodes 340a to 340d and the mirror 230 partially overlap each other when viewed from the upper side.

In the mirror device 2 of this embodiment, the central axis (indicated by the alternate long and short dashed line in FIG. 44) of the mirror 230 shifts from the central axis (indicated by the alternate long and two short dashed line in FIG. 44) of the projecting portion 320 having the electrodes 340a to 340d on the surface, as shown in FIG. 44. For this reason, when a uniform bias voltage is applied to the electrodes 340a to 340d, the mirror 230 tilts by a predetermined angle (this state will be referred to as an "initial state" hereinafter) from a state (indicated by dotted line in FIG. 44) wherein the mirror is perpendicular to the central axis. In this embodiment, the mirror 230 is tilted by applying individual control voltages to the electrodes 340a to 340d in this state.

A mirror array 800 shown in FIG. 42 is formed by arranging the mirror devices 2 two-dimensionally in a matrix. In the mirror array 800 having the mirror device 2 shown in FIG. 42, the central axis of the projecting portion 320 and the central axis of the electrodes 340a to 340d of each mirror device 2 exist on a straight line that connects a mirror device 2a located at the center of the mirror array 800 to the center of the mirror 230 of the mirror device 2. As the distance from the mirror device 2a increases, the positions of the central axes gradually separate from the center of the mirror 230 of the mirror device 2 to the opposite side of the mirror device 2a. The central axis of the projecting portion 320 and the central axis of the electrodes 340a to 340d of the mirror device 2a match the central axis of the mirror 230. When a bias voltage is uniformly applied to the electrodes 340a to 340d of each mirror device 2 of the mirror array 800, the mirror 230 tilts to reflect a received light beam to the mirror at the center of the counter mirror array. This allows the mirror array according to this embodiment to reduce the mirror tilt angle.

A method of manufacturing the mirror array according to this embodiment will be described next. A method of manufacturing the mirror substrate 200 is the same as in the 11th embodiment.

In this embodiment, in the step of forming the base 310, first and second terraces 321 and 322, pivot 330, and convex portions 360a and 360b, the projecting portion 320 is formed at a position shifted from the center of the base 310 depending on the position in the mirror array. The projecting portion 320 of the mirror device 2 located at the center of the mirror array 800 is formed almost at the center of the base 310. With this process, the electrode substrate 300 having the above-described shape is formed.

The position of the projecting portion 320, i.e., the positions of the electrodes 340a to 340d of each mirror device 2 of the thus manufactured mirror array 800 are adjusted in accordance with its position in the mirror array 800. Each mirror device reflects a light beam to the mirror at the center of the counter mirror array 800 upon applying a uniform bias voltage to the electrodes 340a to 340d. This allows to decrease the tilt angle of the mirror 230 of each mirror device 2.

In the 11th and 12th embodiments, the mirror array 800 shown in FIG. 42 has 5×5 mirror devices 2. However, the number of mirror devices 2 provided in the mirror array 800 is not limited to 5×5 and can freely be set as needed.

The mirror 230 of the mirror device 2 according to the 11th and 12th embodiments tilts not only one-dimensionally as shown in FIG. 30 but also two-dimensionally about the movable frame pivot axis and mirror pivot axis. Hence, the positions of the electrodes 340a to 340d and projecting portion 320 of the mirror device 2 on the electrode substrate 300 are two-dimensionally adjusted in accordance with the position of the mirror device 2 in the mirror array 800.

The mirror device 2 and mix array according to the 11th and 12th embodiments are usable not only in an optical switch but also in a measurement device, display, and scanner. In this case, the projecting portion 320 and electrodes 340a to 340d of the mirror device 2 are provided at arbitrary positions in accordance with the application purpose and specifications.

In the 11th and 12th embodiments, the central axis of the mirror 230 is shifted from the central axes of the projecting portion 320 and electrodes 340a to 340d by adjusting the position of the projecting portion 320 or the positions of the electrodes 340a to 340d on the electrode substrate 300. However, the central axis of the mirror 230 may be shifted from the central axes of the projecting portion 320 and electrodes 340a to 340d by adjusting the position of the mirror 230 on the mirror substrate 200.

In the 11th and 12th embodiments, a bias voltage and displacement electrodes are applied to the electrodes 340a to 340d. However, only the displacement voltages may be applied.

As described above, according to this embodiment, the electrodes exist at arbitrary positions on the substrate asymmetrically with respect to the pivot axis of the mirror projected onto the electrode substrate. The mirror tilts by a predetermined angle in accordance with bias voltage application to the electrodes. Since the mirror is tilted by applying control voltages in this tilted state, the mirror tilt angle can be small. Since the tilt angle is small, low voltage driving is possible.

13th Embodiment

Figure 45:
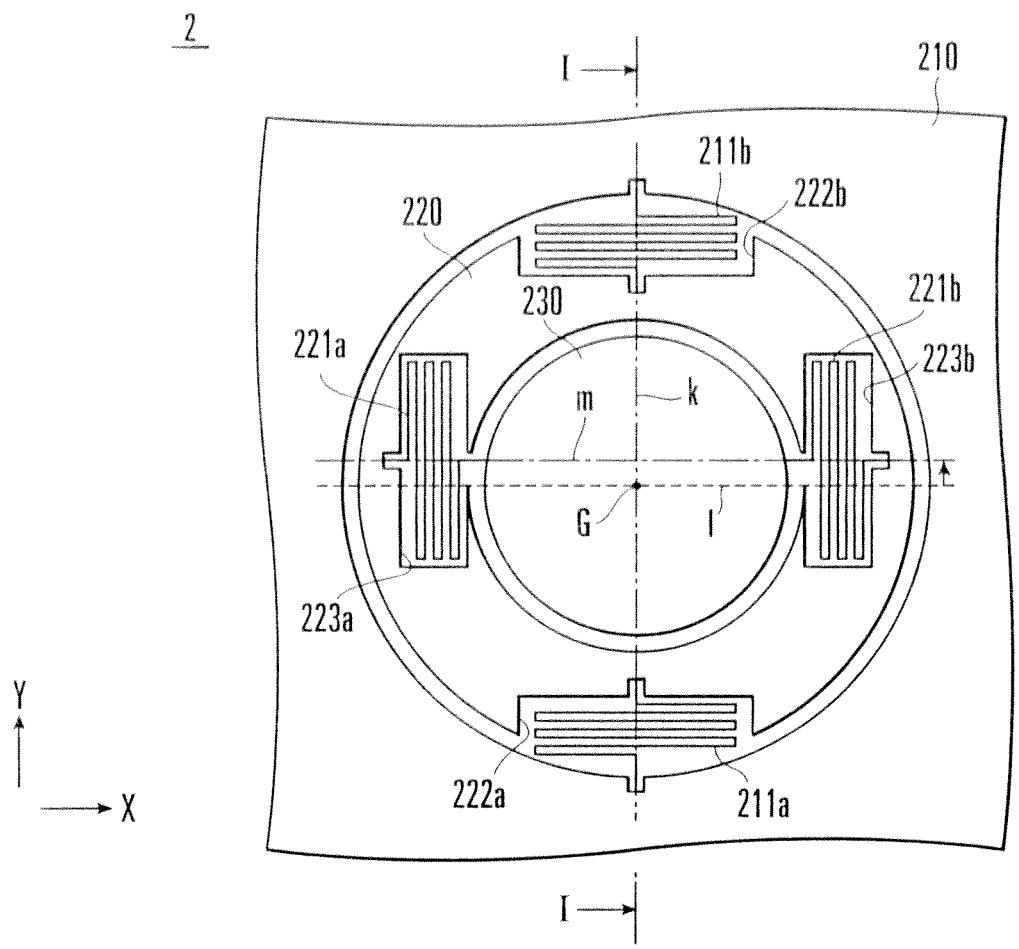
FIG. 45 is a schematic plan view of a mirror device according to the 13th embodiment.

The 13th embodiment of the present invention will be described next. This embodiment reduces the mirror tilt angle by inhibiting at least one of the movable frame pivot axis and mirror pivot axis of a mirror device from passing through the gravity center of a mirror. The same reference numerals as in the eighth to 12th embodiments denote the same constituent elements in the 13th embodiment. FIG. 45 mainly partially illustrates a mirror device 2 having a mirror as a constituent unit of a mirror array. In this embodiment, a mirror device having flat electrodes without any projecting portion will be described as an example.

The mirror device 2 has a structure in which a mirror substrate 200 with a mirror and an electrode substrate 300 with electrodes are arranged in parallel. The mirror substrate 200 has a plate-shaped frame portion 210 with an opening having an almost circular shape when viewed from the upper side, a movable frame 220 with an opening having an almost circular shape when viewed from the upper side and arranged in the opening of the frame portion 210 by a pair of movable frame connectors 211a and 211b, a mirror 230 having an almost circular shape when viewed from the upper side and arranged in the opening of the movable frame 220 by a pair of mirror connectors 221a and 221b, and a frame-shaped member 240 formed on the upper surface of the frame portion 210 so as to surround the movable frame 220 and mirror 230.

The pair of movable frame connectors 211a and 211b including zigzag torsion springs and provided in first notches 222a and 222b of the movable frame 220 connect the frame portion 210 to the movable frame 220. This structure makes the movable frame 220 pivotable about a movable frame pivot axis passing through the pair of movable frame connectors 211a and 211b in the mirror device 2 shown in FIG. 45, the movable frame connectors 211a and 211b connect to the frame portion 210 and movable frame 220 such that the movable frame pivot axis indicated by an alternate long and short dashed line k in FIG. 45 passes through a gravity center G of the mirror 230. In this embodiment, since the mirror 230 has an almost circular shape when viewed from the upper side, the gravity center of the mirror 230 corresponds to the center of the circle of the outside shape of the mirror 230.

The pair of mirror connectors 221a and 221b including zigzag torsion springs and provided in second notches 223a and 223b of the movable frame 220 connect the movable frame 220 to the mirror 230. This structure makes the mirror 230 pivotable about a mirror pivot axis passing through the pair of mirror connectors 221a and 221b. In the mirror device 2 shown in FIG. 45, the mirror connectors 221a and 221b are provided at positions translated from the mirror pivot axis of a conventional mirror device, which is indicated by a dotted line l and passes through the gravity center G, to the side of the movable frame connector 211b, i.e., in the Y direction shown in FIG. 45. Since the mirror pivot axis is translated in the Y direction from the conventional mirror pivot axis l, the mirror pivot axis does not pass through the gravity center of the mirror 230, as indicated by an alternate long and two short dashed line m in FIG. 45. The movable frame pivot axis and mirror pivot axis intersect at a right angle.

Figure 46:
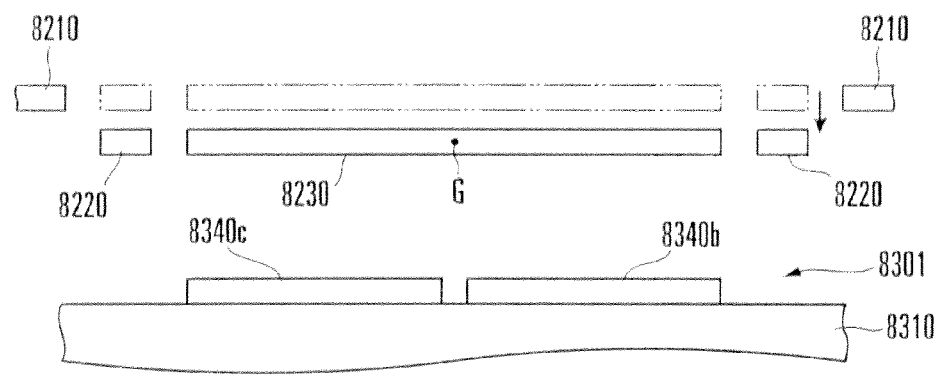
FIG. 46 is a schematic sectional view of a conventional mirror device.
Figure 47:
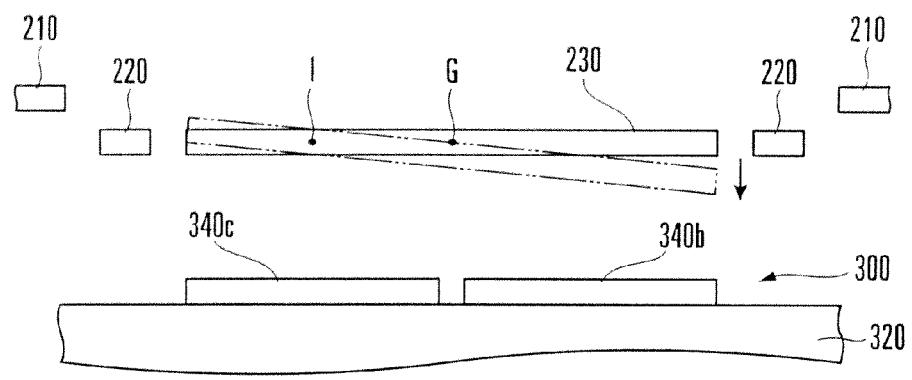
FIG. 47 is a schematic sectional view of the mirror device according to the 13th embodiment.

The operation of the mirror device according to this embodiment will be described next with reference to FIGS. 45 to 47. FIGS. 46 and 47 correspond the section of a main part taken along a line I-I in FIG. 45 and illustrate the relationship between the mirror pivot axis and the mirror 230.

In a conventional mirror device 8200 shown in FIG. 46, mirror connectors 8221a and 221b are arranged to make the pivot axis pass through the gravity center G of a mirror 8230. Hence, the mirror 8230 is supported symmetrically with respect to the mirror pivot axis. For this reason, when a uniform voltage is applied to electrodes 8340a to 8340d, a uniform attracting force acts on the entire mirror 8230. The mirror 8230 and a movable frame 8220 approach the side of a base 8310 while keeping the almost parallel state to the base 8310, as indicated by the dotted line in FIG. 46.

To the contrary, in the mirror device 2 of this embodiment shown in FIG. 47, since the mirror connectors 221a and 221b are provided at the positions translated to the side of the movable frame connector 211b, i.e., in the Y direction, as described above, the mirror pivot axis m does not pass through the gravity center G of the mirror 230. As shown in FIGS. 45 and 41, on the mirror pivot axis m, the distance between the mirror pivot axis and the end of the mirror 230 on the side of the movable frame connector 211a is longer than the distance between the mirror pivot axis and the end of the mirror 230 on the side of the movable frame connector 211b. When an attracting force acts on the mirror 230 upon application of a uniform voltage (to be referred to as a bias voltage hereinafter), the mirror 230 approaches to the side of the movable frame 220 and base 310 and tilts about the mirror pivot axis, as indicated by the dotted line in FIG. 47, so that the end on the side of the movable frame connector 211a is closer to the side of the base 310 (this state will be referred to as an initial state hereinafter). In this embodiment, individual control voltages are applied to the electrodes 340a to 340d in this state, i.e., in the state wherein the end of the mirror 230 in a direction (to be referred to as a "−Y direction" hereinafter) reverse to the Y direction in FIG. 45 approaches to the side of the base 310 (this state will be referred to as "tilt in the −Y direction" hereinafter), thereby tilting the mirror 230.

The distance and direction of movement of the mirror connectors 221a and 221b in the mirror device 2 shown in FIGS. 45 and 47 are freely set as needed in accordance with the position of the mirror device 2 in the mirror array.

Figure 48:
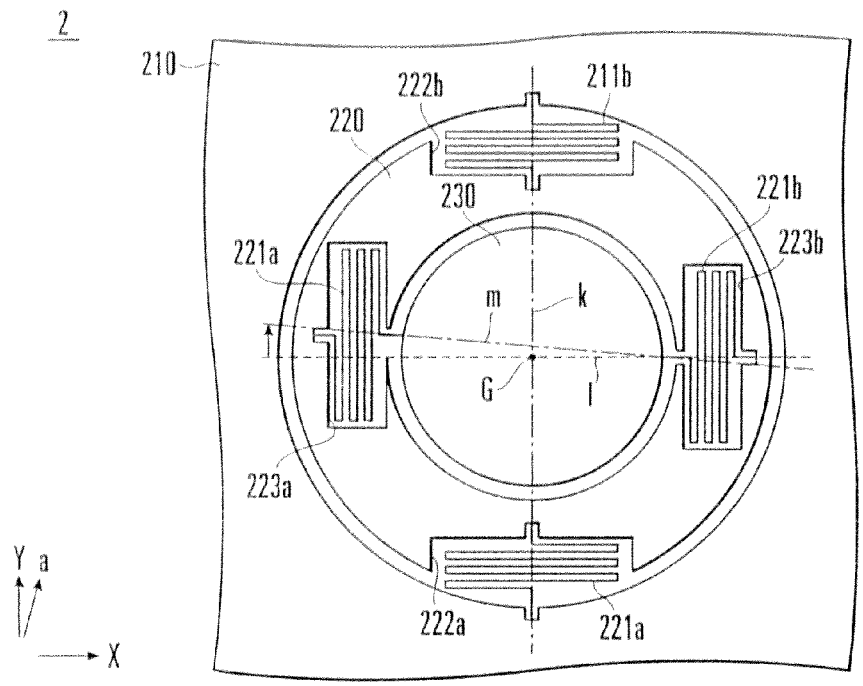
FIG. 48 is a schematic plan view of another mirror device according to the 13th embodiment.

In the mirror device 2 shown in FIG. 45, the mirror connectors 221a and 221b simultaneously move in the Y direction to prevent the mirror pivot axis from passing through the gravity center G of the mirror 230. Instead, one of the mirror connectors 221a and 221b may move in the V direction to prevent the mirror pivot axis from passing through the gravity center G of the mirror 230. This case will be described with reference to FIG. 48. FIG. 48 mainly partially illustrates the mirror substrate of the mirror device 2 having a mirror as a constituent unit of a mirror array. The same names and reference numerals as in the mirror device shown in FIG. 45 denote the same constituent elements in FIG. 48, and a description thereof will be omitted as needed.

In the mirror device 2 shown in FIG. 48, the mirror connector 221a is provided at a position shifted from the mirror pivot axis of the mirror device 8200, which is indicated by the dotted line l in FIG. 48 and passes through the gravity center G, to the side of the movable frame connector 211b, i.e., in the Y direction. The end of the conventional mirror pivot axis 1 on the side of the mirror connector 221a moves in the Y direction. That is, the mirror pivot axis indicated by the alternate long and two short dashed line m in FIG. 48 does not pass through the gravity center of the mirror 230. The mirror pivot axis m and movable frame pivot axis k do not intersect at a right angle. The mirror pivot axis m intersects the movable frame pivot axis k at an arbitrary angle. On the movable frame pivot axis k, the distance between the mirror pivot axis and the end of the mirror 230 on the side of the movable frame connector 211a is longer than the distance between the mirror pivot axis and the end of the mirror 230 on the side of the movable frame connector 211b. When an attracting force acts on the mirror 230 in accordance with application of a bias voltage with a uniform magnitude to the electrodes 340a to 340d, the mirror 230 tilts about the mirror pivot axis in that intersects the movable frame pivot axis k at an arbitrary angle so that the end on the side of the movable frame connector 211*a* approaches to the side of the base 310. In this embodiment, individual control voltages are applied to the electrodes 340*a* to 340*d* in this initial state, i.e., in the state wherein the end of the mirror 230 in a direction (to be referred to as a "−a direction" hereinafter) reverse to the a direction perpendicular to the mirror pivot axis m in FIG. 48 approaches to the side of the base 310 (this state will be referred to as "tilt in the −a direction" hereinafter), thereby tilting the mirror 230.

In the mirror device 2 shown in FIG. 48, the mirror connector 221*a* moves in the Y direction. However, the mirror connector 221*b* may move in the Y direction. The moving distance of the mirror connectors 221*a* and 221*b* is freely set as needed in accordance with the position of the mirror device 2 in the mirror array. The moving direction of the mirror connectors 221*a* and 221*b*, i.e., the positive/negative sign of the Y direction from the mirror pivot axis of the conventional mirror device 8200 is freely set as needed in accordance with the position of the mirror device 2 in the mirror array.

Each of the mirror connectors 221*a* and 221*b* may move in the Y direction. In this case, the mirror connectors 221*a* and 221*b* can freely move as needed as long as the mirror pivot axis does not pass through the gravity center of the mirror 230.

Figure 49:
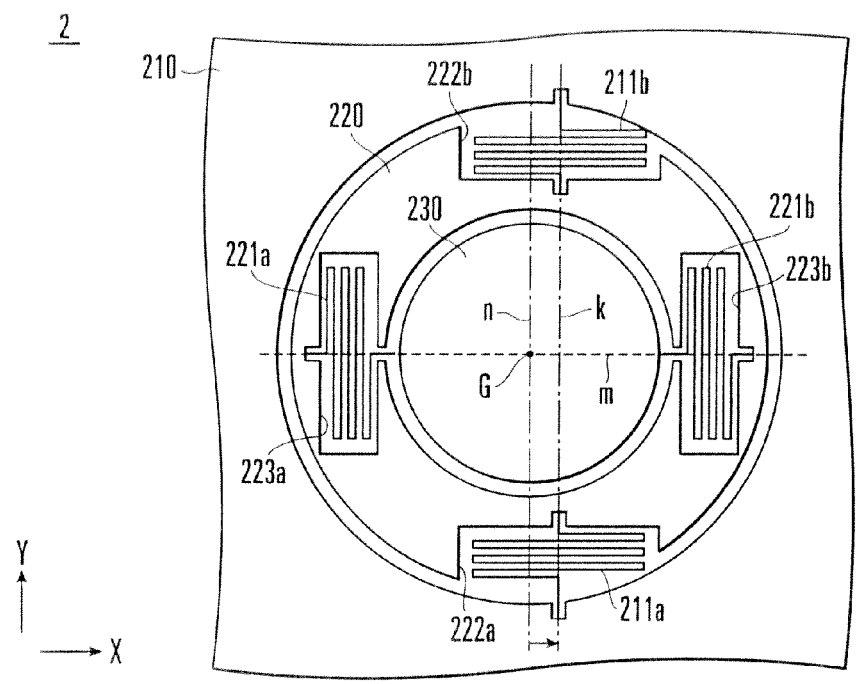
FIG. 49 is a schematic plan view of still another mirror device according to the 13th embodiment.

A mirror device whose movable frame pivot axis does not pass through the gravity center of the mirror will be described next with reference to FIG. 49. FIG. 49 mainly partially illustrates the mirror substrate 200 of the mirror device 2 having a mirror as a constituent unit of a mirror array. The same names and reference numerals as in the mirror device shown in FIG. 45 denote the same constituent elements in FIG. 49, and a description thereof will be omitted as needed.

In the mirror device 2 shown in FIG. 49, the movable frame connectors 211*a* and 211*b* are provided at positions shifted from the movable frame pivot axis of the conventional mirror device 8200, which is indicated by a dotted line n in FIG. 49 and passes through the gravity center G, to the side of the mirror connector 221*b*, i.e., in the X direction. The movable frame pivot axis that is translated for the conventional movable frame pivot axis n in the X direction does not pass through the gravity center of the mirror 230, as indicated by the alternate long and short dashed line k in FIG. 49. On the movable frame pivot axis k, the distance between the movable frame pivot axis and the end of the mirror 230 on the side of the mirror connector 221*a* is longer than the distance between the mirror pivot axis and the end of the mirror 230 on the side of the mirror connector 221*b*. When an attracting force acts on the mirror 230 upon application of a predetermined bias voltage to the electrodes 340*a* to 340*d*, the mirror 230 tilts about the movable frame pivot axis so that the end on the side of the mirror connector 221*a* approaches to the side of the base 310. In this embodiment, individual control voltages are applied to the electrodes 340*a* to 340*d* in this initial state, i.e., in the state wherein the end in a direction (to be referred to as a "−X direction" hereinafter) reverse to the X direction in FIG. 49 approaches to the side of the base 310 (this state will be referred to as "tilt in the −X direction" hereinafter), thereby tilting the mirror 230.

In the mirror device 2 shown in FIG. 49, the moving distance of the movable frame connectors 211*a* and 211*b* is freely set as needed in accordance with the position of the mirror device 2 in the mirror array. The moving direction of the movable frame connectors 211*a* and 211*b*, i.e., the positive/negative sign of the X direction from the movable frame pivot axis of the conventional mirror device 8200 is freely set as needed in accordance with the position of the mirror device 2 in the mirror array.

As in FIG. 48, in the mirror device 2 shown in FIG. 49, one of the movable frame connectors 211*a* and 211*b* may move to prevent the movable frame pivot axis from passing through the gravity center of the mirror 230. In this case, when an attracting force acts on the mirror 230 upon application of a uniform bias voltage to the electrodes 340*a* to 340*d*, the mirror 230 tilts about the movable frame pivot axis that intersects the mirror pivot axis at an arbitrary angle so that the end on the side of one of the mirror connectors 221*a* and 221*b* approaches to the side of the base 310. Even in this case, the distance and direction of movement of the movable frame connectors 211*a* and 211*b* are freely set as needed in accordance with the position of the mirror device 2 in the mirror array.

Each of the movable frame connectors 211*a* and 211*b* may move in the X direction. In this case, the movable frame connectors 211*a* and 211*b* can freely move as needed as tong as the movable frame pivot axis does not pass through the gravity center of the mirror 230.

Figure 50:
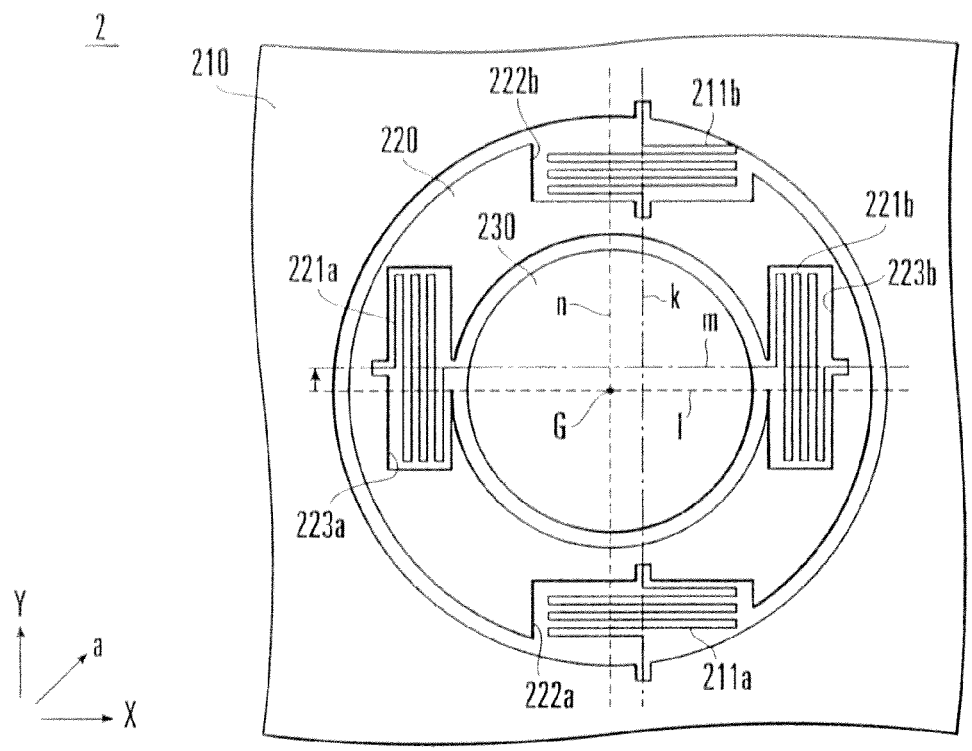
FIG. 50 is a schematic plan view of still another mirror device according to the 13th embodiment.

A mirror device whose movable frame pivot axis and mirror pivot axis do not pass through the gravity center G of the mirror will be described next with reference to FIG. 50. FIG. 50 mainly partially illustrates the mirror substrate 200 of the mirror device 2 having a mirror as a constituent unit of a mirror array. The same names and reference numerals as in the mirror devices shown in FIGS. 45 and 49 denote the same constituent elements in FIG. 50, and a description thereof will be omitted as needed.

In the mirror device 2 shown in FIG. 50, the movable frame connectors 211*a* and 211*b* are provided at positions shifted from the movable frame pivot axis of the conventional mirror device 8200, which is indicated by the dotted line n in FIG. 50 and passes through the gravity center G, to the side of the mirror connector 221*b*, i.e., in the X direction. The mirror connectors 221*a* and 221*b* are provided at positions shifted from the mirror pivot axis of the conventional mirror device 8200, which is indicated by the dotted line l in FIG. 50 and passes through the gravity center G, to the side of the movable frame connector 211*b*, i.e., in the Y direction. The movable frame pivot axis indicated by the alternate long and short dashed line k and the mirror pivot axis indicated by the alternate long and two short dashed line m do not pass through the gravity center of the mirror 230 because they are translated for the conventional movable frame pivot axis n and mirror pivot axis l in the X and Y directions, respectively. On the movable frame pivot axis k, the distance between the movable frame pivot axis and the end of the mirror 230 on the side of the mirror connector 221*a* is longer than the distance between the mirror pivot axis and the end of the mirror 230 on the side of the mirror connector 221*b*. On the mirror pivot axis m, the distance between the mirror pivot axis and the end of the mirror 230 on the side of the movable frame connector 211*a* is longer than the distance between the mirror pivot axis and the end of the mirror 230 on the side of the movable frame connector 211*b*. When an attracting force acts on the mirror 230 in accordance with application of a predetermined bias voltage to the electrodes 340*a* to 340*d*, the mirror 230 tilts about the movable frame pivot axis k and mirror pivot axis m so that the end in a direction (to be referred to as a "−a direction" hereinafter) reverse to the a direction in FIG. 50 approaches to the side of the base 310 (this state will be referred to as "tilt in the −a direction" hereinafter). In this embodiment, individual control voltages are applied to the electrodes 340*a* to 340*d* in this initial state, thereby tilting the mirror 230.

In the mirror device 2 shown in FIG. 50, the moving distances of the movable frame connectors 211*a* and 211*b* and mirror connectors 221a and 221b are freely set as needed in accordance with the position of the mirror device 2 in the mirror array. The moving directions of the movable frame connectors 211a and 211b and mirror connectors 221a and 221b, i.e., the positive/negative sign of the X and Y directions are freely set as needed in accordance with the position of the mirror device 2 in the mirror array.

In the mirror device 2 shown in FIG. 50, the movable frame connectors 211a and 211b and mirror connectors 221a and 221b simultaneously move in the Y direction to prevent the movable frame pivot axis and mirror pivot axis from passing through the gravity center G of the mirror 230. Instead, one of the movable frame connectors 211a and 211b and one of the mirror connectors 221a and 221b may move to prevent the mirror pivot axis from passing through the gravity center G of the mirror 230.

Figure 51:
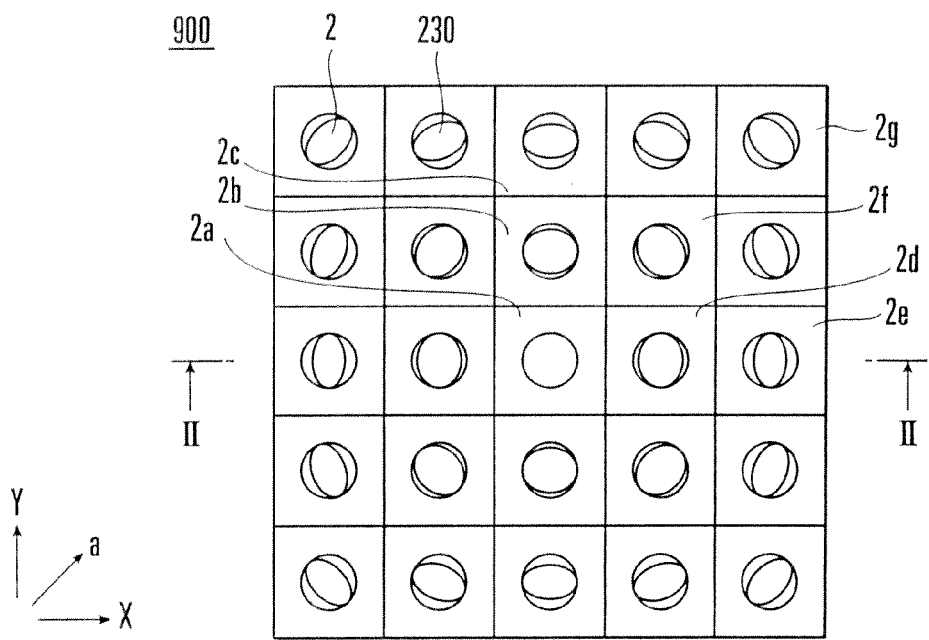
FIG. 51 is a schematic plan view of a mirror array according to the 13th embodiment.

A mirror array according to this embodiment will be described next with reference to FIG. 51. FIG. 51 illustrates a state wherein a predetermined bias voltage is applied to the electrodes 340a to 340d. Each mirror device shown in FIG. 51 is in the state shown in FIG. 45, 48, 49, or 50 viewed from the front side. That is, each mirror device has the mirror connectors 221a and 221b in the horizontal direction and the movable frame connectors 211a and 211b in the vertical direction.

In a mirror array 900 according to this embodiment, the mirror devices 2 described with reference to FIGS. 45, 48, 49, and 50 are two-dimensionally arranged in a matrix. The mirror array 900 corresponds to the mirror arrays 510 an 520 of the optical switch 600 shown in FIG. 29. In the mirror array 900, at least one of the movable frame connectors 211a and 211b and mirror connectors 221a and 221b is formed at a position that does not pass through the gravity center of the mirror 230 so that the mirror 230 reflects a light beam to a mirror located at the center of the counter mirror array in the initial state wherein a uniform bias voltage is applied to the electrodes 340a to 340d. In a mirror device 2a located at the center of the mirror array 900, the movable frame connectors 211a and 211b and mirror connectors 221a and 221b are formed such that the movable frame pivot axis and mirror connectors pass through the gravity center of the mirror 230 while intersecting each other at a right angle.

For example, in a mirror device 2b adjacent to the mirror device 2a in the Y direction, the mirror connectors 221a and 221b move in the +Y direction from the gravity center G such that the mirror 230 tilts in the −Y direction in the initial state, like the mirror device 2 shown in FIG. 45. In a mirror device 2c adjacent to the mirror device 2b in the Y direction, the mirror connectors 221a and 221b move in the Y direction more than the mirror connectors 221a and 221b of the mirror device 2b such that the mirror 230 tilts in the −Y direction more than the mirror 230 of the mirror device 2b in the initial state.

In a mirror device 2d adjacent to the mirror device 2a in the X direction, the movable frame connectors 211a and 211b move in the +X direction from the gravity center G such that the mirror 230 tilts in the −X direction in the initial state, like the mirror device 2 shown in FIG. 49. In a mirror device 2e adjacent to the mirror device 2d in the X direction, the movable frame connectors 211a and 211b move in the +X direction more than the movable frame connectors 211a and 211b of the mirror device 2d such that the mirror 230 tilts in the −X direction more than the mirror 230 of the mirror device 2d in the initial state.

In a mirror device 2f adjacent to the mirror device 2a in the X and Y directions, i.e., in the direction of the arrow a in FIG. 50, the mirror connector 221a moves in the +Y direction from the gravity center G such that the mirror 230 tilts in and −X and −Y directions, i.e., a direction (to be referred to as a "−a direction" hereinafter) reverse to the arrow a in FIG. 50 more than in the mirror device 2a, like the mirror device 2 shown in FIG. 48. In a mirror device 2g adjacent to the mirror device 2f in the a direction, the mirror connector 221a moves in the +Y direction more than the mirror connector 221a of the mirror device 2f such that the mirror 230 tilts in the −a direction more than the mirror 230 of the mirror device 2f in the initial state.

In the mirror devices 2f and 2g, the movable frame connector 211a may move in the +X direction. In the mirror devices 2f and 2g, the movable frame connectors 211a and 211b and mirror connectors 221a and 221b may move in the +X and +Y directions, respectively. In the mirror devices 2f and 2g, the movable frame connector 211a and mirror connector 221a may move in the +Y and +X directions, respectively.

As described above, the positions of the movable frame connectors 211a and 211b and mirror connectors 221a and 221b are set in accordance with the position of the mirror device in the mirror array 900. When a bias voltage having a uniform magnitude is applied to the electrodes 340a to 340d, the mirror 230 of each mirror device 2 of the mirror array 900 tilts to reflect a received light beam to the mirror at the center of the counter mirror array. This reflecting operation is the same as that described in the ninth embodiment with reference to FIG. 30.

FIG. 30 is a sectional view taken along a line II-II in FIG. 51. FIG. 30 schematically illustrates the sections of the mirrors 230 of the plurality of mirror devices 2 arranged in mirror arrays 510 and 520 each including the mirror array 900. Each of mirrors 511 to 515 of the mirror array 510 and mirrors 521 to 525 of the mirror array 520 corresponds to the mirror 230 included in the above-described mirror array 900. The mirror arrays 510 and 520 shown in FIG. 30 correspond to the mirror arrays 510 and 520, respectively, of the optical switch 600 shown in FIG. 29.

As described above, in this embodiment, the movable frame connectors 211a and 211b and mirror connectors 221a and 221b are provided such that at least one of the movable frame pivot axis and mirror pivot axis does not pass through the gravity center of the mirror 230. Since the mirror tilts by a predetermined angle in the initial state, the mirror tilt angle can be small consequently. Accordingly, the driving voltage of the mirror device and mirror array can be low.

The mirror device and mirror array according to this embodiment are manufactured by the same manufacturing method as in the above-described ninth embodiment.

In this embodiment, in the step of forming, in the single-crystal silicon layer, trenches conforming to the shapes of the frame portion 210, movable frame connectors 211a and 211b, movable frame 220, mirror connectors 221a and 221b, and mirror 230, the movable frame connectors 211a and 211b and mirror connectors 221a and 221b are formed while shifting their positions in the above-described X and Y directions depending on the position in the mirror array.

The positions of the movable frame connectors 211a and 211b and mirror connectors 221a and 221b of each mirror device 2 of the thus manufactured mirror array 900 are adjusted in accordance with its position in the mirror array 900. Each mirror device reflects a light beam to the mirror at the center of the counter mirror array upon applying a predetermined bias voltage to the electrodes 340a to 340d. This allows to decrease the tilt angle of the mirror 230 of each mirror device 2. Additionally, since the mirror 230 tilts in the initial state, the operation range of the mirror 230 is small, and consequently, low voltage driving is possible.

FIG. 38 shows a modification of the mirror substrate 200. In this embodiment, as described above, the movable frame connectors 211a and 211b are provided in the first notches 222a and 222b formed in the movable frame 220. However, the movable frame connectors 211a and 211b need not always exist there and may exist in third notches 224a and 224b formed in the frame portion 210, as shown in FIG. 38. Even in the mirror substrate 200, it is possible to reduce the tilt angle of the mirror 230 by preventing the movable frame pivot axis and mirror pivot axis from passing through the gravity center of the mirror 230.

The electrodes 340a to 340d need not always exist on the base 310 and may exist on, e.g., a projecting portion provided on the base 310. Alternatively, the electrodes 340a to 340d may exist on the projecting portion and base 310.

In this embodiment, the mirror array 900 shown in FIG. 51 has 5×5 mirror devices 2. However, the number of mirror devices 2 provided in the mirror array 900 is not limited to 5×5 and can freely be set as needed.

The mirror device 2 and mirror array according to this embodiment are usable not only in an optical switch but also in a measurement device, display, and scanner. In this case, the projecting portion 320 and electrodes 340a to 340d of the mirror device 2 are provided at arbitrary positions in accordance with the application purpose and specifications.

In this embodiment, a bias voltage and displacement electrodes are applied to the electrodes 340a to 340d. However, only the displacement voltages may be applied.

As described above, according to this embodiment, since the mirror pivot axis does not pass through the gravity center, the mirror tilts by a predetermined angle upon bias voltage application to the electrodes. Since the mirror is tilted by applying control voltages in this tilted state, the mirror tilt angle can be small. Since the tilt angle is small, low voltage driving is possible.

14th Embodiment

The 14th embodiment of the present invention will be described next.

Although not illustrated in FIGS. 107 and 108, when a mirror array includes a plurality of mirrors 8103 (mirror devices) two-dimensionally integrated, conventionally, interconnections to supply a voltage to driving electrodes 8003-1 to 8003-4 of a second mirror device pass near the mirror 8103 of a given mirror device (to be referred to as a first mirror device hereinafter). Since a driving voltage is applied to the interconnections, the mirror 8103 of the first mirror device also receives an electrostatic force from the interconnections. Hence, a tilt angle θ of the mirror 8103 has a value shifted from the appropriate angle decided by the voltage applied to the driving electrodes 8003-1 to 8003-4 of the first mirror device. In addition, the driving voltage applied to the driving electrodes 8003-1 to 8003-4 of the second mirror device changes any time depending on the state of the optical switch. For this reason, with an influence from the interconnections to the plurality of second mirror devices, it is difficult to control the tilt angle of the mirror 8103 of the first mirror device.

Such interference from interconnections is negligible if the mirror 8103 is excessively spaced apart from the interconnections. This increases the layout pitch of the mirrors 8103 and uneconomically increases the size of the entire mirror array. In the optical switch, a pair of mirror arrays facing each other exchange a light beam. If the mirror layout pitch in the mirror array increases, the tilt angle θ required for each mirror 8103 also increases to make manufacturing difficult. There is a requirement for arranging the plurality of mirrors 8103 close as much as possible. If the interconnections can be led to the lower surface side of a lower substrate 8001 by forming vertical holes in the lower substrate 8001 with the driving electrodes 8003-1 to 8003-4, it is possible to suppress interference from the interconnections while arranging the plurality of mirrors 8103 in the vicinity. However, leading the interconnections to the lower surface side of the lower substrate 8001 is technically difficult. That is, it is preferable in manufacturing to two-dimensionally form the interconnections on the surface of the lower substrate 8001. However, if the interconnections exist near the mirror 8103, interference of the interconnections to the mirror 8103 is not negligible.

This embodiment has been made to solve the above-described problem and has as its object to suppress an unexpected variation in the mirror tilt angle due to interference from interconnections in the neighborhood in a mirror device and a mirror array including a plurality of mirror devices arranged two-dimensionally.

Figure 52:
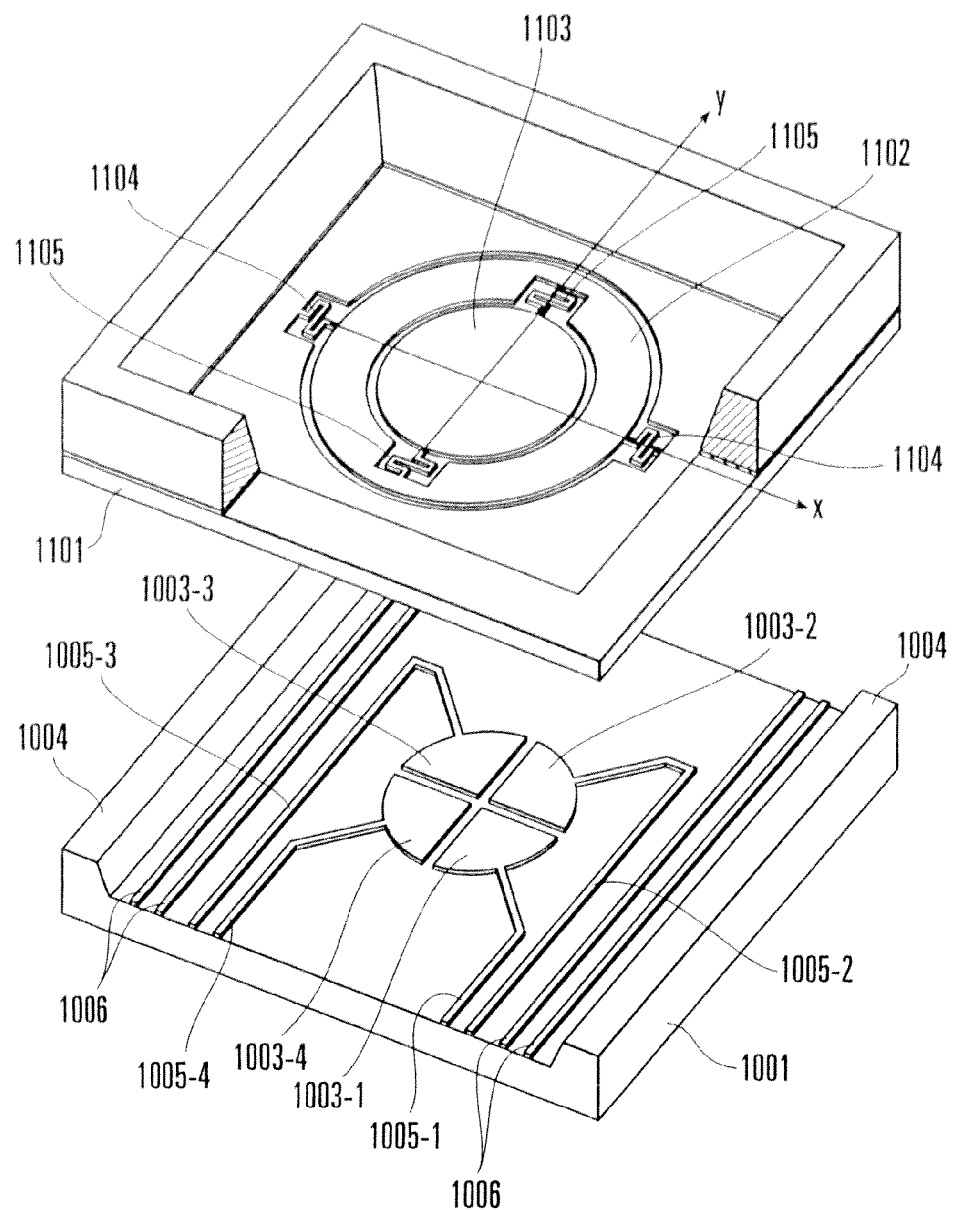
FIG. 52 is an exploded perspective view showing the structure of a mirror device according to the 14th embodiment.
Figure 53:
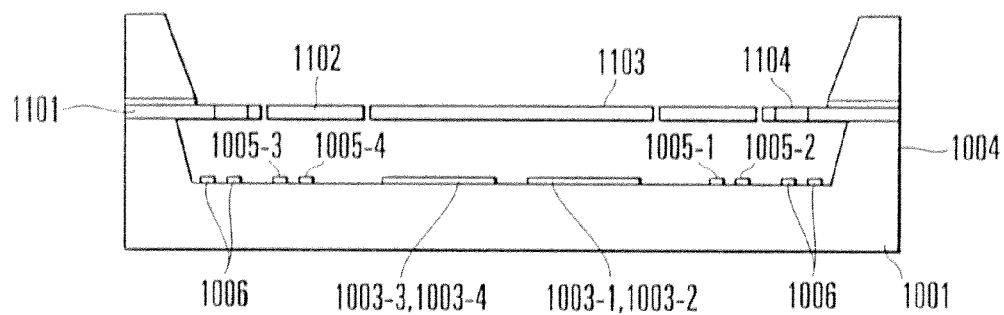
FIG. 53 is a sectional view of the mirror device shown in FIG. 52.

In this embodiment, as shown in FIGS. 52 and 53, four driving electrodes 1003-1 to 1003-4 are provided at the center of a lower substrate 1001 made of single-crystal silicon. Supports 1004 of single-crystal silicon are provided on both sides of the upper surface of the lower substrate 1001.

An upper substrate 1101 has an annular gimbal 1102 inside. A mirror 1103 is provided inside the gimbal 1102. For example, a Ti/Pt/Au layer with a three-layered structure is formed on the upper surface of the mirror 1103. Torsion springs 1104 connect the upper substrate 1101 to the gimbal 1102 at two 180° opposite points. Similarly, torsion springs 1105 connect the gimbal 1102 to the mirror 1103 at two 180° opposite points. The X-axis passing through the pair of torsion springs 1104 and the Y-axis passing through the pair of torsion springs 1105 intersect at a right angle. As a result, the mirror 1103 can pivot around the X- and Y-axes each serving as a pivot axis. The upper substrate 1101, gimbal 1102, mirror 1103, and torsion springs 1104 and 1105 are integrally made of single-crystal silicon.

The structure of the lower substrate 1001 and the structure of the upper substrate 1101 shown in FIGS. 52 and 53 are separately manufactured. The upper substrate 1101 is soldered to the supports 1004 so that the upper substrate 1101 bonds to the lower substrate L001. In this mirror device, the mirror 1103 is grounded. A positive voltage is applied to the driving electrodes 1003-1 to 1003-4 to generate an asymmetrical potential difference between the driving electrodes 1003-1 to 1003-4. An electrostatic force attracts the mirror 1103 and causes it to pivot in an arbitrary direction.

In this embodiment, interconnections 1005-1 to 1005-4 are formed on the upper substrate 1101. The interconnections 1005-1 to 1005-4 connect to the driving electrodes 1003-1 to 1003-4, respectively, to supply a driving voltage from a power supply (not shown) to the driving electrodes 1003-1 to 1003-4. Interconnections 1006 connect to the driving electrodes (not shown) of other mirror devices formed on the same substrates 1001 and 1101 as those of the mirror device shown in FIGS. 52 and 53 to supply a driving voltage to the driving electrodes.

In the mirror device shown in FIGS. 52 and 53, if the interconnections 1005-1 to 1005-4 and 1006 run in parallel to the X- and Y-axes, they have strong influence on pivotal movement of the gimbal 1102 about the X-axis and the mirror 1103 about the Y-axis. Especially, the interconnections 1005-1 to 1005-4 and 1006 readily influence on the gimbal 1102 outside the mirror 1103. This is because the gimbal 1102 exists closer to the interconnections 1005-1 to 1005-4 and 1006 than the mirror 1103.

On the other hand, if the interconnections 1005-1 to 1005-4 and 1006 exist in a direction perpendicular to the X-axis, they hardly interfere with pivotal movement of the gimbal 1102 about the X-axis. Similarly, if the interconnections 1005-1 to 1005-4 and 1006 exist in a direction perpendicular to the Y-axis, they hardly interfere with pivotal movement of the mirror 1103 about the Y-axis.

In this embodiment, with emphasis on suppressing the influence of the interconnections 1005-1 to 1005-4 and 1006 on the gimbal 1102 that readily receives the influence, the interconnections 1005-1 to 1005-4 and 1006 are provided in the Y direction perpendicular to the pivot axis of the gimbal 1102. The influence on the pivotal movement of the mirror 1103 is suppressed by increasing the distance between the mirror 1103 and the interconnections 1005-1 to 1005-4 and 1006, as will be described below.

When the accuracy of tilt angle control of the mirror 110 is about 1/1000 of the total tilt angle, the influence of the interconnections 1005-1 to 1005-4 and 1006 is allowable in the same or less degree. The accuracy of about 1/1000 of the total tilt angle corresponds to a beam position accuracy of about 10 μm when 10×10 mirrors 1103 having a diameter of, e.g., 500 μm are arranged at a pitch of 1

Figure 54:
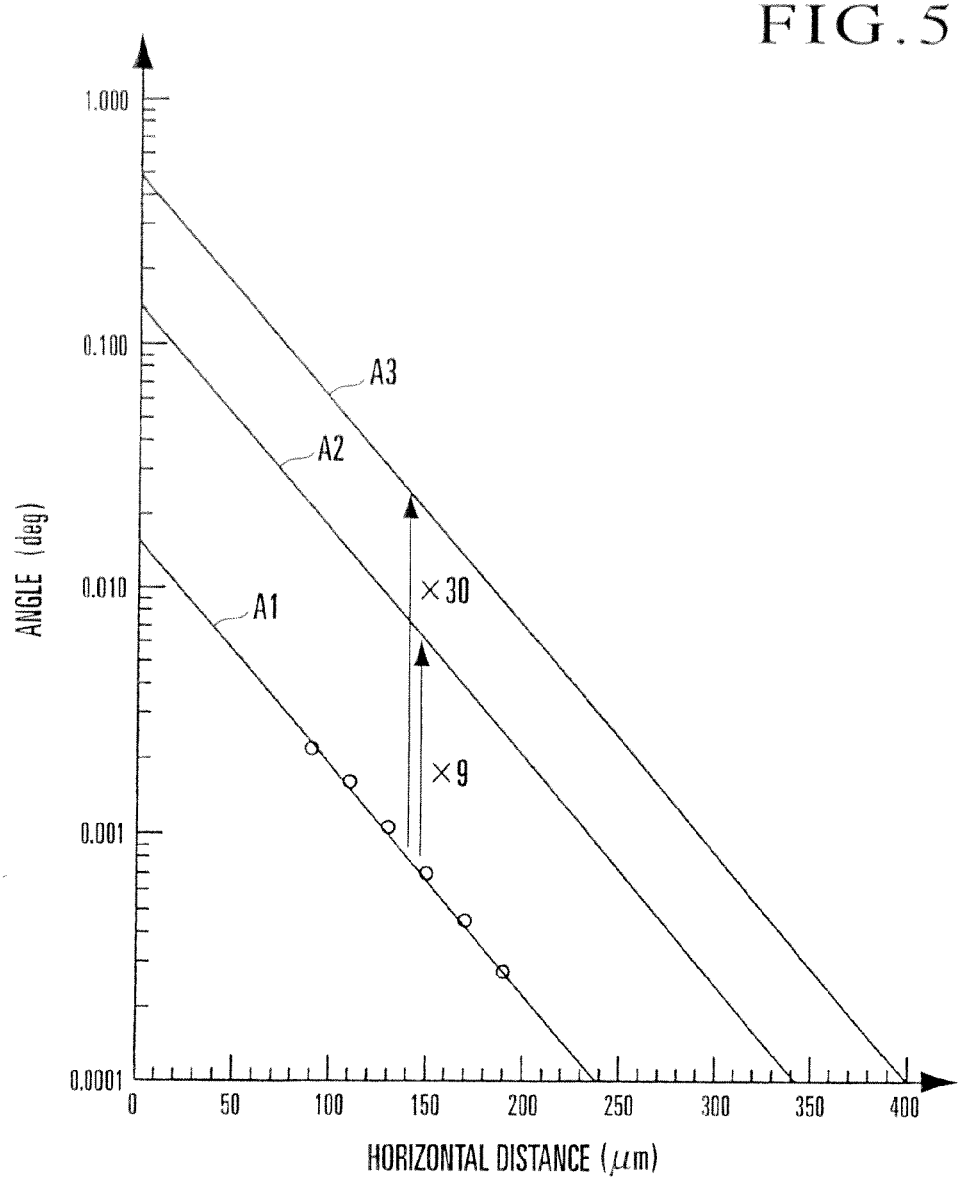
FIG. 54 is a graph showing an actual measurement result of the influence of an electrostatic force from interconnections on a mirror 1103.
Figure 55:
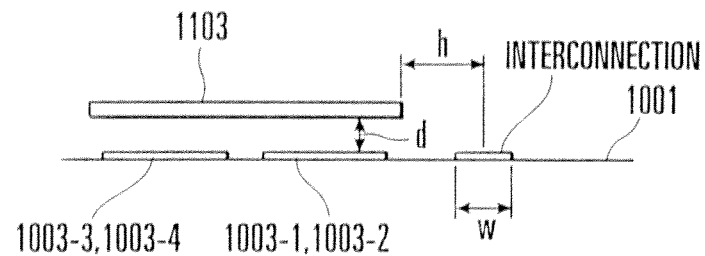
FIG. 55 is a view for explaining the arrangement conditions of the mirror 1103, driving electrodes 1003-1 to 1003-4, and interconnections in measuring the data shown in FIG. 54.

The actual measurement result of the influence of the electrostatic force from the interconnections on the mirror 1103 will be described with reference to FIGS. 54 and 55. Referring to FIG. 54, the abscissa represents a horizontal distance h from an end of the mirror 1103 to an interconnection, and the ordinate represents the shift of the tilt angle of the mirror 1103 generated by the electrostatic force from the interconnection. The rotation spring rigidity of the torsion spring 1105 is $2.4 \times 10^{-9}$ Nm, the voltage applied to the interconnection is 80 V, a width W of the interconnection is 9 μm, and a distance d between the mirror 1103 and the driving electrodes 1003-1 to 1003-4 is 87.8 μm.

An actual measurement result obtained under these conditions is a characteristic A1 in FIG. 54. Under actual use conditions, the driving voltage is, e.g., about 240 V at maximum. The characteristic A1 changes to a characteristic A2 in FIG. 54 when the driving voltage is 240 V. In the characteristic A2, the angle shift of the mirror 1103 is about nine times as compared to the characteristic A1. The characteristics A1 and A2 are obtained assuming that only one interconnection exists. When the driving voltage of 240 V is applied to 12 interconnections (the total interconnection width W is 200 μm), the characteristic A1 changes to a characteristic A3 in FIG. 54. In the characteristic A3, the angle shift of the mirror 1103 is about 30 times as compared to the characteristic A1.

As is apparent from the characteristic A3 in FIG. 54, when the horizontal distance h equals the distance d between the mirror 1103 and the driving electrodes 1003-1 to 1003-4, the angle shift decreases by about an order of magnitude as compared to the case of h=0. When h=2 d, the angle shift decreases by about two orders of magnitude as compared to the case of h=0. When h=4 d, the angle shift decreases by about three orders of magnitude. This result indicates that the influence of the interconnections decreases to an effectively negligible level when the interconnections 1005-1 to 1005-4 and 1006 are spaced apart from the mirror 1103 by, e.g., about 4 d.

In this embodiment, therefore, an unexpected variation in the tilt angle of the mirror 1103 due to interference from the interconnections 1005-1 to 1005-4 and 1006 can be suppressed by providing the interconnections 1005-1 to 1005-4 and 1006 in the direction perpendicular to the pivot axis of the gimbal 1102. This suppressing effect can further increase when the interconnections 1005-1 to 1005-4 and 1006 are spaced apart from the mirror 1103. In a uniaxial-pivot mirror device without any gimbal, the interconnections 1005-1 to 1005-4 and 1006 are provided in a direction perpendicular to the pivot axis of the mirror 1103.

As described above, according to this embodiment, in a uniaxial-pivot mirror device having mirror supported to pivot with respect to the upper substrate, interconnections connected to the driving voltages are arranged on the lower substrate perpendicularly to the pivot axis of the mirror, thereby suppressing an unexpected variation in the mirror tilt angle due to interference from the interconnections. Additionally, since it is unnecessary to form interconnections on the lower surface side of the lower substrate, the variation in the mirror tilt angle can be suppressed while maintaining easy manufacturing.

According to this embodiment, in a biaxial-pivot mirror device that has an annular gimbal supported to pivotal with respect to the upper substrate and a mirror supported to pivotal with respect to the gimbal and pivots about two axes that intersect at a right angle, interconnections connected to the driving voltages are arranged on the lower substrate perpendicularly to the pivot axis of the gimbal, thereby suppressing an unexpected variation in the mirror angle due to interference from the interconnections. Additionally, since it is unnecessary to form interconnections on the lower surface side of the lower substrate, the variation in the mirror tilt angle can be suppressed while maintaining easy manufacturing.

15th Embodiment

Figure 56:
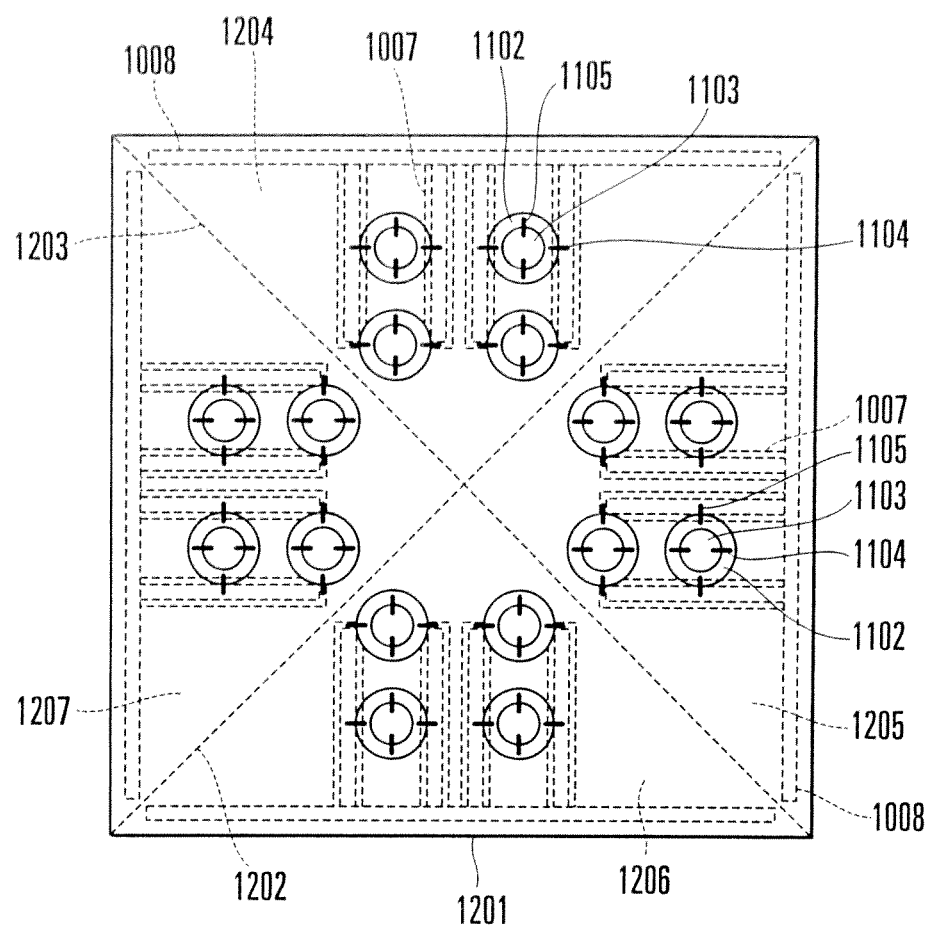
FIG. 56 is a plan view showing the layout of mirror devices and interconnections in a mirror array according to the 15th embodiment.

In the 14th embodiment, the interconnections of a single mirror device have been described. In the 15th embodiment, the interconnections of a mirror array including a plurality of mirror devices arranged two-dimensionally will be described with reference to FIG. 56. The same reference numerals as in FIGS. 52 and 53 denote the same parts in FIG. 56. Referring to FIG. 56, interconnections 1007 connect to the driving electrodes of each mirror device (the interconnections 1007 correspond to the interconnections 1005-1 to 1005-4 and 1006 in FIGS. 52 and 53). Electrode terminals 1008 for wire bonding connect to the interconnections 1007.

In the mirror array shown in FIG. 56, the electrode terminals 1008 connected to an external power supply are arranged at the outer periphery of a rectangular mirror arrangement region 1201. The interconnections 1007 run from the electrode terminal 1008 toward the center. This realizes an efficient interconnection layout.

In this embodiment, two diagonal lines 1202 and 1203 divide the mirror arrangement region 1201 into four divided regions 1204 to 1207. In two arbitrary adjacent divided regions surrounded by two intersecting sides of the mirror arrangement region 1201 and the diagonal lines 1202 and 1203, the mirror devices are arranged while making the pivot axes (axes passing through pairs of torsion springs 1104) of gimbals 1102 intersect at a right angle. For example, the divided region 1204 has the gimbals 1102 with their pivot axes set in the horizontal direction in FIG. 56. The divided region 1205 adjacent to the divided region 1204 has the gimbals 1102 with their pivot axes set in the vertical direction in FIG. 56. In the divided regions 1204 to 1207, the interconnections 1007 run perpendicularly to the pivot axes of the gimbals 1102, as in the 14th embodiment.

In this way, this embodiment can suppress the unexpected variation in the tilt angle of the mirror 1103 due to interference from the interconnections 1007.

As described above, according to this embodiment, in a mirror array having a plurality of biaxial-pivot mirror devices arranged two-dimensionally, two arbitrary adjacent divided regions surrounded by two intersecting sides of the rectangular mirror arrangement region and the diagonal lines have the mirror devices including gimbals with pivot axes intersecting at a right angle. In each divided region, the interconnections connected the driving electrodes run on the lower substrate perpendicularly to the pivot axes of the gimbals. This structure can suppress any unexpected variation in the mirror tilt angle due to interference from the interconnections.

16th Embodiment

The 16th embodiment of the present invention will be described next. This embodiment suppresses an unexpected variation in the mirror tilt angle due to interference from interconnections by arranging, at a position closer to the interconnections than a mirror, a conductive member equipotential to the mirror. The same names as in the 14th embodiment denote the same constituent elements in the 16th embodiment.

Figure 57:
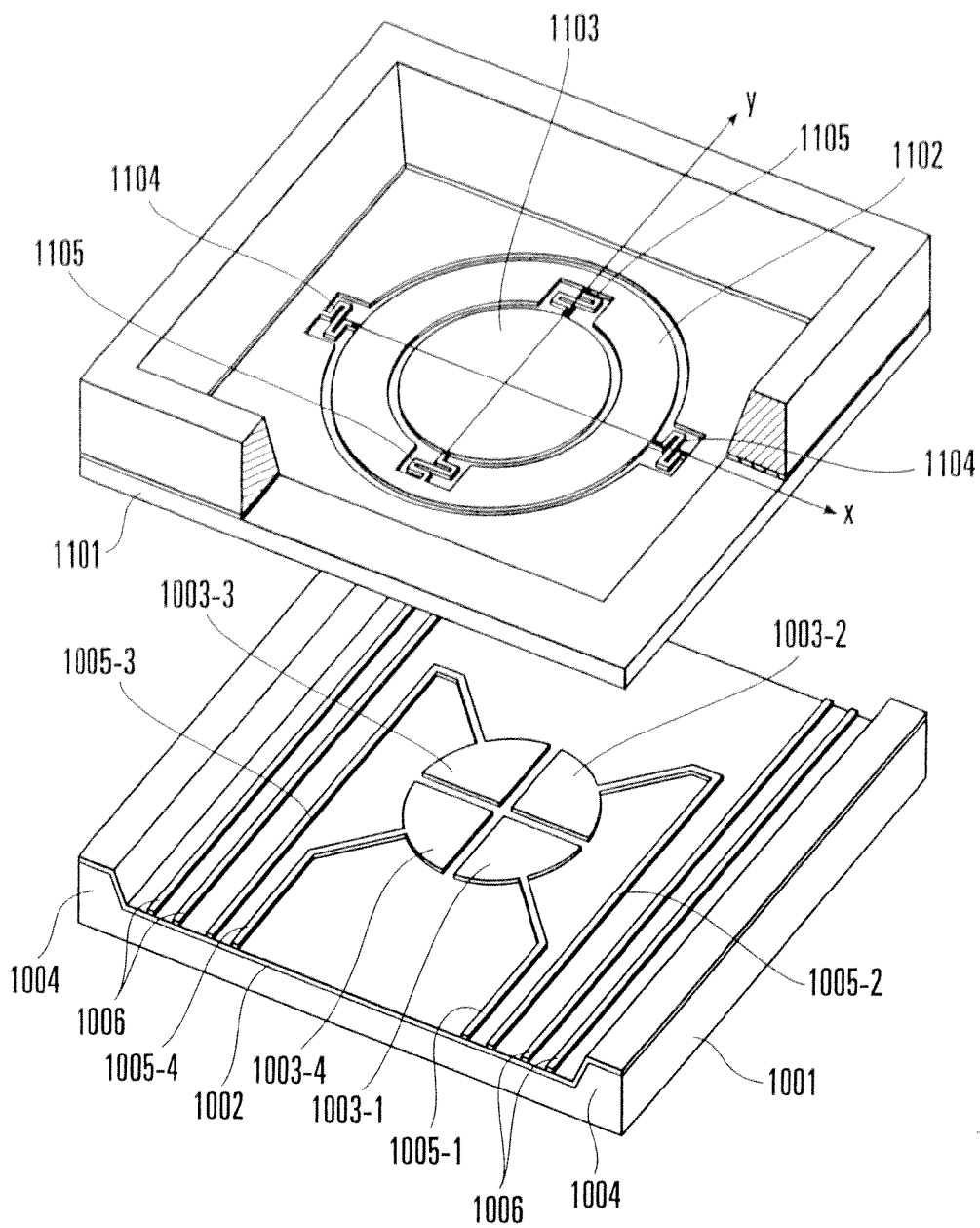
FIG. 57 is an exploded perspective view showing the structure of a mirror device according to the 16th embodiment.
Figure 58:
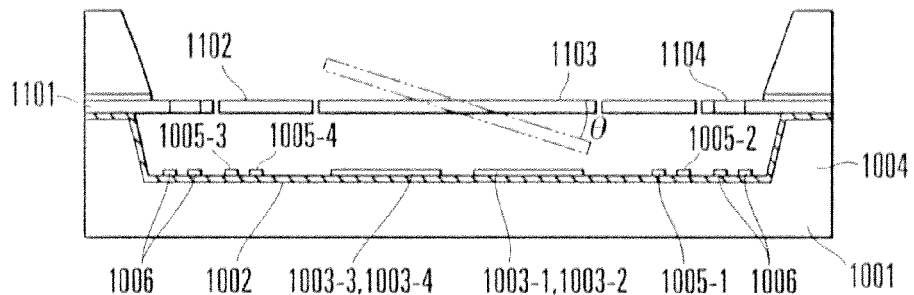
FIG. 58 is a sectional view of the mirror device shown in FIG. 57.

As shown in FIGS. 57 and 58, an insulating layer 1002 made of a silicon oxide film is formed on a lower substrate 101 of single-crystal silicon. Four driving electrodes 1003-1 to 1003-4 are provided on the insulating layer 1002 at the center of the lower substrate 1001. Supports 1004 of single-crystal silicon are provided on both sides of the upper surface of the lower substrate 1001. Interconnections 1005-1 to 1005-4 connect to the driving electrodes 1003-1 to 1003-4, respectively, to supply a driving voltage from a power supply (not shown) to the driving electrodes 1003-1 to 1003-4. Interconnections 1006 connect to the driving electrodes (not shown) of other mirror devices formed on the same substrates 1001 and 1101 as those of the mirror device shown in FIGS. 57 and 58 to supply a driving voltage to the driving electrodes.

The upper substrate 1101 has an annular gimbal 1102 inside. A mirror 1103 is provided inside the gimbal 1102. For example, a Ti/Pt/Au layer with a three-layered structure is formed on the upper surface of the mirror 1103. Torsion springs 1104 connect the upper substrate 1101 to the gimbal 1102 at two 180° opposite points. Similarly, torsion springs 1105 connect the gimbal 1102 to the mirror 1103 at two 180° opposite points. The X-axis passing through the pair of torsion springs 1104 and the Y-axis passing through the pair of torsion springs 1105 intersect at a right angle. As a result, the mirror 1103 can pivot around the X- and Y-axes each serving as a pivot axis. The upper substrate 1101, gimbal 1102, mirror 1103, and torsion springs 1104 and 1105 are integrally made of single-crystal silicon.

The structure of the lower substrate 1001 and the structure of the upper substrate 1101 shown in FIGS. 57 and 58 are separately manufactured. The upper substrate 1101 is soldered to the supports 1004 so that the upper substrate 1101 bonds to the lower substrate 1001. In this mirror device, the mirror 1103 is grounded. A positive or negative voltage is applied to the driving electrodes 1003-1 to 1003-4 to generate an asymmetrical potential difference between the driving electrodes 1003-1 to 1003-4. An electrostatic force attracts the mirror 1103 and causes it to pivot in an arbitrary direction.

As described above, the upper substrate 1101, gimbal 1102, mirror 1103, and torsion springs 1104 and 1105 are integrally made of single-crystal silicon. A predetermined potential (e.g., ground potential) is applied to the mirror 1103 through the upper substrate 1101, torsion springs 1104, gimbal 1102, and torsion springs 1105.

Figure 59:
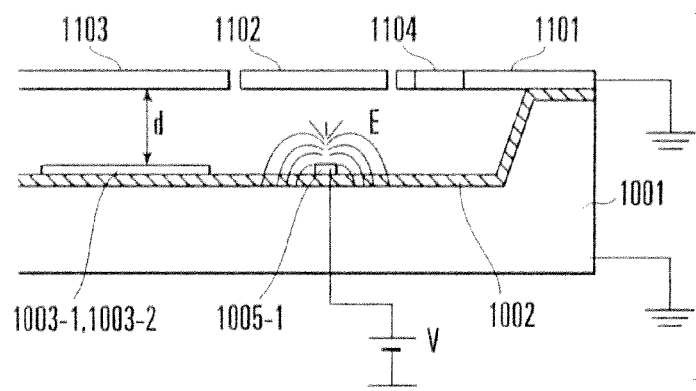
FIG. 59 is a view for explaining the principle of suppressing variations in the tilt angle of a mirror in the 16th embodiment.

As a characteristic feature of this embodiment, a conductive member equipotential to the mirror 1103 is arranged at a position closer to the interconnections 1005-1 to 1005-4 and 1006 than the mirror 1103. This structure suppresses any unexpected variation in the tilt angle of the mirror 1103 due to interference from the interconnections 1005-1 to 1005-4 and 1006. In this embodiment, the lower substrate (conductive substrate) 1001 of single-crystal silicon serves as the conductive member equipotential to the mirror 1103. That is, the lower substrate 1001 is equipotential to the mirror 1103, as shown in FIG. 59.

A distance d between the mirror 1103 and the driving electrodes 1003-1 to 1003-4 is, e.g., about 90 μm. Since the thickness of the insulating layer 1002 that exists between the interconnections 1005-1 to 1005-4 and 1006 and the lower substrate 1001 is smaller than the distance d, the lower substrate 1001 is closer to the interconnections 1005-1 to 1005-4 and 1006 than the mirror 1103. For this reason, when the lower substrate 1001 is equipotential to the mirror 1103, most of lines E of electric force generated by applying a voltage V to the interconnection 1005-1 terminate on the side of the lower substrate 1001, as shown in FIG. 59. This also applies to the remaining interconnections 1005-2 to 1005-4, although FIG. 59 shows only the lines of electric force of the interconnection 1005-1, for the illustrative convenience. According to this embodiment, it is possible to suppress any unexpected variation in the tilt angle of the mirror 1103 due to interference from the interconnections 1005-1 to 1005-4 and 1006.

When an insulating substrate is used as the lower substrate, the lines of electric force from the interconnections terminate on the mirror-side substrate, resulting in stronger interference to the mirror. Even with such an insulating substrate, the same effect as in this embodiment is available if shielding interconnections equipotential to the mirror are arranged adjacent to the interconnections. However, the shielding interconnections consume an extra area so no wide spacing between the interconnections and the mirror can be maintained.

As described above, according to this embodiment, the expected variation in the mirror tilt angle due to interference from the interconnections can be suppressed by arranging, at a position closer to the interconnections than the mirror, a conductive member equipotential to the mirror. In this embodiment, since it is unnecessary to form interconnections on the lower surface side of the lower substrate, the variation in the mirror tilt angle can be suppressed while maintaining easy manufacturing. In this embodiment, since the lower substrate serves as the conductive member equipotential to the mirror, the conductive member located closer to the interconnections than the mirror can easily be obtained.

17th Embodiment

Figure 60:
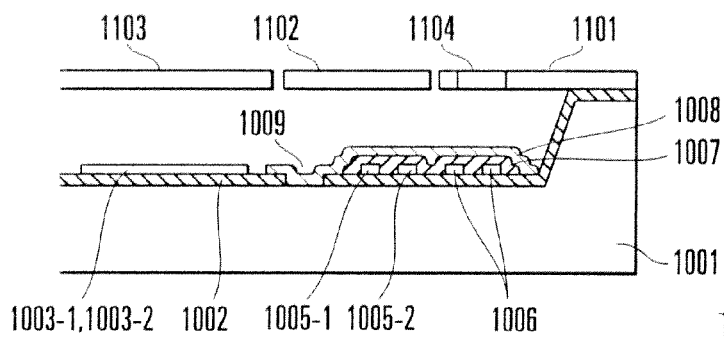
FIG. 60 is a sectional view showing the structure of the main part of a mirror device according to the 17th embodiment.

The 17th embodiment of the present invention will be described next. The same reference numerals as in FIGS. 57 and 58 denote the same parts in FIG. 60.

In this embodiment, a lower substrate 1001 serves as a conductive member equipotential to a mirror 1103, as in the 16th embodiment. In addition, a conductive layer 1008 formed on an insulating layer 1007 on interconnections 1005-1 to 1005-4 and 1006 also serves as a conductive member equipotential to the mirror 1103.

The conductive layer 1008 electrostatically shields the interconnections 1005-1 to 1005-4 and 1006 to enhance the effect of the first embodiment that suppresses the unexpected variation in the tilt angle of the mirror 1103 clue to interference from the interconnections 1005-1 to 1005-4 and 1006.

To make the conductive layer 1008 equipotential to the mirror 1103, a contact hole 1009 is formed by partially removing an insulating layer 1002 on the surface of the lower substrate 1001. This structure can directly connect the conductive layer 1008 to the lower substrate 1001 without routing an interconnection to make the conductive layer 1008 equipotential to the mirror 1103. It is therefore easy to ensure electrical connection to the isolated conductive layer 1008 that has difficulty in interconnection.

As described above, according to this embodiment, a conductive layer formed on an insulating layer on the interconnections serves as a conductive member equipotential to the mirror. This enhances the effect of suppressing the unexpected variation in the mirror tilt angle due to interference from the interconnections.

18th Embodiment

Figure 61:
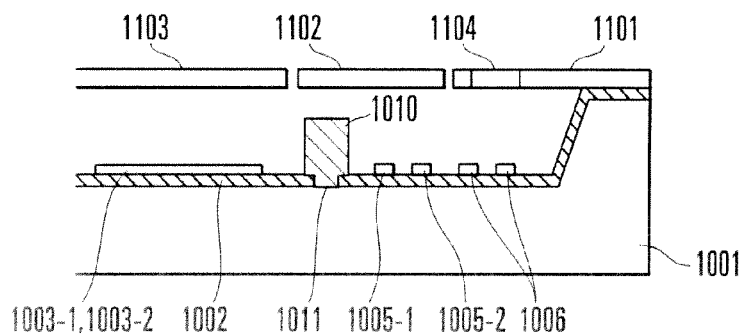
FIG. 61 is a sectional view showing the structure of the main part of a mirror device according to the 18th embodiment.

The 18th embodiment of the present invention will be described next. The same reference numerals as in FIGS. 57 and 58 denote the same parts in FIG. 61.

In this embodiment, a lower substrate 1001 serves as a conductive member equipotential to a mirror 1103, as in the 16th embodiment. In addition, a conductive wall-shaped member 1010 arranged between the mirror 1103 and interconnections 1005-1 to 1005-4 and 1006 also serves as a conductive member equipotential to the mirror 1103.

The wall-shaped member 1010 shields the interconnections 1005-1 to 1005-4 and 1006 from the mirror 1103 to enhance the effect of the 16th embodiment that suppresses the unexpected variation in the tilt angle of the mirror 1103 due to interference from the interconnections 1005-1 to 1005-4 and 1006.

To make the wall-shaped member 1010 equipotential to the mirror 1103, a contact hole 1011 is formed by partially removing an insulating layer 1002, as in the 17th embodiment. The lower substrate 101 is formed on the contact hole 1011. This structure can easily make the wall-shaped member 1010 equipotential to the mirror 1103.

As described above, according to this embodiment, a conductive wall-shaped member arranged between the mirror and the interconnections serves as a conductive member equipotential to the mirror. This enhances the effect of suppressing the unexpected variation in the mirror tilt angle due to interference from the interconnections.

In the 16th to 18th embodiments, increasing the distance between the mirror 1103 and the interconnections 1005-1 to 1005-4 and 1006 can enhance the effect of the 16th to 18th embodiments. When the accuracy of tilt angle control of the mirror 1103 is about 1/1000 of the total tilt angle, the influence of the interconnections 1005-1 to 1005-4 and 1006 is allowable in the same or less degree. The accuracy of about 1/1000 of the total tilt angle corresponds to a beam position accuracy of about 10 μm when 10×10 mirrors 1103 having a diameter of, e.g., 500 μm are arranged at a pitch of 1 mm.

19th Embodiment

The 19th embodiment of the present invention be described next.

A conventional mirror device will be described first with reference to FIGS. 62 and 63. The same reference numerals as in FIGS. 107 and 108 denote the same constituent elements in FIGS. 62 and 63.

A terrace-shaped projecting portion 8005 is provided at the center of a lower substrate 8001 of single-crystal silicon. Four driving electrodes 8003-1 to 8003-4 are provided on an insulating layer 8002 made of a silicon oxide film on the four corners of the projecting portion 8005 and the lower substrate 8001 continuous from the four corners. Supports 8004 of single-crystal silicon are provided on both sides of the upper surface of the lower substrate 8001.

An upper substrate 8101 has an annular gimbal 8102 inside. A mirror 8103 is provided inside the gimbal 8102. For example, a Ti/Pt/Au layer with a three-Layered structure is formed on the upper surface of the mirror 8103. Torsion springs 8104 connect the upper substrate 3101 to the gimbal 8102 at two 180° opposite points. Similarly, torsion springs 8105 connect the gimbal 8102 to the mirror 8103 at two 180° opposite points. The X-axis passing through the pair of torsion springs 8104 and the Y-axis passing through the pair of torsion springs 8105 intersect at a right angle. As a result, the mirror 8103 can pivot around the X- and Y-axes each serving as a pivot axis. The upper substrate 8101, gimbal 8102, mirror 8103, and torsion springs 8104 and 8105 are integrally made of single-crystal silicon.

Figure 62:
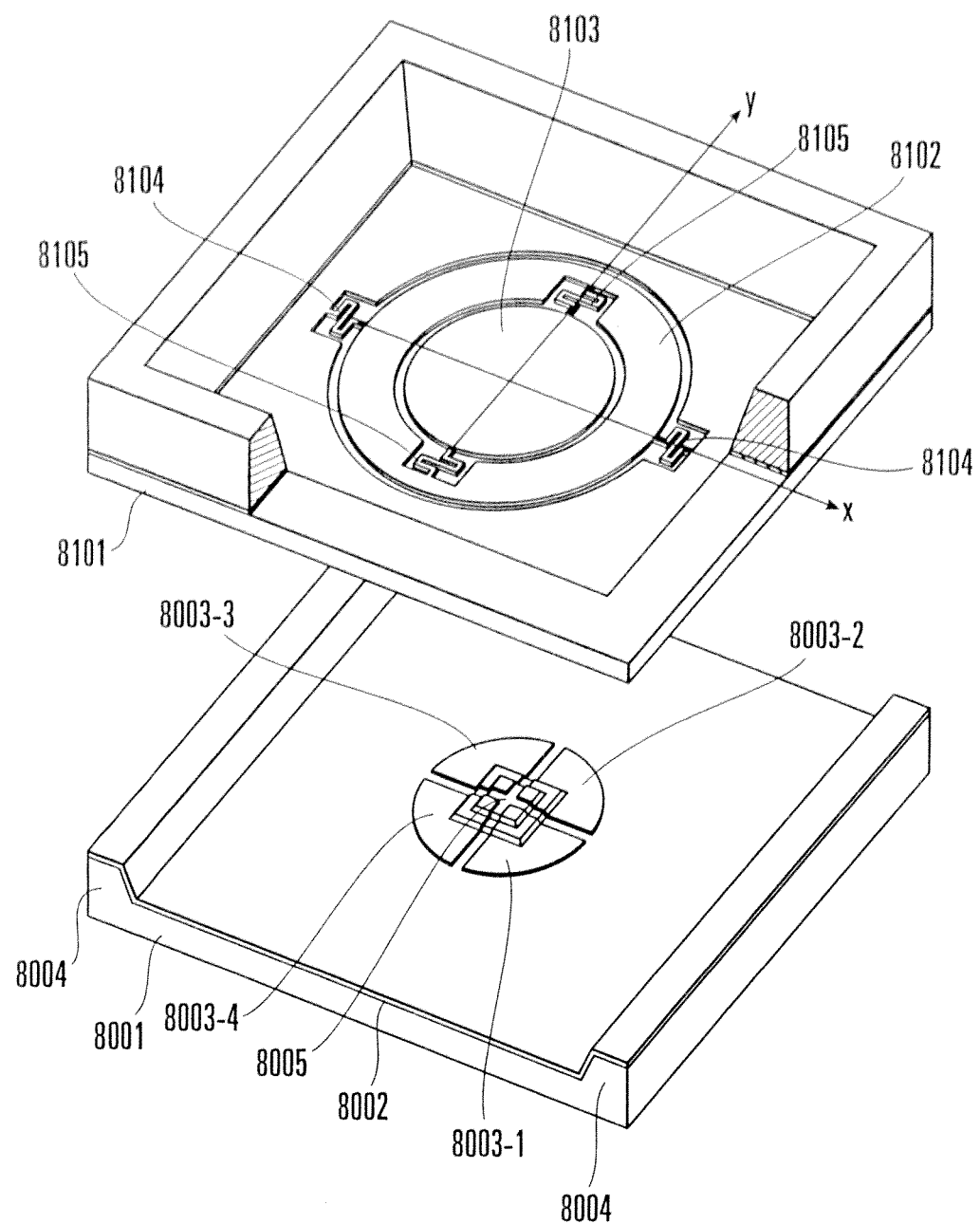
FIG. 62 is an exploded perspective view showing the structure of a conventional mirror device.
Figure 63:
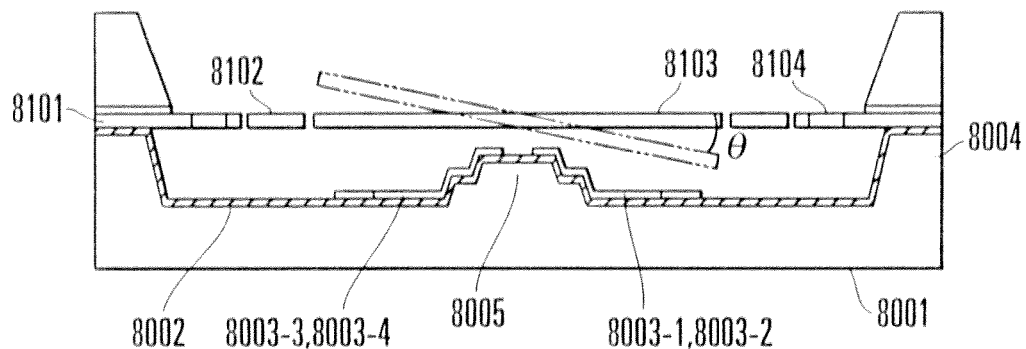
FIG. 63 is a sectional view of the mirror device shown in FIG. 62.

The structure of the lower substrate 8001 and the structure of the upper substrate 8101 shown in FIGS. 62 and 63 are separately manufactured. The upper substrate 8101 is soldered to the supports 8004 so that the upper substrate 8101 bonds to the lower substrate 8001. In this mirror device, the mirror 8103 is grounded. A positive voltage is applied to the driving electrodes 8003-1 to 8003-4 to generate an asymmetrical potential difference between the driving electrodes 8003-1 to 8003-4. An electrostatic force attracts the mirror 8103 and causes it to pivot in an arbitrary direction.

Figure 64:
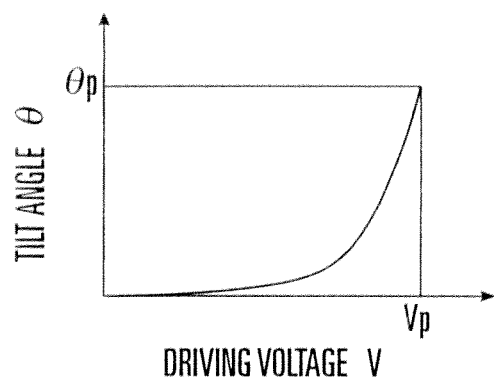
FIG. 64 is a graph showing an example of a driving voltage vs. tilt angle characteristic curve in the mirror device shown in FIG. 62.

In the mirror device shown in FIGS. 62 and 63, the relationship between a driving voltage V applied to the driving electrodes 8003-1 to 8003-4 and a tilt angle θ of the mirror 8103 is nonlinear. Especially, when the tilt angle θ increases, the change in the tilt angle θ with respect to the driving voltage V abruptly increases. Finally, dθ/dV becomes infinite to generate an unstable state called pull-in or snap-down wherein the driving electrodes 8003-1 to 8003-4 attract the mirror 8103. A pull-in angle is about ⅓ the angle made by the mirror 8103 and the driving electrodes 8003-1 to 8003-4 when no driving voltage is applied. FIG. 64 shows an example of a driving voltage vs. tilt angle characteristic curve. Referring to FIG. 64, θp is a pull-in angle, and Vp is a pull-in voltage to give the pull-in angle $θ_p$.

In the mirror device shown in FIGS. 62 and 63, the torsion springs 8104 and 8105 support the mirror 8103 to make it freely pivot. The torsion springs 8104 and 8105 ideally exhibit low spring rigidity only in the pivot direction and infinite rigidity for the remaining displacements. Actually, to obtain low spring rigidity in the pivot direction, the spring rigidity in the vertical direction and that in the expansion/contraction direction must also be low. Hence, if a moment to make the mirror 8103 pivot is generated by applying a voltage to the driving electrodes 8003-1 to 8003-4, the mirror 8103 not only pivots but also approaches the side of the driving electrodes 8003-1 to 8003-4.

Figure 65:
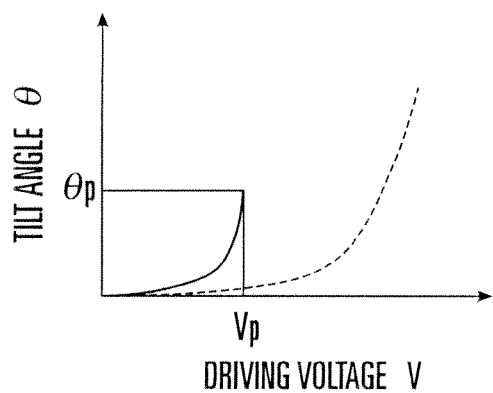
FIG. 65 is a graph showing an example of a driving voltage vs. tilt angle characteristic curve when a mirror sinks and pivots in the mirror device shown in FIG. 62.

At the same driving voltage, the tilt angle θ of the mirror 8103 is larger when the mirror 8103 sinks to the side of the driving electrodes 8003-1 to 8003-4 and pivots than when the mirror 8103 pivots without moving its gravity center position, i.e., pivotal center. This is because the electrostatic force increases in inverse proportion to the second power of the distance between the mirror 8103 and the driving electrodes 8003-1 to 8003-4. If the mirror 8103 sinks, the increase in the tilt angle θ of the mirror 8103 with respect to the driving voltage exhibits larger nonlinearity than a case wherein the pivotal center is fixed. FIG. 65 shows an example of a driving voltage vs. tilt angle characteristic curve when the mirror 8103 sinks and pivots. The solid line in FIG. 65 indicates a characteristic when the mirror 8103 sinks and pivots. The broken line indicates a characteristic when the mirror 8103 does not sink (characteristic in FIG. 64).

As is apparent from FIG. 65, when the mirror 8103 sinks, the nonlinearity of the tilt angle θ with respect to the driving voltage V is more conspicuous. The pull-in angle $\theta_p$ and pull-in voltage Vp also decrease. The torsion spring structure which can prevent the mirror 8103 from sinking is free from the above-described problem. As described above, it is difficult in the actual design to form the torsion springs 8104 and 8105 that are soft only in the pivot direction of the mirror 8103 and rigid in the sinking direction of the mirror 8103.

This embodiment has been made to solve the above-described problem and has as its object to improve the nonlinear response of the mirror tilt angle with respect to the driving voltage in a mirror device.

The embodiment of the present invention will be described below with reference to the accompanying drawings. A terrace-shaped projecting portion 1305 is provided at the center of a lower substrate 1301 of single-crystal silicon. Four driving electrodes 1303-1 to 1303-4 are provided on an insulating layer 1302 made of a silicon oxide film on the four corners of the projecting portion 1305 and the lower substrate 1301 continuous from the four corners. Supports 1304 of single-crystal silicon are provided on both sides of the upper surface of the lower substrate 1301.

An upper substrate 1401 has an annular gimbal 1402 inside. A mirror 1403 is provided inside the gimbal 1402. For example, a Ti/Pt/Au layer with a three-layered structure is formed on the upper surface of the mirror 1403. Torsion springs 1404 connect the upper substrate 1401 to the gimbal 1402 at two 180° opposite points. Similarly, torsion springs 1405 connect the gimbal 1402 to the mirror 1403 at two 180° opposite points. The X-axis passing through the pair of torsion springs 1404 and the Y-axis passing through the pair of torsion springs 1405 intersect at a right angle. As a result, the mirror 1403 can pivot around the X- and Y-axes each serving as a pivot axis. The upper substrate 1401, gimbal 1402, mirror 1403, and torsion springs 1404 and 1405 are integrally made of single-crystal silicon.

Figure 66:
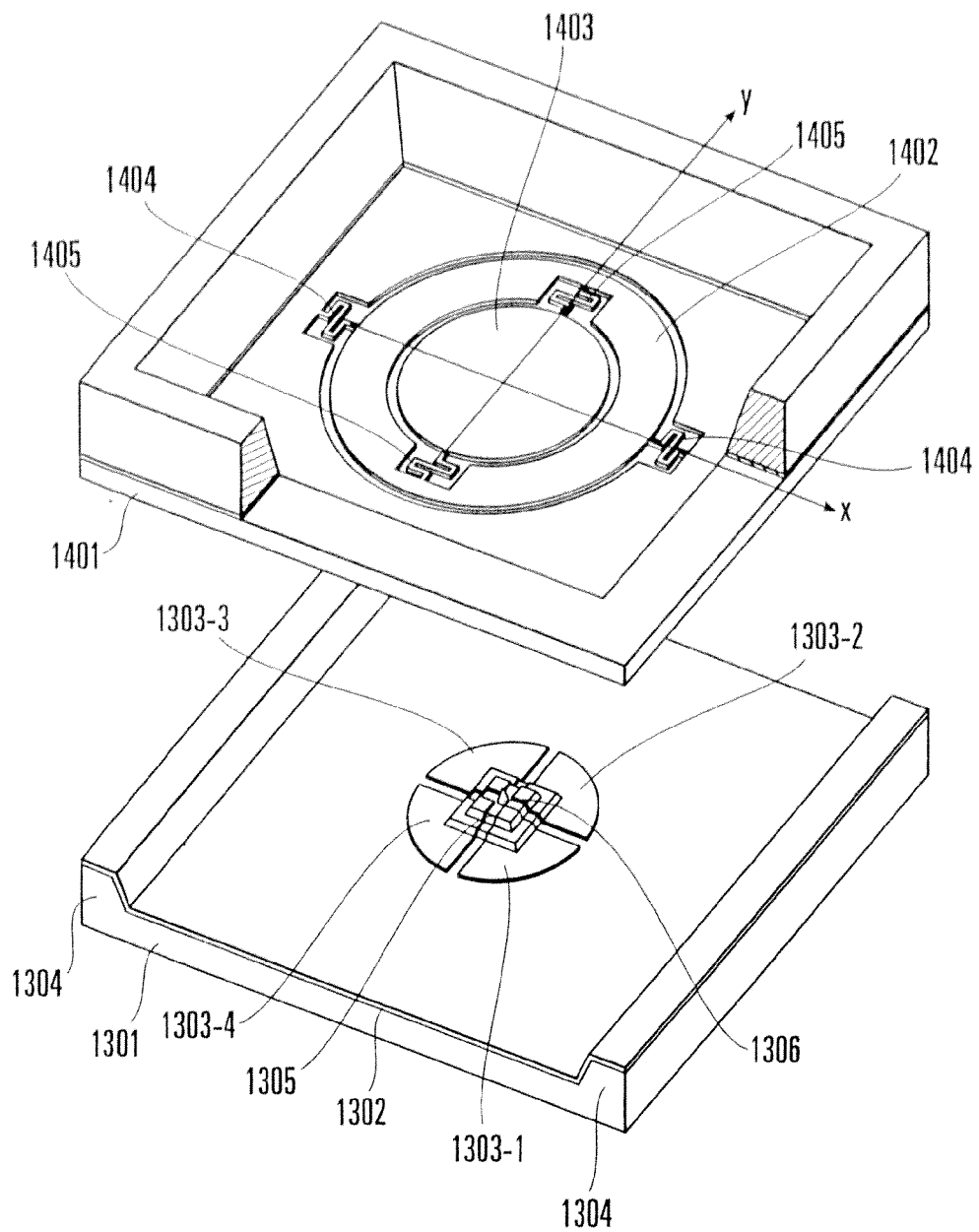
FIG. 66 is an exploded perspective view showing the structure of a mirror device according to the 19th embodiment.
Figure 67:
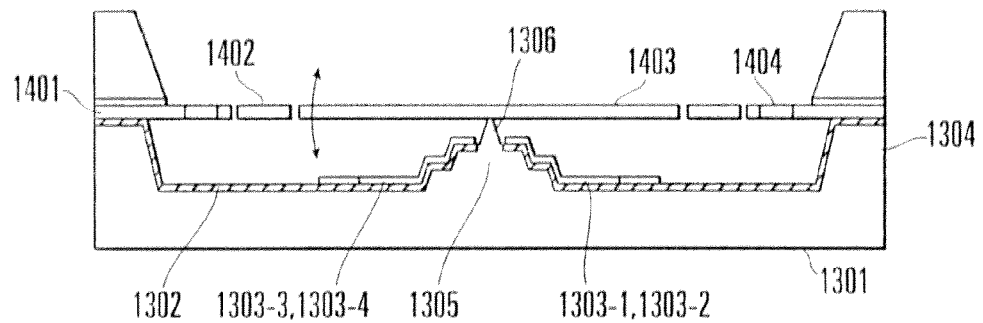
FIG. 67 is a sectional view of the mirror device shown in FIG. 66.

The structure of the lower substrate 1301 and the structure of the upper substrate 1401 shown in FIGS. 66 and 67 are separately manufactured. The upper substrate 1401 is soldered to the supports 1304 so that the upper substrate 1401 bonds to the lower substrate 1301. In this mirror device, the mirror 1403 is grounded. A positive voltage is applied to the driving electrodes 1303-1 to 1303-4 to generate an asymmetrical potential difference between the driving electrodes 1303-1 to 1303-4. An electrostatic force attracts the mirror 1403 and causes it to pivot in an arbitrary direction.

In this embodiment, to prevent the mirror 1403 from sinking, a pivot (column) 1306 to support the pivotal center of the mirror 1403 is formed on the upper surface of the projecting portion 1305. The pointed pivot 1306 arranged at the position of the pivotal center of the mirror 1403 fixes the pivotal center of the mirror 1403, prevents the mirror 1403 from sinking, and allows the mirror 1403 to pivot up to the appropriate pull-in angle.

In this embodiment, the pivot 1306 prevents the mirror 1403 from sinking. For this reason, the spring rigidity of the torsion springs 1404 and 1405 in the sinking direction (to the tower side of FIG. 67) can be low. The spring rigidity in the pivot direction (the direction of the arrow in FIG. 67) can also be low. As a result, the driving voltage necessary for making the mirror 1403 pivot can be lower than before. The lower substrate 1301, projecting portion 1305, and pivot 1306 are integrally made of single-crystal silicon. The pivot 1306 can be formed by, e.g., anisotropic etching of silicon or high aspect ratio structure formation by RIE.

Figure 68:
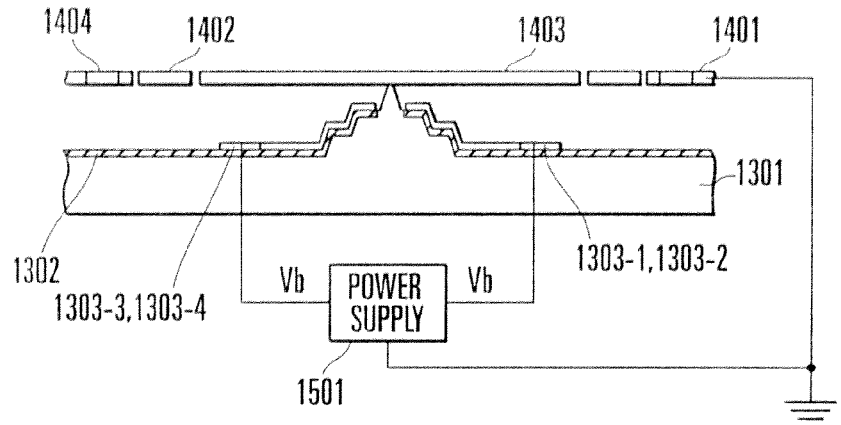
FIG. 68 is a view for explaining a bias voltage application method according to the 19th embodiment.

In this embodiment, a predetermined bias voltage Vb is applied from a power supply 1501 to the four divided driving electrodes 1303-1 to 1303-4, as shown in FIG. 68. As before, the upper substrate 1401, gimbal 1402, mirror 1403, and torsion springs 1404 and 1405 are integrally made of single-crystal silicon. A ground potential is applied to the mirror 1403 through the upper substrate 1401, torsion springs 1404, gimbal 1402, and torsion springs 1405. When only the bias voltage Vb is applied to the driving electrodes 1303-1 to 1303-4, the mirror 1403 maintains the equilibrium state (θ=0) without pivoting.

Figure 69:
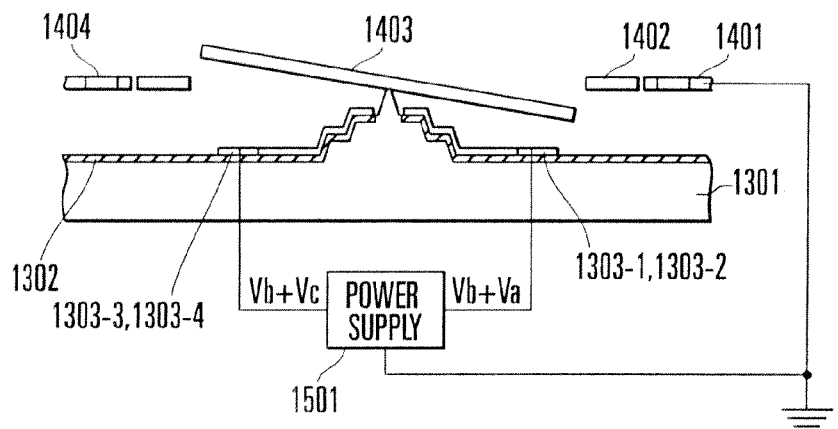
FIG. 69 is a view for explaining a voltage application method when a mirror pivots in the 19th embodiment.

A method of making the mirror 1403 pivot from this equilibrium state will be described. Uniaxial pivot will be explained here for the descriptive convenience. Biaxial pivot will be described later. To make the mirror 1403 pivot about, e.g., the Y-axis, Vb+Va is applied to, of the driving electrodes 1303-1 to 1303-4, the driving electrodes (to be referred to as positive-side driving electrodes hereinafter) 1303-1 and 1303-2 close to the mirror 1403, and Vb+Vc is applied to the driving electrodes (to be referred to as negative-side driving electrodes hereinafter) 1303-3 and 1303-4 far from the mirror 1403, as shown in FIG. 69. Let V be the driving voltage necessary for obtaining the tilt angle θ of the mirror 1403. In this case, the voltages Va and Vc applied together with the bias voltage Vb are Va=V and Vc=−V. The bias voltage Vb and driving voltage V have a relationship given by V<Vb.

Figure 70:
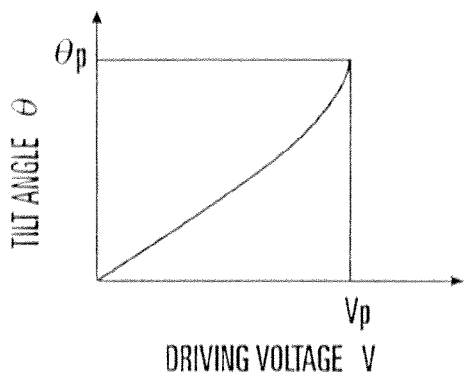
FIG. 70 is a graph showing an example of a driving voltage vs. tilt angle characteristic curve in the mirror device according to the 19th embodiment.

In this embodiment, when the bias voltage Vb is applied, and in this state, a voltage difference is generated between the positive-side driving electrodes and the negative-side driving electrodes, the mirror 1403 can pivot, and the linear response of the tilt angle θ with respect to the driving voltage V can improve. FIG. 70 shows an example of a driving voltage vs. tilt angle characteristic curve in the mirror device of this embodiment. According to this embodiment, an almost linear response is available in a relatively wide range from θ=0 to an angle close to the pull-in angle $\theta_p$. If no bias voltage Vb is applied, the mirror 1403 does not largely tilt until application of a high voltage, as shown in FIGS. 64 and 65. The mirror 1403 abruptly pivots then and reaches the pull-in state. On the other hand, when the bias voltage Vb is applied, as in this embodiment, the mirror 1403 pivots in proportion to the voltage difference between the positive-side driving electrodes and the negative-side driving electrodes. Hence, the pivot controllability of the mirror 1403 can improve.

The reason why the linear response of the tilt angle θ with respect to the driving voltage can be improved by applying the bias voltage Vb will be described below. The tilt angle θ of the mirror 1403 increases in accordance with the voltage applied between the mirror 1403 and the driving electrodes 1303-1 to 1303-4. The balance between the restoring force of the torsion springs 1404 and 1405 by a spring rigidity k of rotation of the torsion springs 1404 and 1405 and the electrostatic force from the driving electrodes 1303-1 to 1303-4 decides the tilt angle θ.

Let $M_S$ be the moment by the restoring force of the torsion springs 1404 and 1405, and $M_E$ be the moment by the electrostatic force. The moments $M_S$ and $M_E$ are given by $$M_S = -k\theta \quad (2)$$

$$M_E = M_E(V, \theta) \quad (3)$$

The moment $M_E$ by the electrostatic force depends on the shape of the driving electrodes 1303-1 to 1303-4 and is therefore represented by the function $M_E(V, 0)$. The spring rigidity k depends on the shape of the torsion springs 1404 and 1405.

Figure 71:
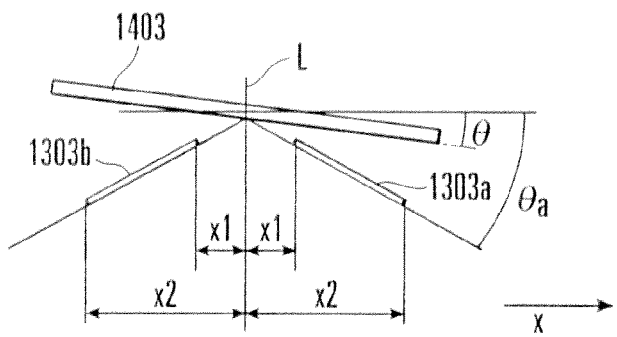
FIG. 71 is a view for explaining the effect of bias voltage application to driving electrodes in the 19th Embodiment.

For the descriptive convenience, assume that a positive-side driving electrode 1303a and a negative-side driving electrode 1303b are arranged on slanting surfaces with an angle θa to be bilaterally symmetrical with respect to a vertical line L that passes through the pivotal center of the mirror 1403, as shown in FIG. 71. The edges of each of the positive-side driving electrode 1303a and negative-side driving electrode 1303b are spaced apart from the vertical line L by distances x1 and x2. The mirror 1403 pivots about the Y-axis (perpendicular to the drawing surface of FIG. 71). Pivotal movement about the X-axis is neglected.

Let Vb be the bias voltage, and V be the driving voltage. A voltage (Vb−V) is applied to the negative-side driving electrode 1303b. A voltage (Vb+V) is applied to the positive-side driving electrode 1303a. At this time, the moment $M_E$ by the electrostatic force from the driving electrodes 1303a and 1303b is given by $$M_E = \frac{1}{2}\varepsilon(Vb+V)^2 \int_{x1}^{x2} \frac{dx}{(\theta a-\theta)^2 x} + \frac{1}{2}\varepsilon(Vb-V)^2 \int_{-x1}^{-x2} \frac{dx}{(\theta a+\theta)^2 x} \quad (4)$$

In equation (4), the First term on the right-hand side indicates the moment by the positive-side driving electrode 1303a, and the second term on the right-hand side indicates the moment by the negative-side driving electrode 1303b. Equation (4) can be rewritten to $$M_E = \frac{1}{2}\varepsilon\left[\frac{(Vb+V)^2}{(\theta a-\theta)^2} - \frac{(Vb-V)^2}{(\theta a+\theta)^2}\right]\ln\frac{x2}{x1} \quad (5)$$

Assuming θ/θa<<1, equation (5) can be approximated to $$M_E = 2\varepsilon\left(\frac{Vb}{\theta a^2}V + \frac{Vb^2}{\theta a^3}\theta\right)\ln\frac{x2}{x1} \quad (6)$$

The first term in the parentheses of equation (6) represents that the moment $M_E$ is proportional to the first power of the voltage V. Since θ<θa/3 and V<Vb, the second term in the parentheses of equation (6) has a value so small that it is negligible as compared to the first term in a relatively wide angle range. The balance between the moment by the electrostatic force and the restoring force of the torsion springs 1404 and 1405 decides the tilt angle θ of the mirror 1403. Hence, we obtain $$M_S + M_E = 0 \quad (7)$$

From equations (2) and (6), we obtain $$-k\theta + 2\varepsilon\left(\frac{Vb}{\theta a^2}V + \frac{Vb^2}{\theta a^3}\theta\right)\ln\frac{x2}{x1} = 0 \quad (8)$$

Equation (8) can be approximated to $$\theta \cong \frac{2\varepsilon}{k}\frac{Vb}{\theta a^2}V\ln\frac{x2}{x1} \quad (9)$$

As is apparent from equation (9), when the bias voltage Vb is applied, the tilt angle θ of the mirror 1403 linearly responds to the voltage V.

In a comparative case without application of the bias voltage Vb, the moment $M_E$ by the electrostatic force is given by $$M_E = \frac{1}{2}\varepsilon V^2 \int_{x1}^{x2} \frac{dx}{(\theta a-\theta)^2 x} \quad (10)$$

Equation (10) can be rewritten to $$M_E = \frac{1}{2}\varepsilon \frac{V^2}{(\theta a-\theta)^2}\ln\frac{x2}{x1} \quad (11)$$

Assuming θ/θa<<1, equation (11) is approximated. From the approximate expression and equations (2) and (7), we obtain $$\theta \cong \frac{1}{2k}\varepsilon\frac{V^2}{\theta a^2}\ln\frac{x2}{x1} \quad (12)$$

As is apparent from equation (12), when no bias voltage Vb is applied, the tilt angle θ of the mirror 1403 is proportional to the second power of the voltage V even in a small angle range.

The bias voltage Vb has a clear upper limit value. This is because when the bias voltage Vb has a predetermined value or more, the state of the mirror 1403 is unstable even at θ=0 and cannot be restored. This phenomenon indicates that the differential value of the sum of the moment by the restoring force of the torsion springs 1404 and 1405 and the moment by the electrostatic force when θ=0 is 0 or more. That is, the mirror 1403 cannot be restored to the state when θ=0. The mirror 1403 freely pivots in a direction in which the tilt angle θ increases. Hence, the condition of the bias voltage Vb is obtained $$\frac{dM_E}{d\theta} + \frac{dM_S}{d\theta} < 0 \quad (13)$$

That is, the bias voltage Vb satisfies $dM_S/d\theta < k$. In the electrode structure shown in FIG. 71, we obtain $$\left(\frac{d}{d\theta}\left[-k\theta + 2\varepsilon\left(\frac{Vb}{\theta a^2}V + \frac{Vb^2}{\theta a^3}\theta\right)\ln\frac{x2}{x1}\right]\right)_{V=0,\theta=0} < 0 \quad (14)$$

Hence, we obtain $$Vb < \sqrt{\frac{k\theta a^3}{2\varepsilon\ln\frac{x2}{x1}}} \quad (15)$$

As described above, application of the bias voltage Vb improves the linear response of the tilt angle θ of the mirror 1403 with respect to the driving voltage V. However, application of the bias voltage Vb to the driving electrodes indicates that the driving electrode side attracts the mirror 1403. When only the torsion springs 1404 and 1405 support the mirror 1403, the mirror 1403 sinks so it is impossible to expect improvement of the linear response. In extreme cases, only pull-in to the driving electrodes occurs. To the contrary, in this embodiment, the pivot 1306 is arranged at the position of the pivotal center of the mirror 1403 to prevent the mirror 1403 from sinking even when the bias voltage Vb is applied. Hence, the linear response of the tilt angle θ with respect to the voltage V can improve.

Even in driving by applying the bias voltage Vb, the pull-in angle rarely changes from that without application of the bias voltage Vb. Hence, the driving method by applying the bias voltage Vb to the driving electrodes can improve the linear response of the tilt angle θ with respect to the voltage V without decreasing the rotatable angle of the mirror 1403 or increasing the load on the power supply 1501.

Figure 72:
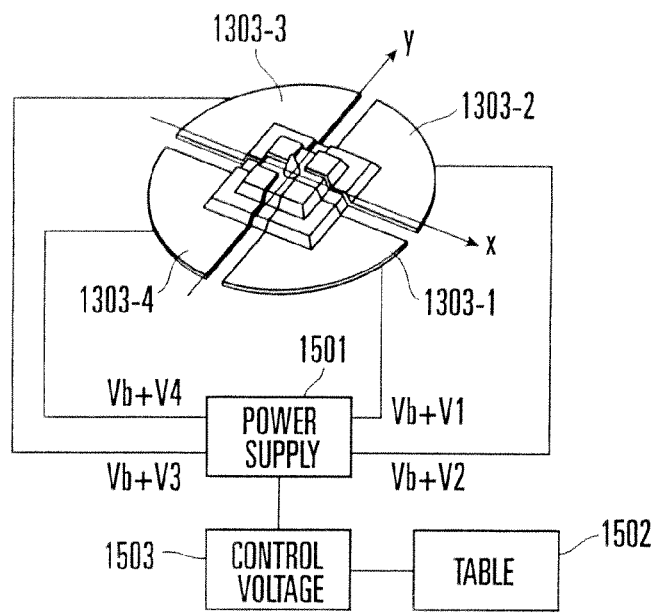
FIG. 72 is a view for explaining a driving method in biaxial driving.

The driving method for biaxial pivot will be described finally. As shown in FIG. 72, in biaxial pivot, Vb+V1, Vb+V2, Vb+V3, and Vb+V4 are applied to the four divided driving electrodes 1303-1, 1303-2, 1303-3, and 1303-4, respectively.

To obtain the driving voltages V1 to V4 necessary for an arbitrary tilt angle of the mirror 1403, the electrostatic capacitance between the mirror 1403 and the driving electrodes 1303-1 to 1303-4 is calculated on the basis of the positional relationship between the mirror 1403 and the driving electrodes 1303-1 to 1303-4. An electrostatic force at the tilt angle is calculated from the change in electrostatic capacitance for a small mirror tilt angle. The moment by the electrostatic force is obtained from this value. The balance between this moment and the restoring force of the torsion springs 1404 and 1405 decides the relationship between the driving voltages V1 to V4 and the tilt angle of the mirror 1103.

To calculate the electrostatic capacitance between the mirror 1403 and the driving electrodes 1303-1 to 1303-4, it is necessary to analyze the electromagnetic field by using, as the boundary condition, the positional relationship between the mirror 1403 and the driving electrodes 1303-1 to 1303-4. Normally, numerical analysis using a finite-element method is executed. Numerical analysis using a finite-element method is disclosed in, e.g., a reference "M. Fischer et al., "Electrostatically deflectable polysilicon micromirrors-dynamic behavior and comparison with the results from FEM modeling with ANSYS", Sensors and Actuators, Vol. A67, pp. 89-95, 1998", or a reference "M. Drano et al., "Novel Fabrication Process and Structure of a low-Voltage-Operation Micromirror Array for Optical MEMS Switches", Technical digest of Electron Device Meeting (IEDM'03), 8-10, Dec. 2003".

A table (storage unit) 1502 stores in advance the thus obtained relationship between the X- and Y-direction tilt angles of the mirror 1403 and the driving voltages V1 to V4. A control circuit (acquisition unit) 1503 acquires the values of the driving voltages V1 to V4 corresponding to a desired tilt angle of the mirror 1403 from the table 1502 and sets the values in the power supply 1501. The power supply 1501 applies the set driving voltages V1 to V4 to the driving electrodes 1303-1 to 1303-4 together with the predetermined bias voltage Vb.

The method of setting the bias voltage Vb will be described next. As described above, when a voltage of a certain value or more is applied to the driving electrodes of the mirror device, an unstable state called pull-in or snap-down occurs. To prevent this, it is necessary to limit the voltage to be applied to the driving electrodes, i.e., set the maximum value (to be referred to as an applied voltage maximum value hereinafter) of the applied voltage represented by the sum of the driving voltage V and the bias voltage Vb. As already described above, the mirror tilt angle changes depending on the value of the driving voltage. Unless the value of the bias voltage Vb is appropriately set, the posture displacement amount of the mirror is limited, and the desired mirror tilt angle cannot be obtained. For this reason, in this embodiment, the bias voltage Vb is set as follows.

Figure 73:
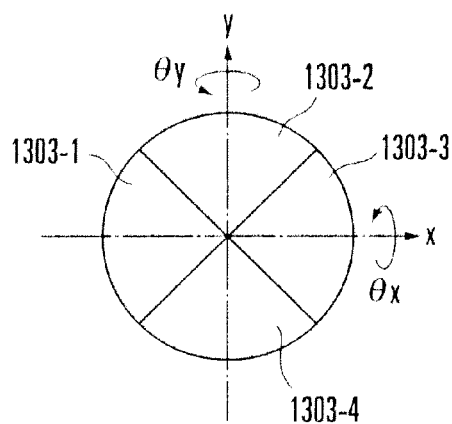
FIG. 73 is a view for explaining a bias voltage setting method.

For example, in FIG. 73, the driving electrodes 1303-1 and 1303-3 are symmetrical about the X-axis, and the driving electrodes 1303-2 and 1303-4 are symmetrical about the Y-axis. In this case, to make the mirror 1403 (not shown) arranged above the driving electrodes 1303-1 to 1303-4 pivot about the Y-axis, Vb+Va is applied to, of the driving electrodes 1303-1 to 1303-4, the positive-side driving electrode 1303-1, and Vb+Vc is applied to the negative-side driving electrode 1303-3. Let Vy be the driving voltage necessary for obtaining a tilt angle θy of the mirror 1403. In this case, the voltages Va and Vc applied together with the bias voltage Vb are Va=Vy and Vc=−Vy. Similarly, to make the mirror 1403 pivot about the X-axis, Vb+Vd is applied to the positive-side driving electrode 1303-2, and Vb+Ve is applied to the negative-side driving electrode 1303-4. Let Vx be the driving voltage necessary for obtaining a tilt angle θx of the mirror 1403. In this case, the voltages Vd and Ve are Vd=Vx and Ve=−Vx.

Figure 74:
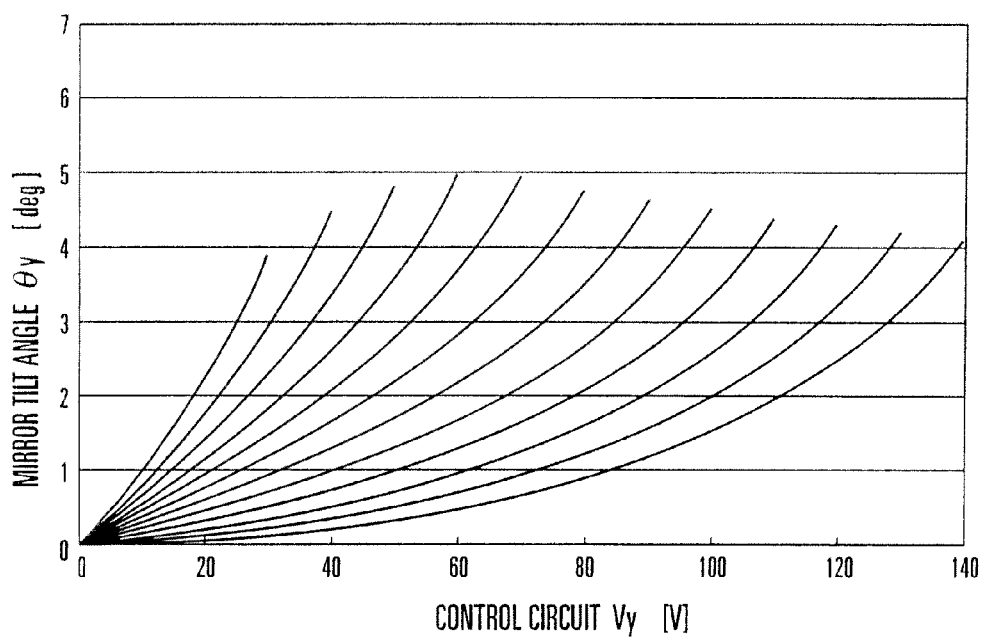
FIG. 74 is a graph showing the relationship between the driving voltage and the tilt angle when the bias voltage changes.

FIG. 74 shows a measurement result of the tilt angle θy of the mirror 1403 when the driving voltage Vy is changed by setting the applied voltage maximum value to 140 [V] and the driving voltage Vx to 0 [V] for the driving electrodes shown in FIG. 73. A solid line a in FIG. 74 indicates the relationship between the driving voltage Vy and the tilt angle θy when the bias voltage Vb is 0 [V]. Solid lines b to l also indicate the relationship between the driving voltage Vy and the tilt angle θy when the bias voltage Vb changes in steps of 10 [V].

As shown in FIG. 74, when the bias voltage Vb changes, the tilt angle θy also changes. Especially, when the bias voltage Vb is about ½ the applied voltage maximum value, as indicated by the solid lines i and h (Vb=70, 80 [V]), the tilt angle θy maximizes. Hence, in this embodiment, the bias voltage Vb is set to about ½ the applied voltage maximum value. This can increase the tilt angle of the mirror 1403.

The table 1502 stores the thus set bias voltage Vb in advance. The control circuit 1503 acquires the values of the driving voltages V1 to V4 corresponding to a desired tilt angle of the mirror 1403 and the bias voltage Vb from the table 1502 and sets the values in the power supply 1501. The power supply 1501 applies the set driving voltages V1 to V4 to the driving electrodes 1303-1 to 1303-4 together with the bias voltage Vb.

FIG. 74 explains the relationship between the driving voltage Vy and the tilt angle θy. This also applies to the relationship between the driving voltage Vy and the tilt angle θy. When the value of the bias voltage applied to the driving electrodes is about ½ the applied voltage maximum value, the tilt angle can increase not only in the mirror device that pivots about two axes, as shown in FIG. 73, but also in a mirror device that pivots about one axis or a mirror device that is translated.

As described above, according to this embodiment, it is possible to improve the linear response of the mirror tilt angle with respect to the driving voltage by forming a pivot on the lower substrate to support the pivotal center a mirror and applying the same bias voltage to the plurality of driving electrodes facing the mirror.

According to this embodiment, a storage means stores in advance the relationship between the tilt angle and the driving voltages applied to the driving electrodes. The values of the driving voltages necessary for obtaining a desired mirror tilt angle are acquired from the storage means for the respective driving electrodes, thereby individually deciding the voltages to be applied to the respective driving electrodes.

According to this embodiment, the mirror tilt angle can increase when the bias voltage applied to the driving electrodes is about ½ the maximum voltage value applicable to the driving electrodes.

20th Embodiment

The 20th embodiment of the present invention will be described below. This embodiment has as its object to obtain a state wherein a larger pivot angle of a mirror is obtained by low-voltage driving without increasing the cost.

Figure 75:
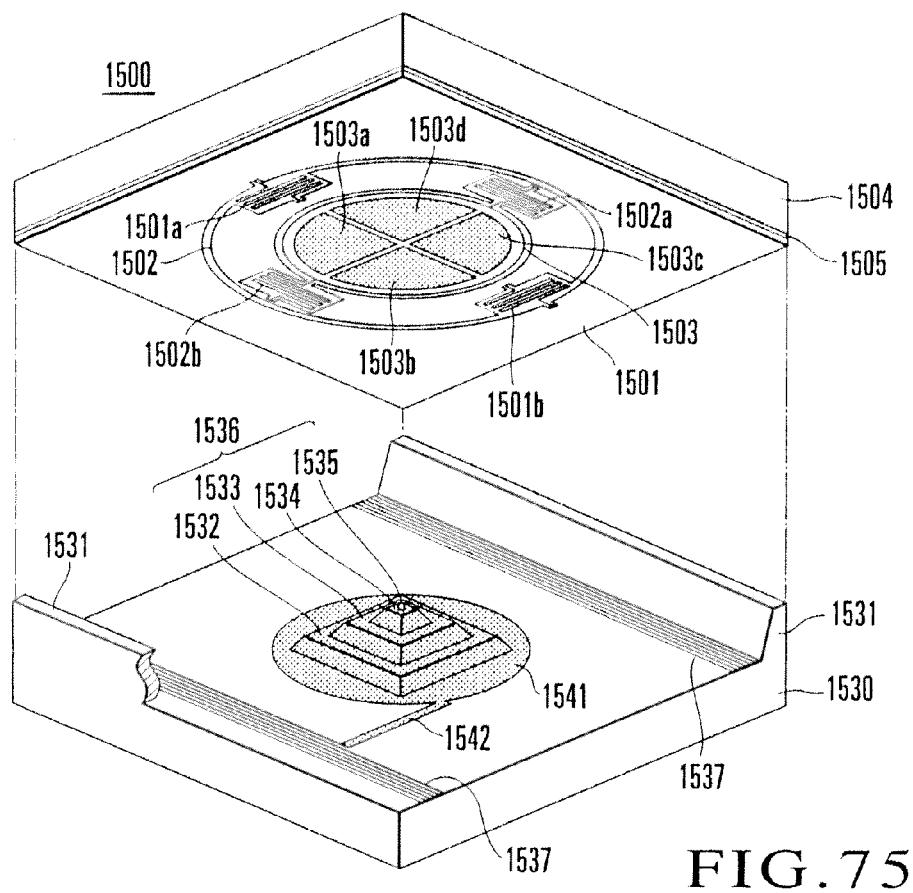
FIG. 75 is a schematic perspective view showing a structural example of a mirror device according to the 20th embodiment.

FIG. 75 mainly partially illustrates a mirror device as a constituent unit of a mirror array. In a mirror array, mirror devices shown in FIG. 75 are arrayed two-dimensionally in a square pattern. The mirror device comprises a mirror substrate 1500 with a mirror and an electrode substrate 1530 with electrodes. The mirror substrate 1500 and electrode substrate 1530 are arranged in parallel. FIG. 75 illustrates a surface of the mirror substrate 1500 facing the electrode substrate 1530, i.e., a state different from the perspective view of FIG. 11.

The mirror substrate 1500 comprises a plate-shaped base 1501, ring-shaped movable frame 1502, and disk-shaped mirror 1503. The base 1501 has an opening having an almost circular shape when viewed from the upper side. The movable frame 1502 is arranged in the opening of the base 1501 and connected to the base 1501 by a pair of connectors 1501a and 1501b. The movable frame 1502 also has an opening having an almost circular shape when viewed from the upper side. The mirror 1503 is arranged in the opening of the movable frame 1502 and connected to the movable frame 1502 by a pair of mirror connectors 1502a and 1502b. A frame portion 1504 surrounding the movable frame 1502 and mirror 1503 is formed at the periphery of the base 1501. The frame portion 1504 is fixed to the base 1501 through an insulating layer 1505.

The connectors 1501a and 1501b including zigzag torsion springs and provided in the notches of the movable frame 1502 connect the base 1501 to the movable frame 1502. This structure makes the movable frame 1502 connected to the base 1501 pivotable about a pivot axis (movable frame pivot axis) passing through the connectors 1301a and 1501b. The mirror connectors 1502a and 1502b including zigzag torsion springs and provided in the notches of the movable frame 1502 connect the movable frame 1502 to the mirror 1503. This structure makes the mirror 1503 connected to the movable frame 1502 pivotable about a pivot axis (mirror pivot axis) passing through the mirror connectors 1502a and 1502b. In the structural example shown in FIG. 75, the movable frame pivot axis and mirror pivot axis intersect each other at a right angle.

The electrode substrate 1530 has a projecting portion 1536 and rib structures 1531 provided at the periphery of the projecting portion 1536. The projecting portion 1536 includes a third terrace 1532 having a truncated pyramidal shape, a second terrace 1533 formed on the upper surface of the third terrace 1532 and having a truncated pyramidal shape, a first terrace 1534 formed on the upper surface of the second terrace 1533 and having a truncated pyramidal shape, and a pivot 1535 formed on the upper surface of the first terrace 1534 and having a truncated pyramidal shape.

The upper surface of the electrode substrate 1530 including the outer surface of the projecting portion 1536 has a common electrode 1541 that is integrally formed in, e.g., a circle concentric to the mirror 1503 on the counter mirror substrate 1500. Interconnection 1537 are formed around the projecting portion 1536 on the electrode substrate 1530. The electrode 1541 connects to the interconnections 1537 through a lead 1542. The common electrode 1541 need only be formed as an integral metal film in a region including the region of the projecting portion 1536. Hence, no high fabrication accuracy is necessary for formation of the common electrode 1541. It is therefore possible to easily form the common electrode 1541 even in the projecting portion 1536 with large step differences without any complex process. For example, in the photolithography process of forming a fine mask pattern for the interconnections 1537 by exposure based on a focal point, a mask pattern for the common electrode 1541 based on a largely different focal point can be formed simultaneously.

The mirror substrate 1500 shown in FIG. 75 also comprises driving electrodes 1503a to 1503d on the surface of the mirror 1503. The driving electrodes are symmetry with respect to the center of the mirror (mirror structure) 1503. The mirror 1503 on the mirror substrate 1500 faces the common electrode 1541 on the counter electrode substrate 1530. A mirror device is formed by joining the lower surface of the base 1501 to the upper surfaces of the rib structures 1531. In the mirror device shown in FIG. 75, the driving electrodes 1503a to 1503d formed on the mirror 1503 face the common electrode 1541 formed on the electrode substrate 1530.

In the mirror device shown in FIG. 75, for example, the common electrode 1541 is grounded. A positive or negative voltage is applied to the driving electrodes 1503a to 1503d to generate an asymmetrical potential difference between them. The mirror 1503 approaches the side of the common electrode 1541 due to the generated electrostatic force and pivots in an arbitrary direction. A power supply outside the mirror device applies the positive or negative voltage.

The projecting portion 1536 formed into a staircase shape with a plurality of terraces has the common electrode 1541. This allows to decrease the distance between the common electrode 1541 and the driving electrodes 1503a to 1503d without sacrificing a tilt angle θ of the mirror 1503. Consequently, the mirror device shown in FIG. 75 can attain a large pull-in angle of the mirror 1503 and low-voltage driving. At the tilt angle θ equal to or more than the pull-in angle, it is impossible to statically stably control the mirror 1503. If the tilt angle θ is equal to or larger than the pull-in angle, the electrostatic force surpasses the restoring force of the connectors so that the mirror 1503 contacts the side of the electrode substrate 1530. The mirror device shown in FIG. 75 allows to easily form the common electrode 1541 although the projecting portion 1536 has large step differences, as described above. Hence, the tilt angle of the projecting portion 1536 can easily be larger than before. As a result, in the mirror device shown in FIG. 75, the tilt angle of the mirror 1503 can be large than before.

Conventionally, to attain a large pull-in angle and low-voltage driving, a projecting portion 8320 is provided on an electrode substrate 8301, and electrodes are formed on the slanting surfaces of the projecting portion 8320, as shown in FIG. 11. On the other hand, interconnections 8370 are formed on a base 8310 of the electrode substrate 8301. In forming a pattern for the electrodes or interconnections, the lower limit, the lower limit of focus of the exposure apparatus is set to the interconnections 8370 having a finer pattern than the electrodes, thereby ensuring the accuracy of the formed pattern. However, the depth of field of the exposure apparatus is limited, and the difference of elevation of the projecting portion 8320 must be limited to 50 to 70 μm or less.

However, to attain a larger pull-in angle and lower-voltage driving, the difference of elevation of the projecting portion 8320 is preferably larger and, more specifically, 100 μm or more. This state can be obtained by using a special exposure apparatus with a wide focus range or executing exposure a plurality of number of times for each step. However, a special exposure apparatus is expensive. An increase in the number of steps leads to an increase in the process cost. Hence, the cost increases conventionally to obtain the above-described arrangement.

The mirror device according to this embodiment comprises a common electrode formed on an electrode substrate, a mirror structure that is pivotally arranged apart above the electrode substrate while facing the common electrode, and a plurality driving electrodes provided on a surface the mirror structure facing the common electrode. For example, when the common electrode is grounded, and a positive or negative voltage is applied to a driving electrode, the mirror structure pivots due to the generated electrostatic force.

In the mirror device, an almost conical projecting portion is formed on the electrode substrate, and at least part of the common electrode is formed on the projecting portion. The mirror structure is arranged to pivot about a pivot axis passing through the center of the mirror structure. The plurality of driving electrodes may be symmetrical with respect to the center of the mirror structure. The mirror device also comprises rib structures provided on the electrode substrate around the common electrode, and a mirror substrate to which the mirror structure pivotally connects. The mirror structure is fixed on the rib structures. Hence, a state wherein the mirror structure is arranged apart above the electrode substrate while facing the common electrode is obtained.

As described above, according to the present invention, the driving electrodes are arranged on the mirror structure. The electrode substrate side need only have the integrally formed common electrode. It is possible to form a large step difference on the electrode substrate side because no fine pattern formation is necessary. Hence, the pivot angle of the mirror can increase in low-voltage driving without any increase in the cost.

Figure 76A:
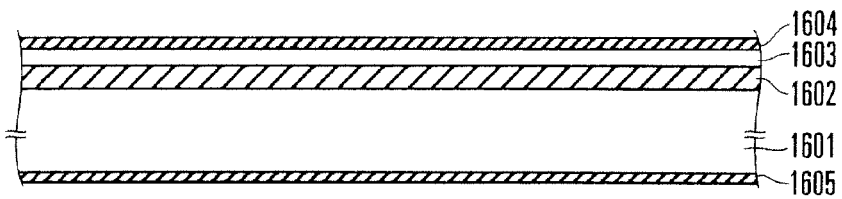
FIGS. 76A to 76L are views showing an example of steps in manufacturing a mirror substrate according to the 20th embodiment.

An example of a method of manufacturing the mirror substrate 1500 shown in FIG. 75 will be described next. First, as shown in FIG. 76A, an SOI substrate having, on a silicon base 1601 with a plane orientation (100), a buried insulating layer 1602 made of silicon oxide and having a thickness of about 1 μm, and a 10-μm thick single-crystal silicon layer (SOI layer) 1603 is prepared. An oxide layer 1604 is formed on the surface of the SOI layer 1603, and an oxide layer 1605 is formed on the lower surface of the silicon base 1601 by, e.g., thermal oxidation.

Figure 76B:
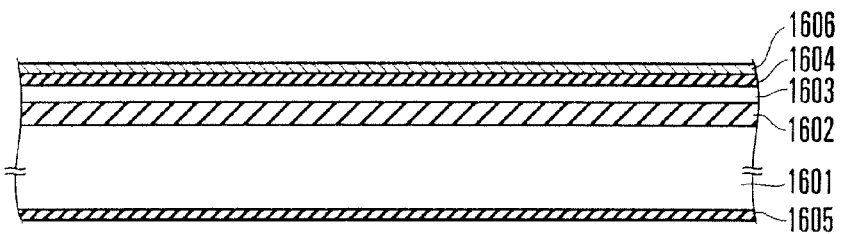
Figure 76C:
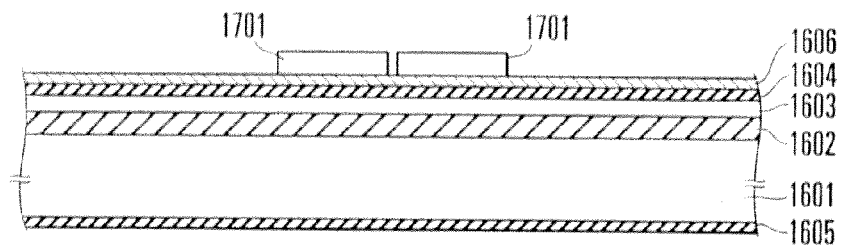
Figure 76D:
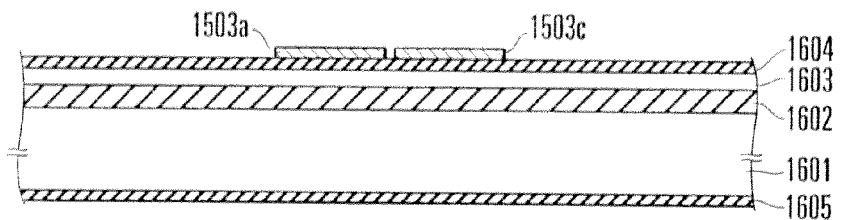

As shown in FIG. 76B, a metal layer 1606 is formed on the oxide layer 1604. The metal layer 1606 is formed by, e.g., forming an aluminum film by sputtering or vapor deposition. As shown in FIG. 76C, a resist mask layer 101 with a photoresist pattern formed by known photolithography is formed on the metal layer 1606. The metal layer 1606 is etched by using the resist mask layer 1701 as a mask. When the resist mask layer 1701 is removed, the driving electrodes 1503a and 1503c are formed on the oxide layer 1604, as shown in FIG. 76D. The fabrication is done by using well-known dry etching such as reactive ion etching. FIGS. 76C to 76L, show a section and therefore do not illustrate the driving electrodes 1503b and 1503d shown in FIG. 75.

Figure 76E:
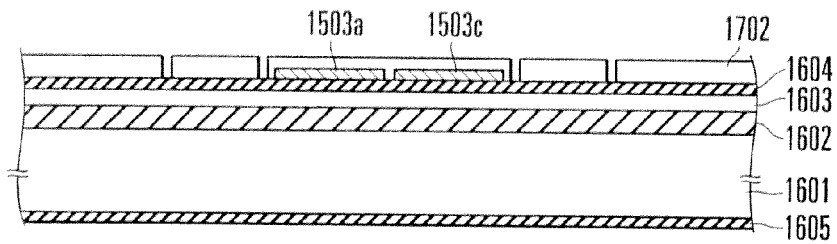
Figure 76F:
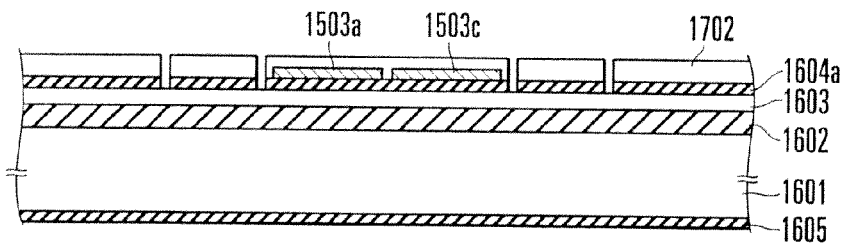

As shown in FIG. 76E, a resist mask layer 1702 with a photoresist pattern formed by known photolithography is formed on the metal layer 1604 including the driving electrodes 1503a and 1503c. The metal layer 1604 is etched by using the resist mask layer 1702 as a mask. At this time, directional etching such as reactive ion etching is performed to expose the surface of the SOI layer 1603 at the etched portions. With this process, an inorganic mask layer 1604a with a mask pattern of silicon oxide is formed, as shown in FIG. 76F. At this time, a pattern to form scribe lines serving as a guide in dicing is provided in a region (not shown) of the resist mask layer 1702.

Figure 76G:
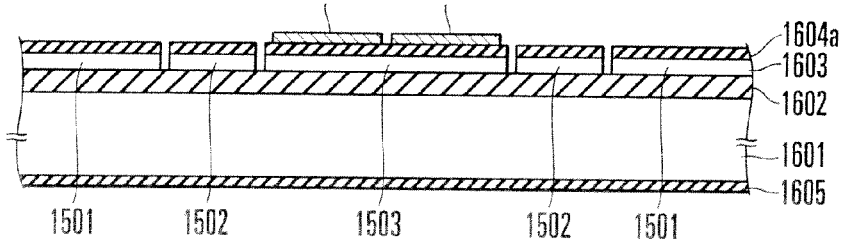

The resist mask layer 1702 is removed by ashing using ozone or oxygen plasma. As shown in FIG. 76G, the SOI layer 1603 is etched by dry etching using the inorganic mask 1604a as a mask. With this etching, the base 1501, movable frame 1502, mirror (mirror structure) 1503, connectors (not shown), and mirror connectors (not shown) are formed. That is, the basic structure of the mirror substrate is complete. The scribe line pattern Formed in the region (not shown) of the resist mask layer 1702 is also transferred to the inorganic mask layer 1604a and then to the SOI Layer 1603. The mirror structure may connect to the base without the movable frame.

Figure 76H:
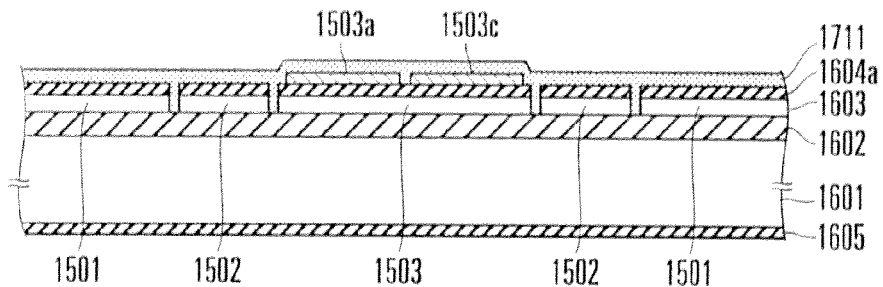
Figure 76I:
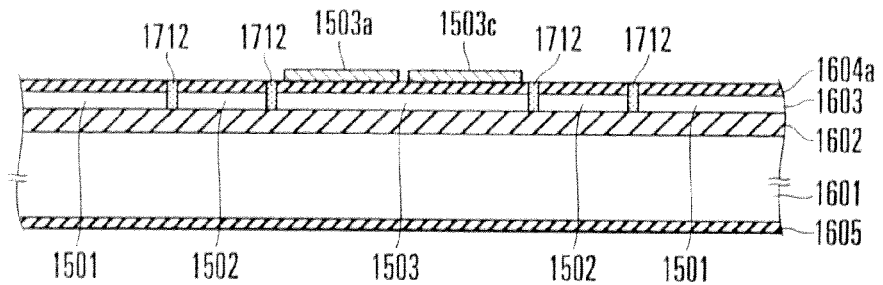

A resin is applied onto the inorganic mask 1604a including the driving electrodes 1503a and 1503c to form a resin film 1711 that fills the spaces between the patterns of the inorganic mask 1604a and the spaces between the structures formed in the SOI layer 1603, as shown in FIG. 76H. The resin film 1711 is etched back to form a protective layer 1712 that exposes the surfaces of the driving electrodes 1503a and 1503c and the inorganic mask layer 1604a and fills the spaces between the patterns of the inorganic mask layer 1604a and the spaces between the structures formed in the SOI layer 1603, as shown in FIG. 76I.

Figure 76J:
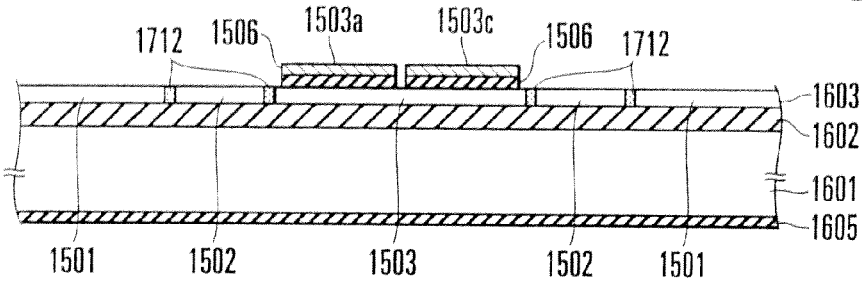
Figure 76K:
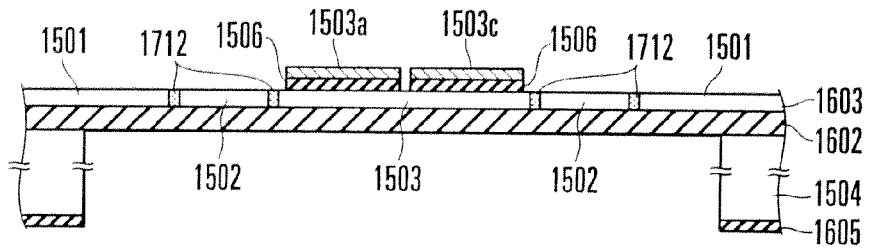
Figure 76L:
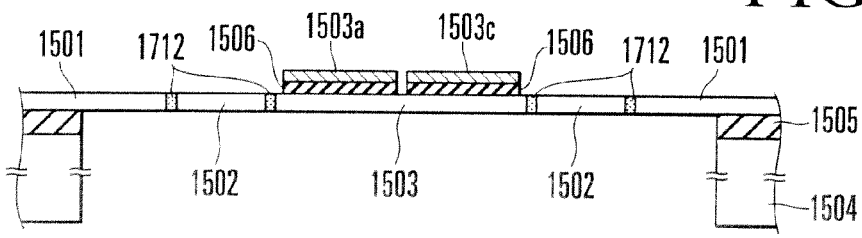

The inorganic mask layer 1604a is etched by using the driving electrodes 1503a and 1503c as a mask and removed so that the driving electrodes 1503a and 1503c exist on an insulating layer 1506 on the SOI layer 1603, as shown in FIG. 76J. Instead of selectively removing the inorganic mask layer 1504a, it may be used as the insulating layer 1506. Next, the oxide layer 1605 and silicon base 1601 are etched by using a mask pattern (frame formation mask pattern) formed by known photolithography to form the frame portion 1504, as shown in FIG. 76K. The mask pattern is removed. Then, the oxide layer 1605 and the buried insulating layer 1602 exposed inside the frame portion 1504 are removed by, e.g., wet etching using an alkaline solution or dry etching, as shown in FIG. 76L, so that the frame portion 1504 is fixed to the base 1501 through the insulating layer 1505.

After that, for example, a reflecting film made of a metal film of, e.g., Au is formed on the surface of the mirror 1503 with the frame portion 1504 by, e.g., vapor deposition. A step of bonding the formed mirror substrate to the electrode substrate to form a mirror device, a step of packaging the mirror device and fixing it by die bonding, and a step of wire-bonding the terminals of the package to the terminals of the electrode substrate are executed. Then, the protective layer 1712 is removed by, e.g., ashing using oxygen plasma to form a space between the base 1501, movable frame 1502, and mirror 1503 to make the movable frame 1502 and mirror 1503 pivotable. With the above-described bonding, the mirror substrate 1500 is fixed on the rib structures 1531 provided on the electrode substrate 1530. The protective layer 1712 may be removed between the above-described packaging steps.

For example, it is possible to suppress damage to the connectors even when an external mechanical vibration is added in loading and fixing the mirror substrate 1500 in a vapor deposition apparatus to form the above-described reflecting film. Similarly, it is possible to suppress damage to the connectors in the step of bonding the mirror substrate to the electrode substrate to form the mirror device, the step of packaging the mirror device and fixing it by die bonding, and the step of wire-bonding the terminals of the package to the terminals of the electrode substrate.

The above-described manufacturing method is merely an example. Another manufacturing method is also usable for forming the mirror substrate shown in FIG. 75. For example, the structures such as the mirror and movable frame are formed after formation of the driving electrodes. However, the driving electrodes may be formed after formation of the mirror and movable frame. The driving electrodes are formed by etching using a mask pattern as a mask. However, the present invention is not limited to this. The driving electrodes may be formed by so-called lift-off.

Figure 77:
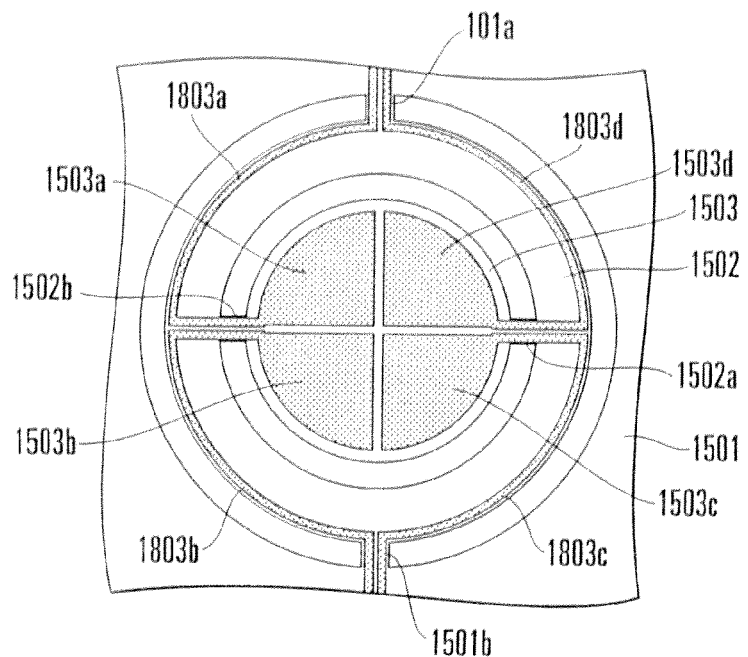
FIG. 77 is a schematic plan view showing a structural example of the mirror substrate according to the 20th embodiment.

Interconnections connected to the driving electrodes 1503*a* to 1503*d* formed on the mirror 1503 will be described next. For example, as shown in schematic plan view of FIG. 77, the driving electrodes 1503*a* to 1503*d* can be led to the side of the base 1501 by interconnections 1803*a* to 1803*d* which pass through the connectors 1501*a* and 1501*b* and mirror connectors 1502*a* and 1502*b*. The driving electrodes are symmetrical with respect to the center of the mirror (mirror structure) 1503.

Figure 78:
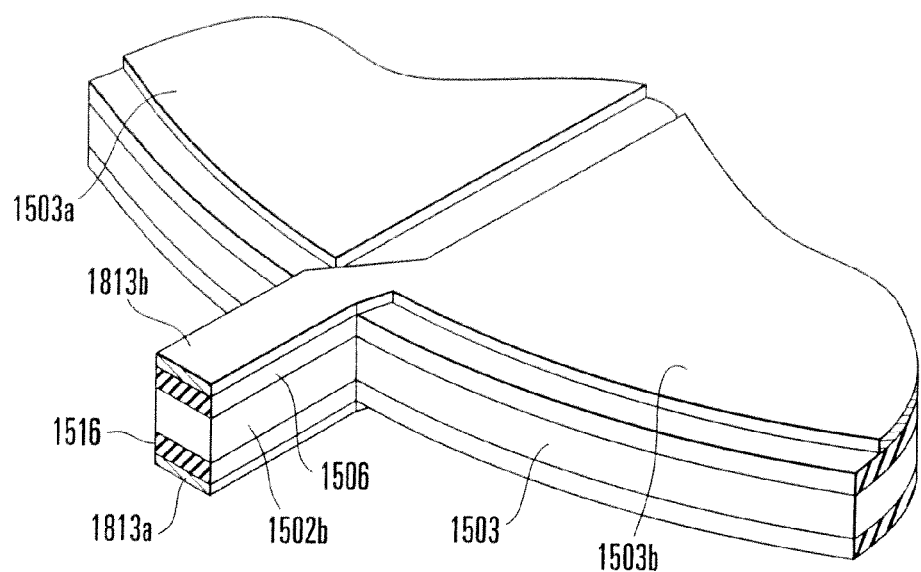
FIG. 78 is a schematic perspective view partially showing a structural example of the mirror substrate according to the 20th embodiment.

As shown in the partial enlarged perspective view of FIG. 78, an interconnection 1813*b* provided on the insulating layer 1506 formed on one surface of the mirror connector 1502*a* may connect to the driving electrode 1503*b*, and an interconnection 1813*a* provided on an insulating layer 1516 formed on the other surface may connect to the driving electrode 1503*a*. The interconnection 1813*a* connects to the driving electrode 1503*a* through a plug (not shown) extending through the insulating layer 1506, mirror 1503, and insulating layer 1516. This also applies to the driving electrodes 1503*c* and 1503*d*.

Figure 79:
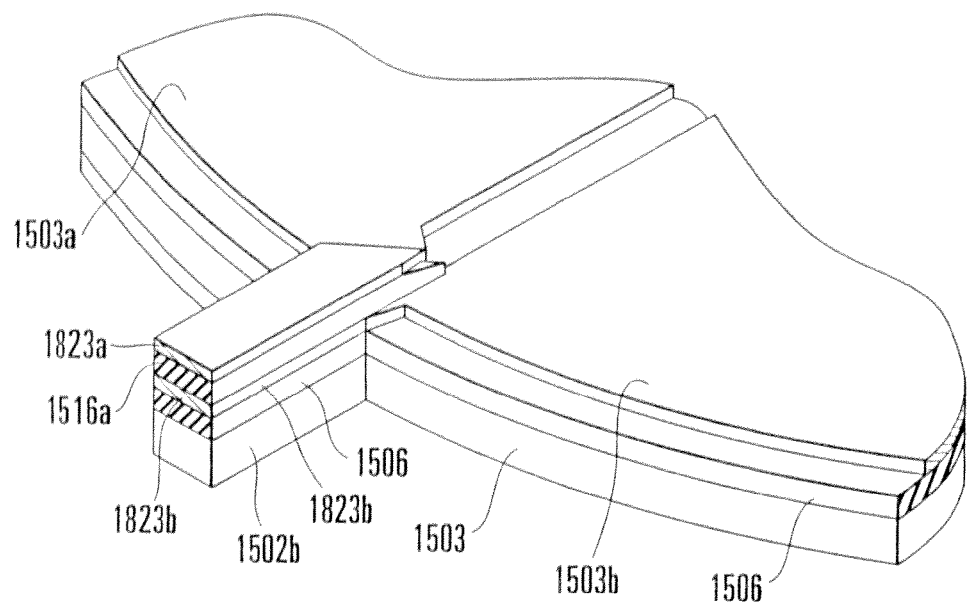
FIG. 79 is a schematic perspective view partially showing a structural example of the mirror substrate according to the 20th embodiment.

As shown in the partial enlarged perspective view of FIG. 79, an interconnection 1823*b* provided on the insulating layer 1506 formed on one surface of the mirror connector 1502*a* may connect to the driving electrode 1503*b*, and an interconnection 1823*a* provided on an insulating layer 1516*a* on the interconnection 1823*b* may connect to the driving electrode 1503*a*. This also applies to the driving electrodes 1503*c* and 1503*d*.

Figure 80:
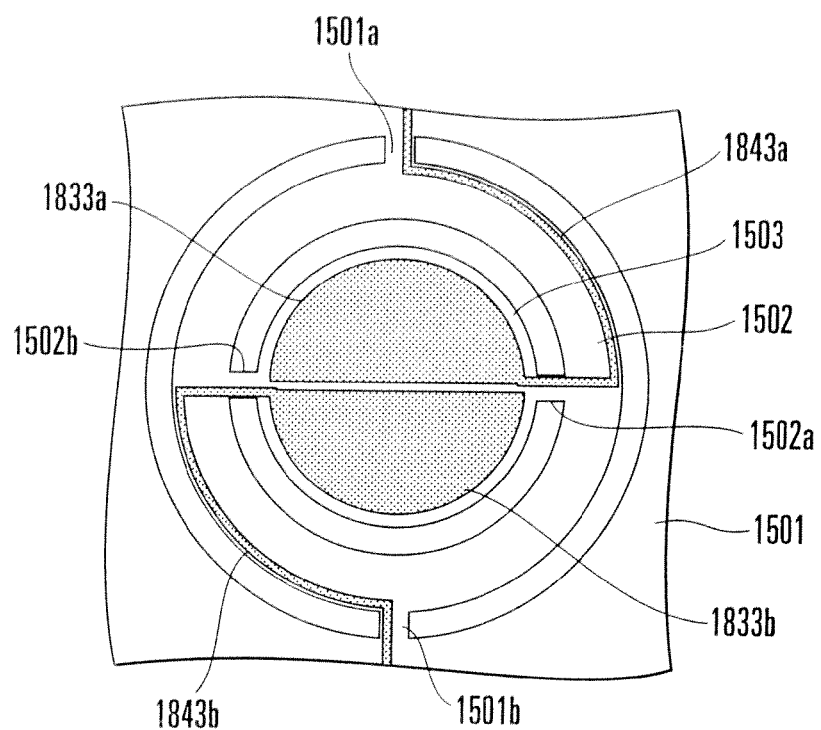
FIG. 80 is a plan view schematically showing a structural example of the mirror substrate according to the 20th embodiment.

As shown in the schematic plan view of FIG. 80, the mirror 1503 may have two divided driving electrodes 1833*a* and 1833*b*. The driving electrodes 1833*a* and 1833*b* can be led to the side of the base 1501 by interconnections 1843*a* and 1843*b* which pass through the connectors 1501*a* and 1501*b* and mirror connectors 1502*a* and 1502*b*. The driving electrodes are symmetrical with respect to the center of the mirror (mirror structure) 1503.

Figure 81:
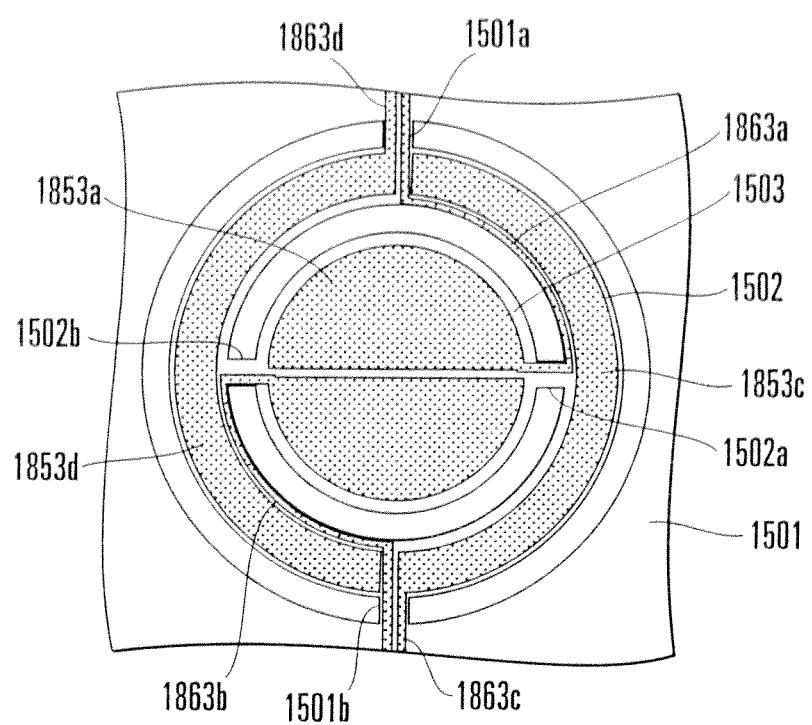
FIG. 81 is a plan view schematically showing a structural example of the mirror substrate according to the 20th embodiment.

As shown in the schematic plan view of FIG. 81, the mirror 1503 may have two divided driving electrodes 1853*a* and 1853*b*. The movable frame 1502 may have two divided driving electrodes 1853*c* and 1853*d*. The driving electrodes 1853*a* and 1853*b* can be led to the side of the base 1501 by interconnections 1863*a* and 1863*b* which pass through the connectors 1501*a* and 1501*b* and mirror connectors 1502*a* and 1502*b*. The driving electrodes 1853*c* and 1853*d* can be led to the side of the base 1501 by interconnections 1863*c* and 1863*d* which pass through the connectors 1501*a* and 1501*b*.

In the above description, the common electrode 1541 is arranged in a region to cover the projecting portion 1536. However, the present invention is not limited to this. It is unnecessary to arrange a patterned electrode on the side of the electrode substrate 1530. For example, a metal layer connected to the ground potential may be arranged as a common electrode in the entire region of the electrode substrate 1530 facing the mirror substrate 1500. This allows to omit the step of patterning the common electrode and more easily manufacture the mirror device at a low cost. The electrode substrate 1530 may have a flat common electrode without having the projecting portion 1536.

21st Embodiment

The 21st embodiment of the present invention will be described next. This embodiment more easily increases the interval between the mirror substrate and the electrode substrate by joining the mirror substrate to rib structures while inserting a gap auxiliary layer therebetween so that the mirror substrate is spaced apart from the electrode substrate by the gap auxiliary layer and rib structures.

Figure 82:
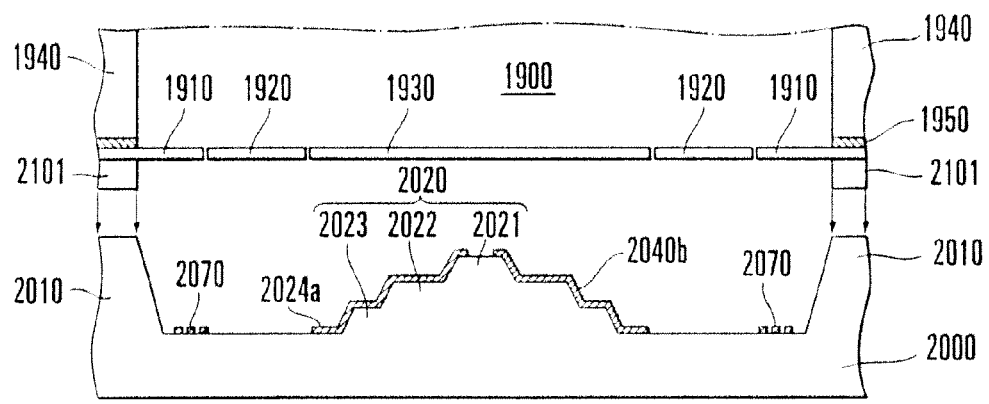
FIG. 82 is a sectional view showing the structure of a mirror device according to the 21st embodiment.
Figure 83:
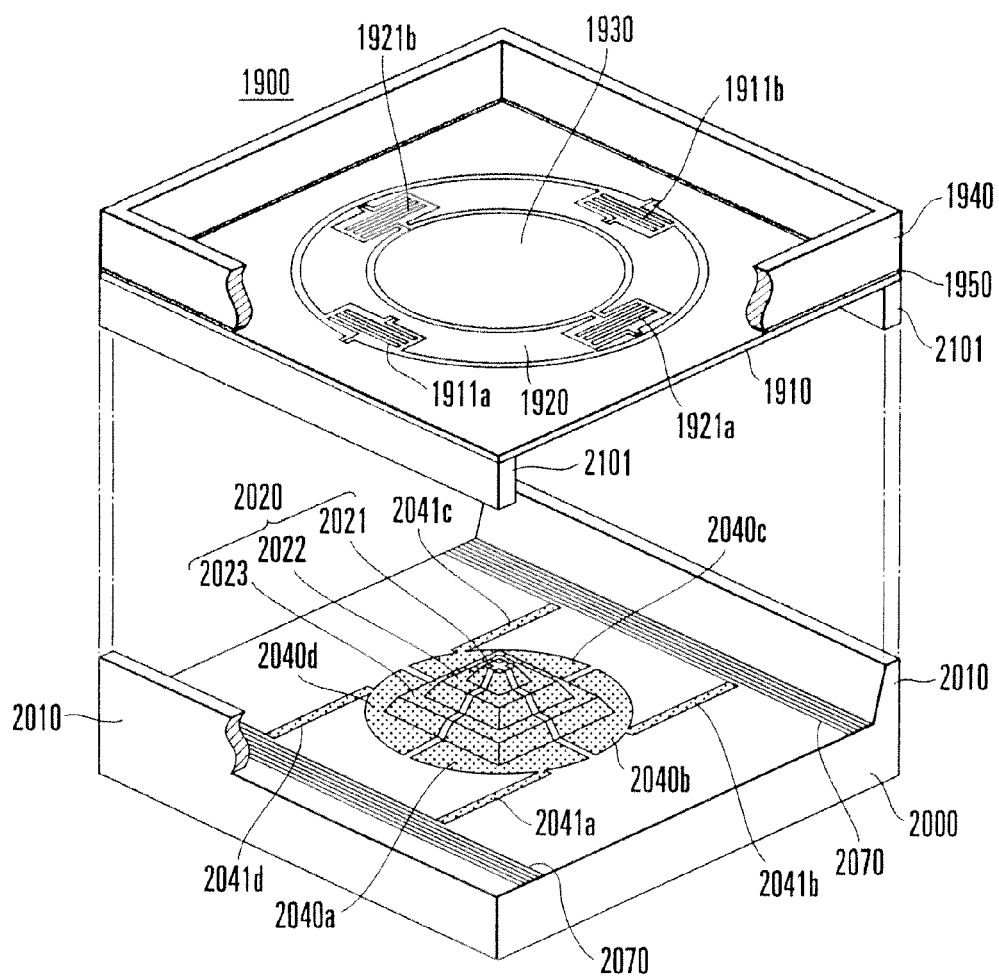
FIG. 83 is a perspective view showing the structure of the mirror device according to the 21st embodiment.

A structural example of a mirror device according to this embodiment will be described with reference to FIGS. 82 and 83. FIGS. 82 and 83 mainly partially illustrate a mirror device as a constituent unit of a mirror array. In a mirror array, for example, mirror devices shown in FIG. 82 are arrayed two-dimensionally in a square pattern. The mirror array comprises a plurality of mirror substrates 1900 with mirrors and a plurality of electrode substrates 2000 with electrode portions. The mirror substrate 1900 and electrode substrate 2000 are arranged in parallel.

The mirror substrate 1900 comprises a plate-shaped base 1910, ring-shaped movable frame 1920, and disk-shaped mirror 1930. The base 1910 has an opening having an almost circular shape when viewed from the upper side. The movable frame 1920 is arranged in the opening of the base 1910 and connected to the base 1910 by a pair of connectors 1911*a* and 1911*b*. The movable frame 1920 also has an opening having an almost circular shape when viewed from the upper side. The mirror 1930 is arranged in the opening of the movable frame 1920 and connected to the movable frame 1920 by a pair of mirror connectors 1921*a* and 1921*b*. A frame portion 1940 surrounding the movable frame 1920 and mirror 1930 is formed at the periphery of the base 1910. The frame portion 1940 is fixed to the base 1910 through an insulating layer 1950. Additionally, in the mirror device shown in FIGS. 82 and 83, the base 1910 has, at its peripheral portion, a gap auxiliary layer 2101 on a surface (lower surface) facing the electrode substrate 2000. The gap auxiliary layer 2101 may have a frame shape.

The connectors 1911*a* and 1911*b* including zigzag torsion springs and provided in the notches of the movable frame 1920 connect the base 1910 to the movable frame 1920. This structure makes the movable frame 1920 connected to the base 1910 pivotable about a pivot axis (movable frame pivot axis) passing through the connectors 1911*a* and 1911*b*. The mirror connectors 1921*a* and 1921*b* including zigzag torsion springs provided in the note the movable frame 1920 connect the movable frame 1920 to the mirror 1930. This structure makes the mirror 1930 connected to the movable frame 1920 pivotable about a pivot axis (mirror pivot axis) passing through the mirror connectors 1921*a* and 1921*b*. The movable frame pivot axis and mirror pivot intersect each other at a right angle.

The electrode substrate 2000 has a projecting portion 2020 and rib structures 2010 provided at the periphery of the projecting portion 2020. The projecting portion 2020 includes a third terrace 2023 having a truncated pyramidal shape, a second terrace 2022 formed on the upper surface of the third terrace 2023 and having a truncated pyramidal shape, and a first terrace 2021 formed on the upper surface of the second terrace 2022 and having a truncated pyramidal shape. The upper surface of the electrode substrate 2000 including the outer surface of the projecting portion 2020 has sector electrode 2040*a* to 2040*d* formed in a circle concentric to the mirror 1930 on the counter mirror substrate 1900. Interconnection 2070 are formed around the projecting portion 2020 on the electrode substrate 2000. The electrode 2040*a* to 2040*d* connect to the interconnections 2070 through leads

2041a to 2041d. The electrodes may be arranged without forming the projecting portion 2020. The interconnections need not be formed on the surface of the electrode substrate with the electrodes and may be arranged in the electrode substrate by via interconnections.

The mirror 1930 on the mirror substrate 1900 faces the electrode 2040a to 2040d on the counter electrode substrate 2000. The gap auxiliary layer 2101 provided on the lower surface of the base 1910 is joined to the upper surfaces of the rib structures 2010. FIGS. 82 and 83 show a state wherein the mirror substrate 1900 is spaced apart from the electrode substrate 2000 for the illustrative convenience. According to the mirror device shown in FIGS. 82 and 83, the rib structures 2010 and gap auxiliary layer 2101 form the gap between the mirror substrate 1900 and the electrode substrate 2000. In other words, the rib structures 2010 and gap auxiliary layer 2101 join the mirror substrate 1900 to the electrode substrate 2000.

Hence, a desired gap is formed by the rib structures 2010 and gap auxiliary layer 2101. This enables to suppress their thickness. As a result, for example, the step difference on the mirror substrate 1900 is not so large even if the gap auxiliary layer 2101 exists. Hence, a fine pattern such as the connectors 1911a and 1911b and mirror connectors 1921a and 1921b can be formed accurately. The rib structures 2010 and gap auxiliary layer 2101 support the mirror substrate 1900 and electrode substrate 2000 while spacing them apart from each other by a predetermined distance, thereby forming, between the mirror substrate 1900 and the electrode substrate 2000, a space where a movable structure such as the mirror 1930 can move. It is therefore necessary to only form the rib structures 2010 in a region on the electrode substrate 2000 without the electrodes. The gap auxiliary layer 2101 need only be arranged in accordance with the positions of the thus formed rib structures 2010.

To increase the difference of elevation of the projecting portion, the interval (gap) between the mirror substrate and the electrode substrate is increased. Conventionally, it is difficult to increase the gap. In a prior art, for example, convex portions (rib structures) 8360a and 8360b formed by fabricating an electrode substrate 8301 form a gap between a mirror substrate 8201 and the electrode substrate 8301, as shown in the sectional view of FIG. 13. Alternatively, a frame portion 8241 of a mirror substrate 8200 forms a gap between the mirror substrate 8200 and an electrode substrate 8300, as shown in the sectional view of FIG. 86. Support portions 8260 formed on a frame portion (base) 8210 of the mirror array 800 may form a gap between the mirror substrate 8200 and the electrode substrate 8300, as shown in the sectional view of FIG. 87.

In the structure shown in FIG. 13, however, the electrodes and interconnections are formed after the convex portions 8360a and 8360b are formed. Hence, the convex portions 8360a and 8360b cannot be so high. Generally, electrodes and interconnections are formed by photolithography. Photoresist application and exposure are very difficult in a region with a large step difference. For example in normal photolithography, the step difference that allows pattern formation is about 70 μm.

Figure 86:
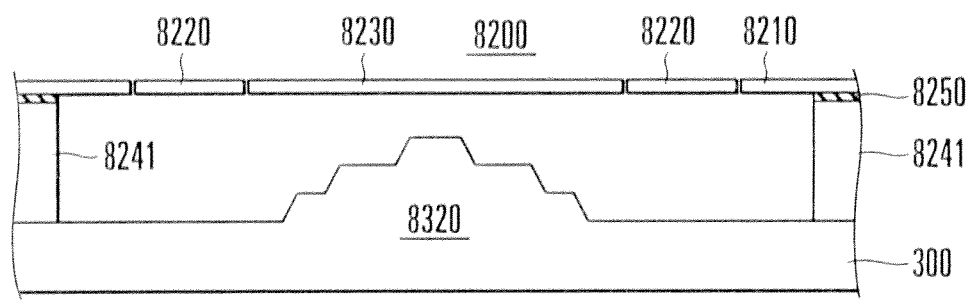
FIG. 86 is a sectional view showing a structural example of a conventional mirror device.
Figure 87:
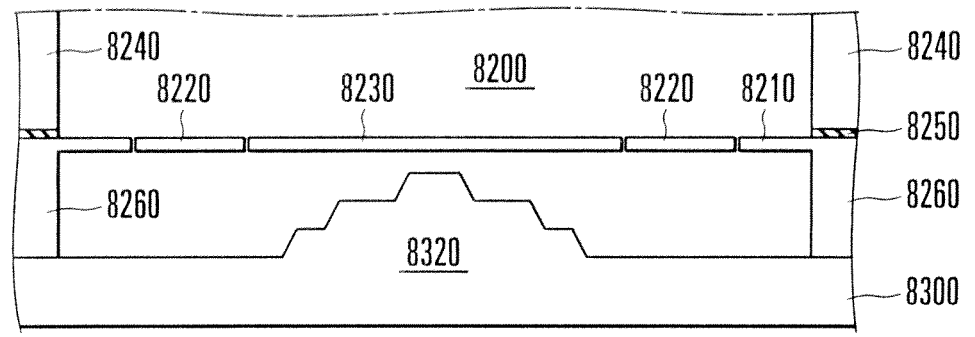
FIG. 87 is a sectional view showing a structural example of a conventional mirror device.

In the structure shown in FIG. 86, the frame portion 8241 of an SOI substrate can be formed by fabricating a thick silicon base. However, since the gap is about 100 to 200 μm, the base is thinned to about 100 to 200 μm. However, such a thin mirror substrate has a remarkably low strength and readily breaks in handling in the mirror formation step or mounting step. In the structure shown in FIG. 87, the support portions 8260 produces a large step difference on the SOI layer with the mirror 8230 and frame portion 8210. If a large step difference exists, it is very difficult to pattern a fine structure such as connectors.

A mirror element according to this embodiment has the above-described structure. Since the mirror substrate is joined to the rib structures via the gap auxiliary layer, the gap auxiliary layer and rib structures space the mirror substrate apart from the electrode substrate so that the interval between the mirror substrate and the electrode substrate can more easily increase. The electrode substrate may have a projecting portion formed into an almost conical shape from the base and facing the mirror. Electrodes may be formed on the projecting portion.

Figure 84A:
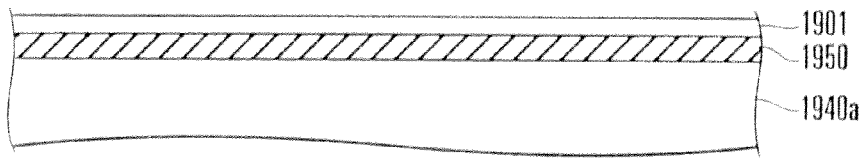
FIGS. 84A to 84E are views for explaining an example of steps in manufacturing a mirror substrate included in the mirror device according to the 21st embodiment.
Figure 84B:
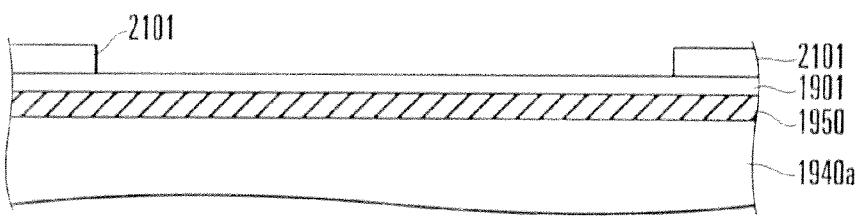

An example of a method of manufacturing the mirror substrate 1900 included in the mirror device of this embodiment will be described next. First, as shown in FIG. 84A, an SOI substrate having, on a silicon base 1940a with a plane orientation (100), the insulating layer 1950 made of silicon oxide and having a thickness of, e.g., about 1 μm, and a 10-μm thick single-crystal silicon layer (SOI layer) 1901 is prepared. The insulating layer 1950 is a buried insulating layer. As shown in FIG. 84B, the gap auxiliary layer 2101 is formed on the silicon base 1940a. The gap auxiliary layer 2101 can be formed by, e.g., selectively forming a seed layer in the formation region of the gap auxiliary layer 2101 and forming a metal layer on the seed layer by electrolytic plating. The gap auxiliary layer 2101 needs to be formed at the boundary of a region corresponding to one mirror device.

Figure 84C:
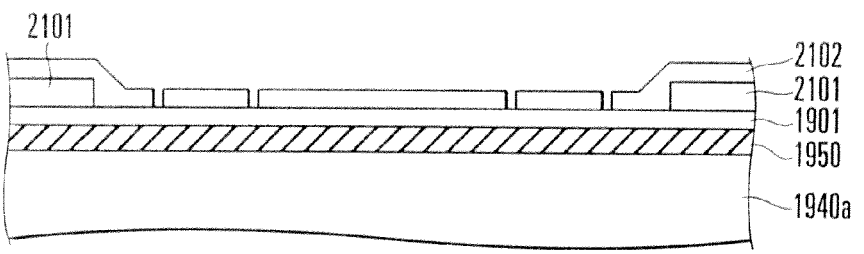
Figure 84D:
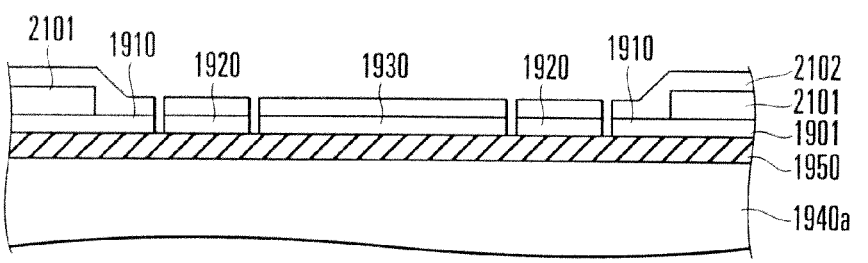

As shown in FIG. 84C, a mask pattern 2102 is formed on the SOI layer 1901. The SOI layer 1901 is etched by using the mask pattern 2102 as a mask. At this time, directional etching such as reactive ion etching is performed to expose the surface of the insulating layer 1950 at the etched portions. With this etching, the base 1910, movable frame 1920, mirror (mirror structure) 1930, connectors (not shown), and mirror connectors (not shown) are formed. That is, the basic structure of the mirror substrate is complete, as shown in FIG. 84D.

After the mask pattern 2102 is removed, a mask pattern (not shown) is formed on the lower surface of the silicon base 1940a. The mask pattern corresponds to one mirror portion of a mirror array and has a square opening region for each mirror. The silicon base 1940a is etched by dry etching by using a CF-based gas and the mask pattern as a mask until the insulating layer 1950 exposes. This process may be wet etching.

Figure 84E:
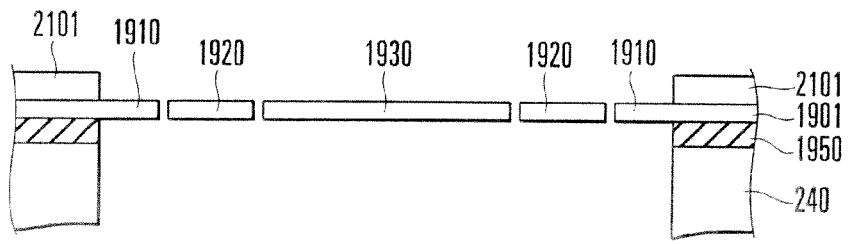

After that, the mask pattern is removed. The mask pattern can be removed by, e.g., ashing or appropriate etching. The insulating layer 1950 exposed inside the formed opening region is removed to form the frame portion 1940, as shown in FIG. 84E. In FIGS. 84A to 84E, the connectors and mirror connectors are formed after formation of the gap auxiliary layer. However, the present invention is not limited to this. The gap auxiliary layer may be formed after the precise fine patterns of the connectors and mirror connectors are formed.

Figure 85A:
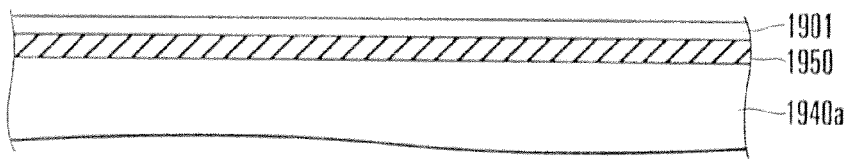
FIGS. 85A to 85E are views for explaining an example of steps in manufacturing the mirror substrate included in the mirror device according to the 21st embodiment.

Another example of the method of manufacturing the mirror substrate 1900 included in the mirror device of this embodiment will be described next. First, as shown in FIG. 85A, an SOI substrate having, on the silicon base 1940a with a plane orientation (100), the insulating layer 1950 made of silicon oxide and having a thickness of, e.g., about 1 μm, and the 10-μm thick single-crystal silicon layer (SOI layer) 1901 is prepared. This is the same as in the manufacturing method described with reference to FIGS. 84A to 84E.

Figure 85B:
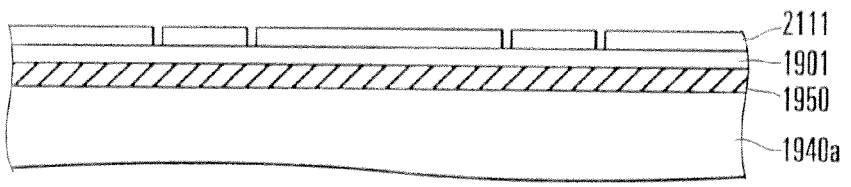
Figure 85C:
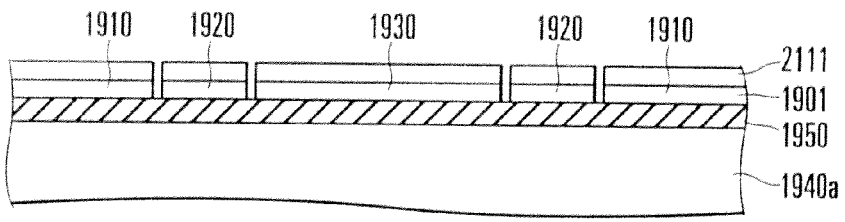

As shown in FIG. 85B, a mask pattern 2111 is formed on the SOI layer 1901. The SOI layer 1901 is etched by using the mask pattern 2102 as a mask. At this time, directional etching such as reactive ion etching is performed to expose the surface of the insulating layer 1950 at the etched portions. With this etching, the base 1910, movable frame 1920, mirror (mirror structure) 1930, connectors (not shown), and mirror connectors (not shown) are formed. That is, the basic structure of the mirror substrate is complete, as shown in FIG. 85C.

Figure 85D:
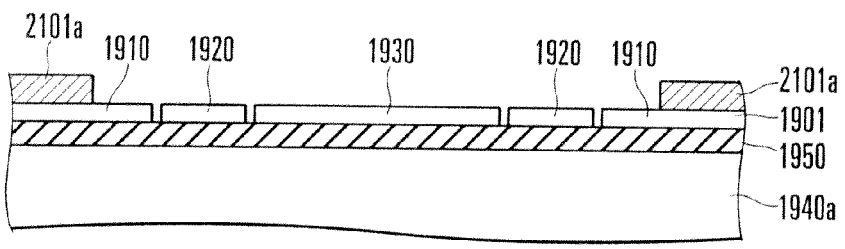

After the mask pattern 2111 is removed, a gap auxiliary layer 2101a of, e.g. glass is formed on the base 1910 (SOI layer 1901), as shown in FIG. 85D. The gap auxiliary layer 2101a of glass is joined to the silicon base 1910 by, e.g., known anodic bonding.

A mask pattern is formed on the lower surface of the silicon base 1940a. The mask pattern corresponds to one mirror portion of a mirror array and has a square opening region for each mirror. The silicon base 1940a is etched by dry etching by using a CF-based gas and the mask pattern as a mask until the insulating layer 1950 exposes. This process may be wet etching.

Figure 85E:
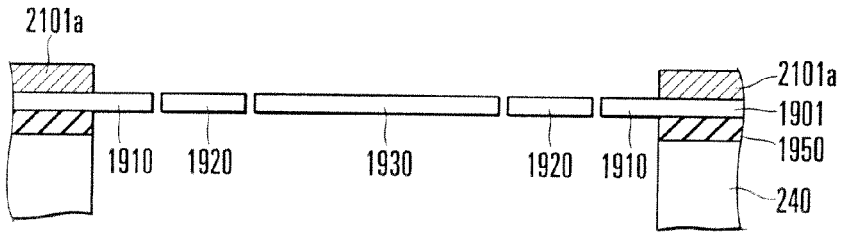

After that, the mask pattern is removed. The mask pattern can be removed by, e.g., ashing or appropriate etching. The insulating layer 1950 exposed inside the formed opening region is removed to form the frame portion 1940, as shown in FIG. 85E.

22nd Embodiment

The 22nd embodiment of the present invention will be described next.

The constituent elements of a conventional mirror device 8200 shown in FIGS. 11 to 13 and, particularly, the constituent elements (to be referred to as movable members hereinafter) of a mirror substrate 8201 including a movable frame 8220, mirror 8230, movable frame connectors 8211a and 8211b, and mirror connectors 8221a and 8221b are spaced part from adjacent members to make the mirror 8230 pivot about the mirror pivot axis and movable frame pivot axis. For this reason, external impact on the mirror device 8200 may cause the movable members of the mirror substrate 8201 to collide against adjacent members and break. Hence, the movable members of the mirror substrate 8201 and the members adjacent to the movable members must have intervals to prevent collusion between adjacent constituent elements in case of external impact.

This embodiment has been made to solve the above-described problem and has as its object to provide a mirror device and a mirror array which have a high impact resistance.

This embodiment will be described below in detail with reference to the accompanying drawings. A mirror array according to this embodiment sets the intervals between the movable members of the mirror substrate of a mirror device included in the mirror array and members adjacent to the movable members to a predetermined value. The same names and reference numerals as in the mirror device shown in FIGS. 14 to 16B denote the same constituent elements in FIG. 88 that shows this embodiment, and a description thereof will be omitted as needed.

A mirror device included in a mirror array according to this embodiment sets four intervals d1 to d4 in a mirror substrate 200 to predetermined values.

Figure 88:
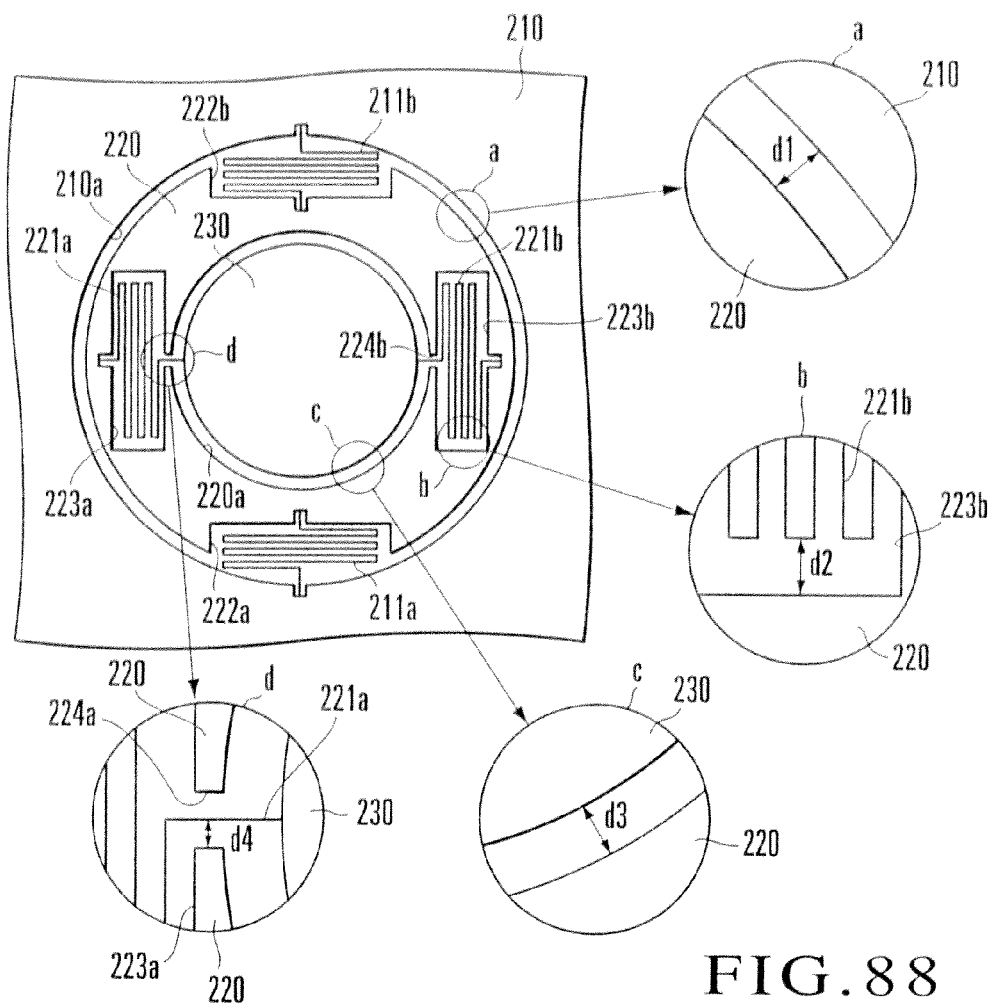
FIG. 88 is a plan view for explaining the structure of a mirror substrate according to the 22nd embodiment.

As well shown in an enlarged view a of FIG. 88, the interval d1 is the interval between the edge of an opening 210a of a frame portion 210 and the arc-shaped edge of a movable frame 220.

As well shown in an enlarged view b of FIG. 88, the interval d2 is the interval between a mirror connector 221b and a second notch 223b and, more specifically, the interval between an end of the mirror connector 221b in a direction perpendicular to the mirror pivot axis and an edge of the second notch 223b adjacent to the end and parallel to the mirror pivot axis. The interval d2 also includes the interval between an end of the mirror connector 221b in a direction parallel to the mirror pivot axis and an edge of the second notch 223b adjacent to the end and perpendicular to the mirror pivot axis.

The interval d2 also includes the interval between a mirror connector 221a and a second notch 223a, the interval between a movable frame connector 211a and a first notch 222a, and the interval between a movable frame connector 211b and a first notch 222b. Their detailed contents are as follows.

The interval between the mirror connector 221a and the second notch 223a indicates the interval between an end of the mirror connector 221a in a direction perpendicular to the mirror pivot axis and an edge of the second notch 223a adjacent to the end and parallel to the mirror pivot axis. This interval also includes the interval between an end of the mirror connector 221a in a direction parallel to the mirror pivot axis and an edge of the second notch 223a adjacent to the end and perpendicular to the mirror pivot axis.

The interval between the movable frame connector 211a and the first notch 222a indicates the interval between an end of the movable frame connector 211a in a direction perpendicular to the movable frame pivot axis and an edge of the first notch 222a adjacent to the end and parallel to the movable frame pivot axis. This interval also includes the interval between an end of the movable frame connector 211a in a direction parallel to the movable frame pivot axis and an edge of the first notch 222a adjacent to the end and perpendicular to the movable frame pivot axis.

The interval between the movable frame connector 211b and the first notch 222b indicates the interval between an end of the movable frame connector 211b in a direction perpendicular to the movable frame pivot axis and an edge of the first notch 222b adjacent to the end and parallel to the movable frame pivot axis. This interval also includes the interval between an end of the movable frame connector 211b in a direction parallel to the movable frame pivot axis and an edge of the first notch 222b adjacent to the end and perpendicular to the movable frame pivot axis.

As well shown in an enlarged view c of FIG. 88, the interval d3 is the interval between the edge of an opening 220a of the movable frame 220 and the edge of a mirror 230.

As well shown in an enlarged view d of FIG. 88, the interval d4 is the interval between the mirror connector 221a and the movable frame 220 and, more specifically, the interval between an end of the mirror connector 221a on the side connected to the mirror 230 and formed along the mirror pivot axis and an edge of a communicating portion 224a that communicates the second notch 223a of the movable frame 220 to the opening 220a.

The interval d4 also includes the interval between the movable frame 220 and the mirror connector 221b as the counterpart of the mirror connector 221a and, more specifically, the interval between an end of the mirror connector 221b on the side connected to the mirror 230 and formed along the mirror pivot axis and an edge of a communicating portion 224b that communicates the second notch 223b of the movable frame 220 to an opening 220b.

The intervals d1 to d4 are set in the following way.

Let m [kg] be the mass of a movable portion of the mirror device, and G [m/s$^2$] be the acceleration applied to the movable portion. The movable portion receives a force given by mG. Let d be the displacement amount of the movable portion, and k be the spring constant of the movable frame connectors 211a and 211b and mirror connectors 221a and 221b that support the movable portion. The relationship between m, G, k, and d is given by $$mG=kd \quad (15)$$

From equation (15), the displacement amount d is calculated by $$d=mG/k \quad (16)$$

The intervals d1 to d4 are set to be larger than the value of the displacement amount d of equation (16). This prevents the movable member of the mirror substrate 200 from contacting a member adjacent to the movable member and breaking even when the acceleration G is applied to the mirror array according to this embodiment.

The value of the acceleration G can freely be set as needed on the basis of the desired value of impact resistance to be imparted to the mirror array of this embodiment.

The movable portion of the mirror device indicates the movable frame 220 and mirror 230. The movable frame 220 has opening portions such as the opening 220a, first notches 222a and 222b, and second notches 223a and 223b. To more reliably prevent the mirror device from breaking, the mass is set assuming that the movable portion is a perfect circle without openings. Let r be the radius of the movable frame 220, ρ be the density of the material of the movable frame 220 and mirror 230, and h be the thickness of the movable frame 220 and mirror 230. At this time, the mass in of the movable portion is given by $\pi r^2 \rho h$.

The mirror connectors 221a and 221b support the mirror 230 and displace in accordance with the acceleration applied to the mirror 230. The intervals related to the mirror connectors 221a and 221b, i.e., the intervals d2 related to the mirror connectors 221a and 221b and the intervals d3 and d4 are set to be larger than the displacement d calculated from equation (16) by substituting the mass of the mirror 230 into the mass m. In this embodiment, to more reliably prevent the mirror device from breaking, the mass m of equation (16) uses a value calculated from $\pi r^2 \rho h$ by using the radius r of the movable frame 220, as described above.

Figure 89:
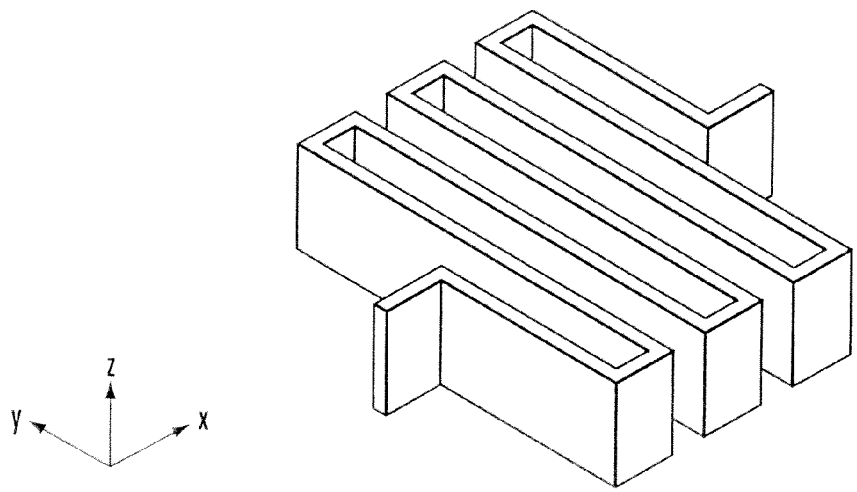
FIG. 89 is a perspective view showing a torsion spring that forms a movable frame connector and a mirror connector.

The zigzag torsion springs included in the movable frame connectors 211a and 211b and mirror connectors 221a and 221b displace in the X and Y directions, as shown in FIG. 89. For the spring constants k of the movable frame connectors 211a and 211b and mirror connectors 221a and 221b, a spring constant $k_x$ in the X-axis and a spring constant $k_y$ in the Y direction must be taken into consideration. The mirror array of this embodiment employs the smallest one of the spring constants $k_x$ and $k_y$, which is substituted into equation (16). This more reliably prevents the movable member of the mirror substrate 200 from contacting a member adjacent to the movable member and breaking even when the acceleration G is applied to the mirror device. Hence, the mirror array according to this embodiment has high impact resistance.

In this embodiment, the pair of movable frame connectors 211a and 211b support the movable frame 230. The pair of mirror connectors 221a and 221b support the mirror 230. The spring constant k of equations (15) and (16) indicates the value of the spring constant of the pair of movable frame connectors 211a and 211b or the spring constant of the pair of mirror connectors 221a and 221b.

The spring constants of the movable frame connectors 211a and 211b and mirror connectors 221a and 221b may be calculated after setting the intervals d1 to d4 in advance. In this case, together with the mass m of the movable portion of the mirror device, the acceleration G applied to the movable portion, the preset values of the intervals d1 to d4 are substituted into the displacement amount d of equation (17) rewritten from equation (15), thereby calculating the spring constant k. On the basis of the calculated spring constant k, the shapes and sizes of the movable frame connectors 211a and 211b and mirror connectors 221a and 221b are set such that the spring constants $k_x$ and $k_y$ of the movable frame connectors 211a and 211b and mirror connectors 221a and 221b in the respective directions exceed the spring constant k calculated from equation (17). This also prevents the movable member of the mirror substrate 200 from contacting a member adjacent to the movable member.

$$k=mG/d \quad (17)$$

A detailed setting example of the spring constant will be described next.

For example, assume that the mass of the movable portion of the mirror device is $1.6 \times 10^{-8}$ [kg], the acceleration applied to the mirror device is 100 G, and the intervals d1 to d4 are 10 [μm]. The spring constant k is calculated by $$(1.6 \times 10^{-8}) \times (100 \times 9.81)/10 \times 10^{-6} \approx 1.57$$

Hence, setting the shapes and the like of the movable frame connectors 211a and 211b and mirror connectors 221a and 221b such that the spring constants of the movable frame connectors 211a and 211b and mirror connectors 221a and 221b exceed 1.57 allows to prevent the movable member of the mirror substrate 200 from contacting a member adjacent to the movable member.

A method of manufacturing a mirror array according to this embodiment will be described next.

The mirror substrate 200 is formed from an SOI (Silicon On Insulator) substrate.

First, a side (major surface: SOI layer) of the SOI substrate with a buried insulating layer 250 undergoes known photolithography and etching such as DEEP RIE to form, in the single-crystal silicon layer, trenches conforming to the shapes of the frame portion 210, movable frame connectors 211a and 211b, movable frame 220, mirror connectors 221a and 221b, and mirror 230.

At this time the trenches are formed such that the above-described intervals d1 to d4 equal or exceed the displacement amount d calculated on the basis of equation (16). More specifically, the mass m of the movable member including the movable frame 220 and mirror 230 is calculated from, e.g., the shapes of the trenches. The spring constants k of the movable frame connectors 211a and 211b and mirror connectors 221a and 221b are calculated from, e.g., the shapes of the trenches. The acceleration G that the mirror array should stand is set. Substituting these values into equation (16) yields the displacement amount d, and the trenches are formed such that the intervals d1 to d4 equal or exceed the displacement amount d.

A resist pattern with openings in predetermined regions corresponding to the trenches is formed on the lower surface of the SOI substrate. The silicon is selectively etched from the lower surface of the SOI substrate by dry etching using, e.g., $SF_6$. In this etching, the opening and frame-shaped member 240 are formed on the lower surface of the SOI substrate by using the buried insulating layer 250 as an etching stopper layer. The silicon may be etched by wet etching using, e.g., potassium hydroxide.

A region of the buried insulating layer 250 exposed to the opening is removed by dry etching using, e.g., $CF_4$ gas. The buried insulating layer 250 may be removed by using hydrofluoric acid.

On the other hand, an electrode substrate 300 is formed from, e.g., a silicon substrate.

First, a silicon substrate is selectively etched by using, as a mask, a predetermined mask pattern made of a silicon nitride film or silicon oxide film and a potassium hydroxide solution. A base 310, first to third terraces 321 to 323, pivot 330, outer trench 350, and convex portions 360a and 360b are formed by repeating the above-described process.

The surface of the silicon substrate on the etched side is oxidized to form a silicon oxide film.

A metal film is formed on the silicon oxide film by, e.g., vapor deposition and patterned by known photolithography and etching to form electrodes 340a to 340d, leads 341a to 341d, and interconnections 370.

With this process, the electrode substrate 300 having the above-described shape is formed.

Then, the mirror substrate 200 is bonded to the electrode substrate 300 to form a mirror array having a mirror device that moves the mirror 230 by applying an electric field to the electrodes 340a to 340d.

The thus manufactured mirror array prevents the movable member of the mirror substrate 200 from contacting another constituent element of the mirror substrate 200 adjacent to the movable member and the mirror device from breaking even when the acceleration C is applied. Hence, the mirror array according to this embodiment has high impact resistance.

In this embodiment, the movable frame connectors 211a and 211b are provided in the first notches 222a and 222b formed in the movable frame 220. The movable frame connectors 211a and 211b may be provided in notches formed in the frame portion 210. The intervals between the movable member and a member adjacent to the movable member in this case will be described with reference to FIG. 90. The same names and reference numerals as in the mirror substrate 200 shown in FIG. 88 denote the same constituent elements in FIG. 90, and a description thereof will be omitted as needed.

Figure 90:
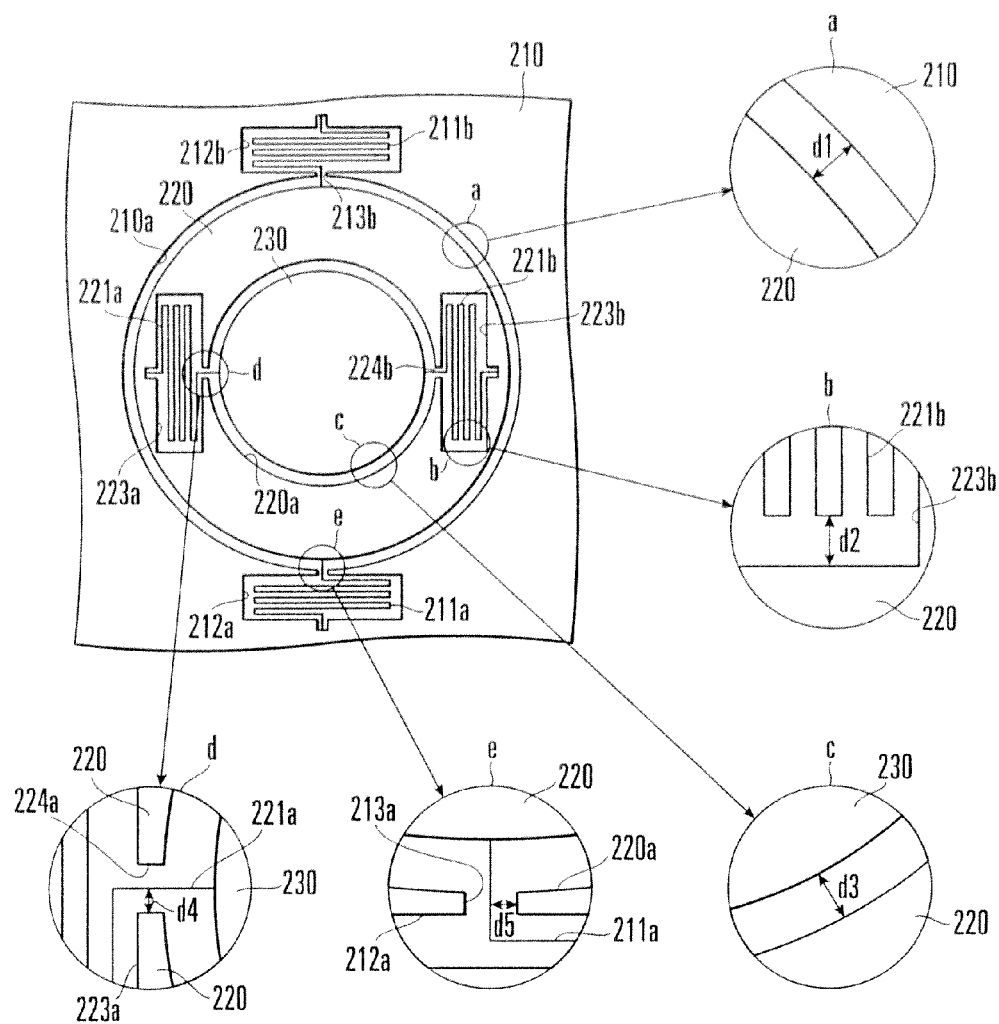
FIG. 90 is a plan view for explaining the structure of the mirror substrate according to the 22nd embodiment.

In the mirror substrate 200 shown in FIG. 90, the pair of movable frame connectors 211a and 211b including zigzag torsion springs and provided in a pair of third notches 212a and 212b of the frame portion 210 connect the frame portion 210 to the movable frame 220. This structure makes the movable frame 220 pivotable about a pivot axis (movable frame pivot axis) passing through the pair of movable frame connectors 211a and 211b.

In the mirror array shown in FIG. 90, five intervals d1 to d5 in the mirror substrate 200 are set to be larger than the value calculated by equation (16).

The intervals d1 to d4 are the same as in the mirror substrate 200 shown in FIG. 88, and a description thereof will be omitted as needed.

As well shown in an enlarged view b of FIG. 90, the interval d2 is the interval between the mirror connector 221b and the second notch 223b and, more specifically, the interval between an end of the mirror connector 221b in a direction perpendicular to the mirror pivot axis and an edge of the second notch 223b adjacent to the end and parallel to the mirror pivot axis. The interval d2 also includes the interval between an end of the mirror connector 221b in a direction parallel to the mirror pivot axis and an edge of the second notch 223b adjacent to the end and perpendicular to the mirror pivot axis.

The interval d2 also includes the interval between the mirror connector 221a and the second notch 223a, the interval between the movable frame connector 211a and the third notch 212a, and the interval between the movable frame connector 211b and the third notch 212b. Their detailed contents are as follows.

The interval between the mirror connector 221a and the second notch 223a indicates the interval between an end of the mirror connector 221a in a direction perpendicular to the mirror pivot axis and an edge of the second notch 223a adjacent to the end and parallel to the mirror pivot axis. This interval also includes the interval between an end of the mirror connector 221a in a direction parallel to the mirror pivot axis and an edge of the second notch 223a adjacent to the end and perpendicular to the mirror pivot axis.

The interval between the movable frame connector 211a and the third notch 212a indicates the interval between an end of the movable frame connector 211a in a direction perpendicular to the movable frame pivot axis and an edge of the third notch 212a adjacent to the end and parallel to the movable frame pivot axis. This interval also includes the interval between an end of the movable frame connector 211a in a direction parallel to the movable frame pivot axis and an edge of the third notch 212a adjacent to the end and perpendicular to the movable frame pivot axis.

The interval between the movable frame connector 211b and the third notch 212b indicates the interval between an end of the movable frame connector 211b in a direction perpendicular to the movable frame pivot axis and an edge of the third notch 212b adjacent to the end and parallel to the movable frame pivot axis. This interval also includes the interval between an end of the movable frame connector 211b in a direction parallel to the movable frame pivot axis and an edge of the third notch 212b adjacent to the end and perpendicular to the movable frame pivot axis.

As well shown in an enlarged view e of FIG. 90, the interval d5 is the interval between the movable frame connector 211a and the frame portion 210 and, more specifically, the interval between an end of the movable frame connector 211a on the side connected to the movable frame 220 and formed along the movable frame pivot axis and an edge of a communicating portion 213a that communicates the third notch 212a of the frame portion 210 to the opening 210a.

The interval d5 also includes the interval between the movable frame connector 211b as the counterpart of the movable frame connector 211a and the frame portion 210 and, more specifically, the interval between an end of the movable frame connector 211b on the side connected to the movable frame 220 and formed along the movable frame pivot axis and an edge of a communicating portion 213b that communicates the third notch 212b of the frame portion 210 to the opening 210a.

Even in this mirror array, the intervals d1 to d5 are set to be larger than the value of the displacement amount d of equation (16). This prevents the movable member of the mirror substrate 200 from contacting a member adjacent to the movable member and breaking even when the acceleration G is applied.

As described above, according to this embodiment, letting m be the mass of the mirror, G be the acceleration applied to the mirror device or mirror array, and k be the spring constant of an elastic member, the interval between the mirror and a frame member supporting the mirror is set to mG/k or more. This prevents the mirror from colliding against the frame member and breaking even when the acceleration G is applied to the mirror device or mirror array. Hence, the mirror device and mirror array of the present invention have high impact resistance.

23rd Embodiment

The 23rd embodiment of the present invention will be described below.

Figure 91:
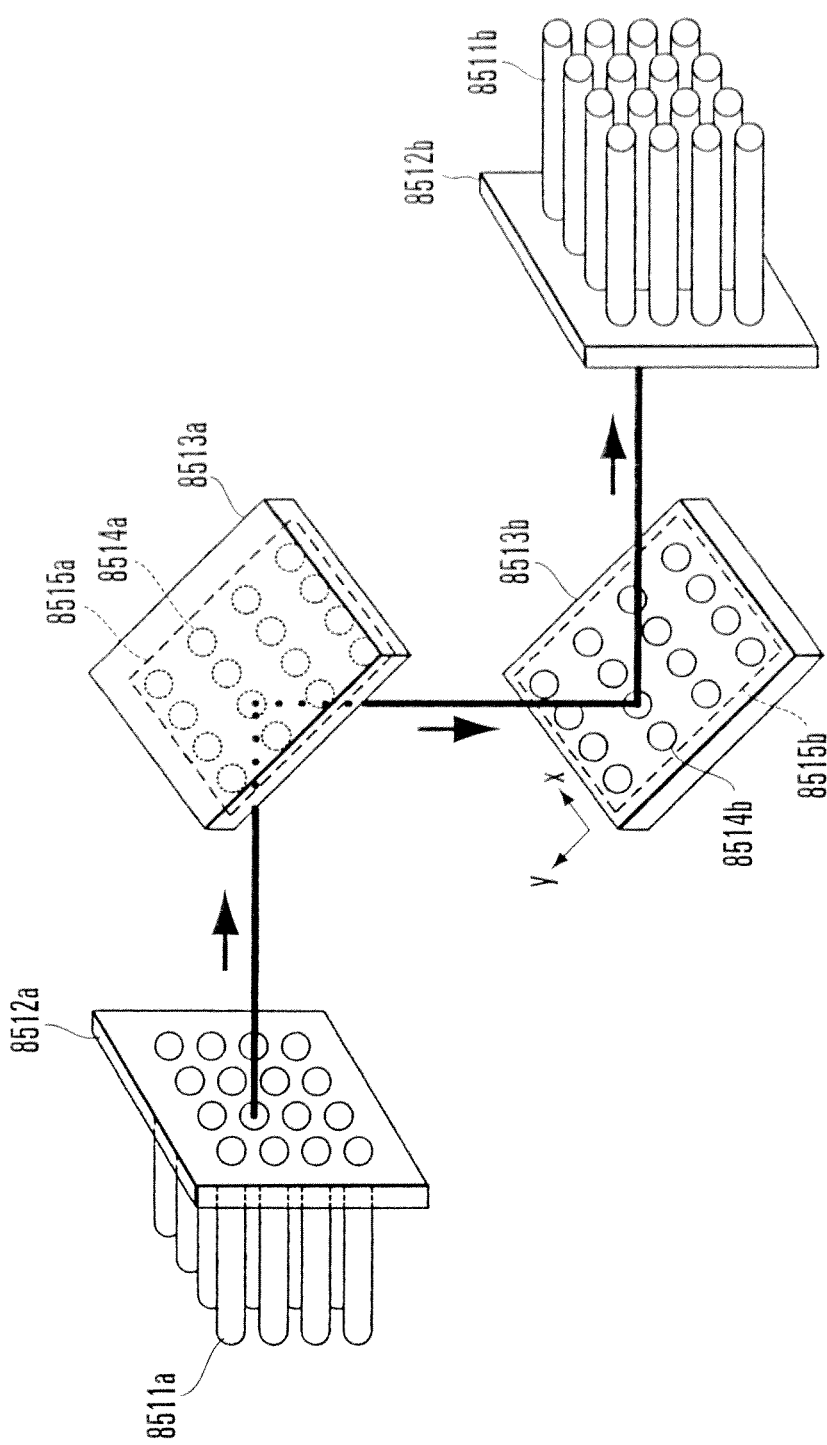
FIG. 91 is a perspective view showing a conventional optical switch.

Biaxial rotation 3D-MEMS (Micro Electro Mechanical Systems) optical switches have received a great deal of attention as a hardware technology to implement large-scale optical switches. FIG. 91 shows a conventional optical switch. Referring to FIG. 91, reference numeral 8511a denotes an input optical fiber array; 8511b, an output optical fiber array; 8512a, an input-side collimator array; 8512b, an output-side collimator array; 8513a, an input-side mirror array; and 8513b, an output-side mirror array. Each of the optical fiber arrays 8511a and 8511b includes a plurality of optical fibers arrayed two-dimensionally. Each of the collimator arrays 8512a and 8512b includes a plurality of microlenses arrayed two-dimensionally. Each of the mirror arrays 8513a and 8513b includes a plurality of mirror devices 8514a and 8514b arrayed two-dimensionally. The arrow in FIG. 91 indicates the traveling direction of a light beam.

An optical signal that has exited an input port of the input optical fiber array 8511a is converted into a light beam by a microlens of the input-side collimator array 8512a, sequentially reflected by the input-side mirror array 8513a and output-side mirror array 8513b, condensed by a microlens of the output-side collimator array 8512b, and guided to an optical fiber of the output optical fiber array 8511b. The mirror of each of the mirror devices 8514a and 8514b included in the mirror arrays 8513a and 8513b can pivot about two axes to reflect incident light in a desired direction corresponding to the tilt angle of the mirror. It is possible to connect an arbitrary input optical fiber to an arbitrary output optical fiber and switch the optical path by appropriately controlling the tilt angles of mirrors of the input-side mirror array 8513a and output-side mirror array 8513b.

The most characteristic components of the above-described optical switch are the mirror arrays 8513a and 8513b. The mirror devices 8514a and 8514b included in the mirror arrays 8513a and 8513b have the structure shown in FIGS. 107 and 108.

Figure 107:
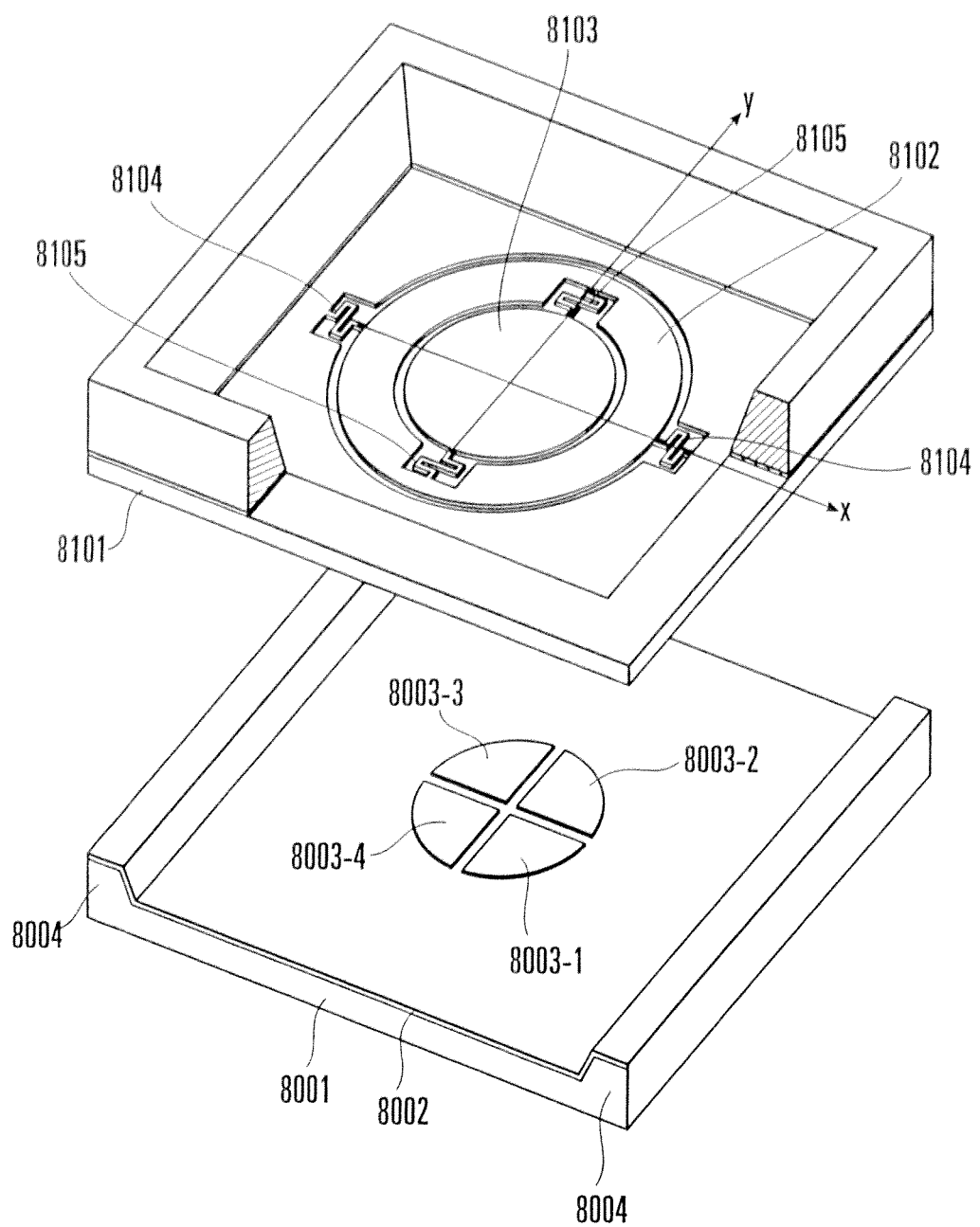
FIG. 107 is an exploded perspective view showing the structure of a conventional mirror device.
Figure 108:
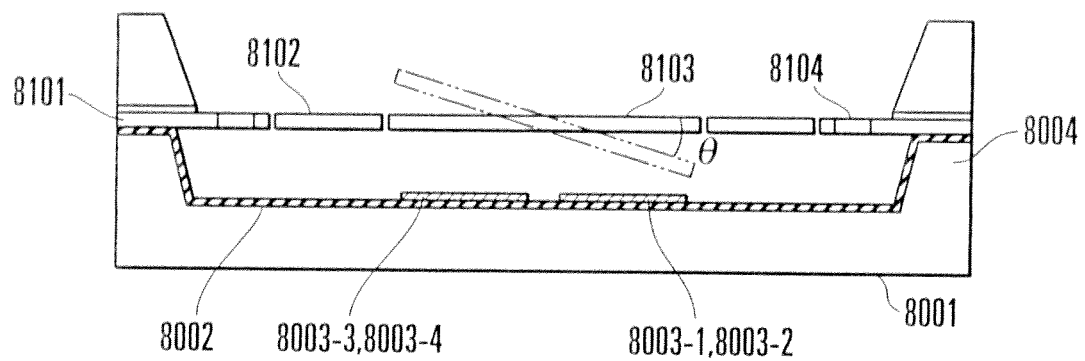
FIG. 108 is a sectional view of the mirror device shown in FIG. 107.

In the mirror device shown in FIGS. 107 and 108, a tilt angle $\theta$ of a mirror 8103 with respect to the moment by an electrostatic force has no direction dependency. The mirror 8103 exhibits the same behavior regardless of whether it pivots about the X-axis or Y-axis if torsion springs 8104 and 8105 have the same structure, and the moment by the electrostatic force is same. Even in pivotal movement in an arbitrary direction between the X-axis and the Y-axis, the mirror 8103 exhibits the same tilt angle $\theta$ in the same moment.

However, driving electrodes 8003-1 to 8003-4 arranged facing the mirror 8103 to give an electrostatic force to control the biaxial pivotal movement of the mirror 8103 are normally formed as four divided electrodes. In addition, the power supply voltage normal has an upper limit, and the tilt angle $\theta$ of the mirror 8103 has a direction dependency for these reasons. Since the driving voltage applied to the four driving electrodes 8003-1 to 8003-4 controls the pivotal movement of the mirror 8103, the anisotropy of the tilt angle $\theta$ of the mirror 8103 poses no problem in a range where the tilt angle $\theta$ is small. When the power supply voltage is limited, and the mirror 8103 can pivot up to only a certain finite tilt angle $\theta$, the tilt angle $\theta$ of the mirror 8103 is large when it pivots in directions (the directions of the X- and Y-axes in FIG. 107) parallel to the parting lines of the four divided driving electrodes 8003-1 to 8003-4 and small when the mirror pivots in directions 45° with respect to the parting lines. This is because two driving electrodes can attract the mirror 8103 by the electrostatic force in the directions parallel, to the parting lines of the driving electrodes 8003-1 to 8003-4 while only one driving electrode need attract the mirror 8L03 in the directions 45° with respect to the parting lines.

Figure 92:
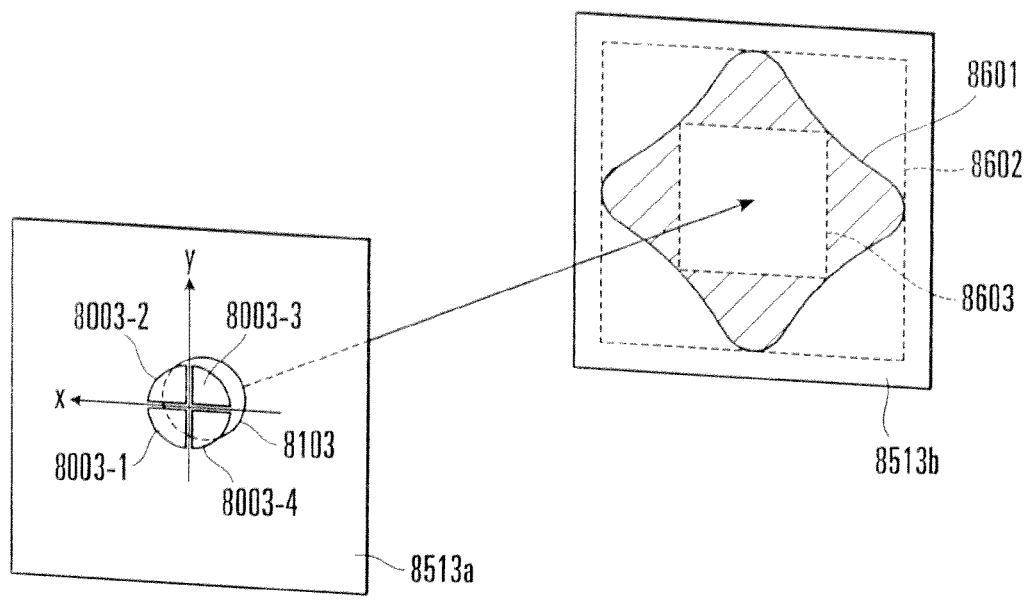
FIG. 92 is a view for explaining a problem of the conventional optical switch.

Hence, when the mirror arrays 8513a and 8513b face each other, as in FIG. 91, a region (region that receives reflected light from the mirror 8103) 301 on the output-side mirror array 8513b, which is scannable by the mirrors 8103 of the input-side mirror devices 8514a arranged in the mirror array 8513a, narrows not in the directions parallel to the parting lines of the driving electrodes 8003-1 to 8003-4 of the input-side mirror devices 8514a but in the directions 45° with respect to the parting lines, as shown in FIG. 92. This also applies to a region on the input-side mirror array 8513a, which is scannable by the mirrors 8103 of the output-side mirror devices 8514b arranged in the mirror array 8513b.

To the contrary, when the mirrors 8103 exit in a rectangular region 8602 of the output-side mirror array 8513b, the mirrors 8103 arranged outside a scannable region 8601 must also effectively function. Hence, a higher driving voltage must be applied to the driving electrodes 8003-1 to 8003-4 of the input-side mirror devices 8514a to largely tilt the mirrors 8103 of the input-side mirror devices 8514a. To increase the driving voltage for mirror control, it is necessary to change the specifications of the power supply and also increase the insulating properties of interconnections and the breakdown voltage of the connector and cable. This increases the technical difficulty, resulting in a high cost.

On the other hand, when the mirrors 8103 exit in a rectangular region 303 of the output-side mirror array 8513b, the mirrors 8103 of the input-side mirror devices 8514a need not tilt largely. Hence, the driving voltage can be low. However, the scannable region 8601 is not used effectively because no mirror 8103 is arranged in the hatched part of the scannable region 8601 shown in FIG. 92. Since the optical switch requires to have multiple channels, the number of arranged mirrors 8103 is preferably increased as much as possible by effectively using the scannable region 8601.

If the driving electrode is divided into eight or 16 parts instead of four parts, and a voltage is applied to driving electrodes corresponding to ½ the total driving electrode area independently of the pivot direction of the mirror 8103, the tilt angle $\theta$ of the mirror 8103 has no anisotropy. However, in the mirror arrays 8513a and 8513b, several ten to several hundred mirrors 8103 must simultaneously be controlled. This produces a strong demand for decreasing the number of driving electrodes prepared for one mirror 8103 to a minimum necessary number. The mirror arrays 8513a and 8513b each having 100 mirrors 8103 require at least 400 interconnections for four divided driving electrodes. The process of these interconnections is not easy. When the number of divided driving electrodes further increases, the number of interconnections reaches an impractical level, making the manufacture very difficult.

As described above, in the conventional optical switch, the driving voltage applied to the driving electrodes 8003-1 to 8003-4 of the mirror devices 8514a and 8514b must be high because of the anisotropy of the tilt angle $\theta$ of the mirrors 8103 of the mirror devices 8514a and 8514b arranged in the mirror arrays 8513a and 8513b. If the driving voltage is to be decreased by reducing the mirror arrangement region, the mirrors cannot be arranged efficiently. In addition, if the driving voltage is to be decreased by increasing the number of divisions of a driving electrode, the device is hard to manufacture.

This embodiment has been made to solve the above-described problem and has as its object to efficiently arrange mirrors in a pair of mirror arrays provided in an optical switch while preventing any increase in the driving voltage and the difficulty of manufacture.

Figure 93:
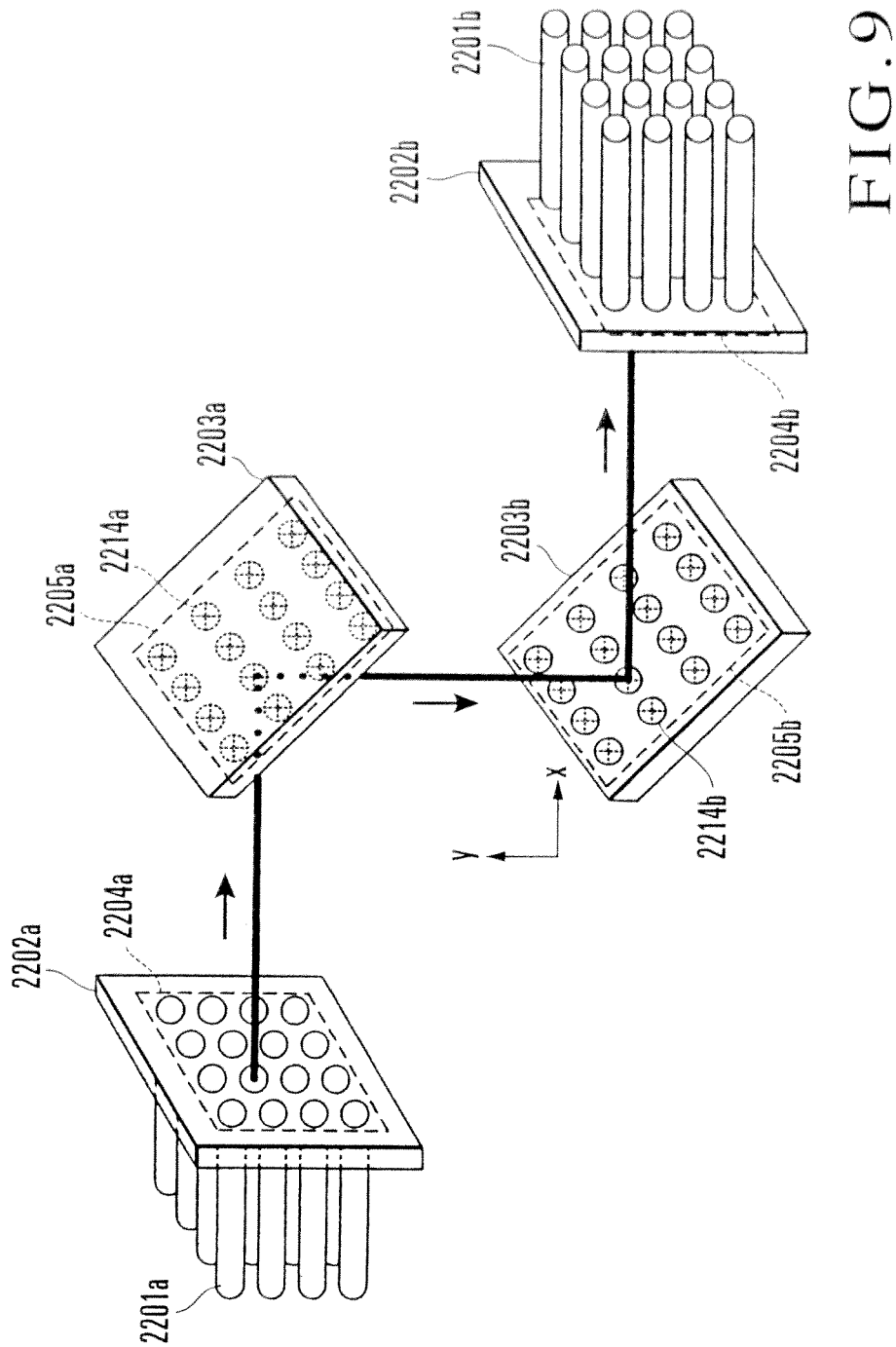
FIG. 93 is a perspective view showing a structure of an optical switch according to the 23rd embodiment.

An optical switch according to this embodiment will be described next with reference to FIG. 93. Referring to FIG. 93, reference numeral 2201d denotes an input optical fiber array; 2201*b*, an output optical fiber array; 2202*a*, an input-side collimator array; 2202*b*, an output-side collimator array; 2203*a*, an input-side mirror array; and 2203*b*, an output-side mirror array. Each of the optical fiber arrays 2201*a* and 2201*b* includes a plurality of optical fibers arrayed two-dimensionally. Each of the collimator arrays 2202*a* and 2202*b* includes a plurality of microlenses arrayed two-dimensionally. Each of the mirror arrays 2203*a* and 2203*b* includes a plurality of mirror devices 2214*a* and 2214*b* arrayed two-dimensionally. The arrow in FIG. 93 indicates the traveling direction of a light beam.

The optical fibers of the input optical fiber array 2201*a* and the microlenses of the input-side collimator array 2202*a* are arranged in a matrix in a rectangular region 2204*a*. The mirror devices 2214*a* are arranged in a matrix in a rectangular region 2205*a* of the input-side mirror array 2203*a* corresponding to the region 2204*a*. Similarly, the optical fibers of the output optical fiber array 2201*b* and the microlenses of the output-side collimator array 2202*b* are arranged in a matrix in a rectangular region 2204*b*. The mirror devices 2214*b* are arranged in a matrix in a rectangular region 2205*b* of the output-side mirror array 2203*b* corresponding to the region 2204*b*.

As before, an optical signal that has exited an input port of the input optical fiber array 2201*a* is converted into a light beam by a microlens of the input-side collimator array 2202*a*, sequentially reflected by the input-side mirror array 2203*a* and output-side mirror array 2203*b*, condensed by a microlens of the output-side collimator array 2202*b*, and guided to an optical fiber of the output optical fiber array 2201*b*.

Figure 94:
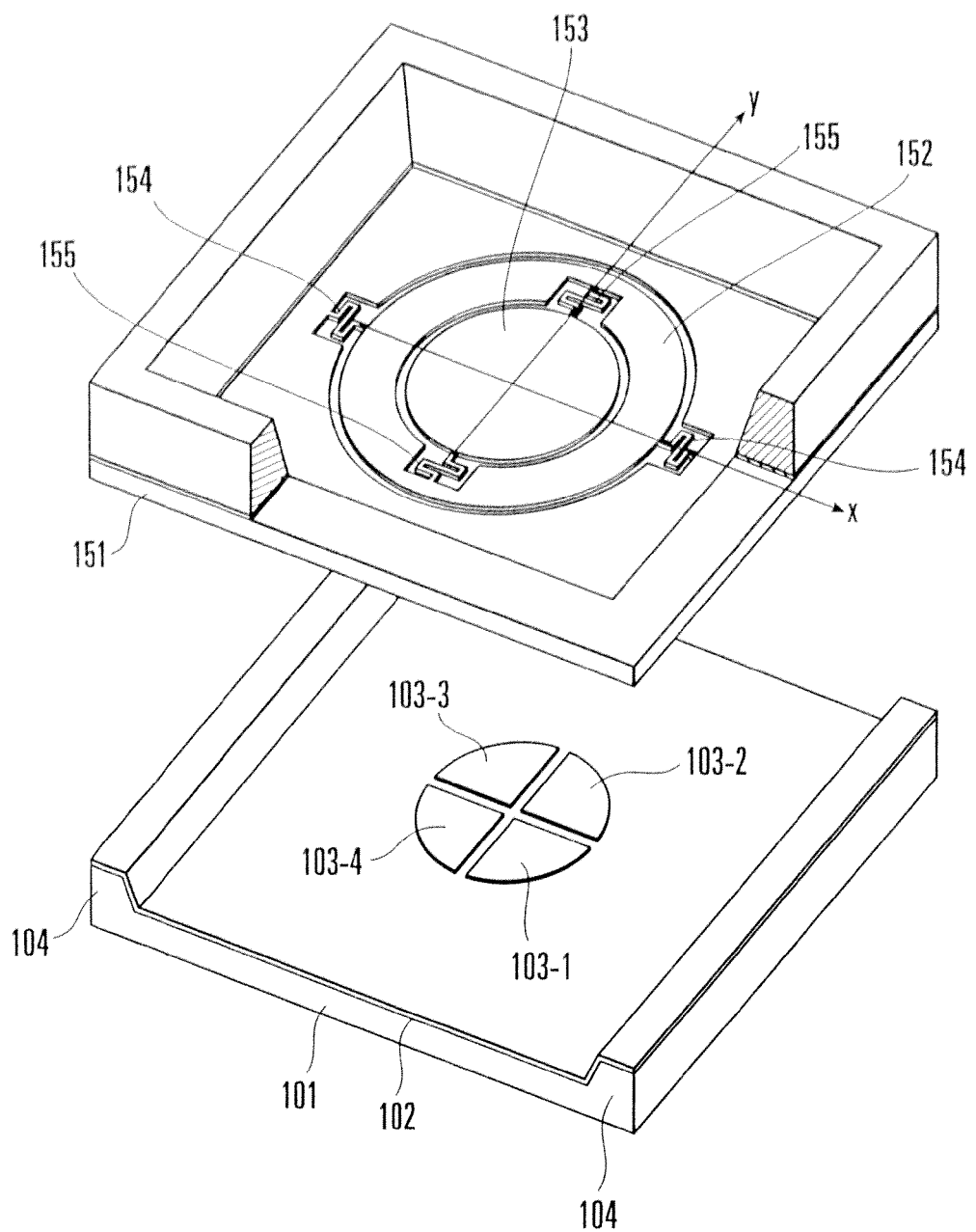
FIG. 94 is an exploded perspective view of a mirror device included in the optical switch according to the 23rd embodiment.

FIG. 94 shows the structure of the mirror devices 2214*a* and 2214*b* according to this embodiment. The same names and reference numerals as in the mirror device shown in FIG. 1 denote the same constituent elements in FIG. 94, and a description thereof will be omitted as needed.

In the conventional optical switch shown in FIG. 91, a pair of opposite sides of a rectangular region 8515*a* of the mirror array 8513*a* where the mirror devices 8514*a* are arranged are parallel to the first parting lines (e.g., X-axis direction) of the driving electrodes 8003-1 to 8003-4 of the mirror devices 8514*b* facing the mirror devices 8514*a*. In addition, the other pair of opposite sides of the rectangular region 8515*a* are parallel to the second parting lines (e.g., Y-axis direction) of the driving electrodes 8003-1 to 8003-4 of the mirror devices 8514*b*. Similarly, a pair of opposite sides of a rectangular region 8515*b* of the mirror array 8513*b* where the mirror devices 8514*b* are arranged are parallel to the first parting lines of the driving electrodes 8003-1 to 8003-4 of the mirror devices 8514*a*. In addition, the other pair of opposite sides of the rectangular region 8515*b* are parallel to the second parting lines of the driving electrodes 8003-1 to 8003-4 of the mirror devices 8514*a*.

Figure 95:
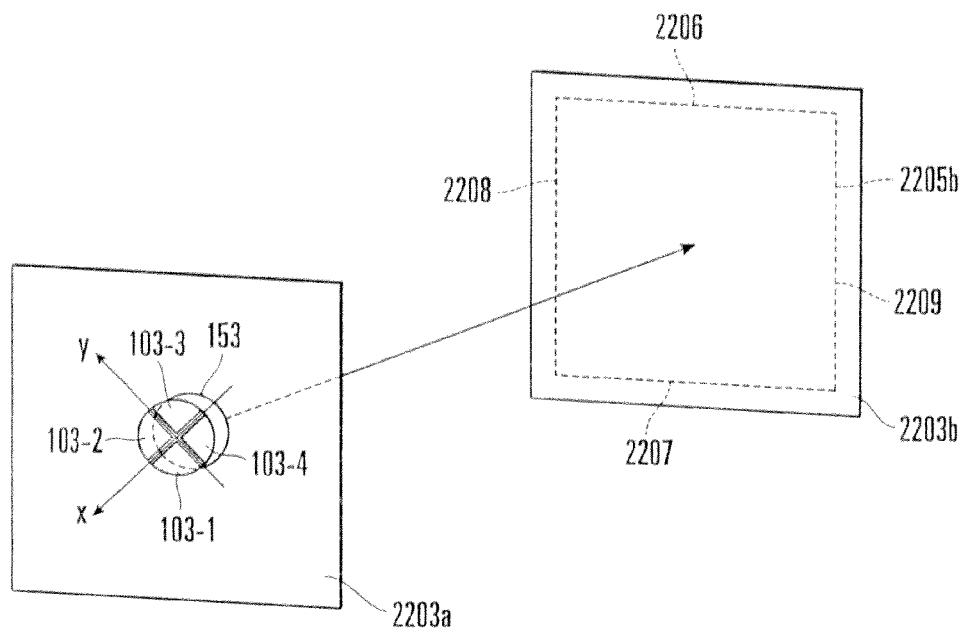
FIG. 95 is a view showing the relationship between the driving electrode arrangement of a mirror device of an input-side mirror array and the arrangement region of a mirror device of an output-side mirror array according to the 23rd embodiment.

In this embodiment, a pair of opposite sides (e.g., 2206 and 2207 in FIG. 95) of the rectangular region 2205*b* of the mirror array 2203*b* where the mirror devices 2214*b* are arranged intersect the first parting lines (e.g., X-axis direction) of driving electrodes 103-1 to 103-4 of the mirror devices 2214*a* facing the mirror devices 2214*b* at an angle of 45°. In addition, the other pair of opposite sides (e.g., 2208 and 2209 in FIG. 95) of the rectangular region 2205*b* intersect the second parting lines (e.g., Y-axis direction) of the driving electrodes 103-1 to 103-4 of the mirror devices 2214*a* at an angle of 45°.

Similarly, a pair of opposite sides of the rectangular region 2205*a* of the mirror array 2203*a* where the mirror devices 2214*a* are arranged intersect the first parting lines of the driving electrodes 103-1 to 103-4 of the mirror devices 2214*b* facing the mirror devices 2214*a* at an angle of 45°. In addition, the other pair of opposite sides of the rectangular region 2205*a* intersect the second parting lines of the driving electrodes 103-1 to 103-4 of the mirror devices 2214*b* at an angle of 45°.

The mirror arrangement method of this embodiment indicates that the arrangement regions 2205*a* and 2205*a* of the mirror devices 2214*a* and 2214*b* are wide in the directions parallel to the X- and Y-axes and narrow in the direction 45° with respect to the X- and Y-axes. That is, in this embodiment, the arrangement regions 2205*a* and 2205*b* of the mirror devices 2214*a* and 2214*b* have the same area as a region 8603 in FIG. 92 in the direction 45° with respect to the X- and Y-axes and extend to the hatched part of the region 8601 in the directions parallel to the X- and Y-axes. The region 8601 is the scannable region of mirrors 153 of the mirror devices 2214*a* and 2214*b*. Hence, it is unnecessary to increase the maximum voltage applied to the driving electrodes 103-1 to 103-4.

In this embodiment, the arrangement of mirror 203 (mirror devices 2214*a* and 2214*b*) of the mirror arrays 2203*a* and 2203*b* is optimized in consideration of the anisotropy of the tilt angle θ of the mirror 153. This allows to effectively use the scannable region of the mirror 153 and obtain an efficient mirror arrangement without increasing the driving voltage. In this embodiment, no multiple divided driving electrodes such as eight or 16 divided driving electrodes are used. Since it is only necessary to change the directions of the parting lines of the driving electrodes 103-1 to 103-4, the mirror arrays 2203*a* and 2203*b* can be manufactured easily as before.

As described above, according to this embodiment, the mirror arrangement region of the second mirror array is set in accordance with the anisotropy of the tilt angle of the first mirror decided by the direction of the parting line of the first driving electrode of the first mirror array, and the mirror arrangement region of the first mirror array is set in accordance with the anisotropy of the tilt angle of the second mirror decided by the direction of the parting line of the second driving electrode of the second mirror array. This allows to effectively use the scannable region of the first and second mirrors and obtain an efficient mirror arrangement without increasing the driving voltage applied to the first and second driving electrodes. In the present invention, no multiple divided driving electrodes such as eight or 16 divided driving electrodes are used. Hence, the mirror array can be manufactured easily as before.

24th Embodiment

Figure 96:
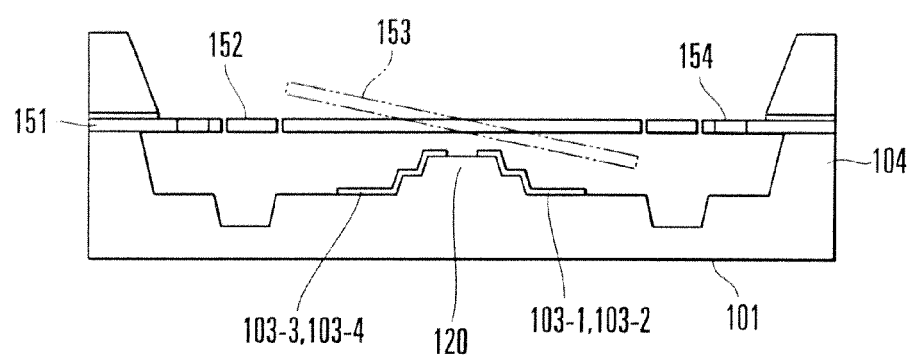
FIG. 96 is a sectional view of a mirror device according to the 24th embodiment in which driving electrodes are formed on the terrace-shaped projecting portion of a lower substrate.

In the 23rd embodiment, the arrangement of the mirrors 153 of the mirror arrays 2203*a* and 2203*b* is optimized in consideration of the anisotropy of the tilt angle θ of the mirror 153. As is known, driving electrodes 103-1 to 103-4 with a staircase shape as shown in FIG. 96 can reduce the driving voltage. This is because the distance between the driving electrodes 103-1 to 103-4 and the mirror 153 can be shortened without sacrificing the tilt angle θ of the mirror 153. In the mirror device shown in FIG. 96, a terrace-shaped projecting portion 120 is formed at the center of a tower substrate 101. The driving electrodes 103-1 to 103-4 are provided on the projecting portion 120.

Figure 97:
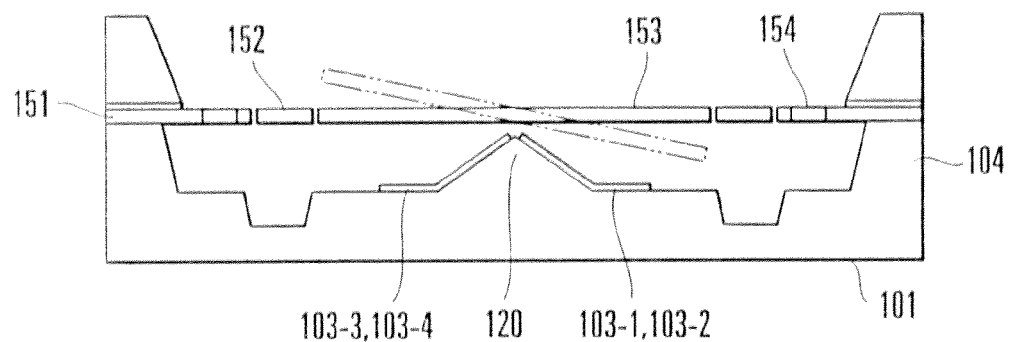
FIG. 97 is a sectional view of a mirror device in which driving electrodes are formed on the conical projecting portion of a lower substrate.

Ideally, the conical projecting portion 120 with its apex at the center of the mirror 153 is formed, as shown in FIG. 97. Forming the driving electrodes 103-1 to 103-4 on the slanting surface of the projecting portion 120 allows to attain a large pull-in angle and low-voltage driving. At the tilt angle θ equal to or more than the pull-in angle, it is impossible to statically stably control the mirror 153. If the tilt angle θ is equal to or larger than the pull-in angle, the electrostatic force surpasses the restoring force of torsion springs so that the mirror 153 approaches the driving electrodes 103-1 to 103-4. When the driving electrodes 103-1 to 103-4 are formed on the conical projecting portion 120, the pull-in angle is about ⅓ the angle made by the mirror 153 and the slanting surface of the projecting portion 120 without voltage application.

It is difficult to form such a conical structure. Actually, the terrace-shaped projecting portion approximate to the conical shape is formed by anisotropic etching of silicon, and the driving electrodes 103-1 to 103-4 are formed on the terrace-shaped projecting portion 120. Anisotropic etching uses the fact that the etching rate of silicon with respect to KOH excessively changes depending on the crystal orientation. For this reason, the (100) plane of silicon exposes in the etching direction while the (111) plane forms the slant of the projecting portion 120. The tilt angle of the slant is 57.4°. To approximately obtain an arbitrary slant angle, anisotropic etching is executed in several steps to form the terrace-shaped projecting portion 120 close to the desired tilt angle.

Figure 98:
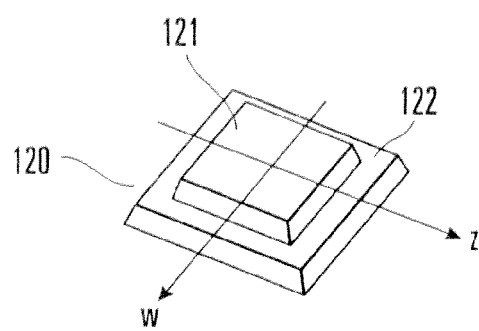
FIG. 98 is a perspective view of the terrace-shaped projecting portion.

The shape of the upper surface of each terrace of the projecting portion 120 is almost square when viewed from the upper side, as indicated by 106 and 107 in FIG. 98. Since upper surfaces 121 and 122 are almost square, the angle made by the mirror 153 and the slant changes depending on the direction. More specifically, the angle made by the mirror 153 and the slant of the projecting portion 120 is large in a direction (e.g., the Z-axis direction in FIG. 98) perpendicular to a pair of opposite sides of the upper surface 121 of the projecting portion 120 and in a direction (e.g., the W-axis direction in FIG. 98) perpendicular to the other pair of opposite sides of the upper surface 121. However, the angle made by the mirror 153 and the slant of the projecting portion 120 is small in directions the diagonal directions of the upper surfaces 121 and 122) 45' with respect the Z- and W-axes. As a result, the pull-in angle when the mirror 153 pivots in the directions 45° with respect to the Z- and W-axes is smaller than that when the mirror 153 pivots in the W-axis directions. Samples with the structure shown in FIG. 96 were actually formed and measured. The pull-in angle is smaller by about 20% in pivotal movement in the directions 45° with respect to the Z- and W-axes.

No problem arises if the pull-in angle is sufficiently large so that an optical path can be formed at an arbitrary portion in a mirror array. However, an increase in the pull-in angle results in an increase in the angle of the slant of the projecting portion 120, i.e., an increase in the difference of elevation between the terraces of the projecting portion 120. To increase the difference of elevation between the terraces of the projecting portion 120, the depth of anisotropic etching must be large. In addition, since the driving electrodes 103-1 to 103-4 are formed on the surface of a structure with a large difference of elevation, the manufacture is difficult. That is, the manufacture is very difficult if the pull-in angle is ensured by the shape of the projecting portion 120. Furthermore, to increase the pull-in angle, the driving voltage must be high.

In fact, a design with a minimum necessary pull-in angle is required. That is, the design must tolerate that the pull-in angle, i.e., the maximum tilt angle of the mirror 153 has direction dependency depending on the three-dimensional shape of the driving electrodes 103-1 to 103-4. Because of this direction dependency, for example, a region on the output-side mirror array scannable by the mirrors 153 of the input-side mirror array is wide in the Z- and W-axis directions and narrow in the directions 45° with respect to the Z- and W-axes.

Figure 99:
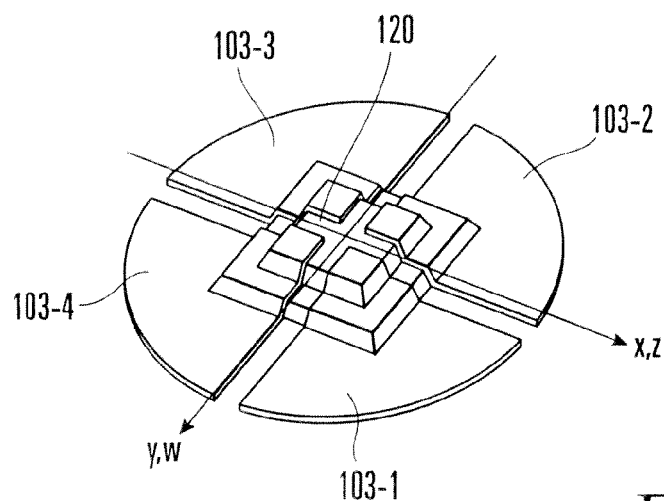
FIG. 99 is a perspective view of four driving electrodes divisionally formed on the terrace-shaped projecting portion.

In this embodiment, the parting lines of the driving electrodes 103-1 to 103-4 are parallel to the Z- and W-axes, in addition to the arrangement of the 23rd embodiment. For example, as shown in FIG. 99, the driving electrodes 103-1 to 103-4 formed on and around the projecting portion 120 have a first parting line (X-axis direction) parallel to the Z-axis and a second parting line (Y-axis direction) parallel to the W-axis. That is, the driving electrodes 103-1 to 103-4 are formed on the four corners of the projecting portion 120 and the lower substrate 101 continuous from the four corners.

The above-described structure can maximize the range where the scannable region (301 in FIG. 92) of the mirrors 153 decided by the directions of the parting lines of the driving electrodes 103-1 to 103-4 and t scannable region of the mirrors 153 decided by the three-dimensional shape of the driving electrodes 103-1 to 103-4 overlap each other. That is, the ultimate scannable region of the mirrors 153 decided by the two kinds of scannable regions can be maximized. As a result, arrangement regions 2205*a* and 2205*b* of the mirror arrays 2203*a* and 2203*b* can have a maximum area.

As described above, according to this embodiment, in four driving electrodes divisionally formed on a terrace-shaped projecting portion having an upper surface with an almost square shape when viewed from the upper side, a direction perpendicular to a pair of opposite sides of the upper surface of the projecting portion is set as a first parting line. A direction perpendicular to the other pair of opposite sides of the upper surface is set as a second parting line. When the electrodes are formed on the four corners of the projecting portion under these conditions, the mirror arrangement regions of the first and second mirror arrays can have a maximum area.

25th Embodiment

The 25th embodiment of the present invention will be described next.

Regarding a conventional optical switch as shown in FIG. 23, a report says that the flatness of a mirror 8230 influences connection loss and crosstalk (Xiaoming Zhu and Joseph M. Kahn, Computing Insertion Loss in MEMS Optical Switches Caused Hy Non-Flat Mirrors, CLEO2001 CtuM43, May 8, 2001, pp. 185-186). Hence, a mirror substrate 8201 of a conventional mirror device 8200 as shown in FIG. 13 is made of single-crystal silicon with excellent flatness. Since silicon has high transmittance in the communication wavelength band, a metal layer of, e.g., gold is generally formed on the reflecting surface of the mirror 8230, as described above. The mirror 8230 is heated in forming the metal layer on it. If the mirror 8230 stands at room temperature, the metal layer gets cool and shrinks. This produces internal stress between the metal layer and silicon to make the mirror 8230 warp. Especially when a chromium layer is further provided to improve the adhesion between silicon and gold, the internal stress increases to make the warp large. There is conventionally required to control warp of the mirror 8230.

A low-loss optical switch can be formed not only by flattening the mirror 8230 but also by optical design using a concave surface. Conventionally, however, the warp amount of the mirror 230 is hard to control.

This embodiment has been made to solve the above-described problem and has as its object to provide a mirror device manufacturing method capable of manufacturing a mirror with a desired warp amount.

Figure 100A:
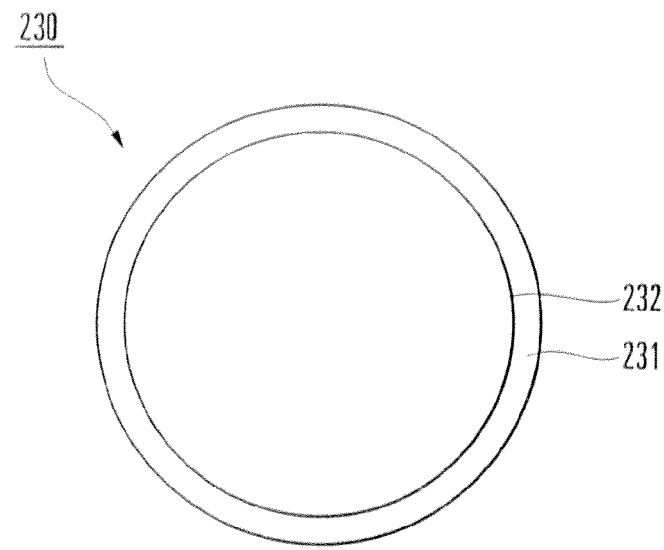
FIG. 100A is a schematic plan view showing the structure of a mirror of a mirror device in a mirror array according to the 25th embodiment.
Figure 100B:
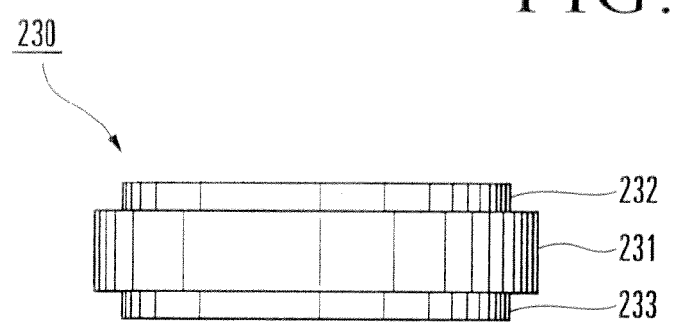
FIG. 100B is a schematic side view of the mirror according to the 25th embodiment.
Figure 100C:
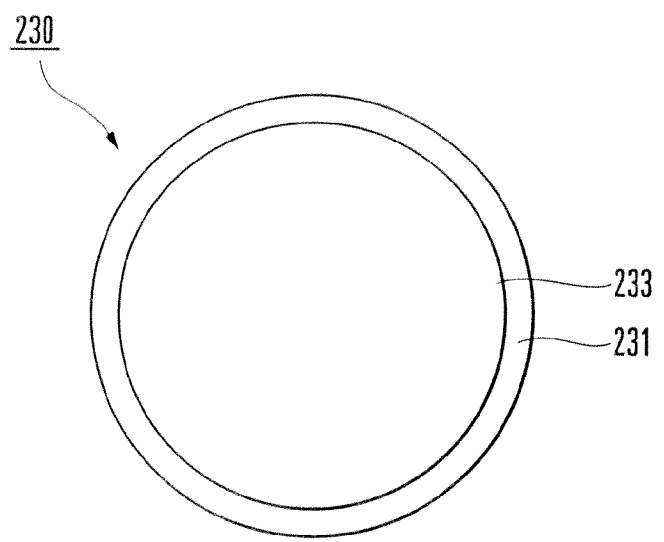
FIG. 100C is a schematic bottom view of the mirror according to the 25th embodiment.

This embodiment will be described next with reference to FIGS. 100A to 100C. A mirror array to this embodiment includes a plurality of mirror devices arranged two-dimensionally in a matrix and has a characteristic feature in the structure of the mirror in the mirror device. The same names and reference numerals as in the mirror device, mirror array, and optical switch described in "Background Art" with reference to FIGS. 11, 12, and 29 denote the same constituent elements in the mirror array of this embodiment, and a description thereof will be omitted as needed.

A mirror 230 in a mirror device included in mirror arrays 510 and 520 of an optical switch 600 comprises a substrate layer 231, an upper surface layer 232 formed on a surface of the substrate layer 231 with a frame-shaped member 240, and a lower surface layer 233 formed on a surface of the substrate layer 231 opposite to the upper surface layer 232.

The substrate layer 231 is made of, e.g., single-crystal silicon with an almost circular shape when viewed from the upper side and supported by mirror connectors 221a and 221b to be pivotal with respect to a movable frame 220.

The upper surface layer 232 includes a metal layer 232a made of a metal such as gold, silver, or aluminum, and an intermediate layer 232b made of, e.g., chromium and provided between the metal layer 232a and the substrate layer 231. The upper surface layer 232 has the same shape and size as the substrate layer 231 and is formed to an arbitrary thickness.

The lower surface layer 233 includes a metal layer 233a made of a metal such as gold, silver, or aluminum, and an intermediate layer 233b made of, e.g., chromium and provided between the metal layer 233a and the substrate layer 231. The lower surface layer 233 has the same shape and size as the substrate layer 231 and is formed to an arbitrary thickness.

Figure 101A:
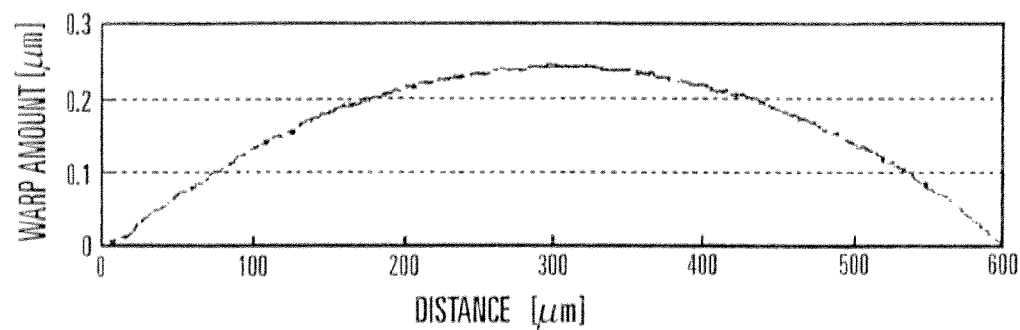
FIG. 101A is a graph showing the relationship between a gold deposition thickness of a mirror 230 having only an upper surface layer 232 and the warp amount of the mirror.
Figure 101B:
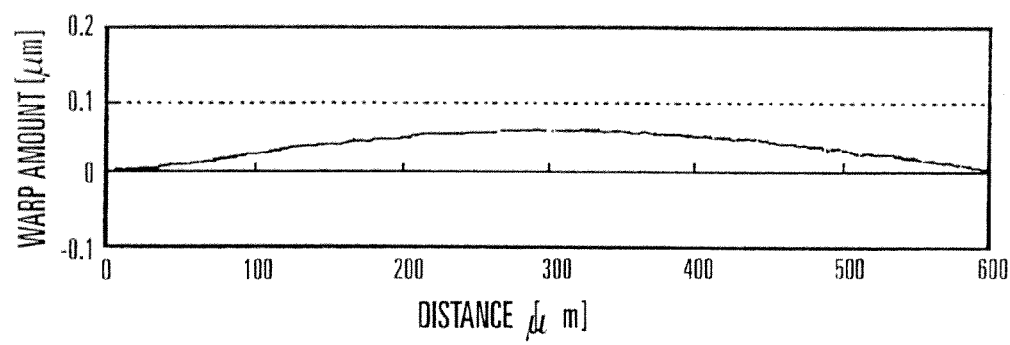
FIG. 101B is a graph showing the relationship between a gold deposition thickness of a mirror 230 having only an upper surface layer 232 and the warp amount of the mirror.

The warp amount of the mirror 230 with the above-described structure depends on the thicknesses of the upper surface layer 232 and lower surface layer 233. This will be described below with reference to FIGS. 101A to 102C. In FIGS. 101A and 101B, the ordinate represents the warp amount of the mirror 230, and the abscissa represents the distance in the radial direction of the mirror 230 with a diameter of 600 µm. FIG. 101A shows the warp amount on the lower surface side of the mirror 230 when the upper surface layer 232 made of gold has a thickness of 0.23 µm. FIG. 101B shows the warp amount on the lower surface side of the mirror 230 when the upper surface layer 232 made of gold has a thickness of 0.15 µm. FIGS. 101A and 101B show measurement results obtained by a three-dimensional surface structure analysis microscope "NewView200" available from Zygo.

Warp of the mirror 230 indicates that the flat mirror 230 curves, i.e., the radius of curvature of the mirror 230 in an infinite state decreases. The w amount of the mirror 230 indicates the difference between the flat mirror 230 and the curved mirror 230 with warp in a direction perpendicular to the plane of the mirror 230 on the basis of an end of the mirror 230 (the position "0" on the ordinate in FIGS. 101A and 101B), as shown in FIG. 101.

As shown in FIGS. 101A and 101B, the warp amount of the mirror 230 increases along with an increase in the thickness of the upper surface layer 232. For example, as shown in FIG. 101A, when the upper surface layer 232 is 0.23 µm thick, the warp amount of the mirror 230 exceeds 0.2 µm at maximum. On the other hand, as shown in FIG. 101B, when the upper surface layer 232 is 0.15 µm thick, the warp amount of the mirror 230 is smaller than 0.1 µm at maximum. Hence, it is possible to control the warp amount of the mirror 230 by controlling the thicknesses of the upper surface layer 232 and lower surface layer 233.

Figure 102A:
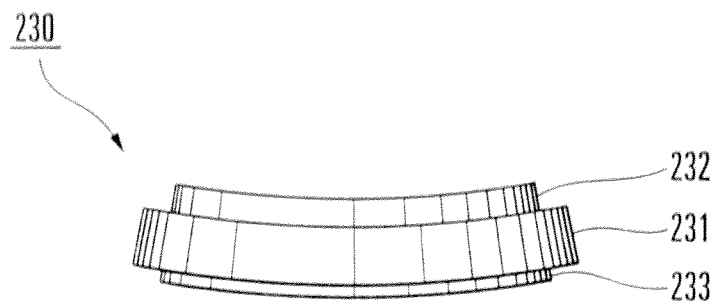
FIG. 102A is a schematic sectional view showing the mirror 230 so as to explain the warp of the mirror 230.
Figure 102B:
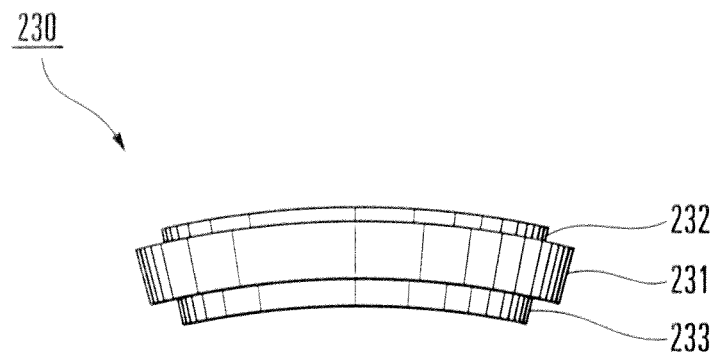
FIG. 102B is a schematic sectional view showing the mirror 230 so as to explain the warp of the mirror 230.
Figure 102C:
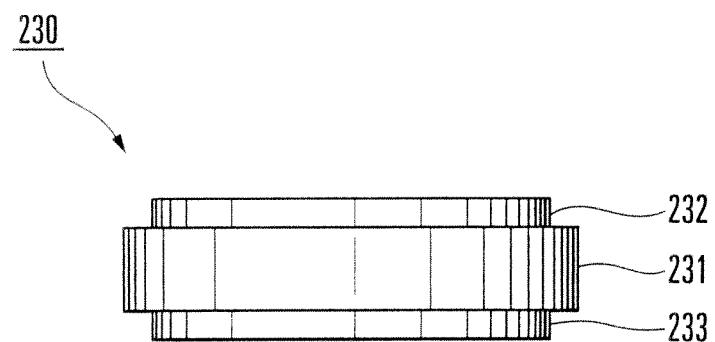
FIG. 102C is a schematic sectional view showing the mirror 230 so as to explain the warp of the mirror 230.

For example, when the upper surface layer 232 is formed thicker than the lower surface layer 233, as shown in FIG. 102A, the mirror 230 which has a concave shape on the side of the upper surface layer 232, i.e., has a concave surface warping to the side of the upper surface layer 232 can be formed. Conversely, when the Lower surface layer 233 is formed thicker than the upper surface layer 232, as shown in FIG. 102B, the mirror 230 which has a concave shape on the side of the low surface layer 233, i.e., has a convex surface warping to the side of the lower surface layer 233 can be formed. When the upper surface layer 232 and lower surface layer 233 have almost the same thickness, the flat mirror 230 can be formed.

A method of manufacturing the mirror array according to this embodiment will be described next with reference to FIGS. 103A to 103E. This embodiment has a characteristic feature in the structure of the mirror in the mirror device included in the mirror array. The electrode substrate structure is the same as that in the mirror array described in the above embodiments. Hence, a description of a method of manufacturing the electrode substrate will be omitted as needed.

Figure 103A:
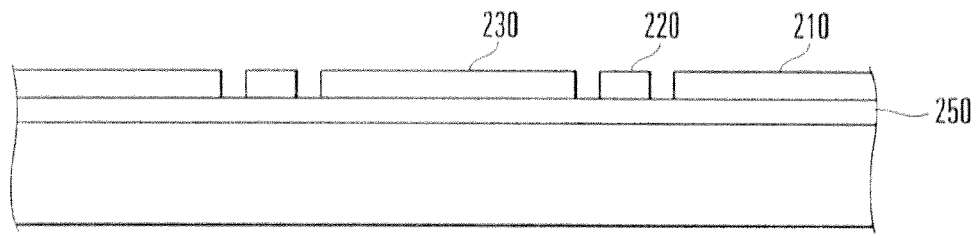
FIGS. 103A to 103E are schematic views for explaining steps in manufacturing the mirror substrate of a mirror array according to the 25th embodiment.

First, as shown in FIG. 103A, a side (to be referred to as an upper surface hereinafter) of an SOI (Silicon On Insulator) substrate with a buried insulating layer 250 undergoes known photolithography and etching such as DEEP RIE to form, in the single-crystal silicon layer, trenches conforming to the shapes of a frame portion 210, movable frame connectors 211a and 211b, movable frame 220, mirror connectors 221a and 221b, and mirror 230.

Figure 103B:
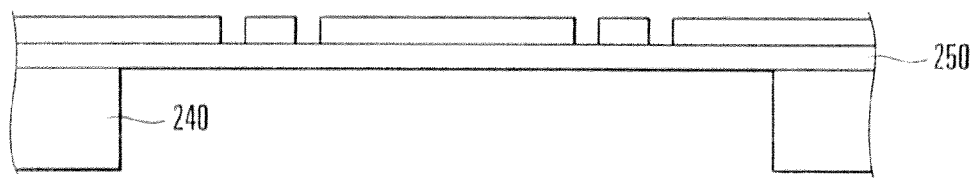

As shown in FIG. 103B, a resist pattern with openings in predetermined regions corresponding to the trenches is formed on the lower surface of the SOI substrate. The silicon is selectively etched from the lower surface of the SOI substrate by using an et chant such as a potassium hydroxide solution. In this etching, an opening and the frame-shaped member 240 are formed on the lower surface of the SOI substrate by using the buried insulating layer 250 as an etching stopper layer.

Figure 103C:
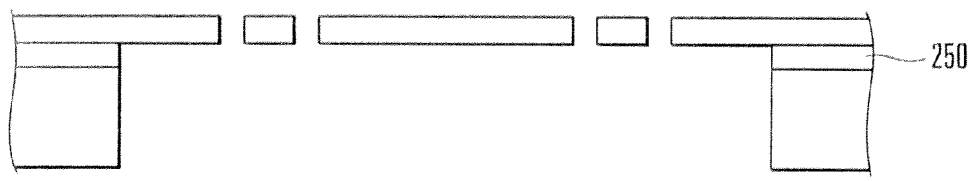

As shown in FIG. 103C, a region of the buried insulating layer 250 exposed to the opening is removed by using hydrofluoric acid.

Figure 103D:
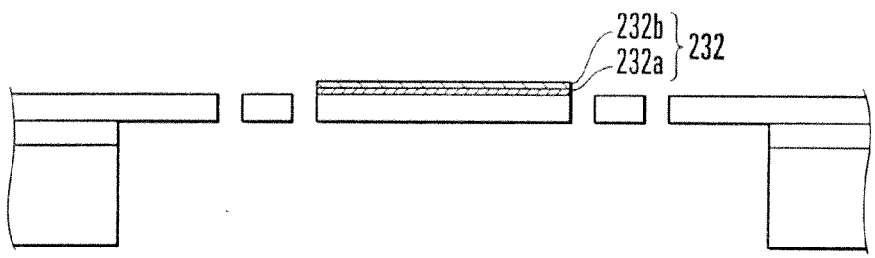

As shown in FIG. 103D, a mask with an opening in a predetermined region corresponding to the mirror 230 is formed on the upper surface of the SOI substrate. The intermediate layer 232b and metal layer 232a are sequentially formed by known vapor deposition or sputtering to form the upper surface layer 232. At this time, the metal layer 232a is formed to an arbitrary thickness such that the mirror 230 has a desired warp amount, i.e., a desired radius of curvature.

Figure 103E:
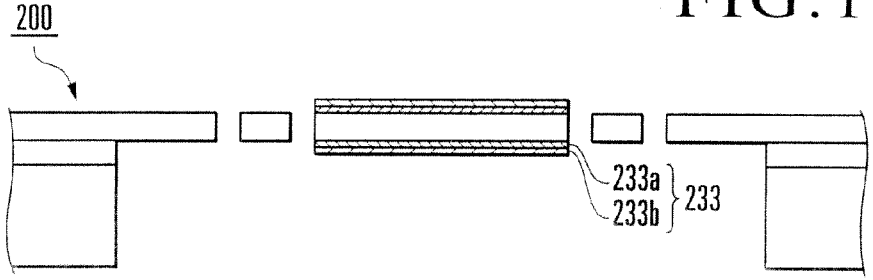

As shown in FIG. 103E, a mask with an opening in a predetermined region corresponding to the mirror 230 is formed on the lower surface of the SOI substrate. The intermediate layer 233b and metal layer 233a are sequentially formed by known vapor deposition or sputtering to form the lower surface layer 233. At this time, the metal layer 233a is formed to an arbitrary thickness such that the mirror 230 has a desired warp amount, i.e., a desired radius of curvature.

The radius of curvature of the mirror 230 is measured. If the measured radius of curvature is different from the desired radius of curvature, at least one of the metal layers 232a and 233a is further formed on the mirror 230 on the basis of the difference in accordance with the same procedures as described with reference to FIGS. 1030 and 103E. With this process, the mirror 230 having the desired shape is formed.

As described above, according to this embodiment, the warp amount of the mirror 230 is controlled by controlling the thickness of at least one of the upper surface layer 232 and lower surface layer 233. This allows to manufacture the mirror 230 having a desired radius of curvature.

In this embodiment, after forming the upper surface layer 232 and lower surface layer 233 or after joining a mirror substrate 200 with the upper surface layer 232 and lower surface layer 233 to an electrode substrate 300, annealing may be done by heating the mirror substrate 230 and then slowly cooling it. The annealing temperature at this time is equal to or higher than a higher one of the temperatures in forming the upper surface layer 232 and lower surface layer 233. This allows to control the shape of the mirror 230 without any influence of the variations in the temperatures in forming the upper surface layer 232 and Lower surface layer 233.

26th Embodiment

The 26th embodiment of the present invention will be described next. This embodiment controls the warp amount of a mirror 230 by changing the temperature in forming an upper surface layer 232 and lower surface layer 233. The same names and reference numerals as in the 25th embodiment denote the same constituent elements the 26th embodiment, and a description thereof will be omitted as needed.

A substrate layer 231 is made of, e.g., single-crystal silicon with an almost circular shape when viewed from the upper side and supported by mirror connectors 221a and 221b to be pivotal with respect to a movable frame 220.

The upper surface layer 232 includes a metal layer 232a made of a metal such as gold, silver, or aluminum, and an intermediate layer 232b made of, e.g., chromium and provided between the metal layer 232a and the substrate layer 231. The upper surface layer 232 has the same shape and size as the substrate layer 231 and is formed under an arbitrary temperature.

The lower surface layer 233 includes a metal layer 233a made of a metal such as gold, silver, or aluminum, and an intermediate layer 233b made of, e.g., chromium and provided between the metal layer 233a and the substrate layer 231. The lower surface layer 233 has the same shape and size as the substrate layer 231 and is formed under an arbitrary temperature.

Figure 104A:
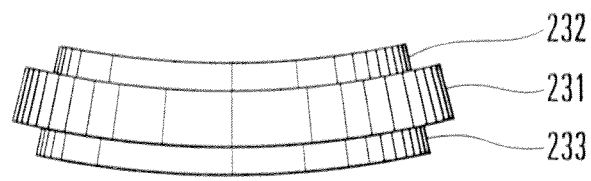
FIGS. 104A to 104C are schematic views for explaining the warp of a mirror 230.
Figure 104B:
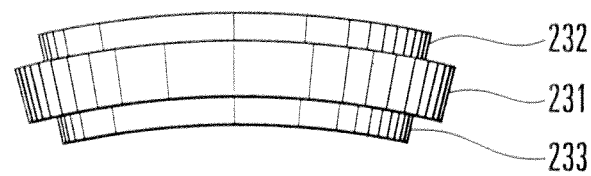
Figure 104C:
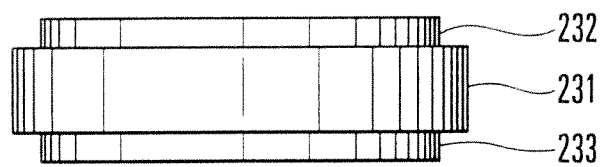

The warp amount of the mirror 230 also depends on the temperature in forming the upper surface layer 232 and lower surface layer 233. The larger the difference between the room temperature and the temperature in forming the upper surface layer 232 and lower surface layer 233 becomes, the larger the warp amount of the mirror 230 becomes. For example, when the temperature in forming the upper surface layer 232 is higher than that in forming the lower surface layer 233, the mirror 230 having a concave surface warping to the side of the upper surface layer 232 can be formed, as shown in FIG. 104A. Conversely, when the temperature in forming the lower surface layer 233 is higher than that in forming the upper surface layer 232, the mirror 230 having a convex surface warping to the side of the lower surface layer 233 can be formed, as shown in FIG. 104B. When the upper surface layer 232 and lower surface layer 233 are formed at almost the same temperature, the flat mirror 230 can be formed, as shown in FIG. 104C.

A method of manufacturing a mirror array according to this embodiment will be described next with reference to FIGS. 103A to 103E.

First, as shown in FIG. 103A, a side (to be referred to as an upper surface hereinafter) of an SOI (Silicon On Insulator) substrate with a buried insulating layer 250 undergoes known photolithography and etching such as DEEP RIE to form, in the single-crystal silicon layer, trenches conforming to the shapes of a frame portion 210, movable frame connectors 211a and 211b, movable frame 220, mirror connectors 221a and 221b, and mirror 230.

As shown in FIG. 103B, a resist pattern with openings in predetermined regions corresponding to the trenches is formed on the lower surface of the SOI substrate. The silicon is selectively etched from the lower surface of the SOI substrate by using an etchant such as a potassium hydroxide solution. In this etching, an opening and the frame-shaped member 240 are formed on the lower surface of the SOI substrate by using the buried insulating layer 250 as an etching stopper layer.

As shown in FIG. 103C, a region of the buried insulating layer 250 exposed to the opening is removed by using hydrofluoric acid.

Next, a metal layer is formed on a surface of the mirror 230, which should change to a concave surface, i.e., warp. For example, to make the side of the upper surface layer 232 warp, a mask with an opening in a predetermined region corresponding to the mirror 230 is formed on the upper surface of the SOI substrate, as shown in FIG. 103D. The intermediate layer 232b and metal layer 232a are sequentially formed by known vapor deposition or sputtering to form the upper surface layer 232. At this time, the metal layer 232a is formed at a first arbitrary temperature such that the mirror 230 has a desired warp amount, i.e., a desired radius of curvature. For example, the susceptor to fix the SOI substrate in the apparatus for forming the metal layer 232a has a heater. The heater heats the SOI substrate to an arbitrary temperature, and the metal layer 232a is formed under this condition. The first arbitrary temperature is set to be higher than a second arbitrary temperature (to be described later).

A metal layer is formed on a surface of the mirror 230, which should change to a convex surface. For example, to form a convex surface on the side of the lower surface layer 233, a mask with an opening in a predetermined region corresponding to the mirror 230 is formed on the lower surface of the SOI substrate, as shown in FIG. 103E. The intermediate layer 233b and metal layer 233a are sequentially formed by known vapor deposition or sputtering to form the lower surface layer 233. At this time, the metal layer 233a is formed at a second arbitrary temperature such that the mirror 230 has a desired warp amount, i.e., a desired radius of curvature. For example, the susceptor to fix the SOI substrate in the apparatus for forming the metal layer 233a has a heater. The heater heats the SOI substrate to an arbitrary temperature, and the metal layer 233a is formed under this condition.

With this process, the mirror 230 having the desired shape is formed. As described above, according to this embodiment, the warp amount of the mirror 230 is controlled by controlling the temperature in forming at least one of the upper surface layer 232 and lower surface layer 233. This allows to manufacture the mirror 230 having a desired radius of curvature.

To form the flat mirror 230, the second arbitrary temperature is set to be higher than the first arbitrary temperature. Since each of the upper surface layer 232 and lower surface layer 233 is heated to the second arbitrary temperature and then cooled down to the room temperature, the flat mirror 230 becomes flat.

In this embodiment, the thickness of at least one of the upper surface layer 232 and lower surface layer 233 may be controlled, as in the 25th embodiment. This enables to more accurately control the shape of the mirror 230.

27th Embodiment

The 27th embodiment of the present invention will be described next. This embodiment controls the warp amount of a mirror 230 by setting the materials of an upper surface layer 232 and lower surface layer 233 on the basis of the coefficient of thermal expansion. The same names and reference numerals as in the 25th and 26th embodiments denote the same constituent elements the 27th embodiment, and a description thereof will be omitted as needed.

A substrate layer 231 is made of, e.g., single-crystal silicon with an almost circular shape when viewed from the upper side and supported by mirror connectors 221a and 221b to be pivotal with respect to a movable frame 220.

The upper surface layer 232 includes a metal layer 232a made of one of metals such as gold, silver, and aluminum in accordance with the shape of the mirror 230, and an intermediate layer 232b made of, e.g., chromium and provided between the metal layer 232a and the substrate layer 231. The upper surface layer 232 has the same shape and size as the substrate layer 231.

The lower surface layer 233 includes a metal layer 233a made of one of metals such as gold, silver, and aluminum in accordance with the shape of the mirror 230, and an intermediate layer 233b made of, e.g., chromium and provided between the metal layer 233a and the substrate layer 231. The lower surface layer 233 has the same shape and size as the substrate layer 231.

The warp amount of the mirror 230 also depends on the coefficients of thermal expansion of the materials of the upper surface layer 232 and lower surface layer 233. As described above, when the upper surface layer 232 or lower surface layer 233 heated in the formation process gets cool to the room temperature and shrinks, the mirror 230 warps. If the coefficient of thermal expansion of the material changes between the upper surface layer 232 and the lower surface layer 233, the shrinkage amount upon cooling also changes. Hence, the warp amount of the mirror 230 also changes. As described above, this embodiment controls the warp amount of the mirror 230 by setting the materials of the upper surface layer 232 and lower surface layer 233 on the basis of the coefficient of thermal expansion.

For example, when the coefficient of thermal expansion of the material of the upper surface layer 232 is larger than that of the lower surface layer 233, the mirror 230 having a concave surface warping to the side of the upper surface layer 232 can be formed, as shown in FIG. 104A. Conversely, when the coefficient of thermal expansion of the material of the lower surface layer 233 is larger than that of the upper surface layer 232, the mirror 230 having a convex surface warping to the side of the lower surface layer 233 can be formed, as shown in FIG. 104B. When the upper surface layer 232 and lower surface layer 233 are made of the same material, the flat mirror 230 can be formed, as shown in FIG. 104C.

A method of manufacturing a mirror array according to this embodiment will be described next with reference to FIGS. 103A to 103E.

First, as shown in FIG. 103A, a side (to be referred to as an upper surface hereinafter) of an SOI (Silicon On Insulator) substrate with a buried insulating layer 250 undergoes known photolithography and etching such as DEEP RIE to form, in the single-crystal silicon layer, trenches conforming to the shapes of a frame portion 210, movable frame connectors 211a and 211b, movable frame 220, mirror connectors 221a and 221b, and mirror 230.

As shown in FIG. 103B, a resist pattern with openings in predetermined regions corresponding to the trenches is formed on the lower surface of the SOI substrate. The silicon is selectively etched from the lower surface of the SOI substrate by using an etchant such as a potassium hydroxide solution. In this etching, an opening and the frame-shaped member 240 are formed on the lower surface of the SOI substrate by using the buried insulating layer 250 as an etching stopper layer.

As shown in FIG. 103C, a region of the buried insulating layer 250 exposed to the opening is removed by using hydrofluoric acid.

As shown in FIG. 103D, a mask with an opening in a predetermined region corresponding to the mirror 230 is formed on the upper surface of the SOI substrate. The intermediate layer 232b and metal layer 232a are sequentially formed by known vapor deposition or sputtering to form the upper surface layer 232. At this time, the metal layer 232a is made of a material having an arbitrary coefficient of thermal expansion such that the mirror 230 has a desired warp amount, i.e., a desired radius of curvature.

As shown in FIG. 103E, a mask with an opening in a predetermined region corresponding to the mirror 230 is formed on the lower surface of the SOI substrate. The intermediate layer 233b and metal layer 233a are sequentially formed by known vapor deposition or sputtering to form the lower surface layer 233. At this time, the metal layer 233a is made of a material having an arbitrary coefficient of thermal expansion such that the mirror 230 has a desired warp amount, i.e., a desired radius of curvature. With this process, the mirror 230 having the desired shape is formed.

As described above, according to this embodiment, the warp amount of the mirror 230 is controlled by setting the materials of the upper surface layer 232 and lower surface layer 233 on the basis of the coefficient of thermal expansion. This allows to manufacture the mirror 230 having a desired radius of curvature.

In this embodiment, after forming the upper surface layer 232 and lower surface layer 233 or after joining a mirror substrate 200 with the upper surface layer 232 and lower surface layer 233 to an electrode substrate 300, annealing may be done by heating the mirror substrate 230 and then slowly cooling it. The annealing temperature at this time is equal to or higher than a higher one of the temperatures in forming the upper surface layer 232 and lower surface layer 233. This allows to control the shape of the mirror 230 without any influence of the variations in the temperatures in forming the upper surface layer 232 and lower surface layer 233.

In this embodiment, the thickness of at least one of the upper surface layer 232 and lower surface layer 233 may also be controlled, as in the 25th embodiment. This enables to more accurately control the shape of the mirror 230.

In this embodiment, the temperature in forming the upper surface layer 232 and lower surface layer 233 may also be controlled, as in the 26th embodiment. This also enables to more accurately control the shape of the mirror 230.

In the 25th to 27th embodiments, the warp amount of the mirror 230 is controlled on the basis of one of the thickness of the metal layers 232a and 233a, the temperature in the formation process, and the coefficient of thermal expansion. However, the warp amount of the mirror 230 may be controlled on the basis of all of these factors. This enables to more accurately control the shape of the mirror 230.

In the 25th to 27th embodiments, the intermediate layers 232b and 233b are inserted between the substrate layer 231 and the metal layers 232a and 233a. The intermediate layers 232b and 233b may be omitted.

In the 25th to 27th embodiments, the lower surface layer 233 is formed after formation of the upper surface layer 232. The order of formation may be reversed.

The mirror arrays and mirror devices according to the 25th to 27th embodiments are usable not only in an optical switch but also in a measurement device, display, and scanner.

As described above, according to the 25th to 27th embodiments, it is possible to control warp of the mirror by providing a metal layer not only on a surface but also on the other surface of the mirror.

28th Embodiment

The 28th embodiment of the present invention will be described next.

A method of manufacturing a conventional mirror device shown in FIGS. 11 and 12 will briefly be described. A mirror substrate 8201 can be formed from an SOI (Silicon On Insulator) substrate. The SOI substrate has a thin silicon layer (SOI Layer) on a buried insulating layer on a thick silicon base. The above-described structures such as a base 8210, movable frame 8220, and mirror 8230 can be formed by fabricating the SOI Layer. When the thick base of the SOI substrate is removed to leave a frame shape, a frame portion 240 can be formed. An insulating layer 8241 shown in FIGS. 11 and 12 corresponds to the buried insulating layer of the SOI substrate.

An electrode substrate 8301 can be formed by etching a single-crystal silicon substrate with a crystal orientation (100) on the major surface by using an alkaline solution such as a potassium hydroxide solution. The etching rate of single-crystal silicon by alkali is much lower in the (111) plane than in the (100) and (110) planes. A projecting portion 8320 with a truncated pyramidal shape and convex portions (rib structures) 8360a and 8360b can be formed by using this phenomenon.

The mirror substrate 8201 and electrode substrate 8301 are formed in the above-described way and bonded to each other, thereby forming a mirror device which makes the mirror 8230 move (pivot) by applying an electric field to electrodes 8340a to 8340d, as shown in FIG. 12. To improve the reflectance of the mirror 8230, a metal layer of, e.g., gold is formed on the surface (the surface shown in FIGS. 11 and 12) of the mirror 8230.

After formation of, e.g., the mirror portion connected by mirror connectors, the mirror substrate formed in the above-described manner is handled while keeping the mirror in a pivotable state. For example, in the step (substrate rotation by spin coating, substrate conveyance between manufacturing apparatuses, and substrate cleaning) of forming structures included in the mirror by patterning or selective etching, the wafer dicing step, the step of forming a metal layer on the mirror surface, the step of bonding the mirror substrate to a substrate with electrode interconnections for driving the mirror, the step of die-bonding the structure to a package, the wire bonding step, and the potting step, the mirror substrate is handled while keeping the movable portions such as the mirror and movable frame connected by the fragile connectors.

In the above-described mirror device, an electric field generated by a voltage applied to the electrodes formed on the electrode substrate gives an attracting force to the mirror and rotates it by several degrees. To control the pivotal movement (position) of the mirror at high positional accuracy, the connectors are designed to deform by a slight force. For example, the connectors include torsion springs with a width of 2 μm and a thickness of 10 μm. The connectors readily break upon receiving a large force. The mirror itself that is formed thin also readily breaks or chips upon receiving a large force.

In the above-described processes, a water current, a centrifugal force in drying a wafer, vibration or impact is generated and applied to the connectors and mirror. Hence, the connectors easily break, or the mirror easily chips. As a result, the manufacturing yield of mirror substrates decreases. Especially, a mirror ray including a number of mirror devices arrayed in a matrix becomes defective if one mirror is defective, resulting in a further decrease in yield.

This embodiment has been made to solve the above-described problem and has as its object to form mirror substrates at a high yield of non-defective units.

This embodiment will be described next with reference to FIGS. 105A to 105K. First, as shown in 105A, an SOI substrate having, on a silicon base 2301 with a plane orientation (100), a buried insulating layer 2302 made of silicon oxide and having a thickness of about 1 μm, and a 10-μm thick single-crystal silicon layer (SOI layer) 2303 is prepared. An oxide layer 2304 is formed on the surface of the SOI layer 2303, and an oxide layer 2305 is formed on the lower surface of the silicon base 2301 by, e.g., thermal oxidation.

Figure 105A:
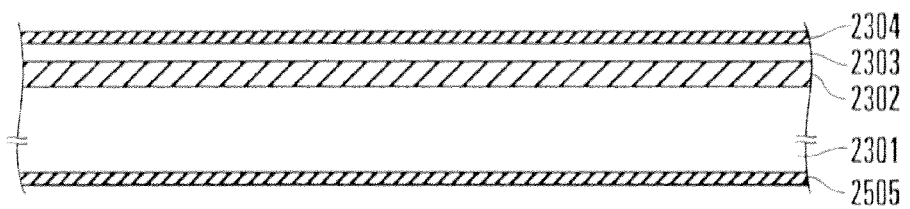
FIGS. 105A to 105K are views showing steps in forming a mirror substrate according to the 28th embodiment.
Figure 105B:
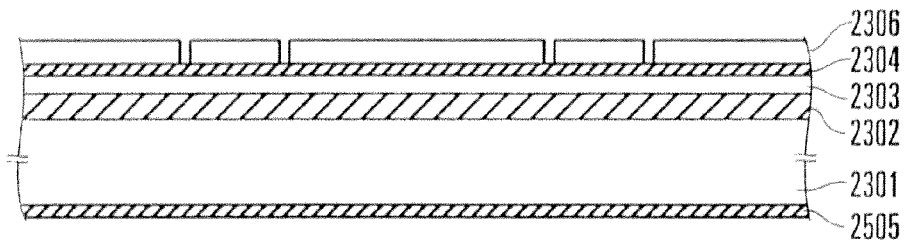
Figure 105C:
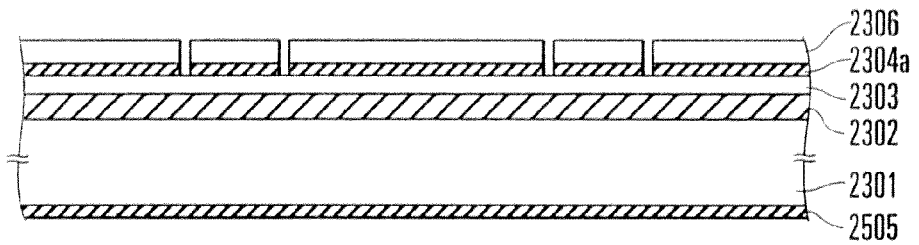

As shown in FIG. 105B, a resist mask layer 2306 with a photoresist pattern formed by known photolithography is formed on the oxide layer 2304. The oxide layer 2304 is etched by using the resist mask layer 2306 as a mask. At this time, directional etching such as reactive ion etching is performed to expose the surface of the SOI layer 2303 at the etched portions. With this process, an inorganic mask layer (movable portion formation mask pattern) 2304a with a mask pattern of silicon oxide is formed, as shown in FIG. 105C. At this time, a pattern to form scribe lines serving as a guide in dicing is provided in a region (not shown) of the resist mask layer 2306.

Figure 105D:
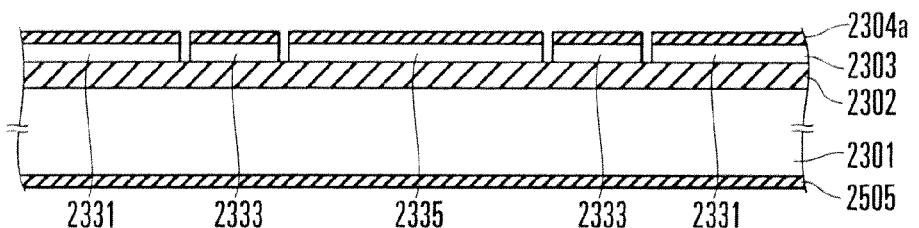

The resist mask layer 2306 is removed by ashing using ozone or oxygen plasma. As shown in FIG. 105D, the SOI layer 2303 is etched by dry etching using the inorganic mask 2304a as a mask. With this etching, the base 2301, movable frame 2303, mirror (mirror structure) 2305, connectors (not shown), and mirror connectors (not shown) are formed. That is, the basic structure of the mirror substrate is complete. The scribe line pattern formed in the region (not shown) of the resist mask layer 2306 is also transferred to the inorganic mask layer 2304a and then to the SOI layer 2303. The mirror structure may connect to the base without the movable frame.

Figure 105E:
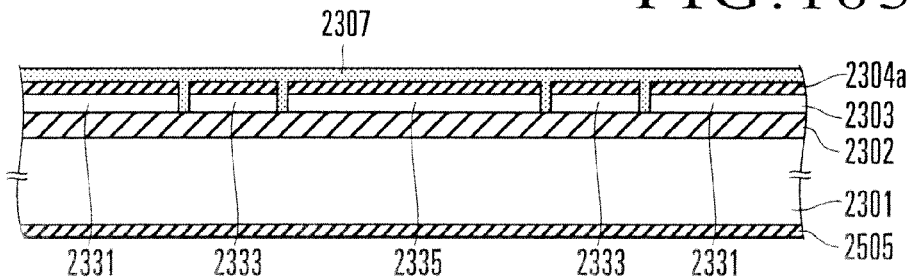
Figure 105F:
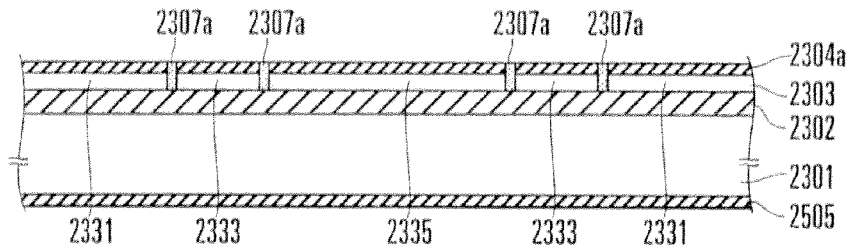

A resin is applied onto the inorganic mask 2304a to form a resin film 2307 that fills the spaces between the patterns of the inorganic mask 2304a and the spaces between the structures formed in the SOI Layer 2303, as shown in FIG. 105E. The resin film 2307 is etched back to form a protective layer 2307a that exposes the surface of the inorganic mask layer 2304a and fills the spaces between the patterns of the inorganic mask 2304a and the spaces between the structures formed in the SOI layer 2303, as shown in FIG. 105F.

Figure 105G:
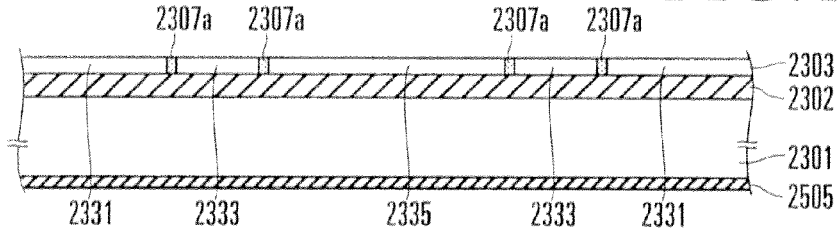

The inorganic mask layer 2304a is removed by, e.g., known chemical mechanical polishing (CMP) to form the protective layer 2307a that fills the spaces between the structures formed in the SOI layer 2303 with a flat surface, as shown in FIG. 105G. As will be described below, in etching the silicon base 2301, the surface of the SOI layer 2303 is fixed in each processing apparatus. For this reason, the surface of the SOI layer 2303 is preferably flat after the inorganic mask layer 2304a is removed.

Figure 105H:
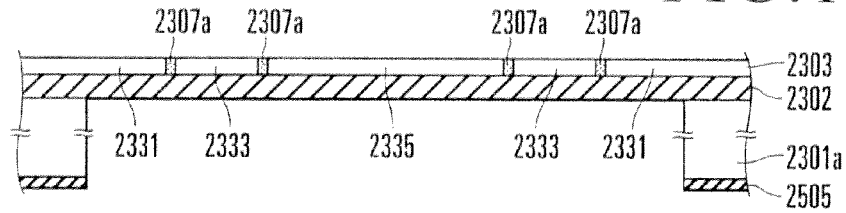
Figure 105I:
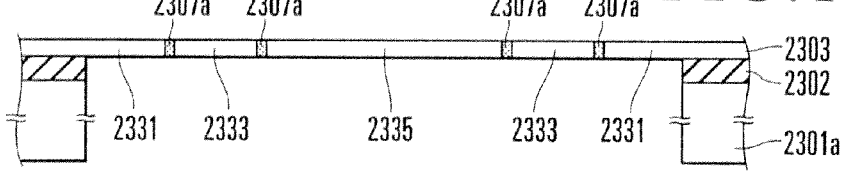

Next, the oxide layer 2305 and silicon base 2301 are etched by using a mask pattern (frame formation mask pattern) formed by known photolithography to form a frame portion 2301a, as shown in FIG. 105H. The mask pattern is removed. Then, the oxide layer 2305 and the buried insulating layer 2302 exposed inside the frame portion 2301a are removed by, e.g., wet etching using an alkaline solution or dry etching, as shown in FIG. 105I.

Figure 105J:
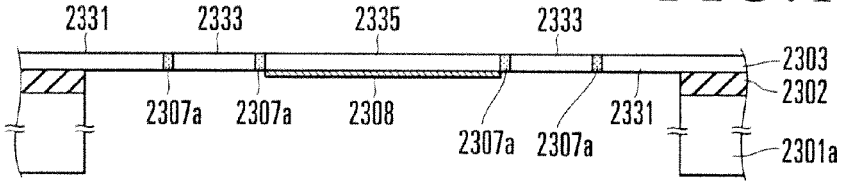
Figure 105K:
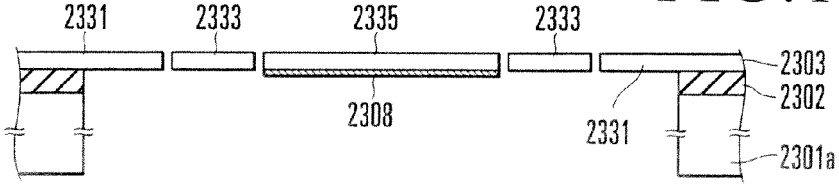

As shown in FIG. 105J, a metal film 2308 of, e.g., Au is formed on the surface of the mirror 2335 with the frame portion 2301d by, e.g., vapor deposition. The metal film 2308 is selectively formed at the portion of the mirror 2335 by using, e.g., a stencil mask. A step of bonding a mirror substrate 2300 to the electrode substrate to form a mirror device, a step of packaging the mirror device and fixing it by die bonding, and a step of wire-bonding the terminals of the package to the terminals of the electrode substrate are executed. Then, the protective layer 2307a is removed by, e.g., ashing using oxygen plasma to form a space between the base 2301, movable frame 2302, and mirror 2335 to make the movable frame 2302 and mirror 2335 pivotable, as partially shown in FIG. 105K. The protective layer 2307a may be removed after formation of the mirror device or between the above-described packaging steps.

Figure 106:
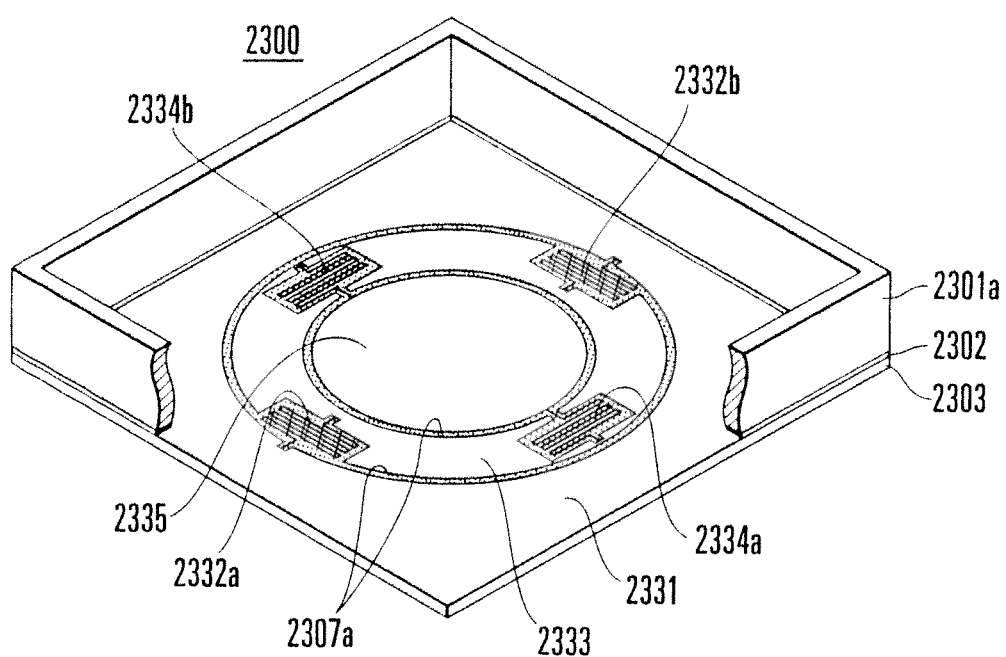
FIG. 106 is a perspective view schematically showing the structure of a mirror substrate 2300 formed by the steps in FIGS. 105A to 105K.

FIG. 106 is a perspective view schematically showing the schematic structure of the mirror substrate 2300 formed by the steps described in FIGS. 105A to 105I. As shown in FIG. 106, the mirror substrate 2300 comprises the base 2301, movable frame 2303, and mirror 2335 formed in the SOI layer 2303. The movable frame 2303 is arranged in the opening of the base 2301 and connects to the base 2301 through a pair of connectors 2332a and 2332b. The mirror 2335 is arranged in the opening of the movable frame 2303 and connects to the movable frame 2303 through a pair of mirror connectors 2334a and 2334b. The frame portion 2301a formed around the base 2301 surrounds the movable frame 2303 and mirror 2335. The frame portion 2301a is fixed to the base 2301 through the buried insulating layer 2302.

The connectors 2332a and 2332b provided in the notches of the movable frame 2303 connect the base 2301 to the movable frame 2303. The movable frame 2303 connected to the base 2301 can pivot about the pivot axis (movable frame pivot axis) passing through the connectors 2332a and 2332b. The mirror connectors 2334a and 2334b provided in the notches of the movable frame 2303 connect the movable frame 2303 to the mirror 2335. The mirror 2335 connected to the movable frame 2303 can pivot about the mirror pivot axis passing through the mirror connectors 2334a and 2334b.

The above-described structure is the same as that of the mirror substrate 8201 shown in FIG. 11. The mirror substrate 2300 shown in FIG. 106 comprises the protective layer 2307a that fills the gaps between the base 2301, connectors 2332a and 2332b, movable frame 2303, mirror connectors 2334a and 2334b, and mirror 2335. Hence, the mirror substrate 2300 shown in FIG. 106 suppresses motions such as pivotal movement in the above-described structure so that it is protected from damage or breakage due to external mechanical vibration.

For example, it is possible to suppress damage to the connectors even when an external mechanical vibration its added in loading and fixing the mirror substrate 2300 in a vapor deposition apparatus to form the metal film 2308 described with reference to FIG. 105J. Similarly, it is possible to suppress damage to the connectors in the step of bonding the mirror substrate 2300 to the electrode substrate to form the mirror device, the step of packaging the mirror device and fixing it by die bonding, and the step of wire-bonding the terminals of the package to the terminals of the electrode substrate.

As described above, according to this embodiment, when the base, connectors, and mirror structure are formed on the buried insulating layer, a protective layer filling the spaces between them is formed. Even when the buried insulating layer in the mirror formation region is removed to expose the both surfaces of the silicon layer and make the mirror structure movable, the mirror structure is prevented from moving. As a result, according to the present invention, the mirror structure and connectors are protected from damage. This allows to form mirror substrates at a high yield of non-defective units.

The eighth to 28th embodiments may have the antistatic structure described in the first to seventh embodiments.

INDUSTRIAL APPLICABILITY

The present invention is applicable, to a electrostatically driven device having a mirror with a changeable tilt angle, a mirror array having a plurality of mirror devices arranged two-dimensionally, an optical switch having the mirror array, a method of manufacturing a mirror substrate included in the mirror device, and a method of manufacturing the mirror device.

The invention claimed is:
1. A mirror device comprising:
 a mirror which is supported to be pivotable with respect to a mirror substrate;
 a driving electrode which is formed on an electrode substrate facing said mirror substrate,
 wherein said driving electrode is formed at an arbitrary position on said electrode substrate asymmetrically with respect to a pivot axis of said mirror projected onto said electrode substrate.
2. A mirror device according to claim 1, wherein said driving electrode is divided by a parting line parallel to the pivot axis of said mirror.
3. A mirror device according to claim 1, further comprising a substantially conical projecting portion which projects from said electrode substrate, wherein said driving electrode is formed on surfaces of said electrode substrate and said projecting portion.
4. A mirror device according to claim 3, wherein said projecting portion is formed at an arbitrary position on said electrode substrate asymmetrically with respect to a pivot axis of said mirror projected onto said electrode substrate.

* * * * *